United States Patent [19]

Pieper et al.

[11] Patent Number: 5,371,851
[45] Date of Patent: Dec. 6, 1994

[54] GRAPHICAL DATA BASE EDITOR

[75] Inventors: Chris M. Pieper, Hillsboro; Cathie J. B. Wier, Portland; Eric M. Bush; Thomas W. Rudwick, III, both of Beaverton; William A. Greenseth, Portland; Robert R. Klingenberg; David Du Pont, both of Beaverton, all of Oreg.

[73] Assignee: Credence Systems Corporation, Fremont, Calif.

[21] Appl. No.: 344,345
[22] Filed: Apr. 26, 1989
[51] Int. Cl.⁵ .............................................. G06F 15/40
[52] U.S. Cl. ..................................... 395/164; 395/162
[58] Field of Search ........................ 364/518, 521, 522; 340/747, 750, 798, 799; 395/162, 163, 164

[56] References Cited

U.S. PATENT DOCUMENTS

| 4,315,315 | 2/1982 | Kossiakoff | 364/300 |
|---|---|---|---|
| 4,455,619 | 6/1984 | Masui et al. | 364/900 |
| 4,722,071 | 1/1988 | Gates et al. | 364/900 |
| 4,809,170 | 2/1989 | Leblang et al. | 364/200 |
| 4,813,013 | 3/1989 | Dunn | 364/900 |
| 4,817,018 | 3/1989 | Cree et al. | 364/518 |
| 4,847,785 | 7/1989 | Stephens | 364/518 |
| 4,849,880 | 7/1989 | Bhaskar et al. | 364/200 |
| 4,881,179 | 11/1989 | Vincent | 364/518 |
| 4,901,221 | 2/1990 | Kodosky et al. | 364/200 |
| 5,005,119 | 4/1991 | Rumbaugh et al. | 364/200 |

OTHER PUBLICATIONS

Compass Development, Inc. *ATOP Automatic Test Optimization Program*, May 1988, pp. 1–4.
Compass Development, Inc., *SAV Stimulus Analysis and Verification*, May 1988, pp. 1–4.
Simutest, Inc., *ATELink*, 5 pages.
Bruce Hadley, "Design and Test Integration With TDS", *STRATEGIES*, Issue No. 14, Fall 1988, pp. 1–16.
Chris Pieper, "New Concepts for Test Stimulus Generation and Editing", *Electronics Test*, Jun. 1988, pp. 46, 48, 50 and 52.
Chris Pieper, "The Myth and Reality of Linking Design and Test", *Electronics Test*, 55–58., Apr. 1988.
Arium Corporation, *Logic Analyzers/Application: Using Split–Screen Displays In Modern Logic Analysis*, Apr. 1989, pp. 68–74 *Evaluation Engineering*.
Chris Everett, "CAE systems that incorporate CAT tools strengthen the link between design and test", EDN Feb. 20, 1986, pp. 52–58.
Peter Singer, "Test Software Development", Semiconductor Intl., Sep. 1986, pp. 76–81.
Johathon Vollmar, "A High-Speed Window-Based Pattern Debugger", 1987 International Test Conference, Paper 44.3, pp. 1058–1064.
Tinaztepe and Ozguc, "Functional Test Program Generation Through Interactive Graphics", 1988 International Test Conference, Paper 28.3, pp. 551–558.
National Instruments Corporation, pamphlet entitled "LabVIEW–New Technology for Scientific Test and Measurement", 1986, 6 pages.
John Ivie, "A High level Approach to Integrating Design and Test", 1988 International Test Conference (Aug.), Paper 24.1, pp. 452–459.
Test Systems Strategies, Inc. Reference Manual entitled "TesTools", Copyright 1984–1985.
Sangster and Monahan, "Aquarius: Logic Simulation On An Engineering Workstation", 20th Design Automation Conference, Paper 8.2, pp. 93–99.

*Primary Examiner*—Phu K. Nguyen
*Attorney, Agent, or Firm*—Smith-Hill and Bedell

[57] ABSTRACT

A system manipulates stimulus/response signal data associated with an integrated circuit design, such as from a computer-aided engineering simulator, and converts the data into a format acceptable by a tester device which tests a prototype or production integrated circuit. The data is graphically displayed as a waveform and as a vector sequence. On-screen editing of either display is reflected in the other display. Further, the same displays are used to convert the data from event-based data into cycle-based template data compatible with a tester. A mix between event and state data during the conversion is allowed. A standard frame generation language is presented for defining tester frames for each signal within a template or timeset. A workbench editor provides for icon-based control of the system.

9 Claims, 68 Drawing Sheets

GRAPHICAL DATA BASE EDITOR

FIELD OF THE INVENTION

This invention relates to a computer system for producing a data base, and more particularly, to such a system for producing the data base via a graphical display.

BACKGROUND OF THE INVENTION

Computer systems have permeated much of everyday life. This is particularly true in business environments where computers are widely used for document preparation using word processor programs. Financial information is manipulated using accounting spread sheet programs which display the information in various graphical forms. Graphical information is very readily assimilable by an individual, and can be more intuitively, and therefore, more quickly understood than by the mere reading of text and tables.

The concept of graphical presentation of information has even gone so far as to be used in the preparation of programs which historically have been written as text on keyboards. Examples of graphical program generators include U.S. Pat. No. 4,315,315 issued to Kossiakoff for GRAPHICAL AUTOMATIC PROGRAMMING. This concept of a block diagram program system is further illustrated by U.S. Pat. No. 4,868,785 issued Sep. 19, 1989 to Jordan et al. for BLOCK DIAGRAM EDITOR SYSTEM AND METHOD FOR CONTROLLING ELECTRONIC INSTRUMENTS. The control of electronic instruments through a graphical user interface is also provided by a product known by the proprietary name "LabVIEW" produced by National Instruments of Austin, Tex. These systems demonstrate the desirability of working with graphical images rather than textual information, particularly when systems become complex and large in size.

An environment in which there has remained a lack of application of graphics in a significant sense has been the analysis and testing of integrated circuit designs and devices.

Many commercial products take advantage of mass produced integrated circuits which have proven functionality to provide desired device operation. However, desired functionality and speed are not often readily achieved with these devices. As a result, application specific integrated circuits (ASIC's) and very high speed integrated circuits (VHSIC's) are used. ASIC's generally have 8,000 or fewer gates. VHSIC's may have 50,000 or more gates. Correspondingly sized commercially available devices will soon follow.

For each gate in a device, typically three to five vectors (ordered sets of data) are required to test each gate of such a device. Thus, for 5,000 gates, this means 15,000 or more vectors. Device pin counts vary between 64 and 256. The pin count also represents the number of bits per vector. Multiplying the number of bits per vector by 15,000 vectors results in generation of a million or more ones and zeroes to make up the vectors for testing. Each vector is created in software as a pattern of ones and zeroes representing device states. These device states, also viewed as waveforms, adjust the timing to test device specifications. The waveforms or states are additionally edited to reflect tester requirements for actual physical waveform generation and device testing.

This massive amount of stimulus data invariably must go through a series of rules, checks and modifications in the progression from design simulation to physical device testing. This problem is compounded as devices grow more complex.

During the process of putting an ASIC device on the market, several steps are involved. First, during a design phase, the concept of the design is reduced into schematic or other related form defining the overall design of the circuit. The design is then analyzed to verify the functionality of the design concept, typically through the use of software simulation. In simulation, models of the design are used to determine whether the captured design performs in a manner that meets the designer's original expectations. Many elaborate simulation models exist which produce an analysis of the design purely from a software viewpoint and are not related to any physical device characteristics, other than the known design functional characteristics of the device. During this simulation, extensive test data, typically as test vectors, are generated for testing the design concept.

Once the design satisfies the engineer as to its functionality and conformance with the design concept and objectives, design verification takes place. A prototype is typically built to determine whether the physical circuit conforms with the simulated design circuit. In most situations a test engineer independent of the design engineer performs the actual test. Conventionally, skilled test engineers use expensive, production-oriented automatic test equipment (ATE), or design engineers use computer-controlled clusters of instruments such as pattern generators, logic analyzers, power supplies, and other related devices. With a production ATE system, the engineer is often faced with inflexible programming, difficult access and high cost. On the other hand, using separate laboratory instruments is time consuming, difficult, tedious, and somewhat overwhelming in complex applications. This approach also often fails to uncover a large number of timing-related problems.

As a result of the need to convert simulation test files into prototype test files for running by a tester (ATE) it is necessary to modify the original simulation timing to meet specific limitations of a vendor's test hardware. Test vector translation stems from the need to convert the event-based test vectors used in simulation into the state or cycle based test vectors required by test hardware. Stimuli generated for simulation environments are normally event oriented. That is, after one event occurs, or at the same time as it occurs, another event, such as a signal transition, takes place. While the sequence of events is critical, the time between events is not. The occurrence of events is not constrained by a real time clock.

Unlike simulators, test hardware must cope with real time constraints. It generally operates as a synchronous, cycle-oriented machine. Consequently, it is driven by state-oriented data, with the signal behavior being controlled by a variety of signal conditioners that are constrained by test cycle boundaries. Depending upon the tester, the signal behavior may be controlled by a variety of different features, such as signal formats, real time edge specification, and variable length test cycles. Converting test vectors from event-oriented data to state-oriented data is a translation process. For each cycle of the tester, the event data is sampled to determine what the state of the tester should be for that cycle. For a general discussion of the issues involved in the design and testing of circuits, see Pieper, "The Myth and Reality of Linking Design and Test" *Electronics Test,* April 1988, pp. 55–59.

Commercial software translators have been developed to automate the conversion process. Setting up, or programming, the translator, however remains a manual process, and the quality of simulation conversion depends upon the quality of the translator setup. Such commercially known translators include a system referred to under the proprietary name of "TDS" made by Test Systems Strategies, Inc. of Beaverton, Oreg.; the systems identified under the proprietary names of SAV (stimulus analysis and verification), and ATOP (automatic test optimization program), provided by Compass Development, Inc. of San Jose, Calif.; and the system known by the proprietary name of "ATELink" of Simutest, Inc. of Santa Clara, Calif.

The TDS package of Test Systems Strategies, Inc. is representative of a relatively complex and comprehensive translator. It provides for the capability of reading in a file from a commercial simulator to make available the test vector structure used during the simulation. A simulation rules checker and tester rules checker determine whether the file data conforms to the specifications of the simulation and to the tester. In order to convert the simulation file into a tester file, as has been mentioned, the file must be conditioned. Waveform editors do this conditioning by allowing the user to enter specifications for changing the data into a form which is acceptable to the tester, except that the data manipulation is done entirely in an event mode format. Thus, the final test program is not available to editing or review. Subroutines are used to draw, using ASCII characters, a representation of the waveform for viewing on a screen. This presentation simply reflects the existence and status of the data and cannot be manipulated, except through the conditioner subroutines. Once the test engineer is satisfied that the data file is acceptable for translation into a test program, a test program generator designed for a specific commercial ATE is run to produce a test program for input to the tester.

This entire process is done through the use of menus and text editing on the screen. Control commands must be entered by inserting proper character strings to manipulate and activate the various system features. It can be seen that setting up a translator remains a manual process and the quality of simulation conversion depends on the quality of the translator setup. The quality of the setup is directly related to the size of the design, the capabilities of the tester, and the test experience of the person setting up the translator.

Thus, while vector-translators are a step in the right direction, the user must still supply a significant amount of knowledge to make them work. Further, it is desirable to have a system which is usable by both design engineers and test engineers, so that the design engineer can generate the necessary test files for testing basic and PCB (printed circuit board) prototype devices using commercially available testers. The test translation process typically involves a detailed understanding of the tester requirements and therefore is not readily undertaken by a design engineer. Further, a test engineer does not have the intimate and extensive knowledge of the intended function and workings of the prototype device, so that this information must be learned and obtained through information provided by the design engineer. It is therefore desirable to have a system which is usable by both design engineers and test engineers which allows them to interface between the two general functions without requiring the extensive background of knowledge typically required.

For a further discussion of these issues, see Pieper, "New Concepts for Test Stimulus Generation and Editing", *Electronics Test,* June 1988, pp 46–52.

SUMMARY OF THE INVENTION

The present invention provides a system for graphically displaying and editing a data base. This is particularly advantageous in the integrated circuit design and test environment.

The preferred embodiment of the present invention provides import and export links to logic simulators, graphical stimulus creation and editing, tester rules checking, tester simulations, automatic test program generation, all through a simple iconic interface. It is thus readily usable by both design and test engineers.

More specifically, in one aspect of the present invention, a system is provided for editing graphically time-based data having a plurality of data elements which are associated with a time reference. User-operable input apparatus is used for inputting data, including data for modifying the time-based data. A programmable computer includes a memory for storing computer program instructions and data, and a processor coupled to the input apparatus and the memory for executing the stored program instructions. The processor is responsive to input data for producing graphic data representing each data element as a continuous signal for a period of time corresponding to the associated time reference. The data elements are also represented as a set of discrete values ordered according to the associated time references.

A graphic display is responsive to graphic data from the processor for displaying, simultaneously, a waveform display of the continuous signals as a function of time, and a vector display of the set of values and the associated time references.

As another aspect of the present invention, a similar system is provided wherein the processor is responsive to input data for producing graphic data representing the time-based data in at least one of a first mode in which each time reference is a predetermined point in time, and a second mode in which each time reference is a predetermined interval of time. The input apparatus is operable for selecting at least one of the first and second modes of display. The graphic display displays the time-based data in the selected mode or modes.

As yet another feature of the present invention, a system is provided for editing graphically time-based data having a plurality of data elements associated with time references. The processor is responsive to input data for producing graphic data representing a vector display of the time-based data showing a representation of the state for each associated time representation. The input apparatus is operable for selecting a plurality of displayed adjacent data elements and selecting a desired data base revision associated with the user-selected data elements. The processor is further responsive to user operation of the input apparatus for revising the user-selected data elements as a group.

A system for generating and displaying a block diagram program is also provided by the invention. User-operable input apparatus provides for inputting data, including data for selecting a plurality of blocks which blocks have input and output terminals of at least two types, where only terminals of one type can be connected. A programmable computer includes a memory for storing computer program instructions and data, and a processor coupled to the input apparatus and to the memory for executing the stored program instructions. Specifically, the processor is responsive to input data for producing graphic data representing the selected blocks and input and output terminals of selected blocks. A graphic display is responsive to graphic data from the processor for displaying images of the selected blocks and associated input and output terminals. The input apparatus is further operable for selecting a terminal of one block for coupling to a terminal of another block. The processor is responsive to the input data for producing graphic data identifying the terminals of other blocks which are of the same type as the selected terminal. The display is responsive to the graphic data for displaying the terminals of other blocks which are of the same type with a feature visually distinguishing them from other terminals.

The present invention also provides a system for generating, displaying and executing a block diagram program, with at least one block of the program representing a predetermined function. User-operable input apparatus is for inputting data, including data for selecting a block and associated function. A programmable computer includes a memory for storing computer program instructions and data, and a processor, coupled to the input apparatus and to the memory, for executing the stored program instructions. Specifically, the processor is responsive to input data for performing the function associated with the selected block, and for producing graphic data representing the selected block with a first graphic feature indicative of a first characteristic of the function performance, and with a second graphic feature, visually distinguishable from the first graphic feature, indicative of a second characteristic of the function performance which is different from the first characteristic. A graphic display is responsive to graphic data from the processor for displaying an image of the selected block with the corresponding graphic feature.

A method for defining a time-based digital signal having at least one of a plurality of states over each of a plurality of predetermined time intervals is also provided by the invention. The method includes the steps of selecting the digital data associated with one of the predetermined time intervals; identifying any subintervals of the one time interval during which the signal is characterized as having a fixed state, a selectable state, or a conditional state; assigning for each subinterval a corresponding identifier defining the characteristic of the signal state in that interval; and concatenating the assigned identifiers in a sequential list corresponding to the chronological order of the associated subintervals.

In the preferred embodiment of the present invention these features are provided by a computer system which receives time-based event data representing time sequences of signal values. These sequences are displayed on a timing editor as continuous waveforms as a function of time, and on a state editor as a series of sequences or vectors with the times of the signal transitions or amplitude changes identified. This data is translatable into a cycle or timeset format with each signal being defined by a frame within each timeset. The frames correspond to predetermined waveforms which are defined by a sequence of terms specifying one or more logic levels, changes in the logic levels, and any conditions relating to the change in logic level. The translation into state or cyclic data is via a user-controlled graphical icon-based display which provides for generation, display and execution of processes. The compatibility of icon-represented processes is displayed prior to interconnection of icons. The status of process execution is also graphically represented in a visual (non-textual) form.

These and other features and advantages of the present invention will become apparent from a reading of the following detailed description of the preferred embodiment in conjunction with the associated drawings.

BRIEF DESCRIPTION OF THE DRAWINGS

FIG. 3 illustrates icons representing system files and processes, including representative icons located in a directory for operation by a user.

FIG. 68 shows a comment identifier on the state editor display and comment listing contained in the retrieved test file.

DETAILED DESCRIPTION OF THE PREFERRED EMBODIMENT

Figure 1:
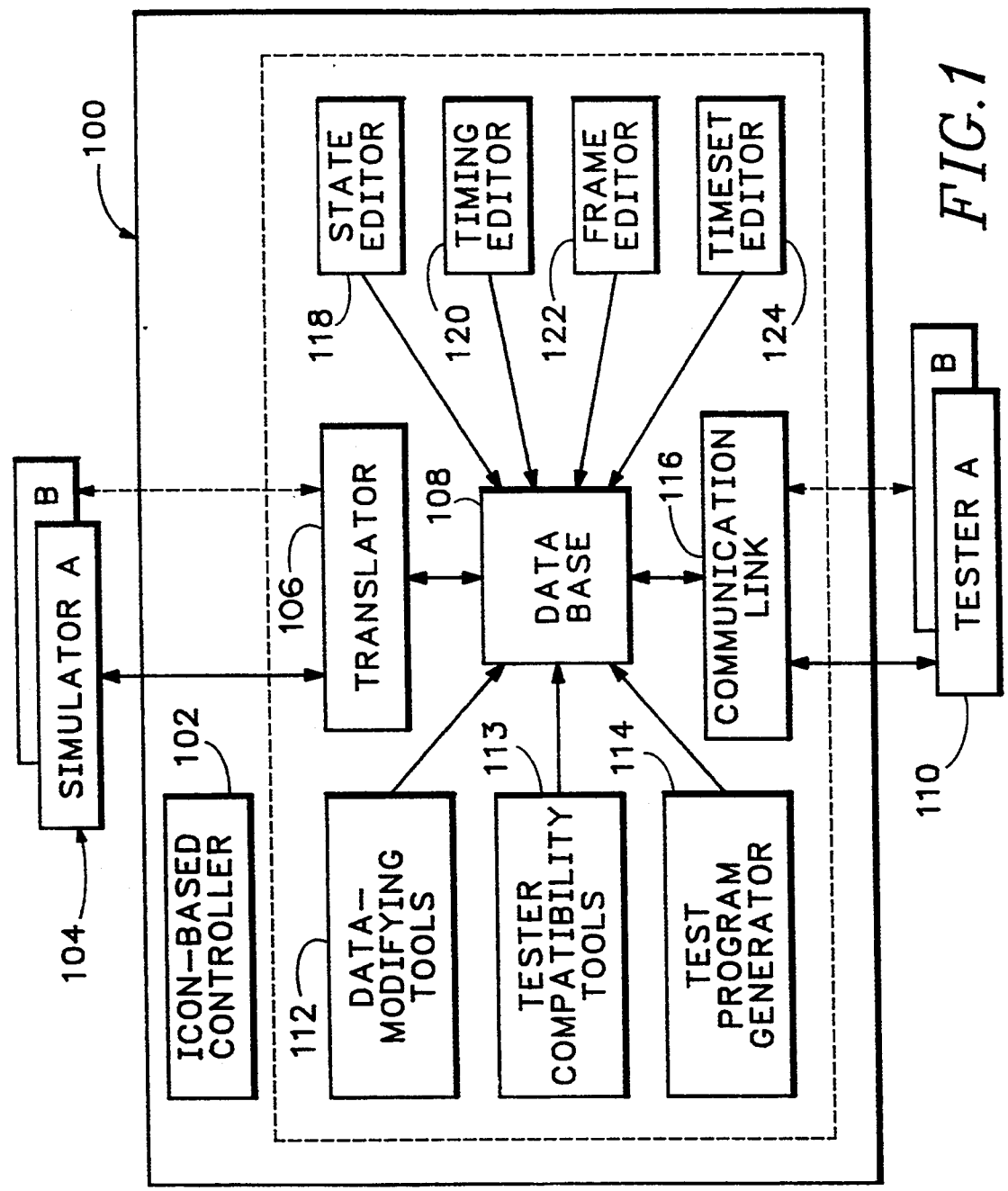
FIG. 1 is a block diagram showing a system made according to the present invention coupled to simulators and testers.

The preferred embodiment of the present invention is embodied in a system 100 shown in block diagram form in FIG. 1. This system is expected to be marketed under the proprietary name of TekWAVES by Tektronix, Inc. of Beaverton, Oreg. System 100 enables a user to create, view and manipulate data representing electrical stimuli, and to exchange data with external simulators and testers. This system allows both design engineers and test engineers with the ability to create stimulus vectors, modify specific waveform events and state characteristics, prepare vector data for a specific tester, create a test program for a specific tester, simulate a tester's results through timesets and time generators, and resimulate a circuit design through translators to and from simulators. System 100 is controlled highly graphically through what is referred to generally as an icon-based controller 102. Controller 102 allows a user, as will be seen, to use input devices, particularly a mouse, for controlling graphic data represented on a display screen for performing described functions.

System 100 is capable of retrieving files from a commercially available simulator 104. Such simulators include CADAT by HHB Systems, Inc., LASAR by Teradyne, Inc., VLAIF by Daisy Systems Corp., and ValidSIM by Valid Logic Systems, Inc. Further, system 100 can both read and write files of HILO of GEN-RAD, Inc., QS by Mentor Graphics Corp., EWAV by Tektronix, Inc., and SEF by Test Systems Strategies, Inc. Conversion from the simulator data base format into a data base format used by system 100 is through a translator 106. Once translated, the data is stored in a resident data base 108 supporting system 100. Controller 102 provides visual display of icons and supporting features for accessing the various files and subroutines for converting a simulator-produced data file into one compatible with a tester 110. The preferred embodiment of system 100 supports various testers, and in particular, testers identified by model nos. LV500, LT1000 and DAS9200, sold by Tektronix, Inc. A set of predefined data-modifying tools 112 provide the user with capabilities for making specific types of changes to the stimulus-response data base. Further, the data can be analyzed and tester-related specific data generated to make the data compatible with a selected tester through analyzer and generator 113. Once the data base conforms with the tester, a test program generator 114 then generates a tester-specific program for communication to the tester through a communications link 116.

The various tools and generators are accessed and made available to the user through various editors. These editors include a state editor 118 which displays the stimulus-response data as a vector or state diagram showing assigned values for each signal for each identified point or period of time. The same information is represented as a continuous waveform for each signal on the display of a timing editor 120. The individual waveforms within selected periods or cycles established in the waveform are determined by a frame editor 122 which defines the frames which a particular tester is capable of generating. Each of the frames for a given cycle of time comprise a timeset. The timing of these waveforms within a timeset are controlled through a timeset editor 124. The appearance and use of these editors and tools will become apparent from the following discussion demonstrating various features of the present invention as embodied in system 100.

Figure 2:
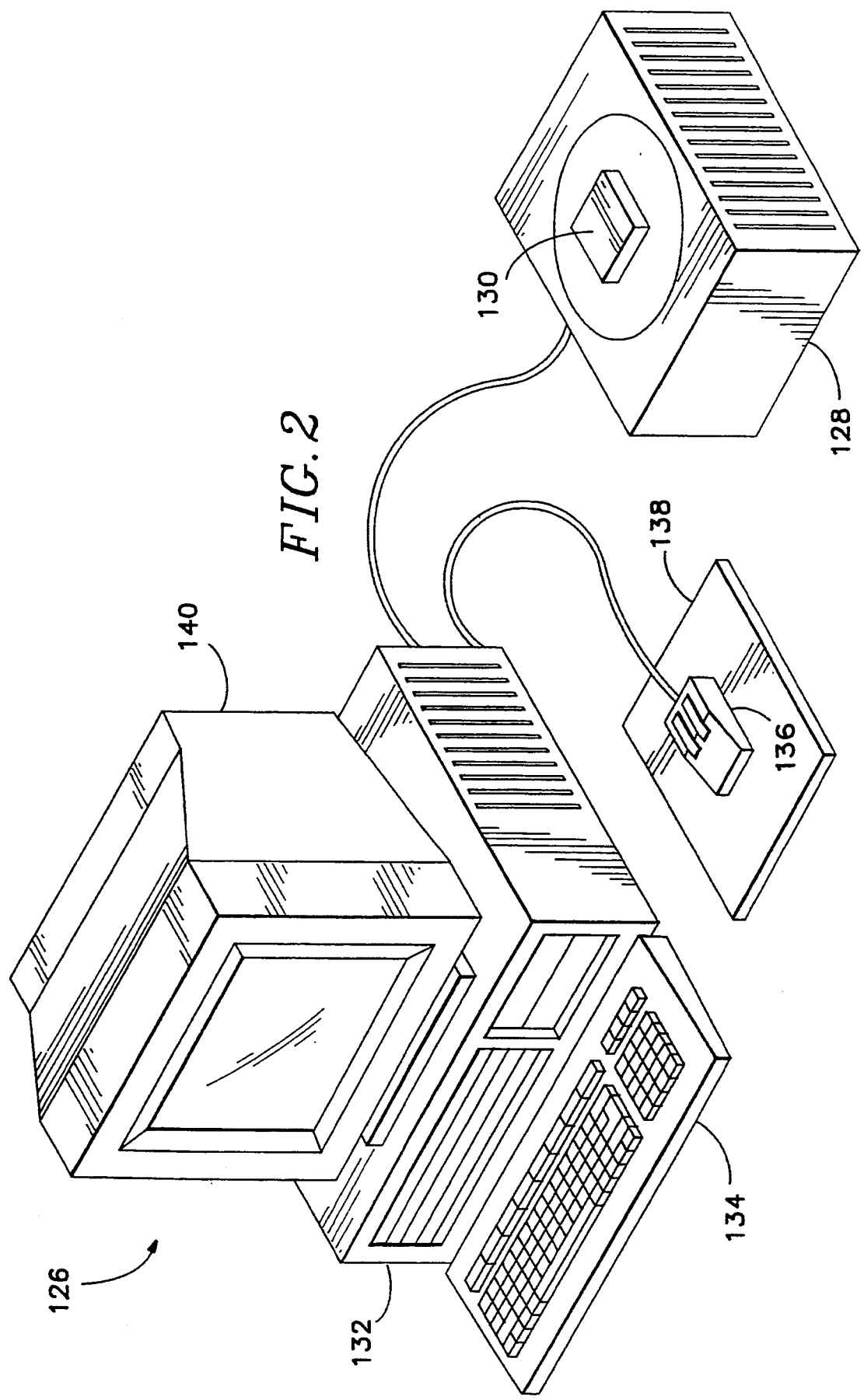
FIG. 2 is an illustration of a computer work station, embodying the system of FIG. 1, coupled to a tester.

Referring now to FIG. 2, an exemplary work station 126 is coupled to a tester 128 for testing an application-specific integrated circuit (ASIC) 130 mounted to tester 128. Work station 126, such as is made by Apollo Computers, Inc., includes a computer 132 comprising a memory for storing data and program instructions, and a processor for processing that data and instructions. Computer 132 is controlled via input devices such as keyboard 134 and a conventional mouse 136 shown on a friction pad 138. The graphical displays used for manipulating the data is provided on the screen of a display or monitor 140.

The following detailed description is directed to particular features of system 100.

Figure 3:
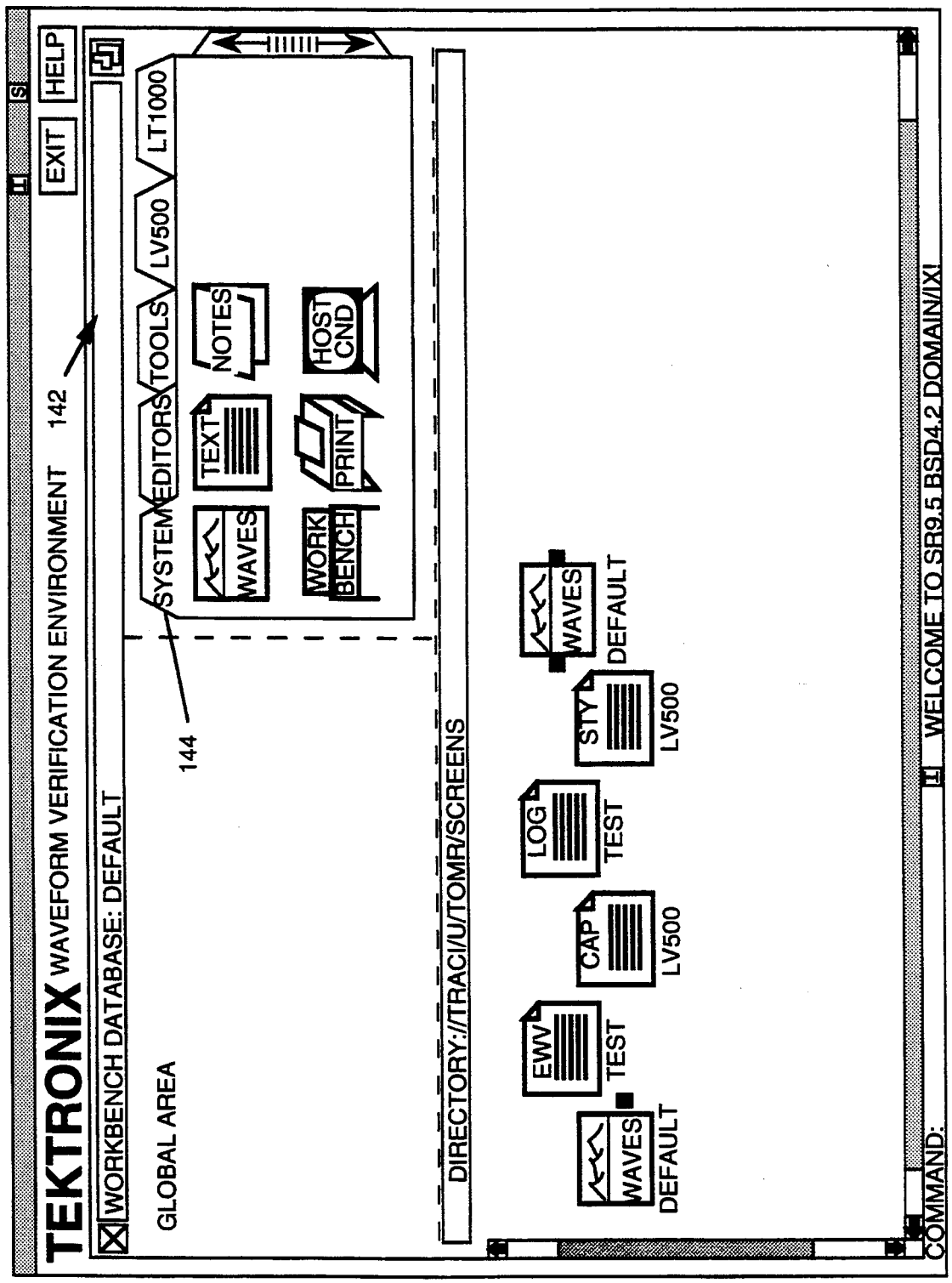
FIGS. 3–68 are screen displays illustrating various features of the system of FIG. 1.
Figure 68:
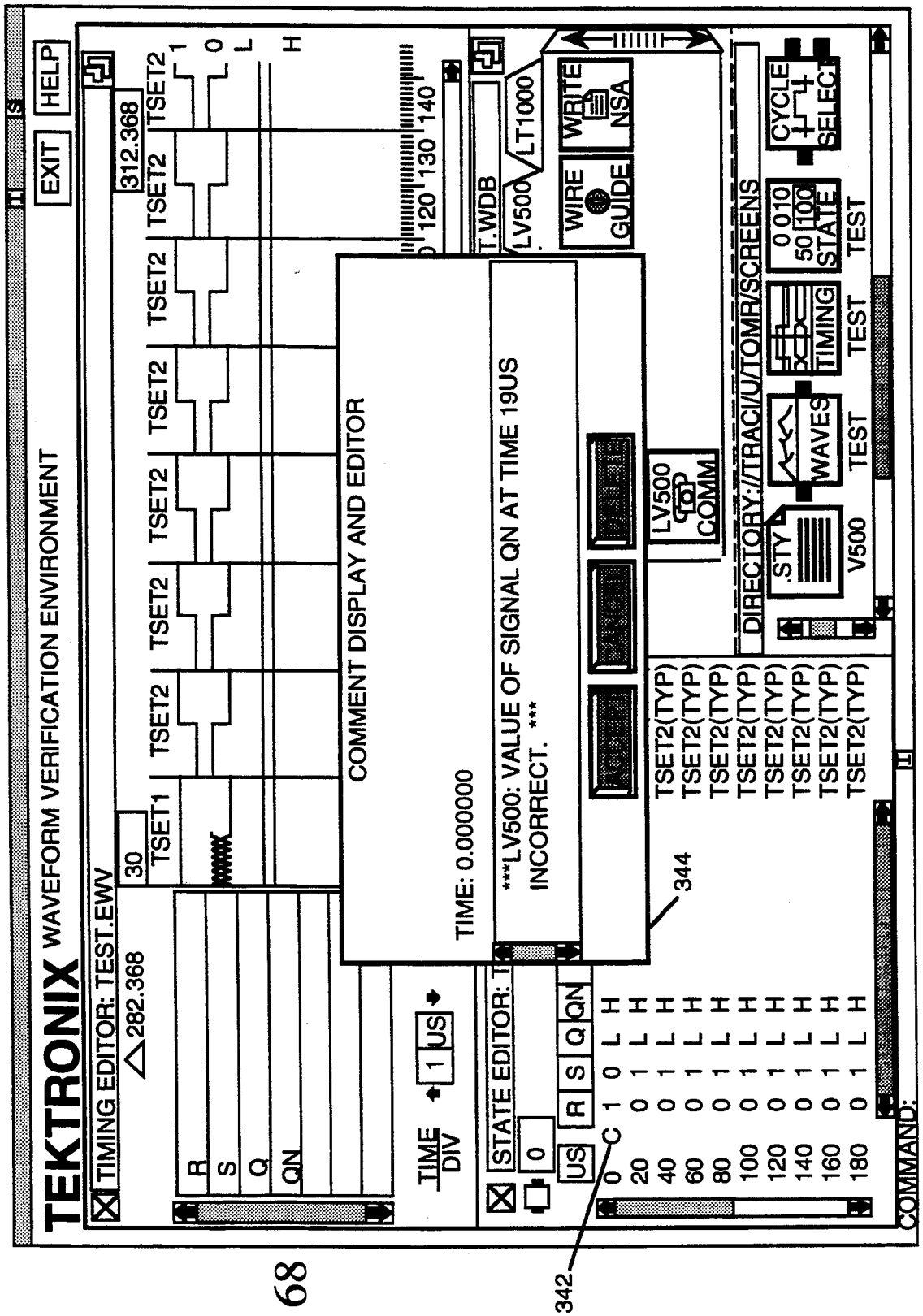

FIGS. 3–68 represent screen displays as seen from an operation of system 100. FIGS. 3–10 show various features of icons available on what is referred to as a workbench 142 which serves as a functional console for controller 102 providing the graphical input and output for a user manipulating data according to an intended objective. Workbench 142 comprises a set of graphical images representing cards displaying various icons. These cards include system card 144, editors card 145, tools card 146, file card 147, translator card 148, tester LV500 card 150, LT1000 card 152, and DAS9200 card 154.

FIG. 3 shows the icons for system card 144 which includes icons identified as WAVES, TEXT, NOTES, Workbench, PRINT and HOST COMMAND. The text file can be used as the basis for generating and copying various files. It is also the basis for such files as EWV, CAP, LOG and STY. The use and function of files and subroutines is controlled through the directory region with manipulation provided through cursor control provided by mouse 136.

Figure 4:
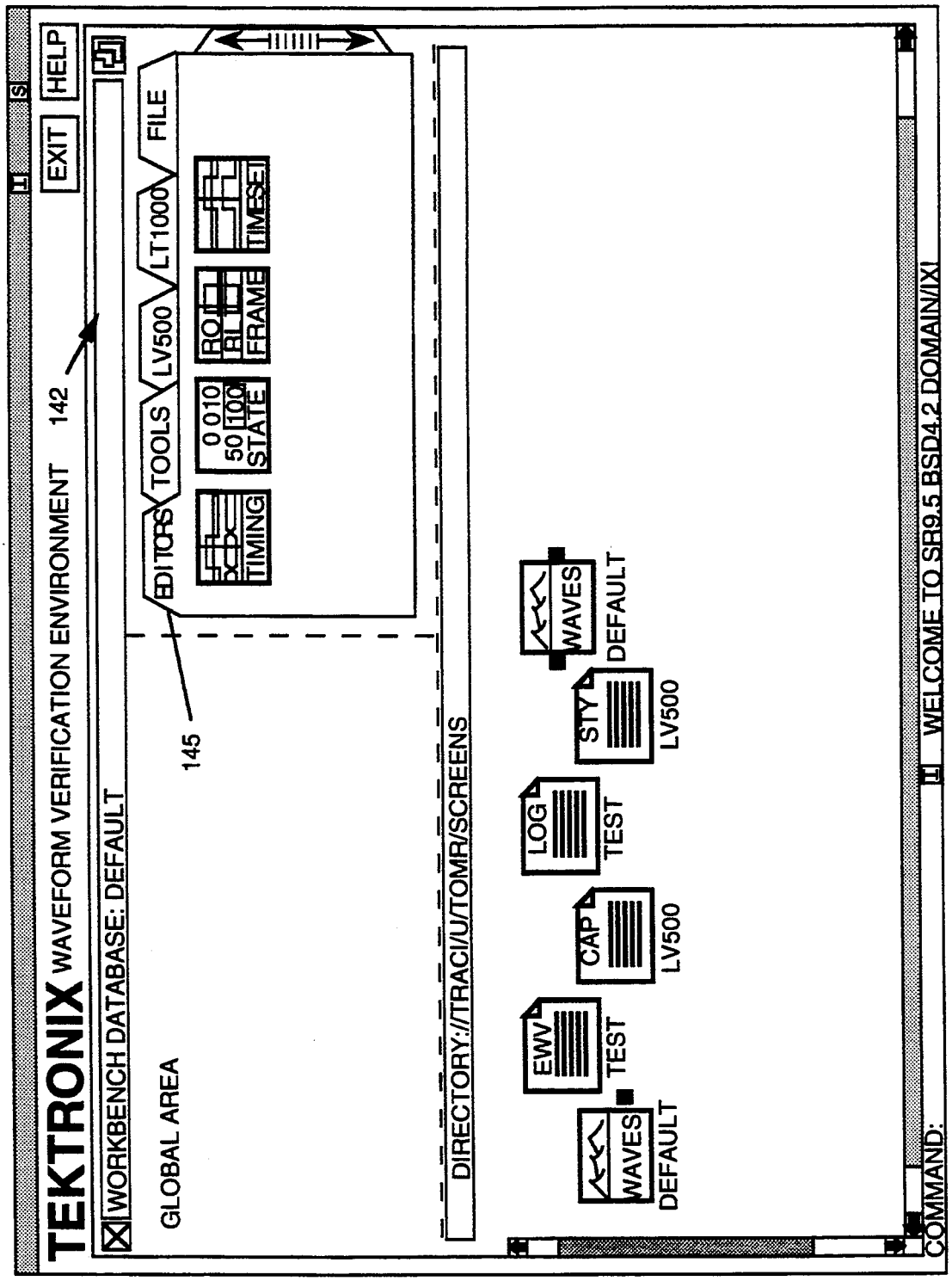
FIG. 4 illustrates editor icons representing editor processes existing in the system.
Figure 5:
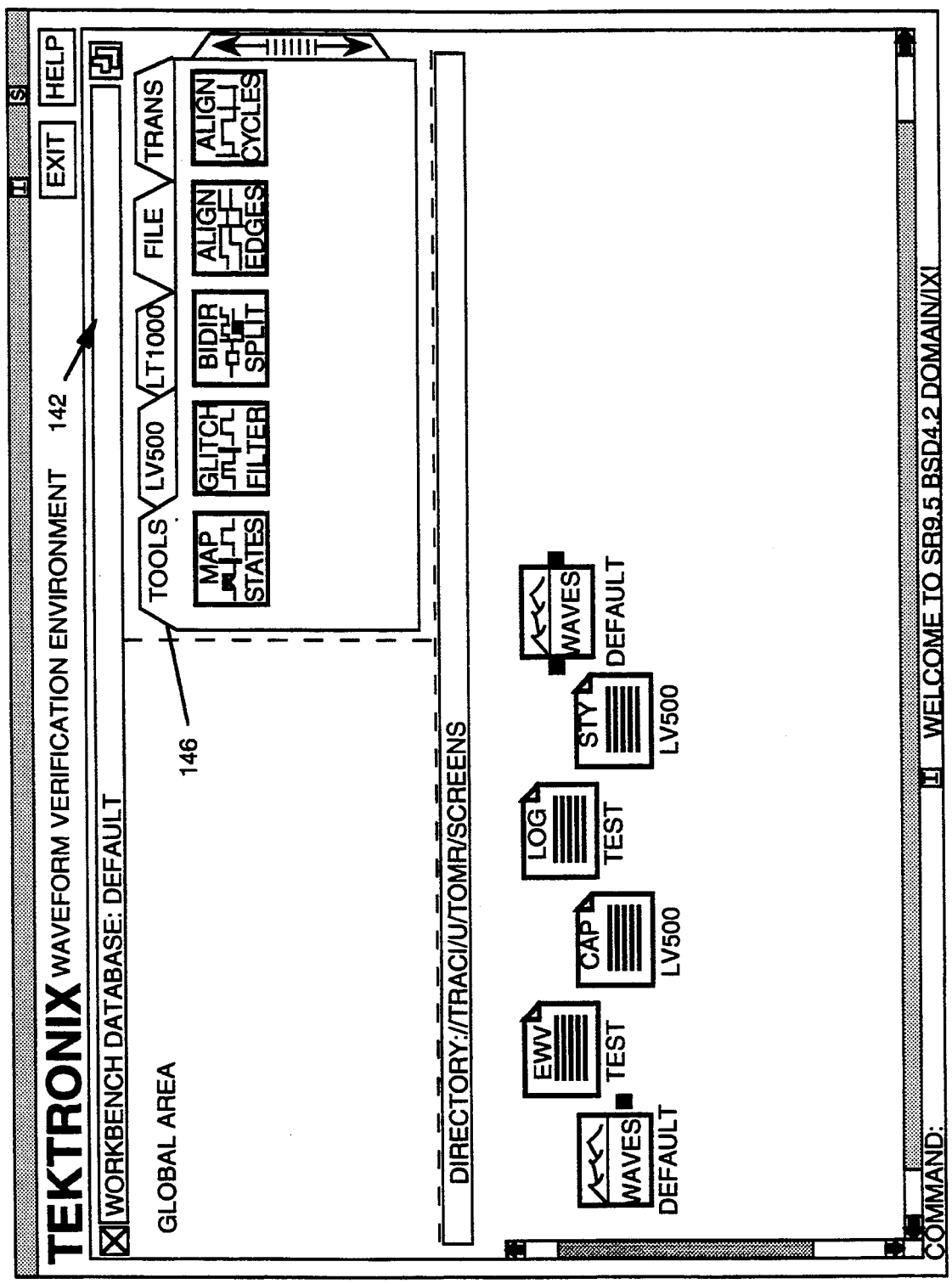
FIG. 5 illustrates tool icons representing processes for conditioning data in a system data base.
Figure 6:
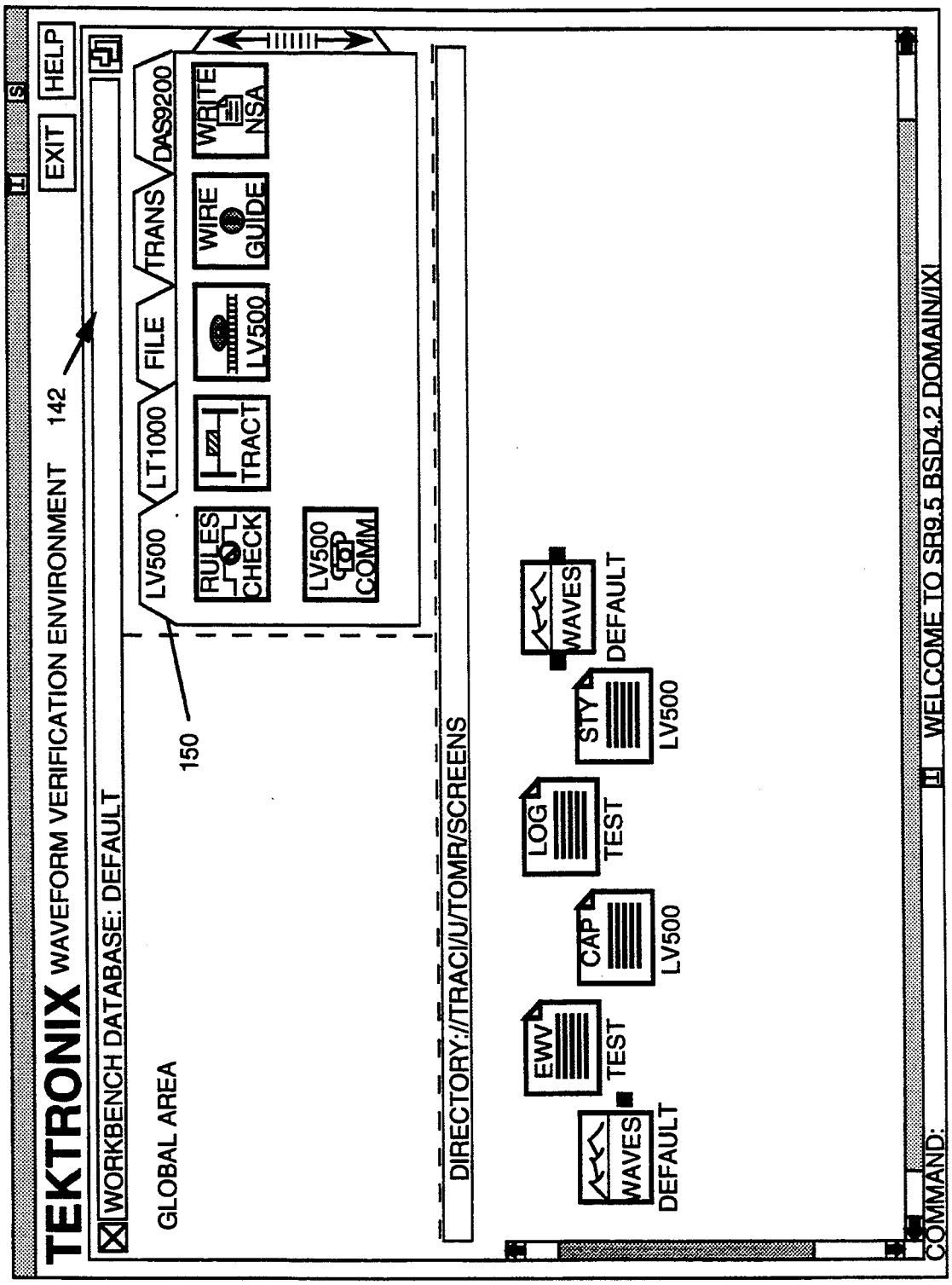
FIGS. 6 and 7 illustrate tester-specific icons representing processes related to two specific testers.
Figure 7:
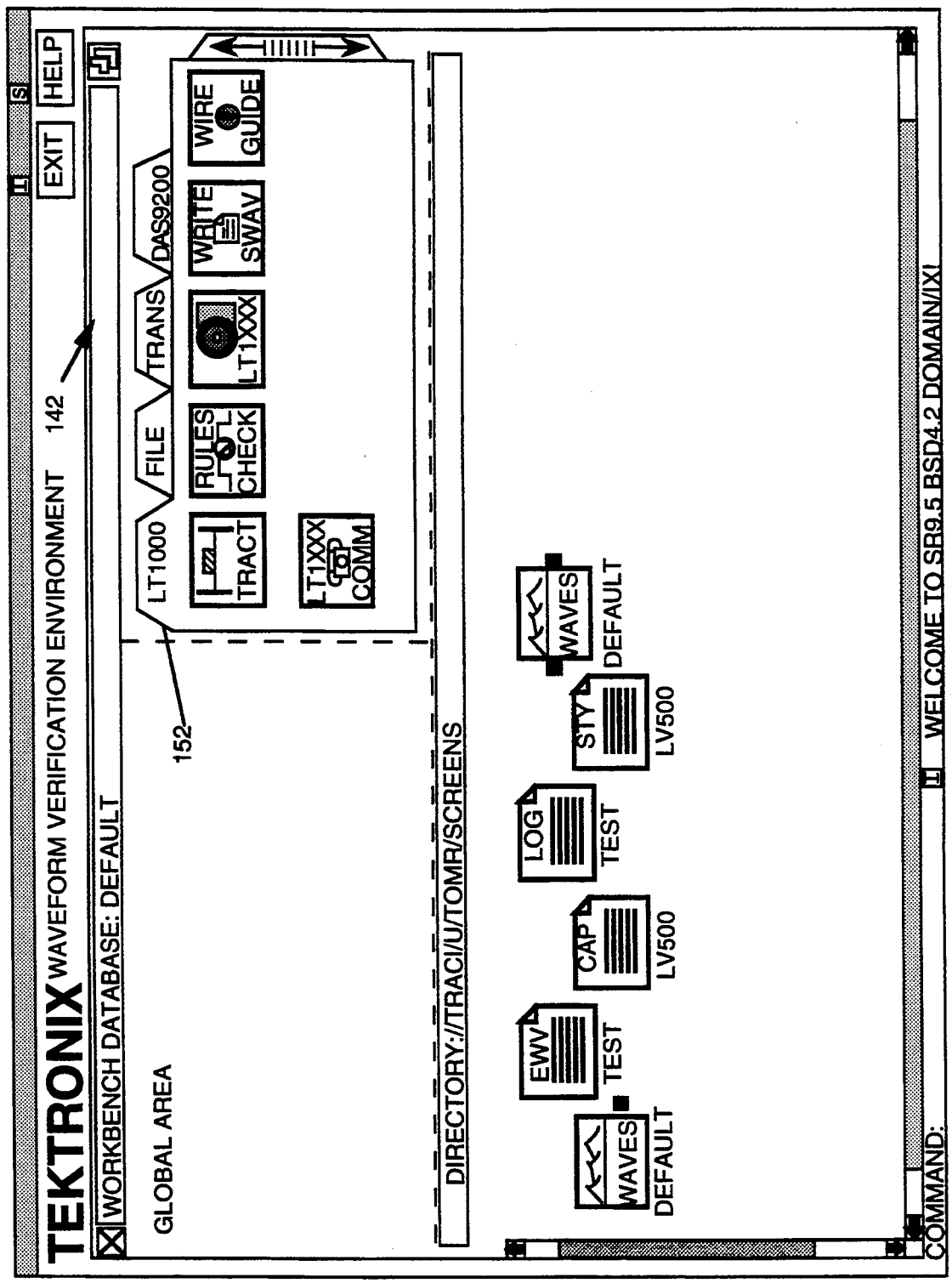

FIG. 4 shows editor card 146 having timing, state, frame and timeset icons. As will be seen, these icons represent the editors which are used for viewing and manipulating the data. Tools card 148, shown in FIG. 5, includes various icons for manipulating the data including map states, glitch filter, bidir (bidirectional) split, align edges, align cycle, scale timing, and cycle select. Tester cards 150 and 152 are shown in FIGS. 6 and 7. These include icons for RULES CHECK, (timeset) X-TRACT, LV500 or LT1XXX (resource allocator), WIRE GUIDE, WRITE MSA or SWAV (test program generator) and LV500 or LT1XXX COMM (communications link). Various of these icons are also identified by the functional blocks of FIG. 1 with which they are associated.

Figure 8:
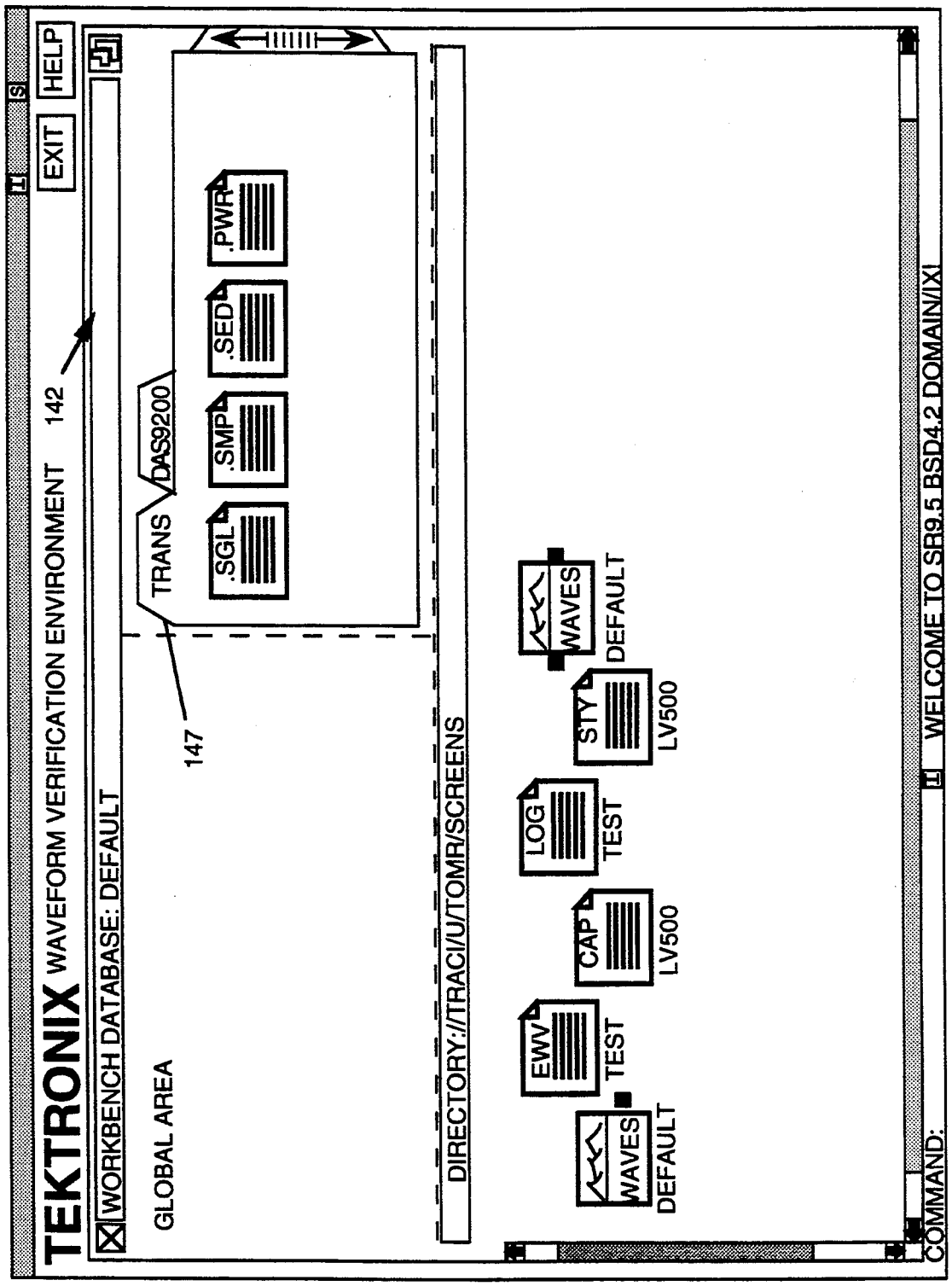
FIG. 8 illustrates icons representing data files for use with associated processors.
Figure 9:
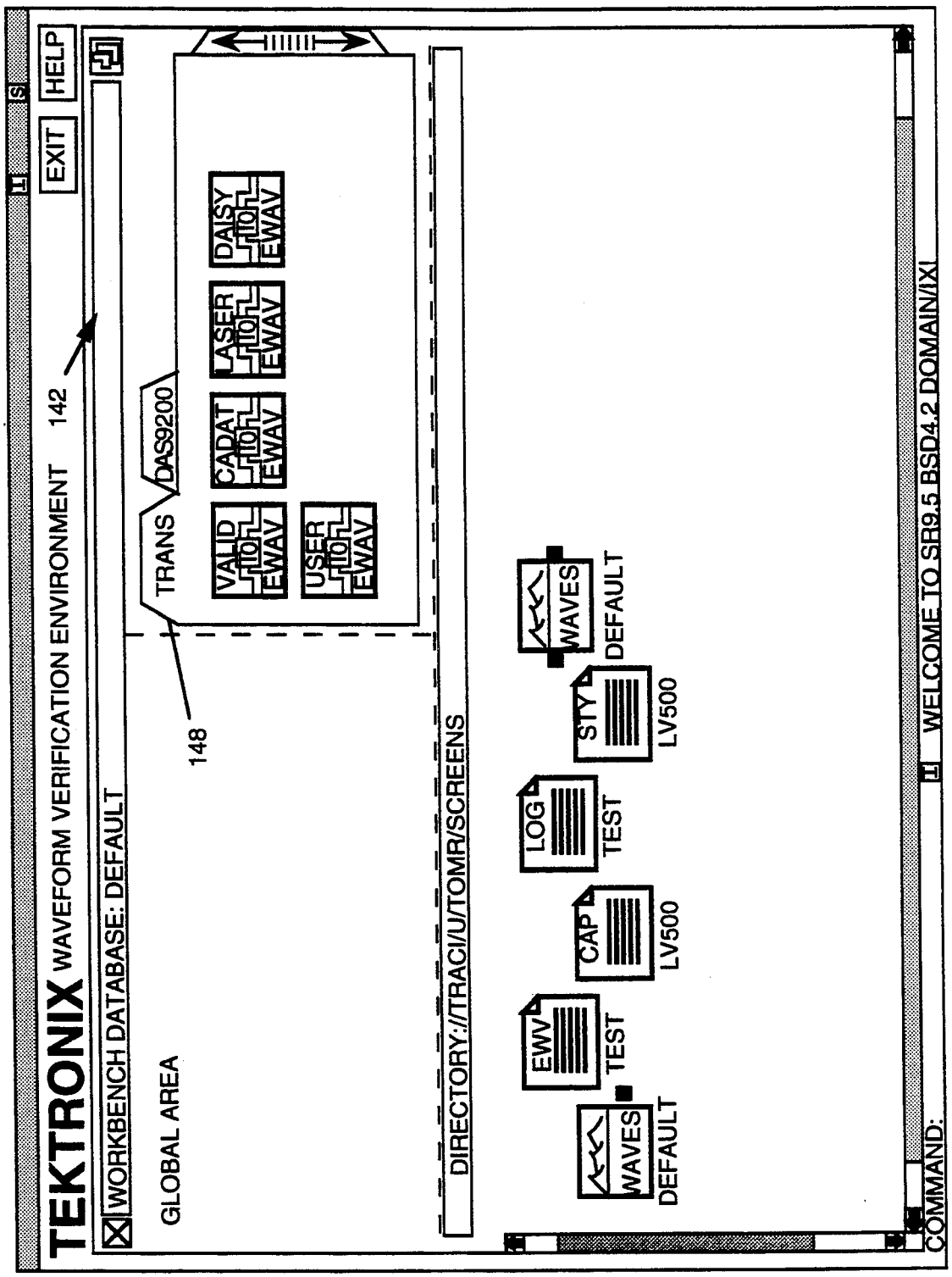
FIG. 9 illustrates translator icons representing processes for converting stimulus and response data output from simulators to the system format.
Figure 10:
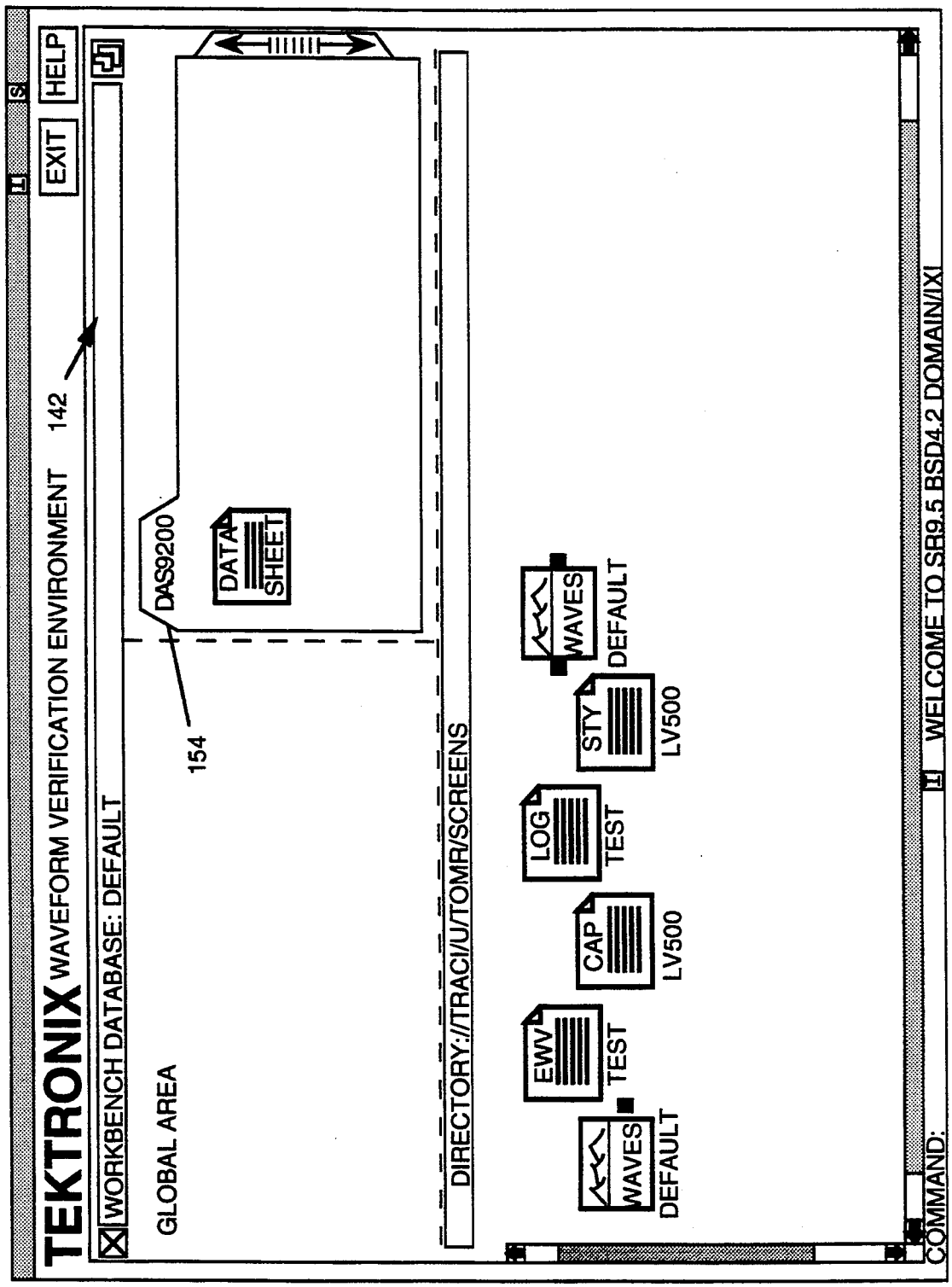
FIG. 10 illustrates a data sheet icon representing a file associated with yet another tester.

FIG. 8 shows file card 147 which includes a set of text files corresponding to various subroutines represented by icons appearing on other cards. SGL refers to the signal file, SMP refers to a state mapping file, SED refers to a cycle seeds file, and PWR refers to a wiring list file. In FIG. 9, translator card 148 shows icons for translating between the various commercially available simulators and the EWAV file format used by system 100. The DAS9200 tester card 154 includes simply a data sheet file at this time. This tester and the LT1000 are not going to be specifically referenced further in this description as the operation of the system is described with reference to the tester having model number LV500.

A three button mouse is the basic interface between the user and the graphical display of system 100. The middle and right buttons on the mouse enable one to open two different types of menus. The middle mouse button produces browser menus which are used to manipulate data. When the middle mouse button is pressed over an editor title bar, the system draws a menu specific to that editor. The editor middle button menu allows one to control various activities with selections that are made by releasing the middle button. When the middle button is pressed over an object, or an open space in an editor or the workbench, if there is a particular text field or icon associated with the menu, the object is highlighted while the menu is up. Also, the bottom item in an icon menu always has the same function as double clicking of the icon. The right mouse button produces help files. When it is pressed over an editor title bar region a menu is displayed which shows the organization of the on-line help. The help is specific to that editor.

A left mouse button pressed followed by an immediate release is a click and causes an object to switch or rotate through a sequence of states. A double-click activates an object on the workbench.

Figure 11:
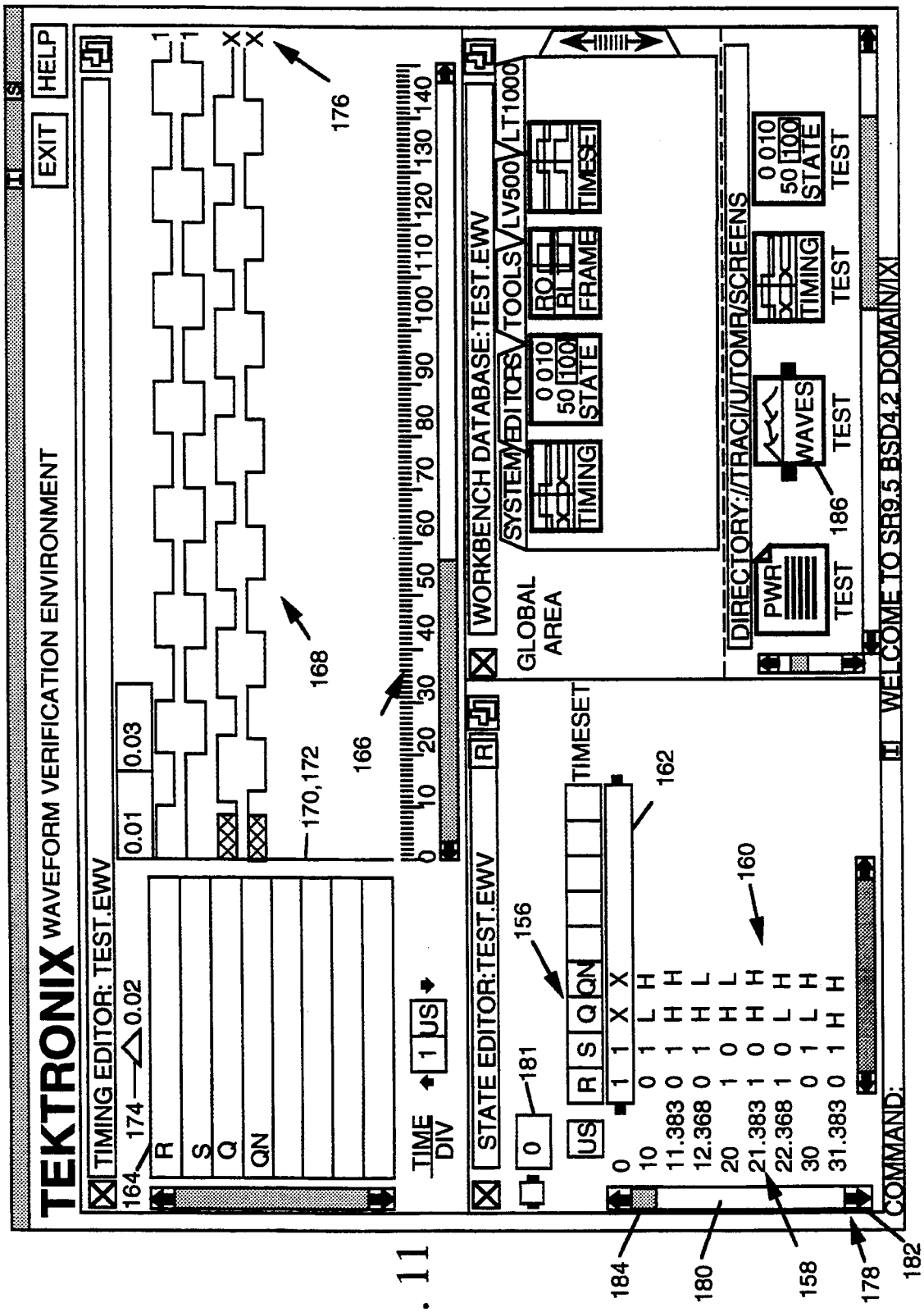
FIG. 11 illustrates the display of event data in state and timing editor windows.

FIG. 11 shows a representative display which includes a window of the workbench having a global area, unused in this display, a region showing the cards which can be sequenced through using the cursor, and a directory which is an active area for performing operations with the cards, editors and tools. Also shown are the displays for timing editor 120 and state editor 118 including an indication of the data base associated with each display. The timing editor and state editor show the same data in two different formats. In the state editor the signal names are shown across the top region 156. Down left column 158 are the time points (when the data shown is event data, indicating a time at which a signal makes a transition from one state to another) or cycle data (when the data shown is state data, indicating the beginning of a cycle period). Vector data is shown for each time entry in region 160. A horizontal bar cursor 162, different than the mouse cursor which also appears on the screen but is not shown, is used to identify a selected vector of data.

Similarly, the timing editor includes a column list of the signals at 164 and a horizontal axis 166 at the lower part of the window indicating the time scale. The data shown in the state editor is displayed as a continuous waveform in a waveform display region 168. Timing editor 120 includes an editor cursor 170 and a mark 172 similar to the cursor. The mark is used to identify a particular vertical line or point in time on the waveform diagram. The cursor is positioned relative to it with the difference in time between the locations of the two identified by a delta indicator 174. The timing editor cursor and state editor cursor are maintained at consistent data locations in the respective displays. Further, the logical data values existing at the cursor location are identified in a region 176 seen in the very right most edge of the waveform diagram.

A useful tool in the display manipulation provided by system 100 is the use of scroll bars, such as scroll bar 178 shown in the state editor window along the vertical left margin. Scroll bar 178 includes, in this instance, a vertical shaft 180 with arrows 181 and 182 on each end. Further, a scroll box 184 exists between the arrows and has a size which varies depending on the type of data the editor displays and the total amount of data existing. The ratio of the scroll box size to the scroll bar shaft size is the same as the ratio of the amount of data the editor displays to the total amount of data. In FIG. 11 it can be seen that scroll bar 178 on the left, vertical side of the state editor is relatively small. Thus, a very small proportion of the total data in the data base is shown. If the editor displays ten percent of the data, the scroll box fills approximately ten percent of the scroll bar shaft. If the editor displays all of the data, such as is shown by the horizontal scroll bar 178 in FIG. 11 for the state editor, the scroll box fills the scroll bar shaft. However, there always is space available in the editor to add new data.

By holding down the left mouse button with the cursor on one of the arrows causes the window to scroll by ten percent increments. Selecting either space around a scroll box, within the scroll bar shaft, causes the graphics page to scroll by a screen-width in the direction indicated by the position of the cursor. Dragging on the scroll box enables one to specify a new screen for the directory.

It is noted that the time frame indicated by the scroll box on the time scale in timing editor 120 is longer than the times shown in time column 158 of the state editor. Further, the scroll box is proportionally larger for the timing editor than it is for the state editor. This is because the window space is sufficiently long in the timing editor to display more data than is shown in the available window space of the state editor.

Further descriptions for manipulation of the graphics and data associated with system 100 using controller 102 will be left to the user's manual associated with the system. Specific mouse actions will thus not be described in detail, but rather the substantive actions will be described with the understanding that they are being accomplished by appropriate manipulation of the three-button mouse.

It can be seen in FIG. 11 that the WAVES test data base icon 186 in the directory section is highlighted. This shows that it is the data base being used to display the information in the timing and state editors. Further, the timing and state editor icons have been dragged into the directory area and activated. As a result, these icons are highlighted to show that the associated subroutines are being executed.

In order to establish the WAVES data base 186, the stimulus/response information may have been input manually by the operating engineer using the tools provided in system 100, or a simulator data base may have been read and converted into an EWAV file format which was then input into the WAVES data base. The example shown would be representative of a flip-flop integrated circuit with R and S being the two input signals and Q and QN being the two output signals. The output signals then in a tester would be the signals that are sensed while the tester would apply the R and S signals as stimulus to the flip-flop.

Figure 12:
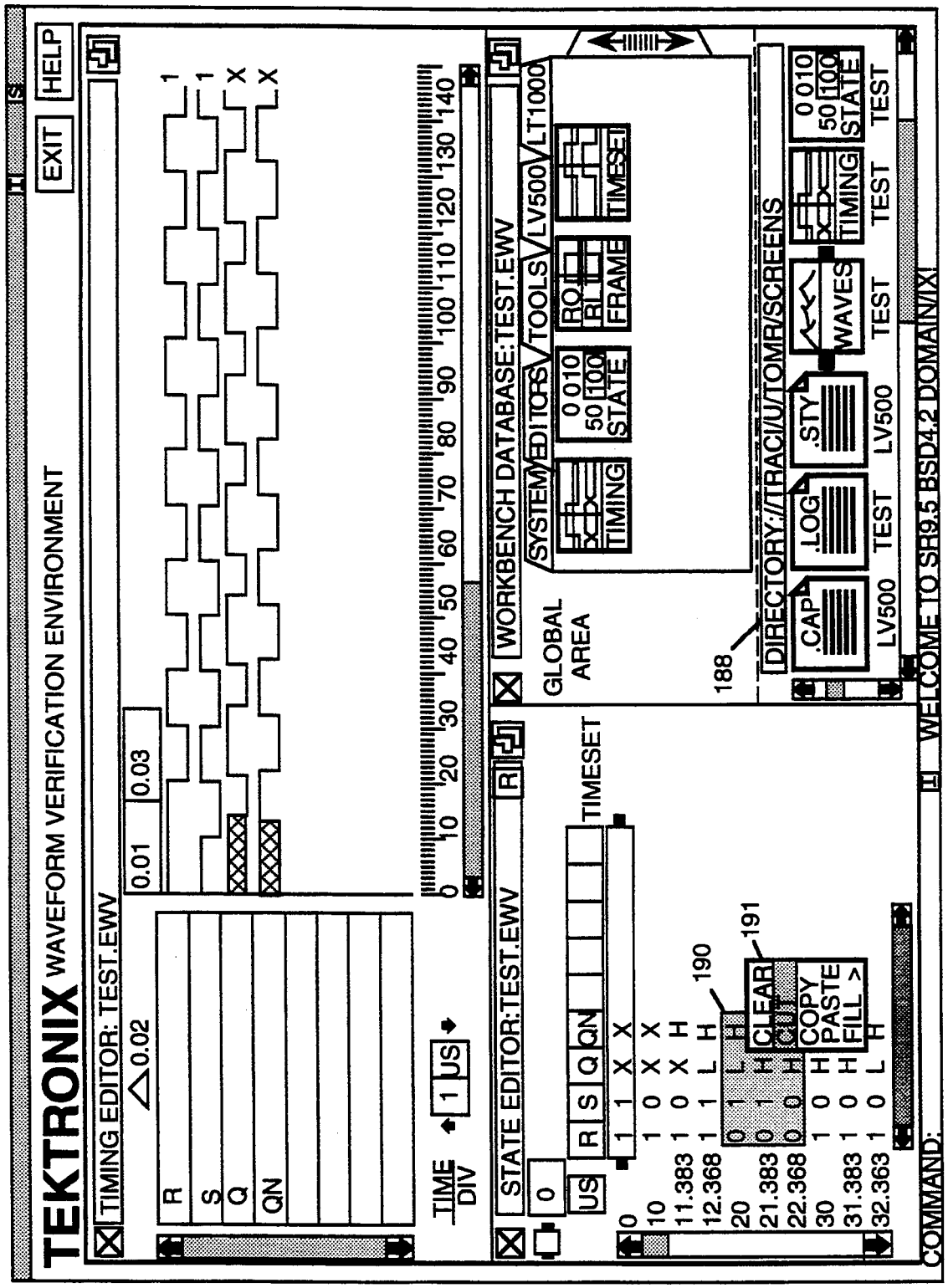
FIG. 12 illustrates selection of a region of the state editor display for editing.

FIGS. 12–15 illustrate steps involved in an exemplary editing of the event data shown in FIG. 11 using the state editor to make the change. FIG. 12 shows selection of a region 190 of the data which includes three test vectors. The present version of system 100 disclosed for which the source program provided herewith, provides for editing in an overwrite mode. That is, entries or removals are simply overwritten over the existing data fields but do not provide for deleting data and times such that the deletion is reflected in the subsequent data. However, as will be shown in the timeset editing function for these editors, the ripple mode feature may be added to the system using conventional programming techniques. The overwrite mode thus provides for replacing states in the selected region which is highlighted, as shown. A middle mouse button pressed while the mouse cursor is over a region selected produces a menu 191 with the options shown.

Figure 13:
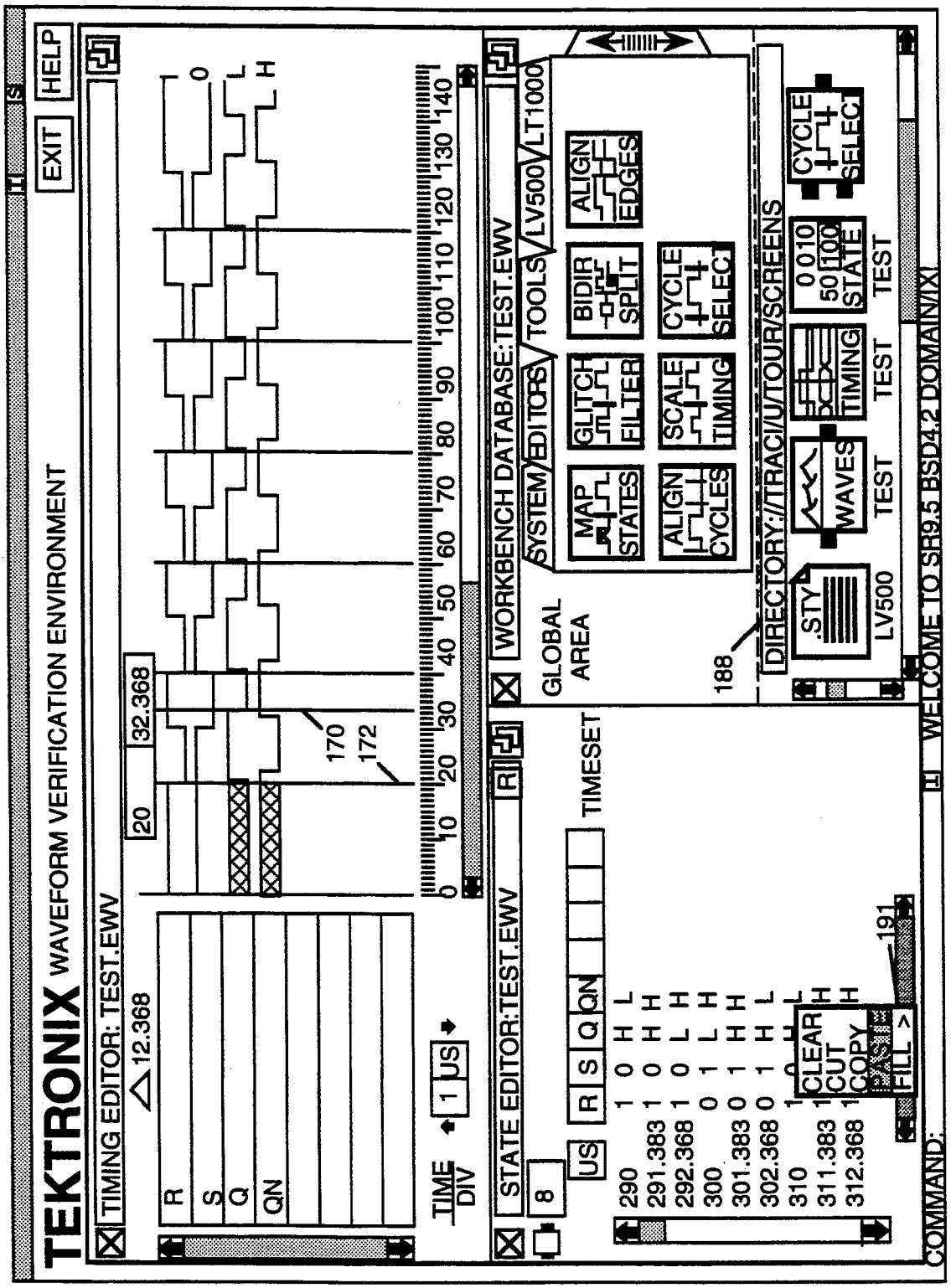
FIG. 13 illustrates selecting a location to insert data copied in FIG. 12.
Figure 14:
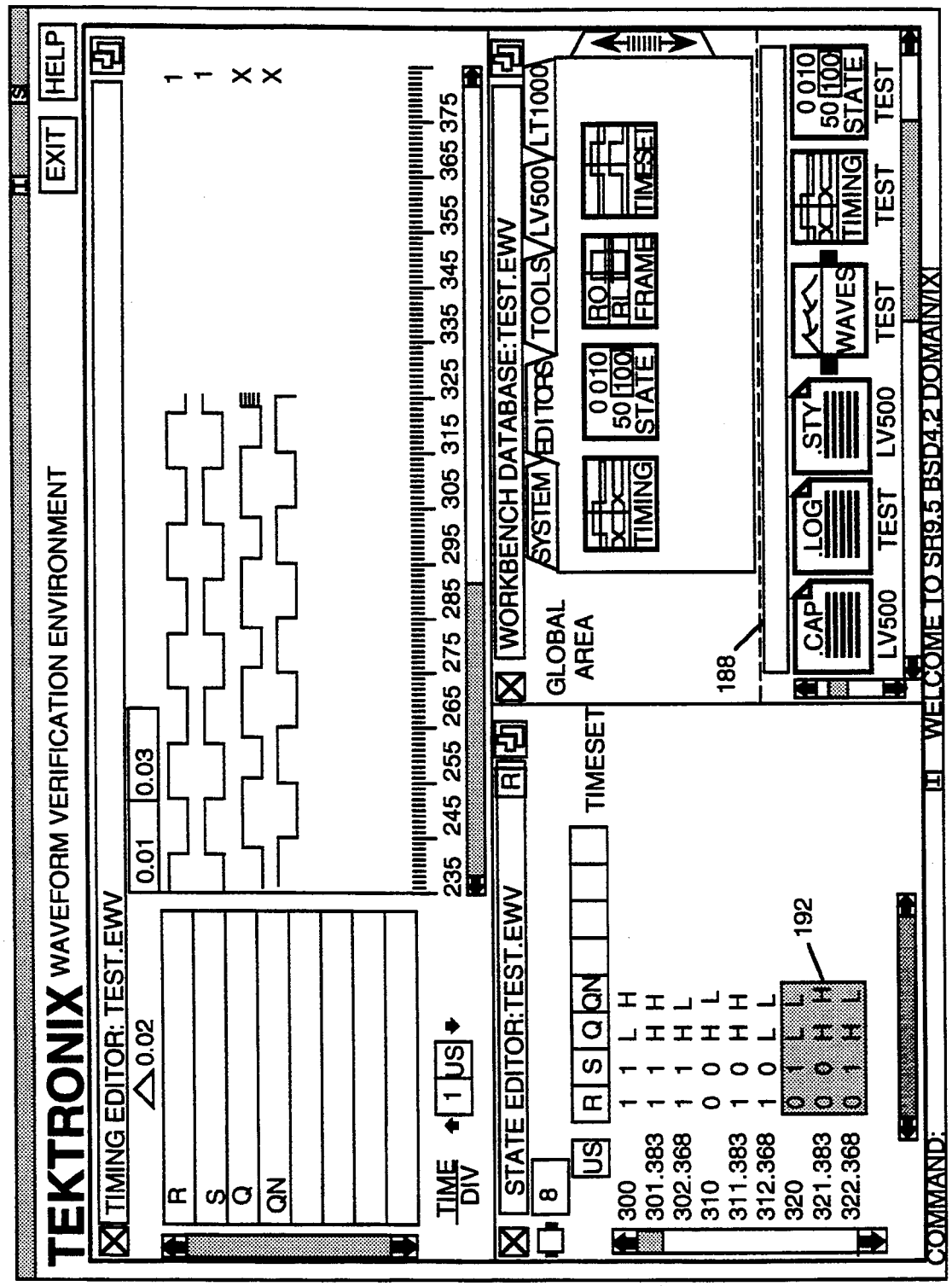
FIG. 14 illustrates the displayed results of the steps of FIGS. 11 and 12.

In this case a cut action is being selected so that the highlighted data is removed from the data base. When this is done, as shown in FIG. 13 in the timing editor window, the state values from the sequence above the cut region are copied into the selected sequence. In FIG. 13, the location at the end of the data is selected as a location to paste the "cut" data. The results of this cut and paste operation are highlighted at 192 in FIG. 14. The timing relationships between the vectors within the cut and pasted portion, and between the vectors in the cut and pasted portion and the preceding vector remain the same. It also could be provided that the sequences inserted into the end of the data section be assigned a predefined increment of time between sequences or vectors, rather than maintaining them with the same relative timing in which they originally existed.

Figure 15:
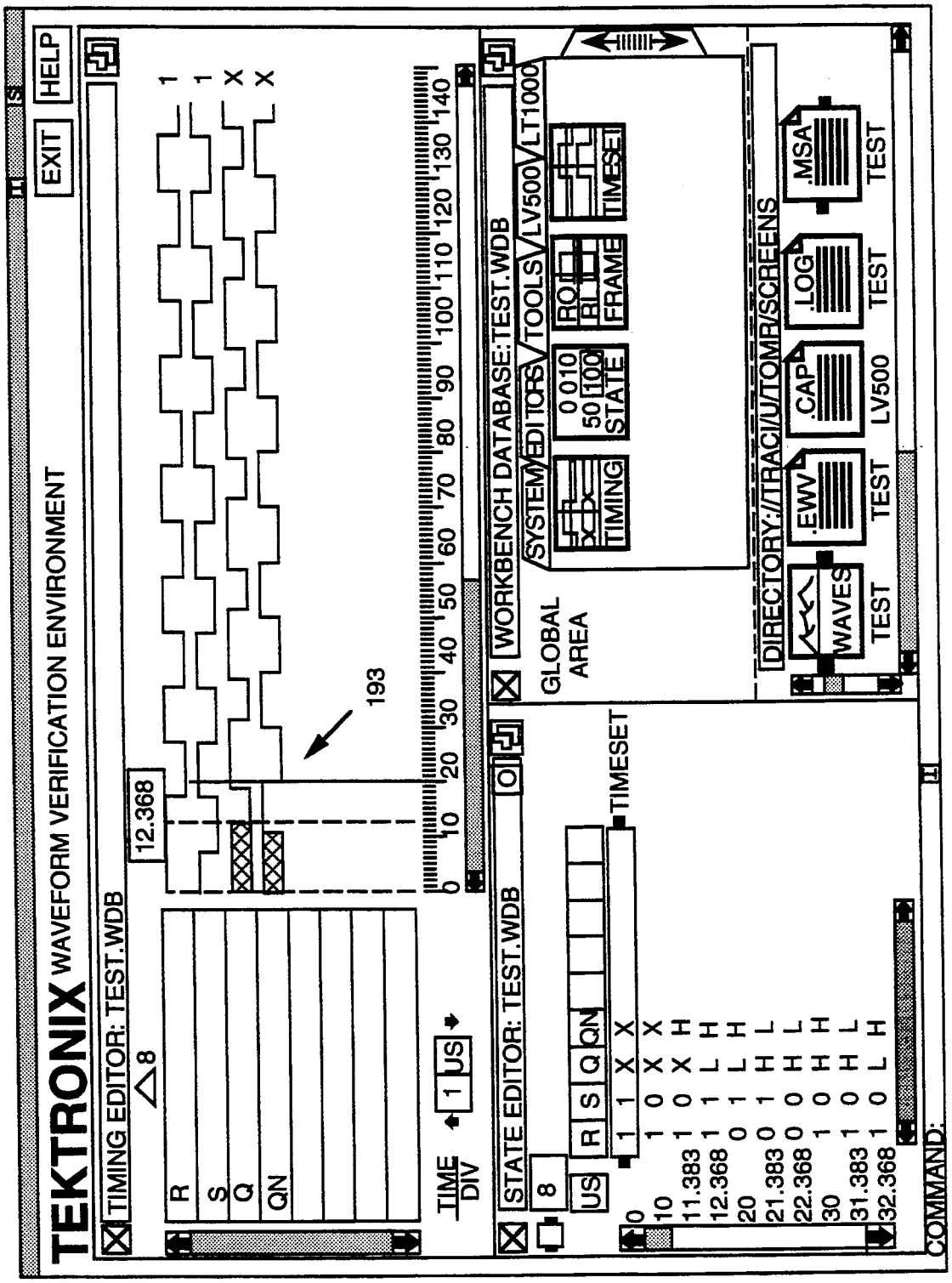
FIG. 15 illustrates placement of the edge dragging cursor at a waveform edge for editing.
Figure 16:
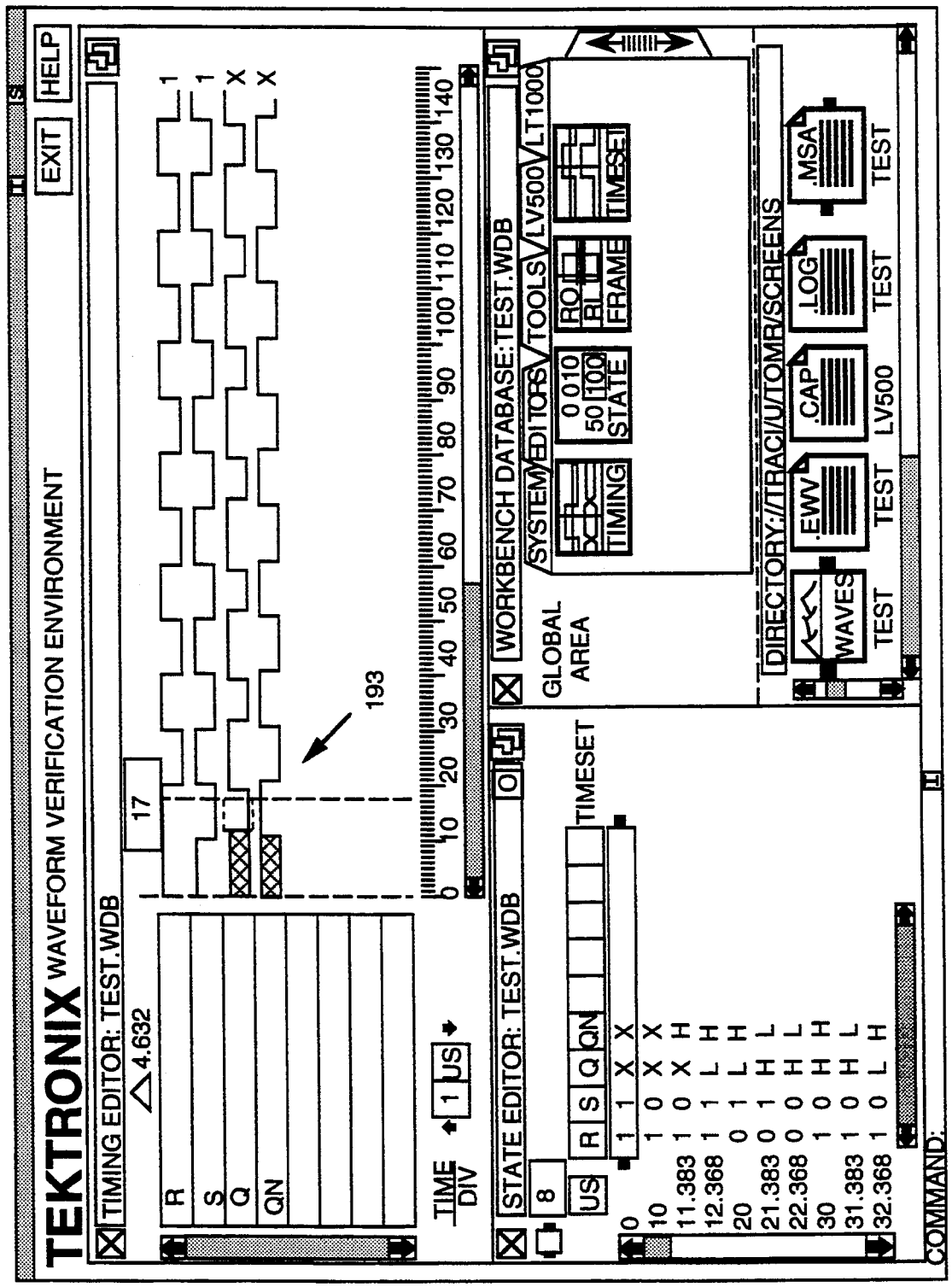
FIG. 16 illustrates display during dragging of a waveform edge with the cursor.
Figure 17:
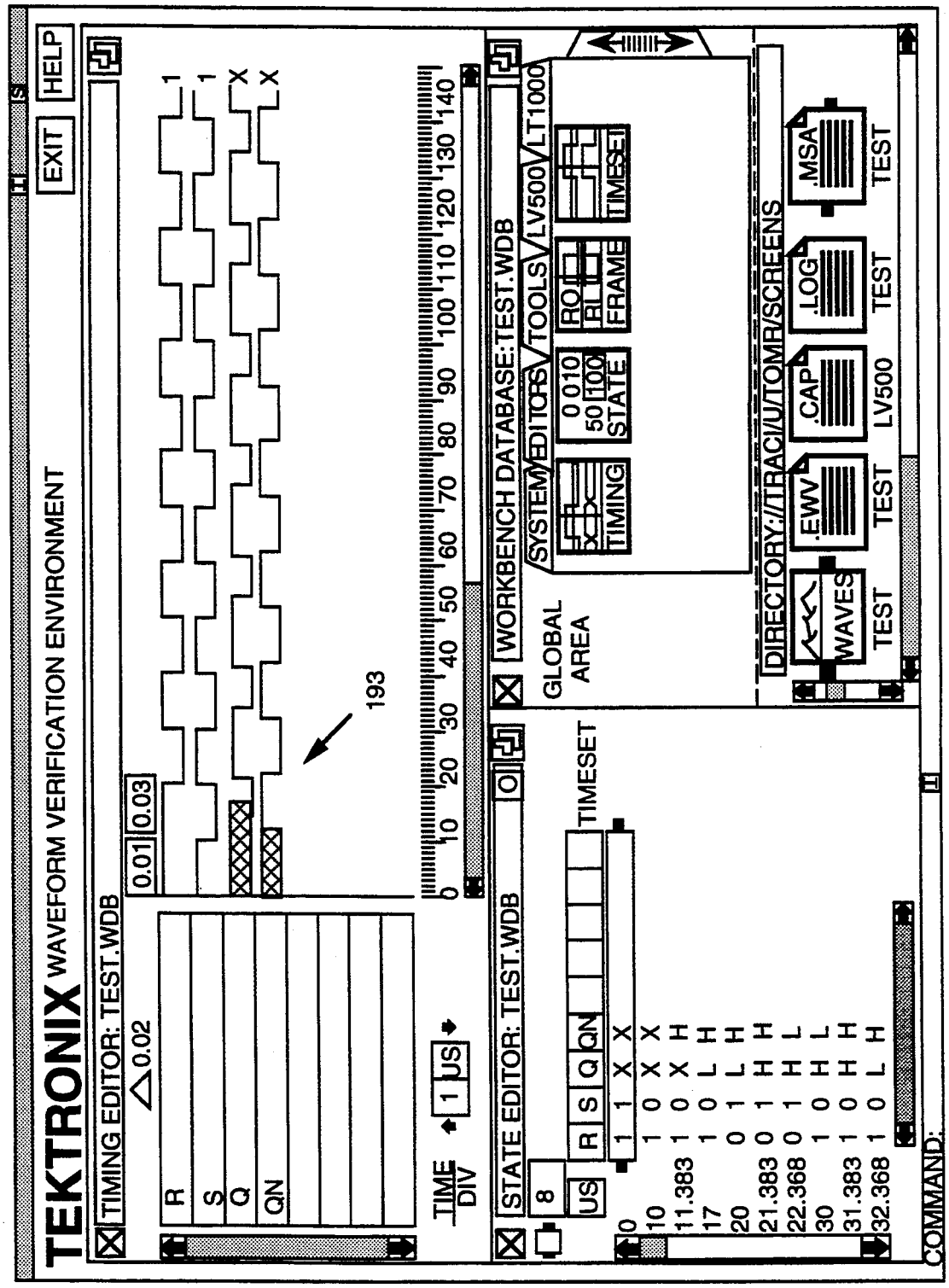
FIG. 17 illustrates the data displays resulting from the editing of FIGS. 15 and 16.

FIGS. 15 and 16 illustrate the capability provided by system 100 of directly editing the waveforms in the window of timing editor 120. In FIG. 15 the cursor is placed on the waveform edge of the first transition of the waveform of response Q in region 193. This waveform is then dragged slightly to the right, to the position shown in FIG. 16. The location of the cursor is identified in the label box at the top of the vertical cursor line in the timing editor window so that the user is constantly aware of the exact position of the cursor. The results of this waveform editing is shown in FIG. 17. It can be seen that the initial state of response Q is extended from its prior duration shown in FIG. 15. The corresponding event displayed by state editor 118 has been moved to a new time, 17 microseconds. Thus, it can be seen that changes made to the data in one editor is reflected directly in the other editor.

Figure 18:
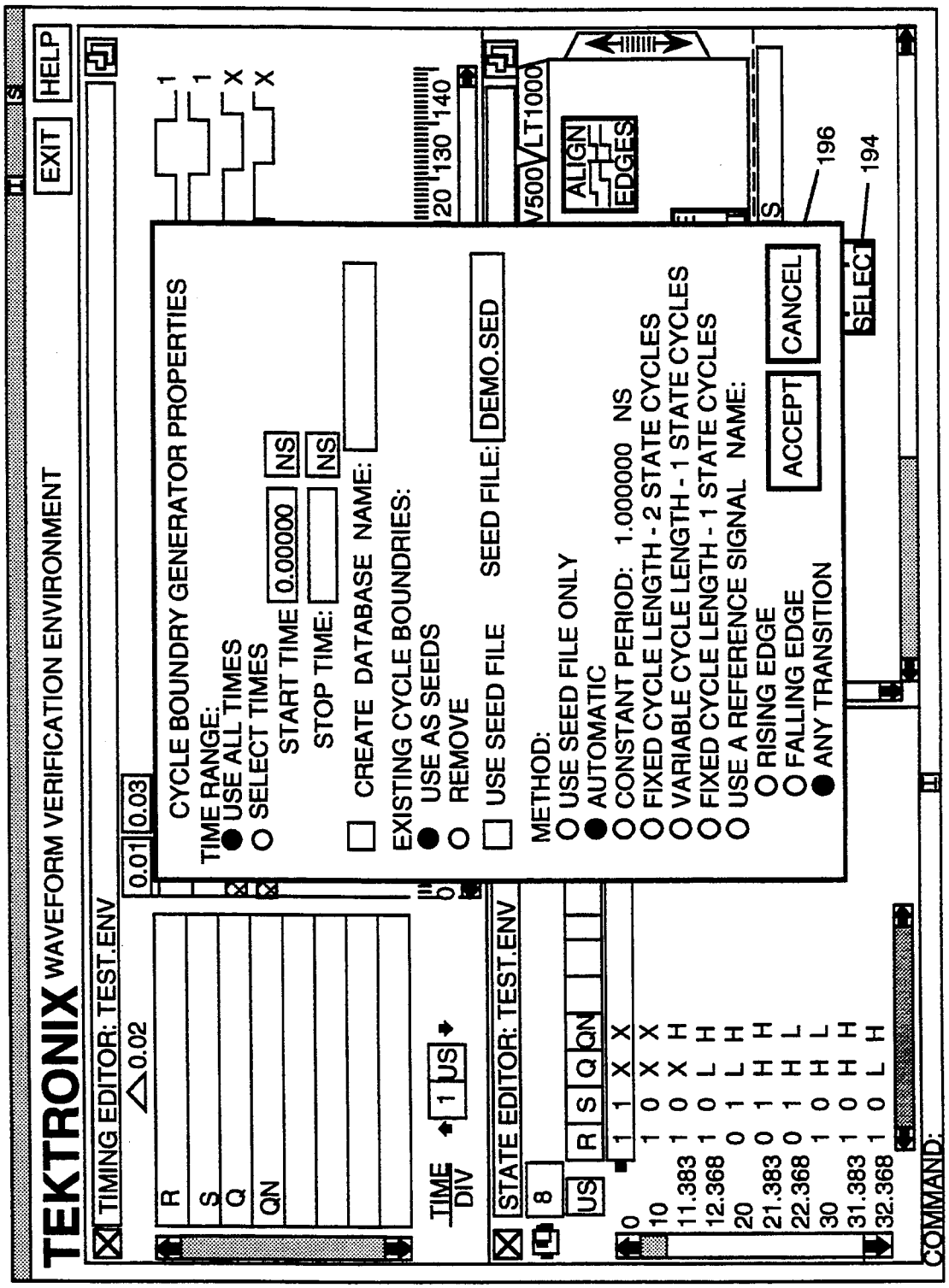
FIG. 18 illustrates a dialog box used to define parameters for positioning cycle boundaries on the data of FIG. 17.

Once an engineer is satisfied that the event data is as desired, then it must be converted into a state or cycle format which requires dividing the signal information into time periods which a tester can use to sequence through in generating the desired waveforms. The cycle or state periods are defined by cycle boundaries which may be added through the cursor bar middle mouse button menu. The cycle boundaries can be located at either the cursor or mark position time. Also, a cycle boundary generator, identified by cycle select icon 194, shown partially in FIG. 18 and more completely in FIG. 19, may be used to locate the boundaries. Icon 194 is hidden by the dialog box 196 entitled "cycle boundary generator properties". By using the information entered into this dialog box, the system analyzes the data and waveforms and selects cycle boundaries.

Figure 19:
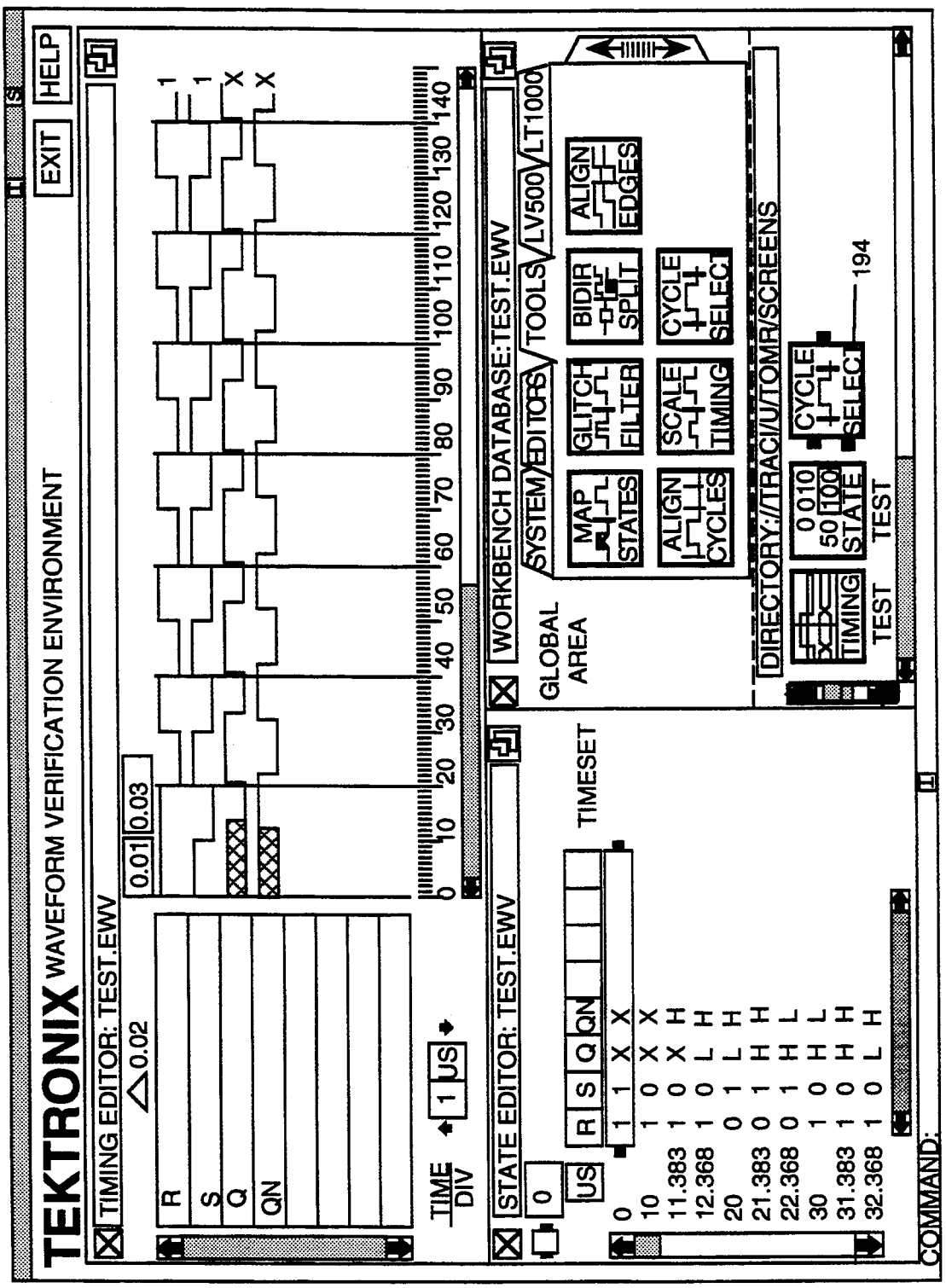
FIG. 19 illustrates the resulting cycle boundary selections from options selected in FIG. 18.

In this example, the cycle boundaries are automatically selected by an internal algorithm provided in system 100. The results of this automatic cycle selection are shown in FIG. 19. It can be seen that relatively regular time intervals were selected which include both single and double transition waveform frames. A frame is the waveform of a signal between two cycle boundaries. Thus, for each cycle period, four frames are used to describe the four signals.

Figure 20:
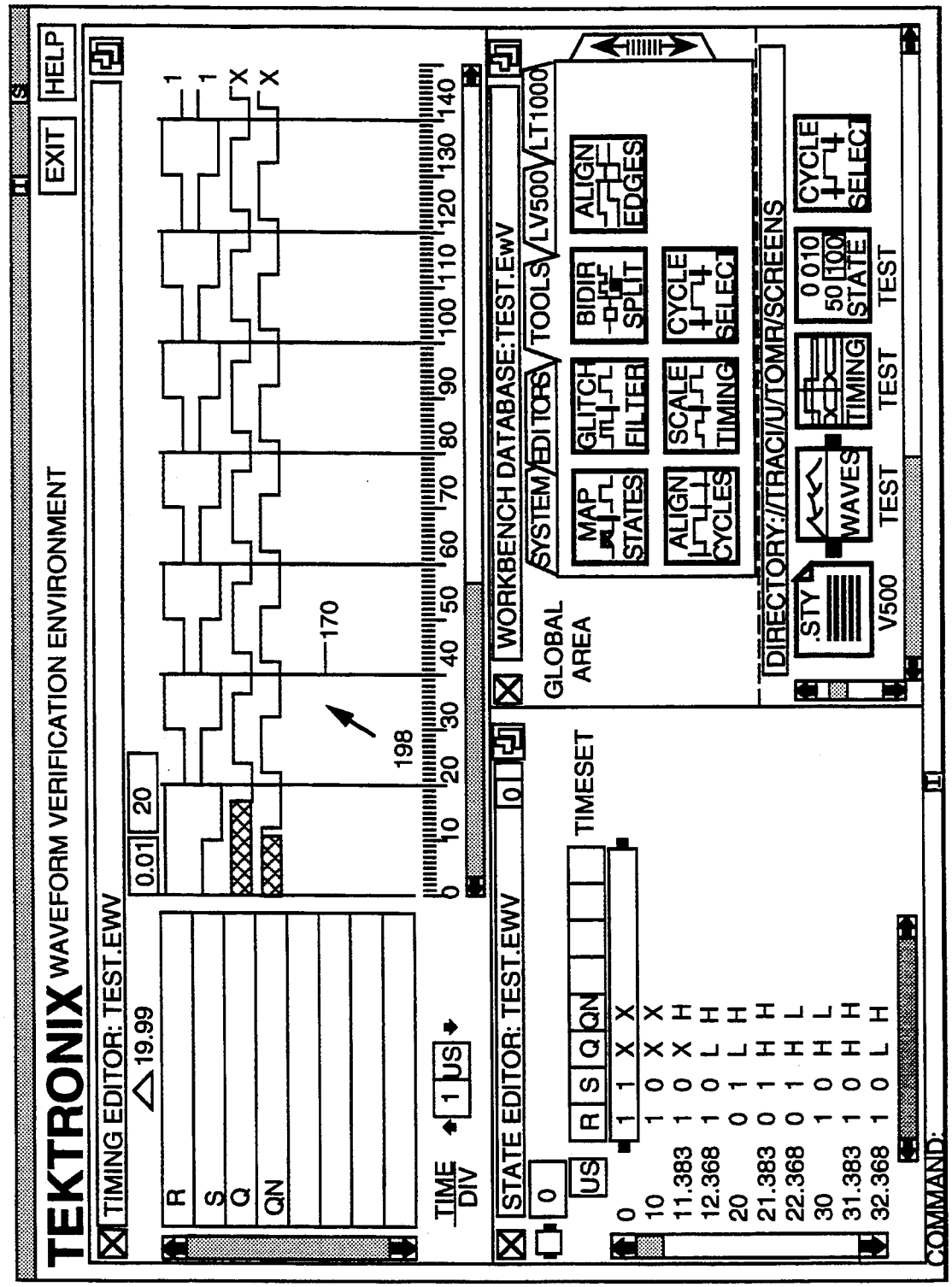
FIG. 20 illustrates movement of the timing editor cursor to a cycle boundary.
Figure 21:
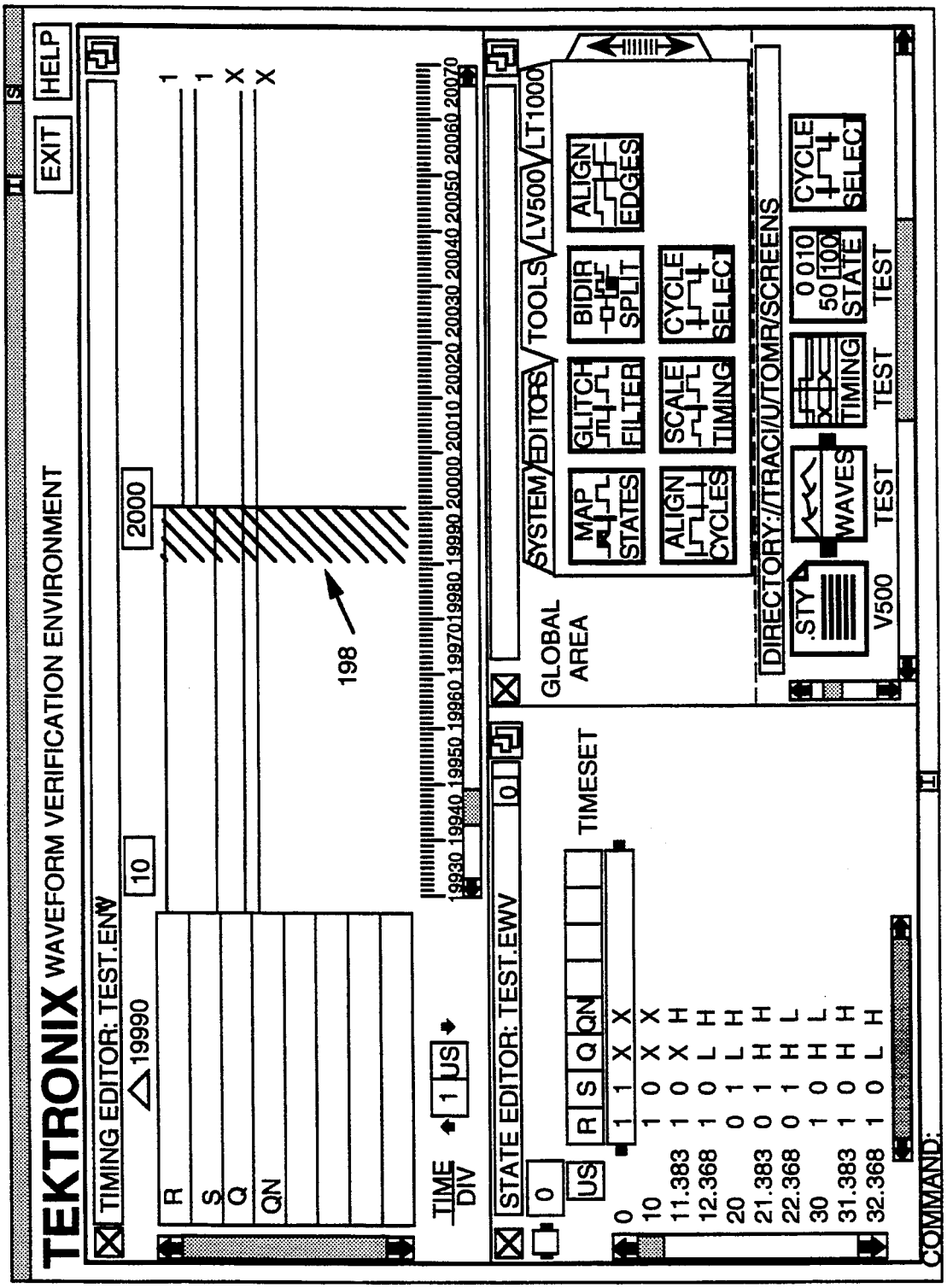
FIG. 21 illustrates enlargement of the timing editor display of FIG. 20.

In FIG. 20 cursor 170 has been moved over in line with the first cycle boundary at 20 microseconds time location. Along each of the cycle boundaries shown are little tick marks directed to the left from the cycle boundary. These tick marks indicate a dead zone 198 which is shown more clearly in FIG. 21. The enlarged scale was obtained in FIG. 21 by changing the timing scale shown in the boxes at the left end of the time scale of the timing editor display That is, the time per division was changed from one microsecond to one nanosecond. Thus, it is clear that the transitions occurring at 20 microseconds all occur after the completion of the dead zone. The dead zone represents an interval of inaction in a cycle required by a tester, as between an input stimulus and the resultant response, or a latency period at the end of a cycle. It will be noted that the data contained within the data file and represented on the windows of timing editor 120 and state editor 118 is still in event format.

Figure 22:
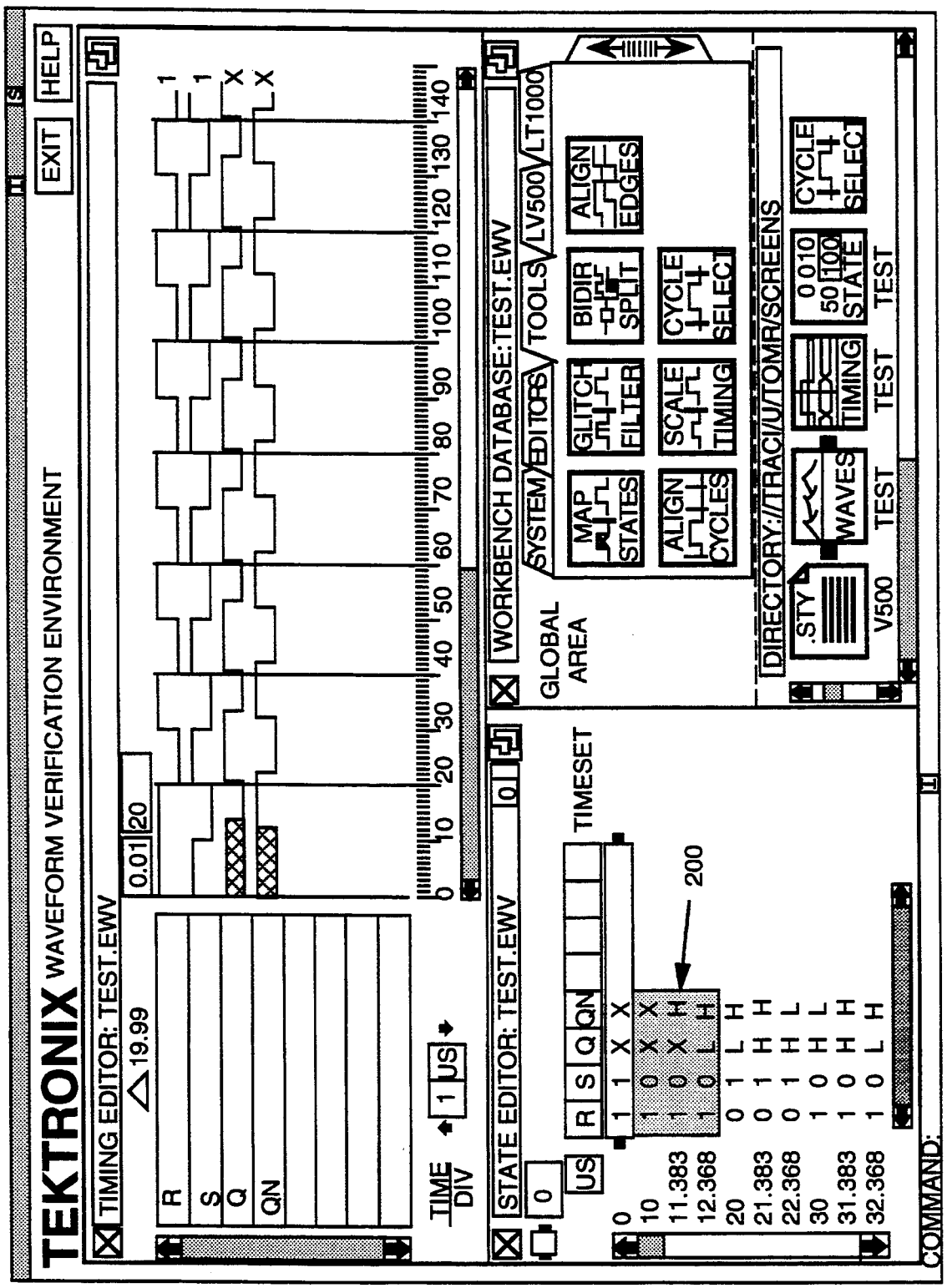
FIG. 22 illustrates highlighting of a region of the vector data displayed in the state editor window.
Figure 23:
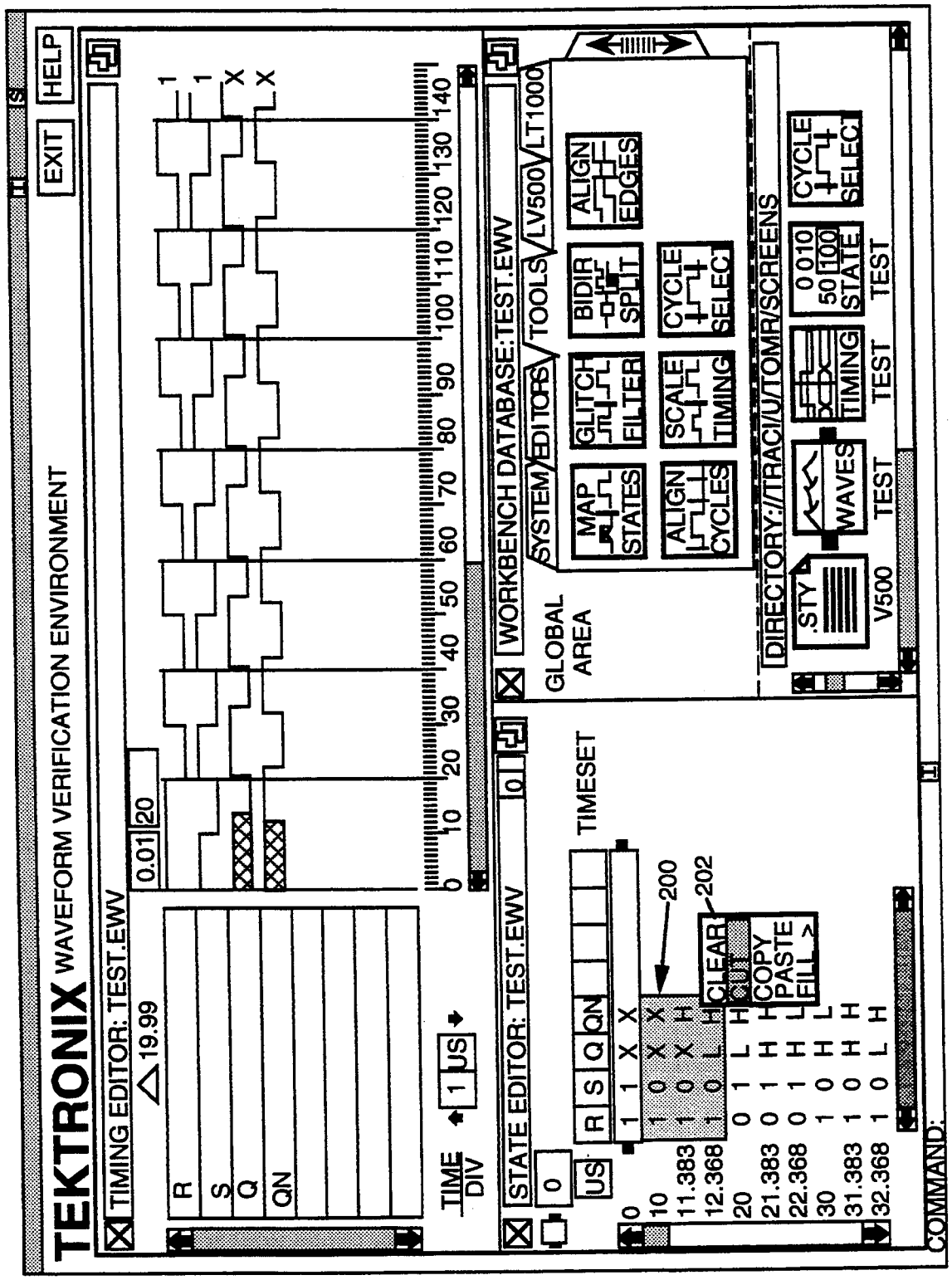
FIG. 23 is similar to FIG. 22 and illustrates the choice of editing options.
Figure 24:
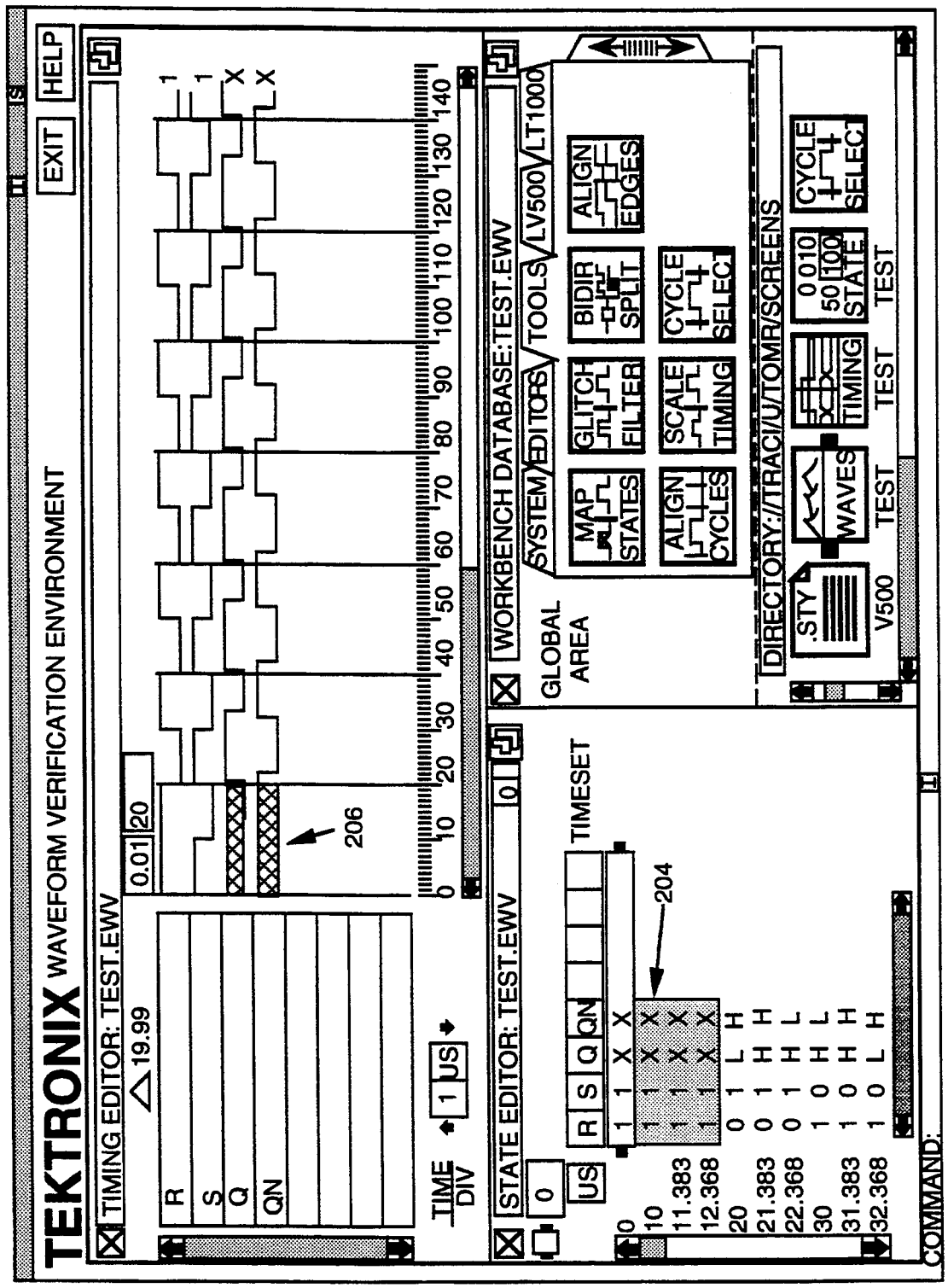
FIG. 24 illustrates the data display resulting from the editing of FIG. 23.

FIGS. 22-26 further represent a sample cut and paste editing operation of the three sequences highlighted at 200 in FIG. 22. As shown in FIG. 23, the highlighted region is selected on a menu 202 to be cut from the data sequence so that it no longer exists. As a result, the data highlighted in FIG. 22 is removed and the sequence existing in the preceding vector is carried through all of the occurrences. Thus, the data is not actually removed but the sequence locations are allowed to stay with the continuing sequence provided as an initial editing position. It is then a simple matter for the engineer to go through and select only those data elements which change from one sequence to the next. Thus, editing is facilitated. If information was pasted back in, then that pasted information would still be given the same event times as previously existed. The data in highlighted area 204 and in waveform area 206 in FIG. 24 can be seen to have been made consistent.

Figure 25:
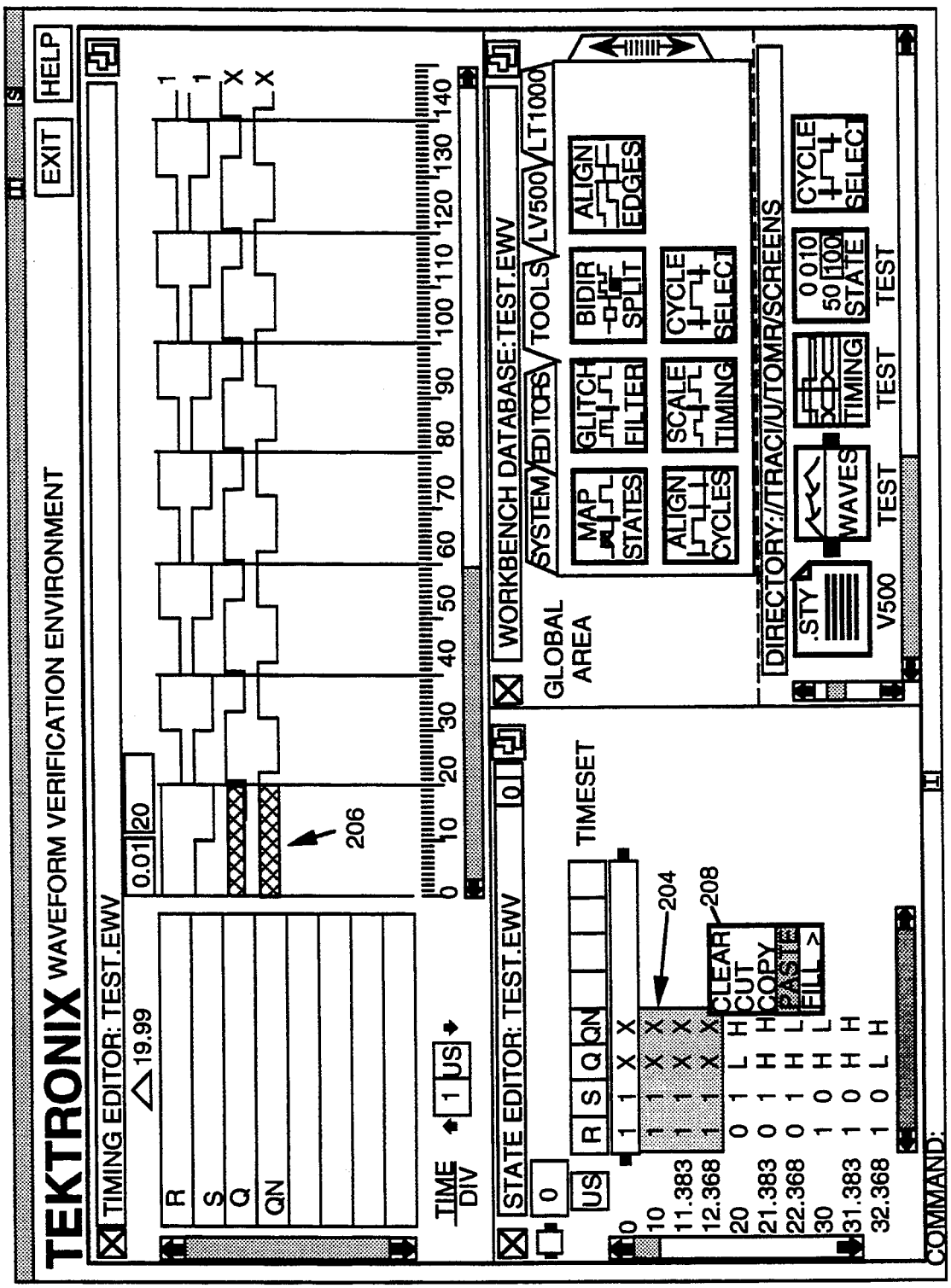
FIG. 25 is an illustration similar to FIG. 23 showing different choices of editing options.
Figure 26:
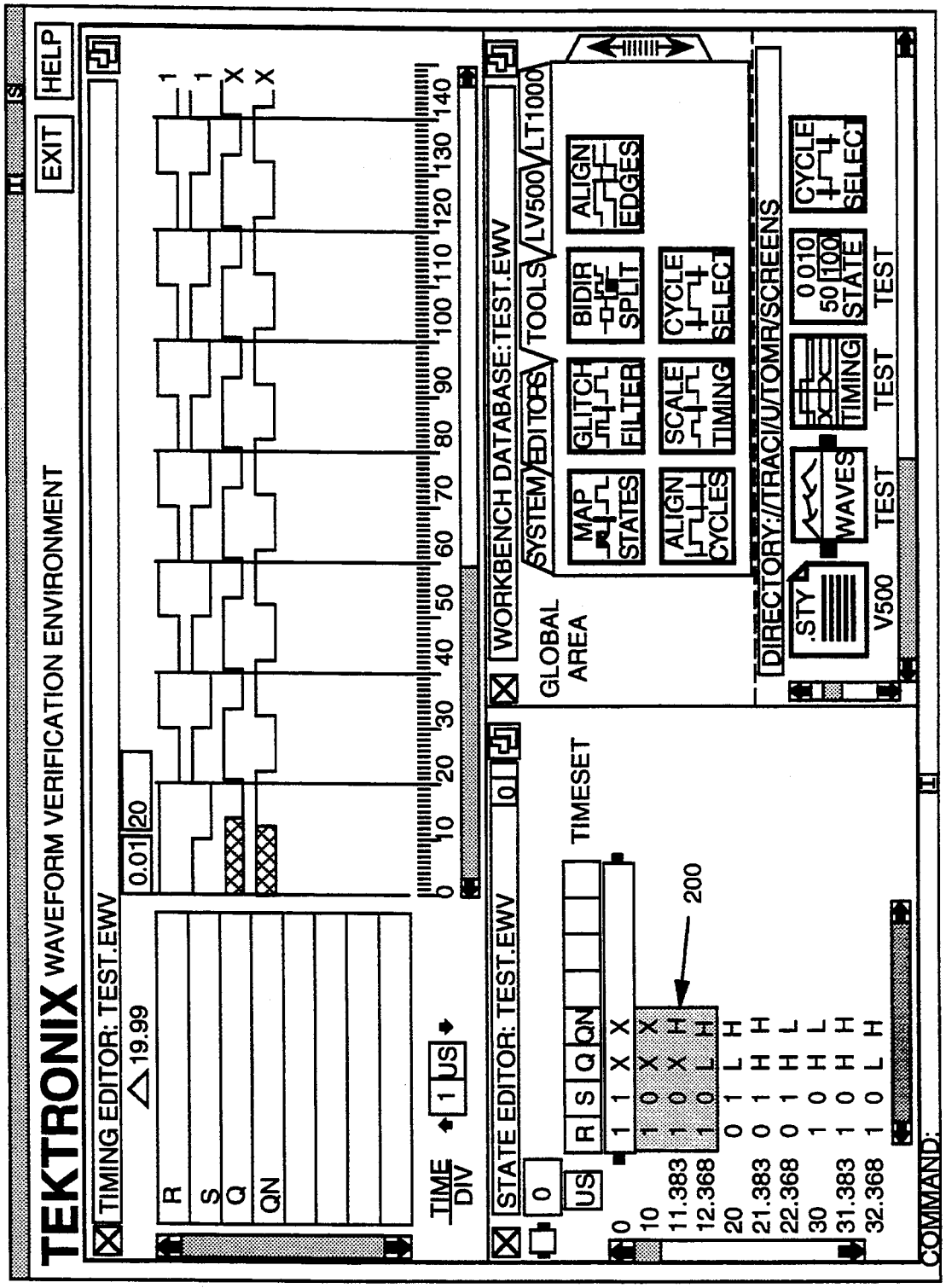
FIG. 26 illustrates the data display resulting from the editing of FIG. 25.

In FIG. 25 the paste option is selected on menu 208 with the result that the same data existing in FIG. 22 is again entered in FIG. 26, resulting in a reestablishing of the original data as shown by highlighted vector region 210 and corresponding waveform region 212. Thus, in this overwrite mode, there is no impact on the timing or states of the subsequent data in the data base.

Figure 27:
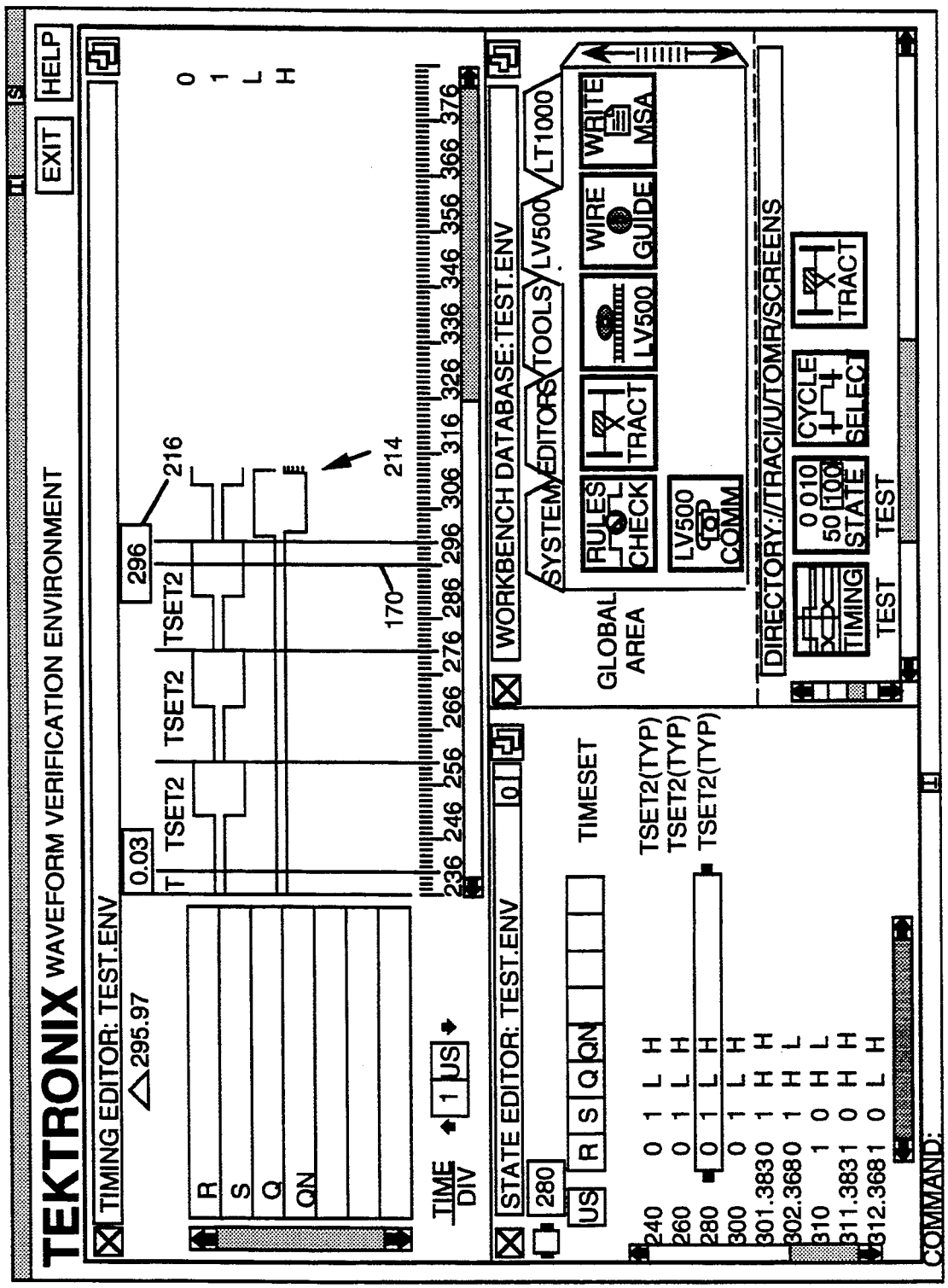
FIG. 27 illustrates a set of data in which timesets are assigned for part of the data.

Between FIGS. 26 and 27 the "X-TRACT" (timeset extractor) icon was retrieved from the LV500 card and executed using the cycle boundaries originally determined. The timesets were selected and determined as partially shown in FIG. 27. It can be seen that the end data in region 214 did not have a terminating cycle boundary so a timeset was not assigned to it. In FIG. 27 timing cursor 170 is in the Last assigned timeset identified as "TSET2".

Figure 28:
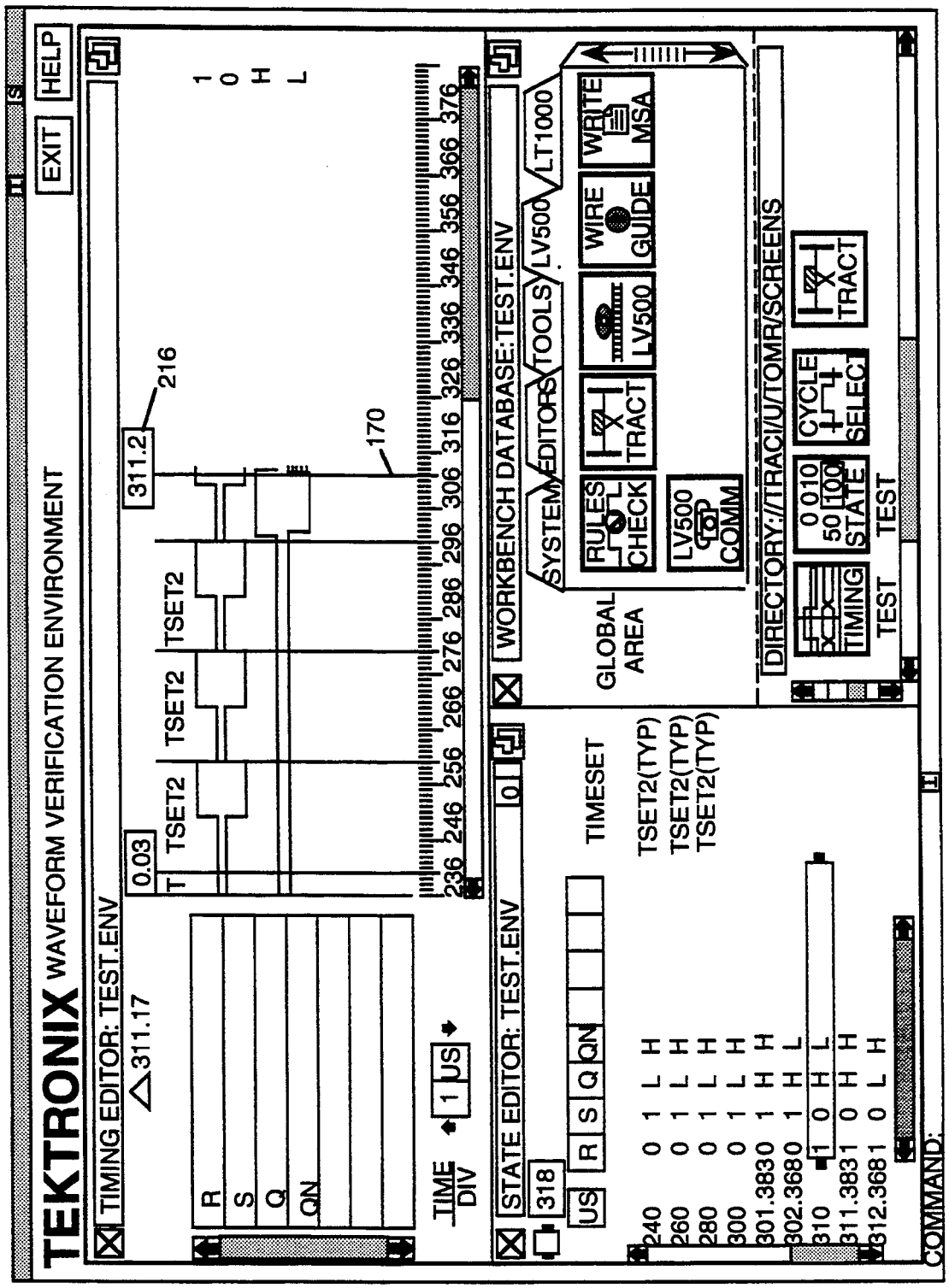
FIG. 28 illustrates movement of the timing editor cursor toward the end of the data.

In FIG. 28 cursor 170 is being moved to the end position of the event data. In the window of state editor 118 the end data is seen to be at 312.368 microseconds. The position of the cursor is indicated in box 216 at the top of the cursor. This cursor can either be manually moved until that specific point is reached, or the end value may simply be typed in the box by locating the work station cursor controlled by mouse 136 in box 216 and typing in the value. The cursor then automatically moves to the position of the value entered.

Figure 29:
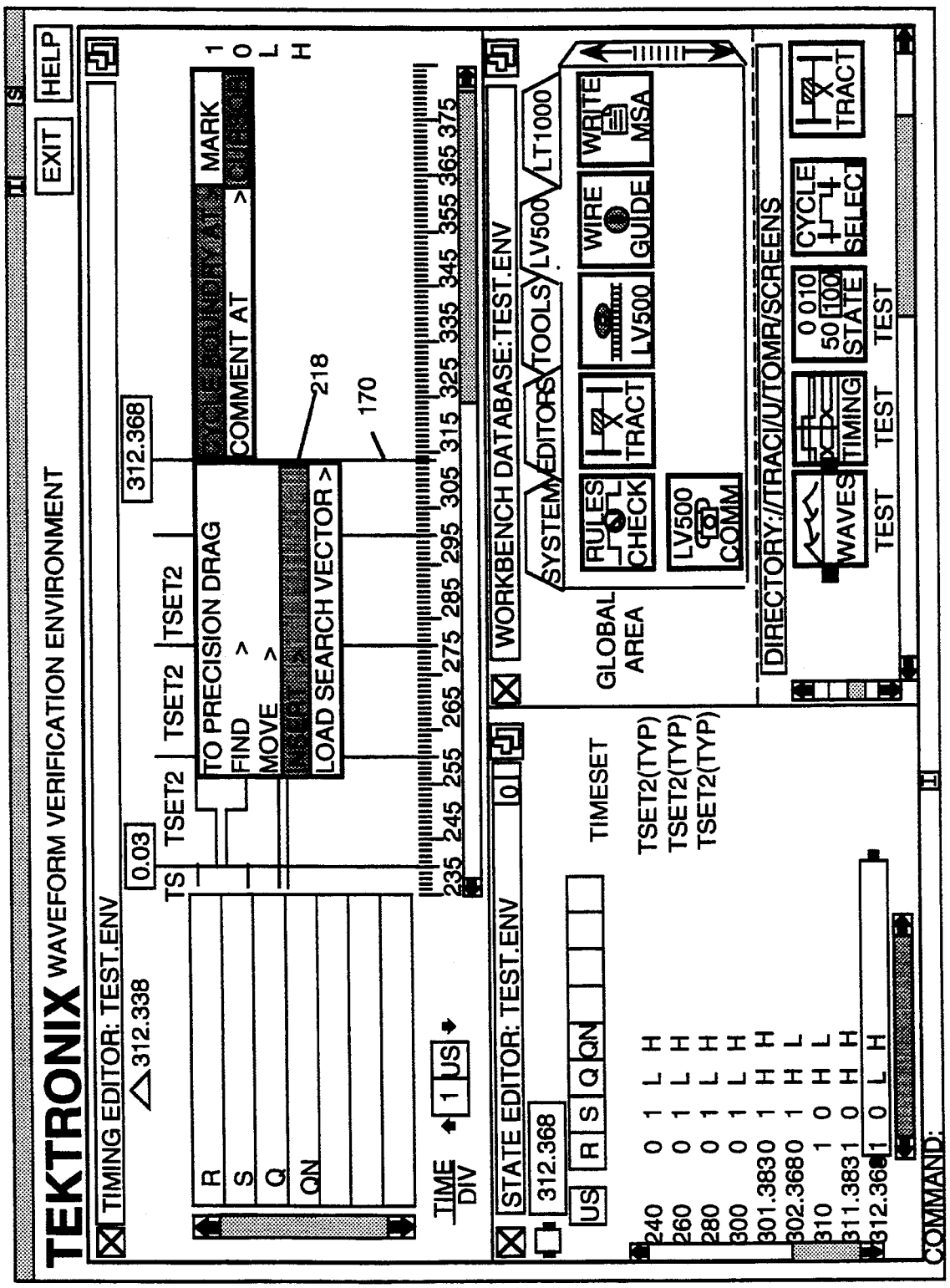
FIG. 29 shows a menu for selecting a choice for the cycle boundary location.
Figure 30:
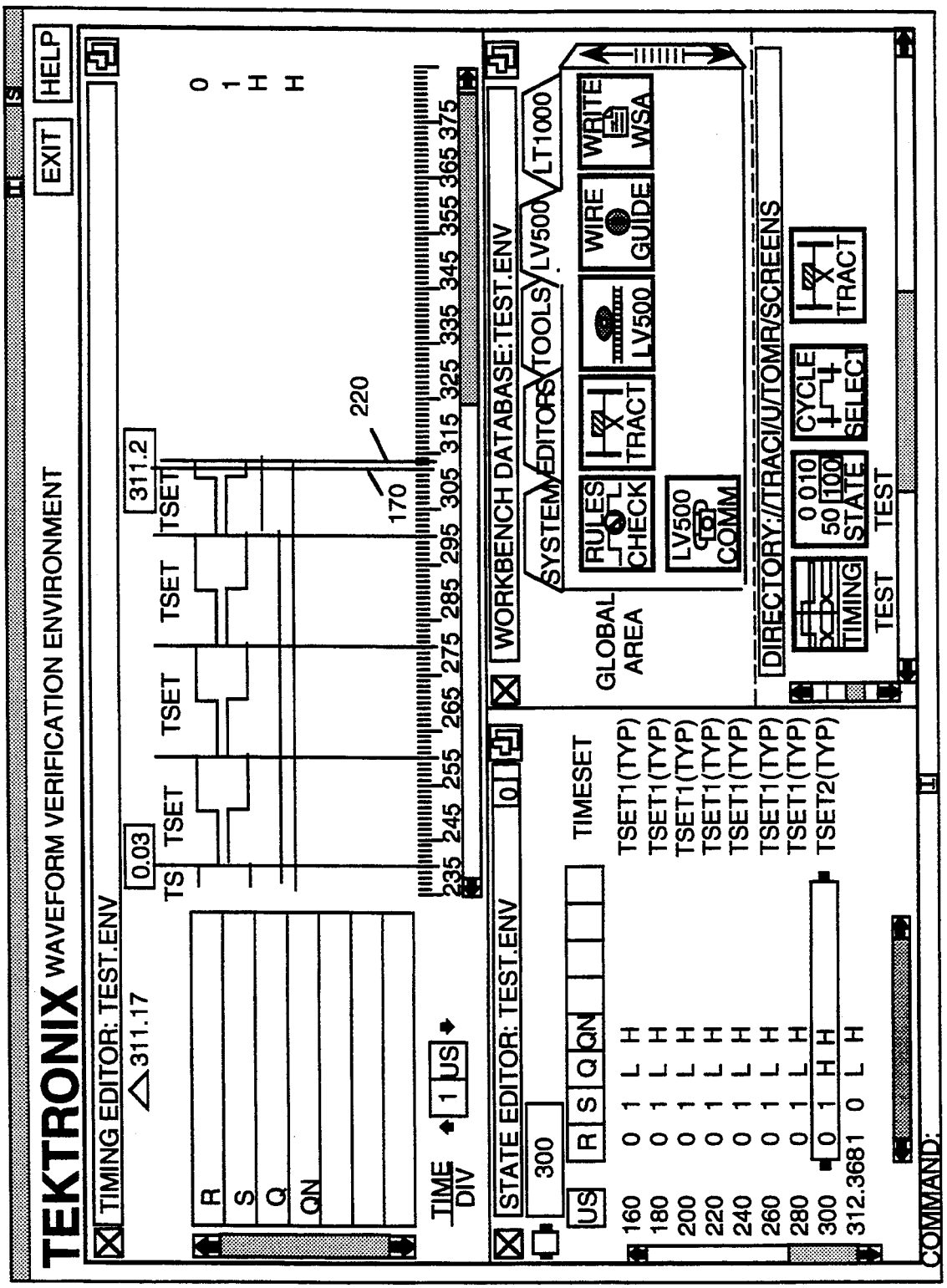
FIG. 30 shows the assignment of a cycle boundary and timeset to the end data.

FIG. 29 shows the compound menu 218 which provides the control for inserting a cycle boundary at the cursor location. Similarly, the timing editor mark 172 could also have been used. FIG. 30 shows the resultant location of the cycle boundary 220 after cursor 170 has been moved off of the cycle boundary. Further, FIG. 30 shows the assignment of a timeset value to the end cycle (by reexecuting the "X-TRACT" icon) which has now been defined by the end cycle boundary 220.

It will be noted in these figures that the waveform data for response signals Q and QN no longer show a varying waveform, but rather one that is constant in level. This is because the output signals are to be sensed at the positions shown by strobe marks 222. These marks are established through a dialog box. It is thus not important to the tester what the level of the sensed signal is during times other than when the strobe occurs, so this information has simply been deleted for clarification of presentation of the tester information.

Figure 31:
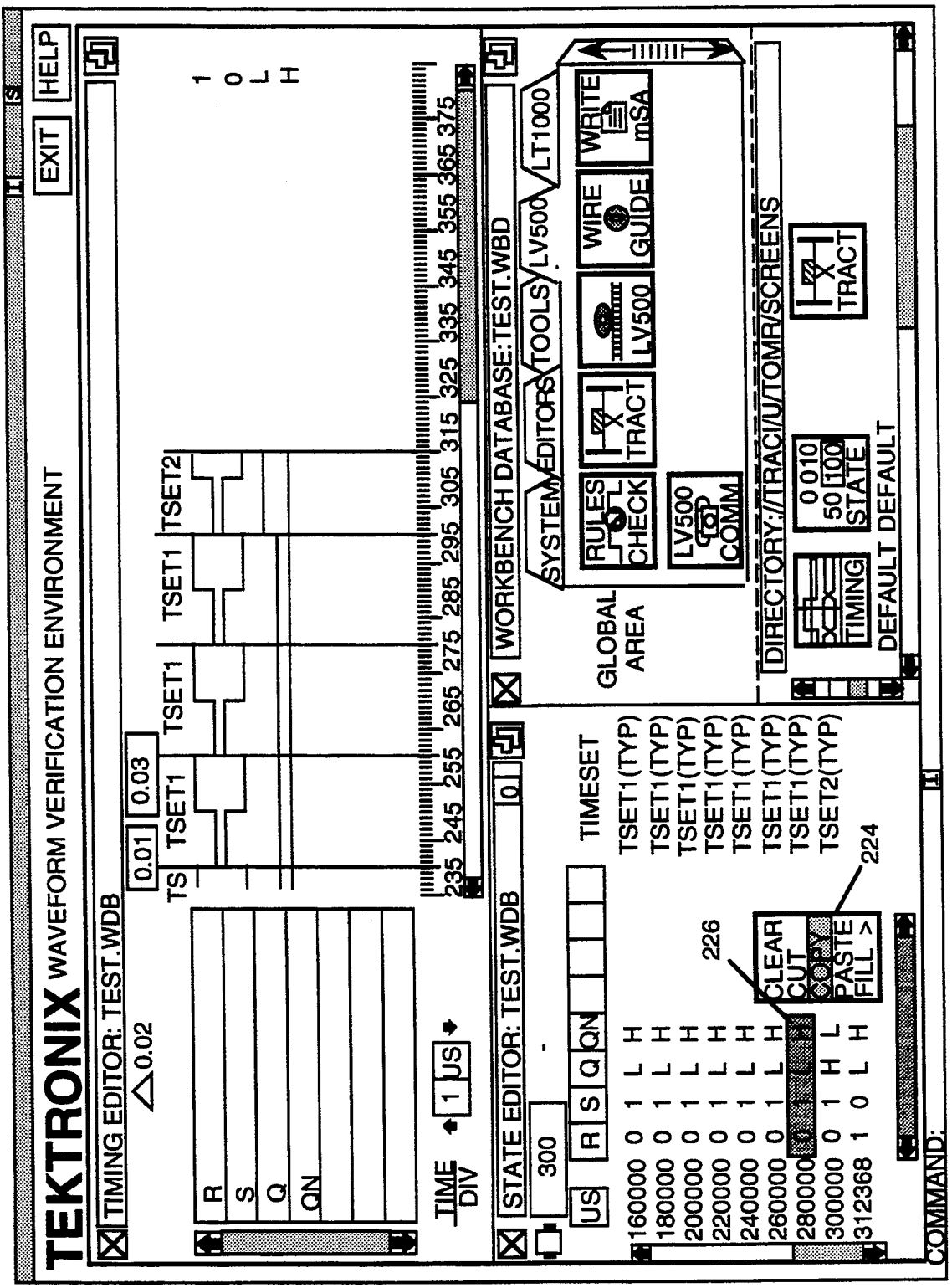
FIG. 31 illustrates the selection of the timeset for copying.
Figure 32:
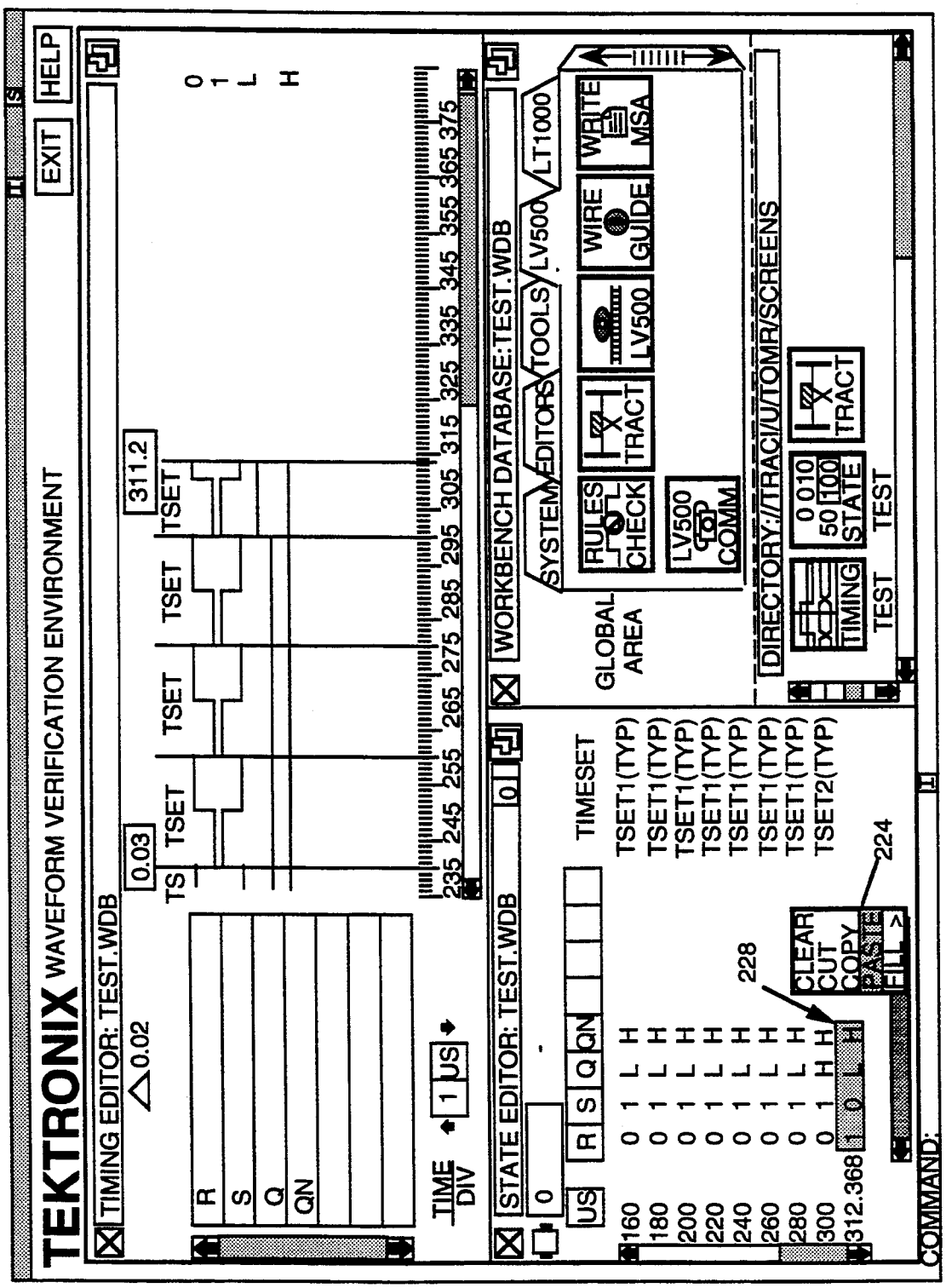
FIG. 32 shows a highlighted timeset with an editing option selected.
Figure 33:
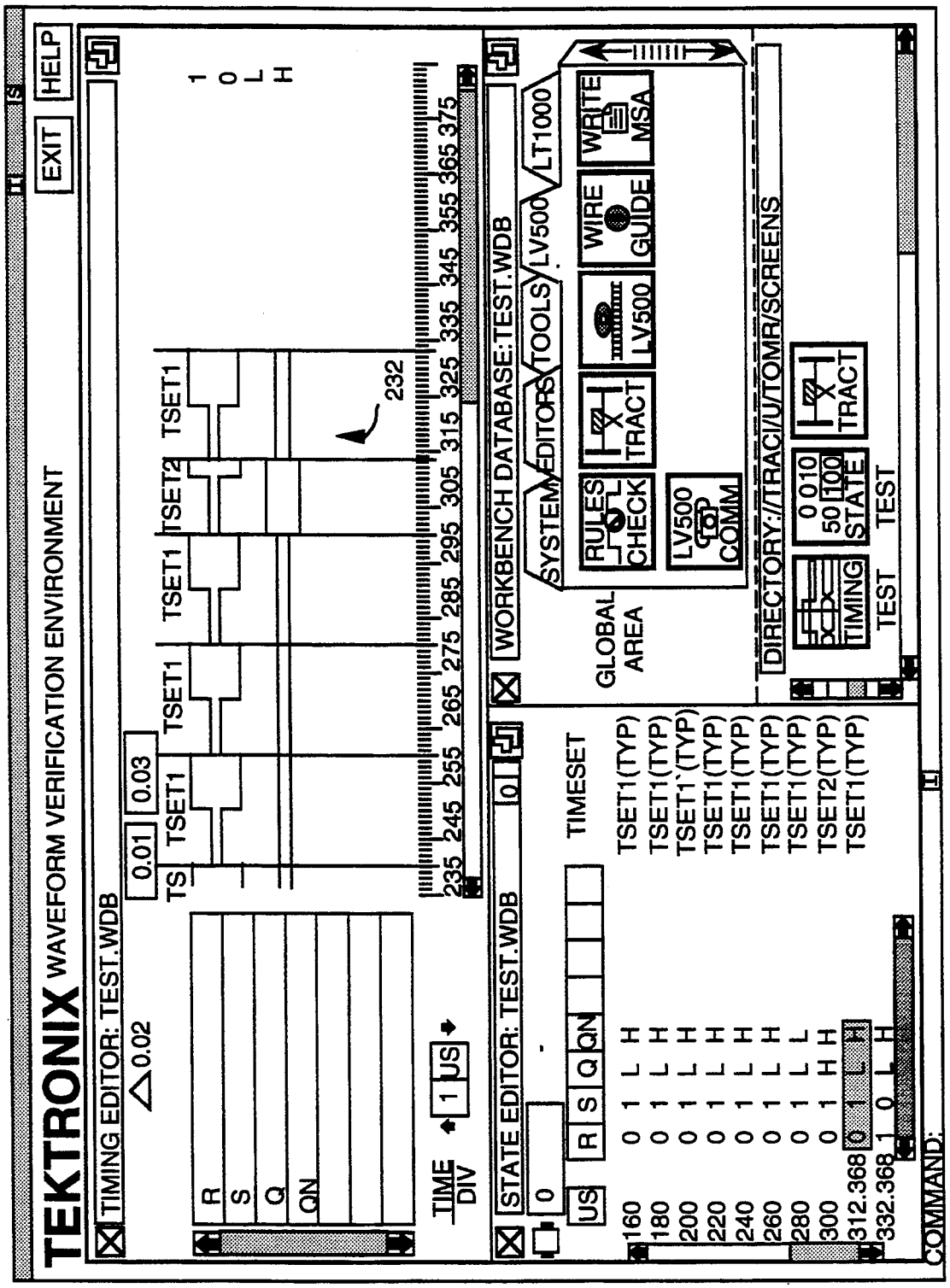
FIG. 33 shows the addition of a new timeset resulting from the editing steps of FIGS. 31 and 32.

In FIGS. 31-33 the editing of timeset information is shown. In particular, FIG. 31 shows a menu 224 with the copy option selected. Further, a selected timeset is shown highlighted at 226. This is the timeset or template which will be copied.

In FIG. 32 it can be seen that the bottom data position is highlighted at 228 and the "paste" option selected on menu 224. The results of the editing are illustrated in FIG. 33, with the inserted timeset shown highlighted at 230 and the new timeset signal illustrated at 232 in the timing editor.

Figure 34:
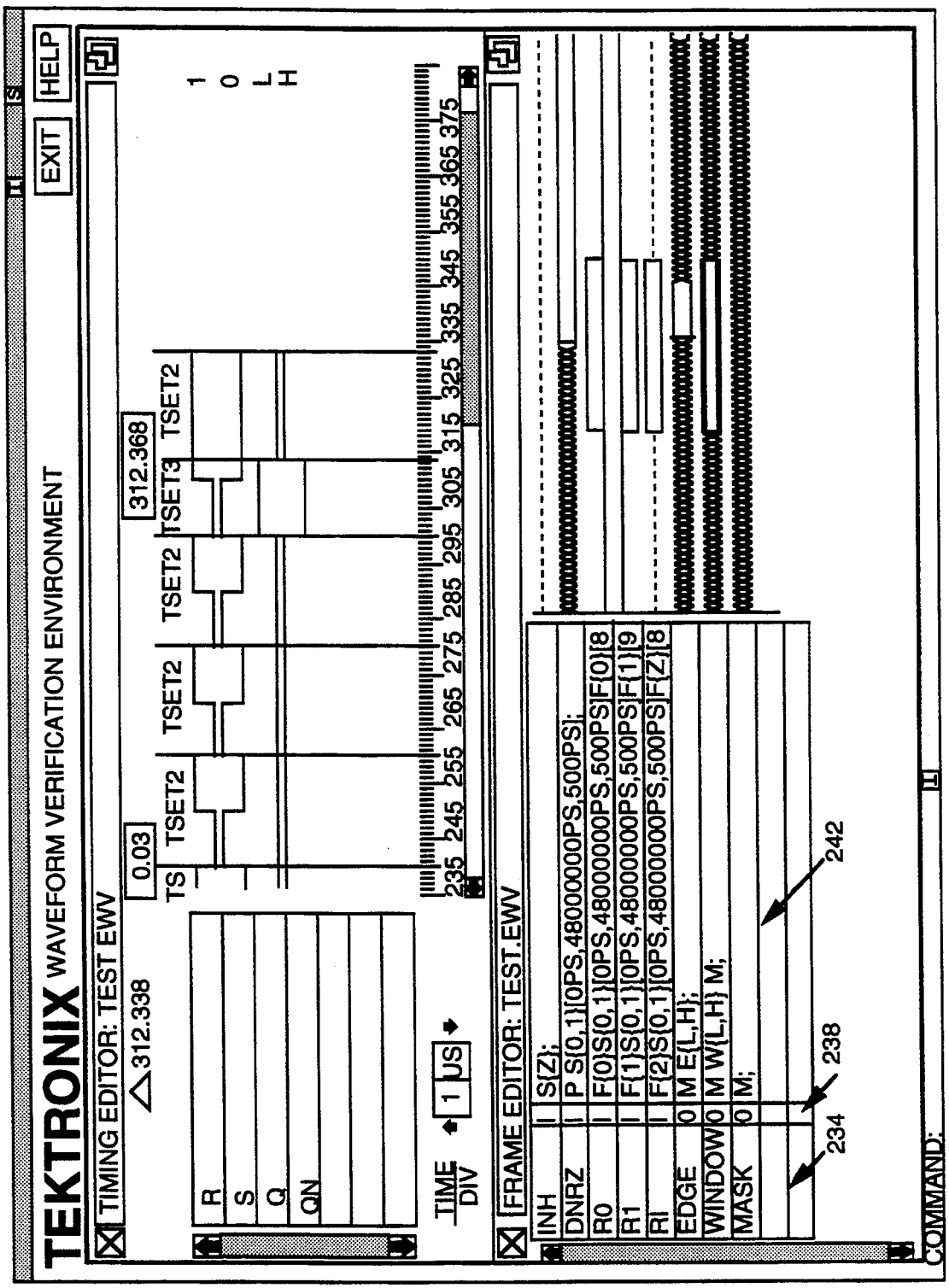
FIGS. 34 and 35 illustrate frame definitions on a frame editor for two data files.
Figure 35:
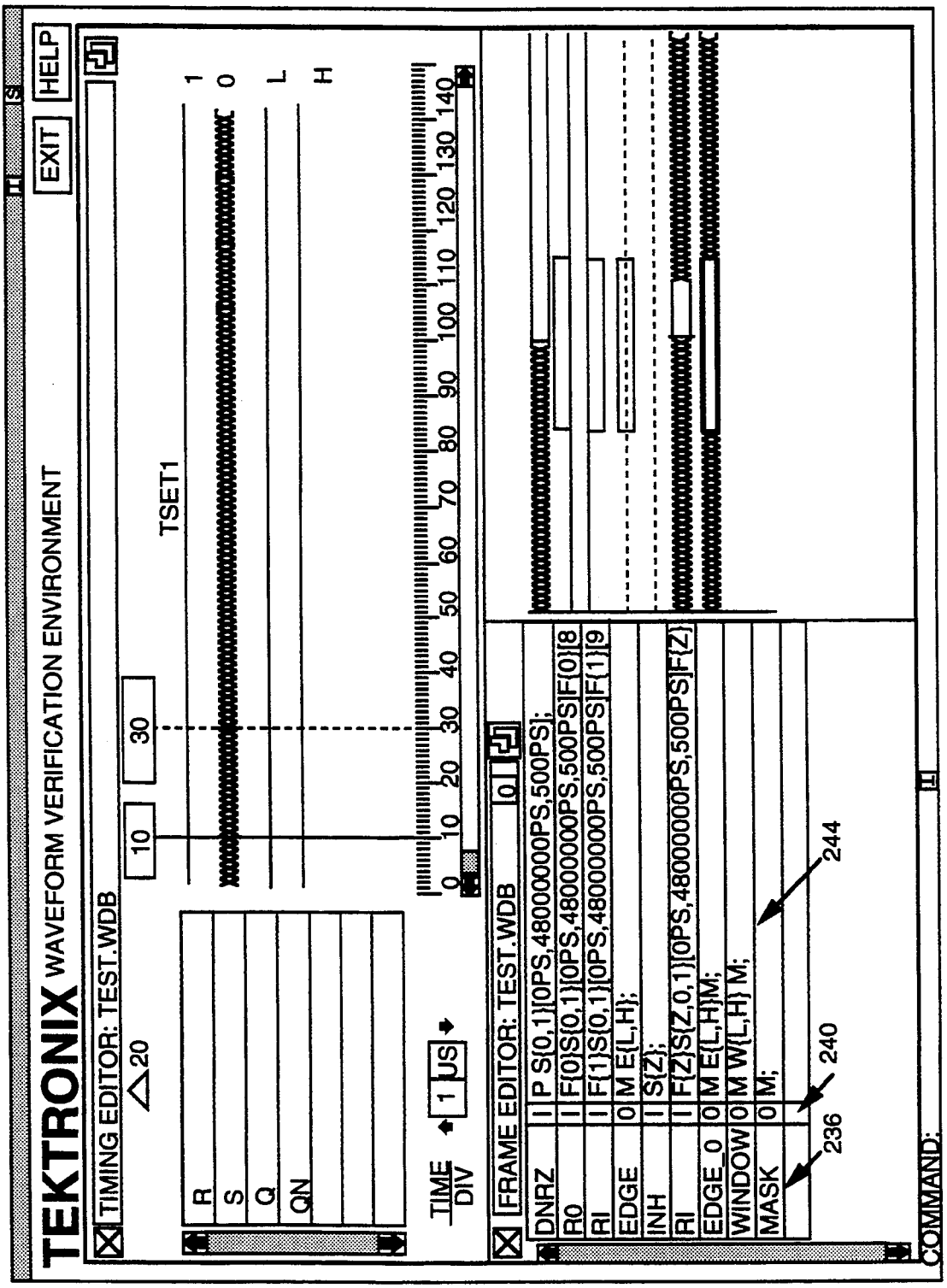
Figure 36:
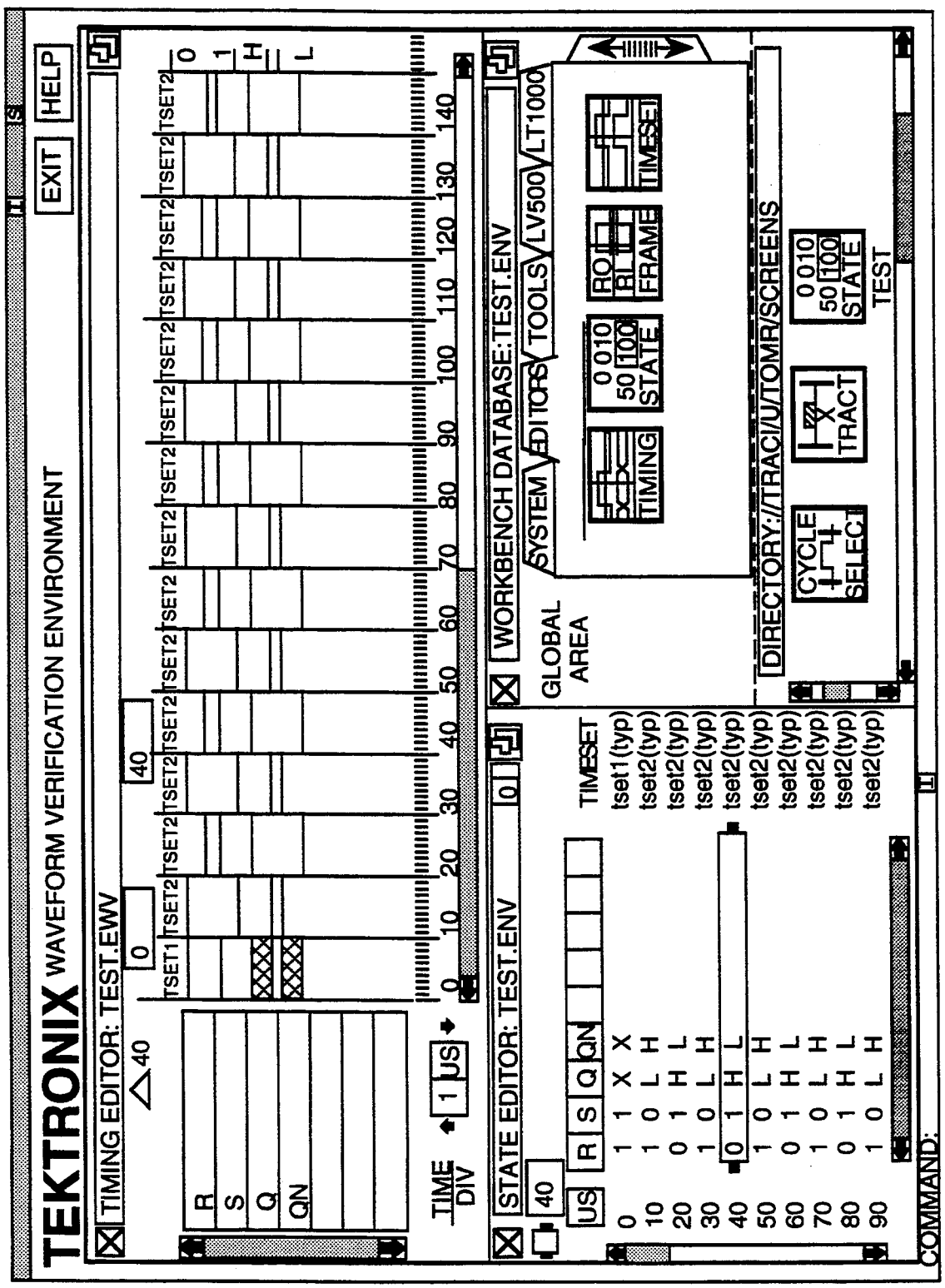
FIG. 36 is similar to FIG. 30, showing an alternative selection of cycle boundaries for the timesets.

FIGS. 34 and 35 illustrate the use of frame editor 122 to define the frames used to develop the timesets. Each waveform during a cycle period of a timeset has an associated frame definition. Each commercial tester has a set of acceptable frame waveforms which it is able to produce with an associated list of variable names which it uses to identify them. It is simply necessary to tell the tester the frame variable name along with any timing parameters specified to determine the timing of the associated waveform to the extent it is applicable.

In order to generalize the use of frame editor 122 so that it could apply to any tester, a frame generation language was developed by which the waveforms that a tester could produce could be defined in a common format which is recognizable by system 100. FIGS. 34 and 35 include illustrations of how the waveforms were defined for two different data bases. It will be seen that the definitions for the corresponding frames are very similar.

As is discussed in the user's manual, the frame generation language consists of the following specifying identifiers: (the following are frame semantics)

Force: = F(state value)
State: = S(allowable state values)
Previous: = P
Compare: = C(acceptable state values)
Edge Sensing: = E(allowable state values)
Window Sensing: = W(allowable state values)
Mask: = M Mask represents the ignoring of a signal for a period of time. A signal may either be sensed at an edge or over a window of a defined duration.

In these definitions the frames have the same variable names as listed in the left column shown at 234 in FIG. 34 and 236 in FIG. 35. The second columns 238 and 240, respectively, indicate whether the signal is an input signal or an output signal. The frame definitions are given in the right hand columns 242 and 244, respectively. The numbers in brackets after the specifiers indicate minimum and maximum time durations and the time increments for selecting a time period within that range.

It will be noted that the RI signal is defined somewhat differently in the two figures. They both include forcing a high impedance state, applying a selected state value and then forcing the high impedance or inhibit state. The difference between the two definitions is that the state which is selectably applied in FIG. 34 can only have a logic state of zero or one. However, in the definition shown in FIG. 35 it can also have a state of high impedance or Z.

Figure 37:
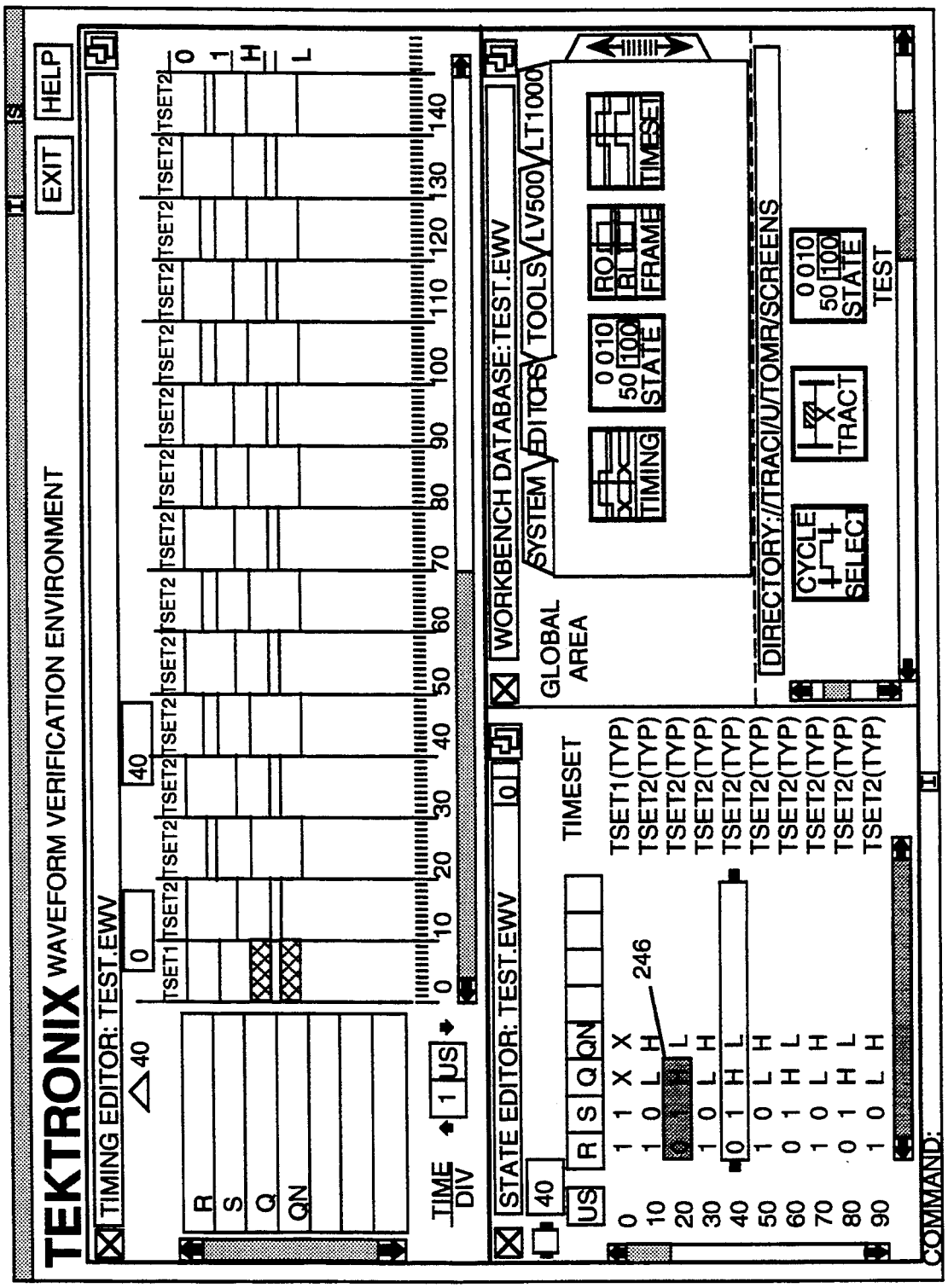
FIG. 37 shows a partial selection of timeset data of the display of FIG. 36 for editing.
Figure 38:
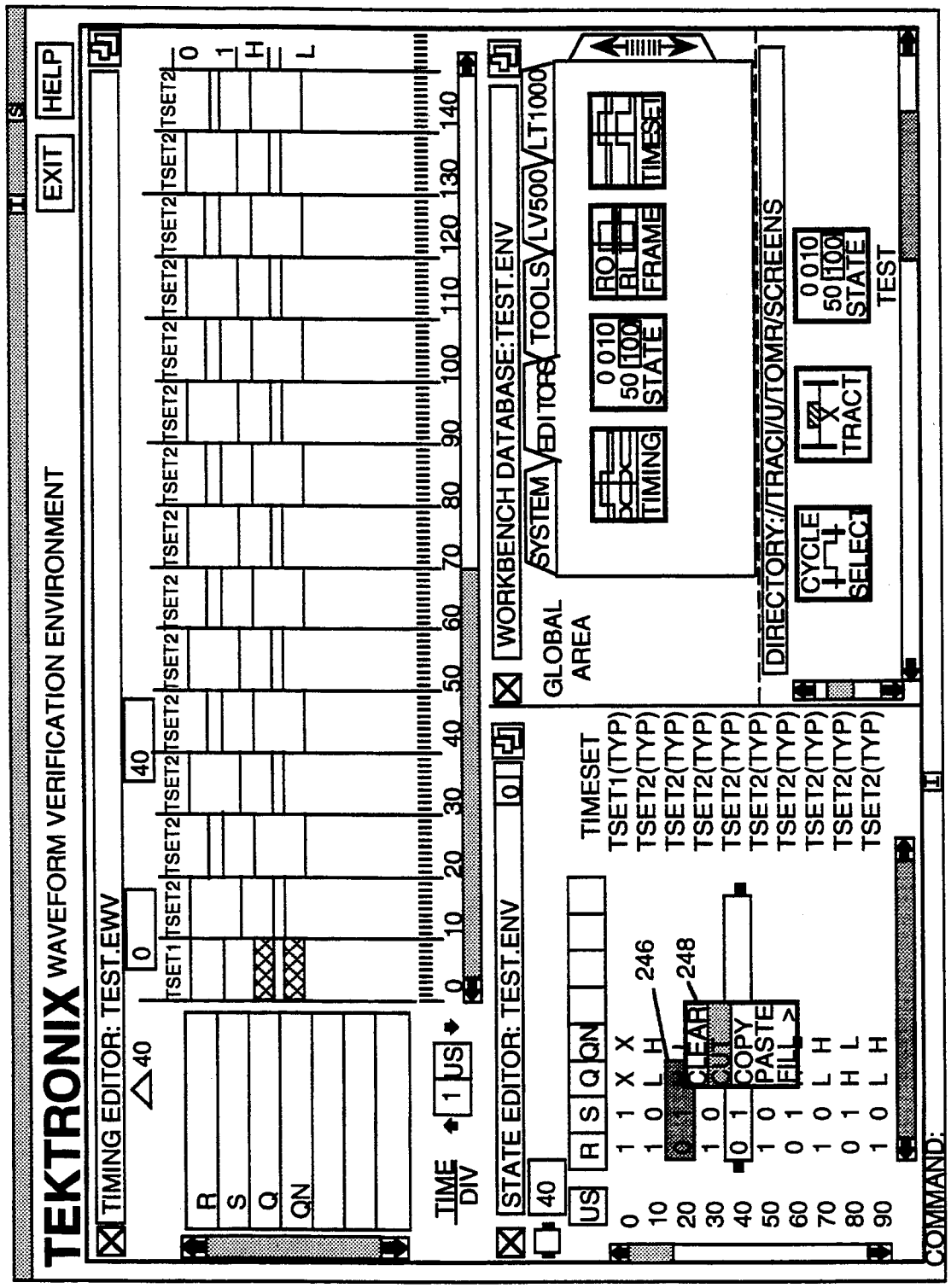
FIG. 38 shows selection of an editing option.
Figure 39:
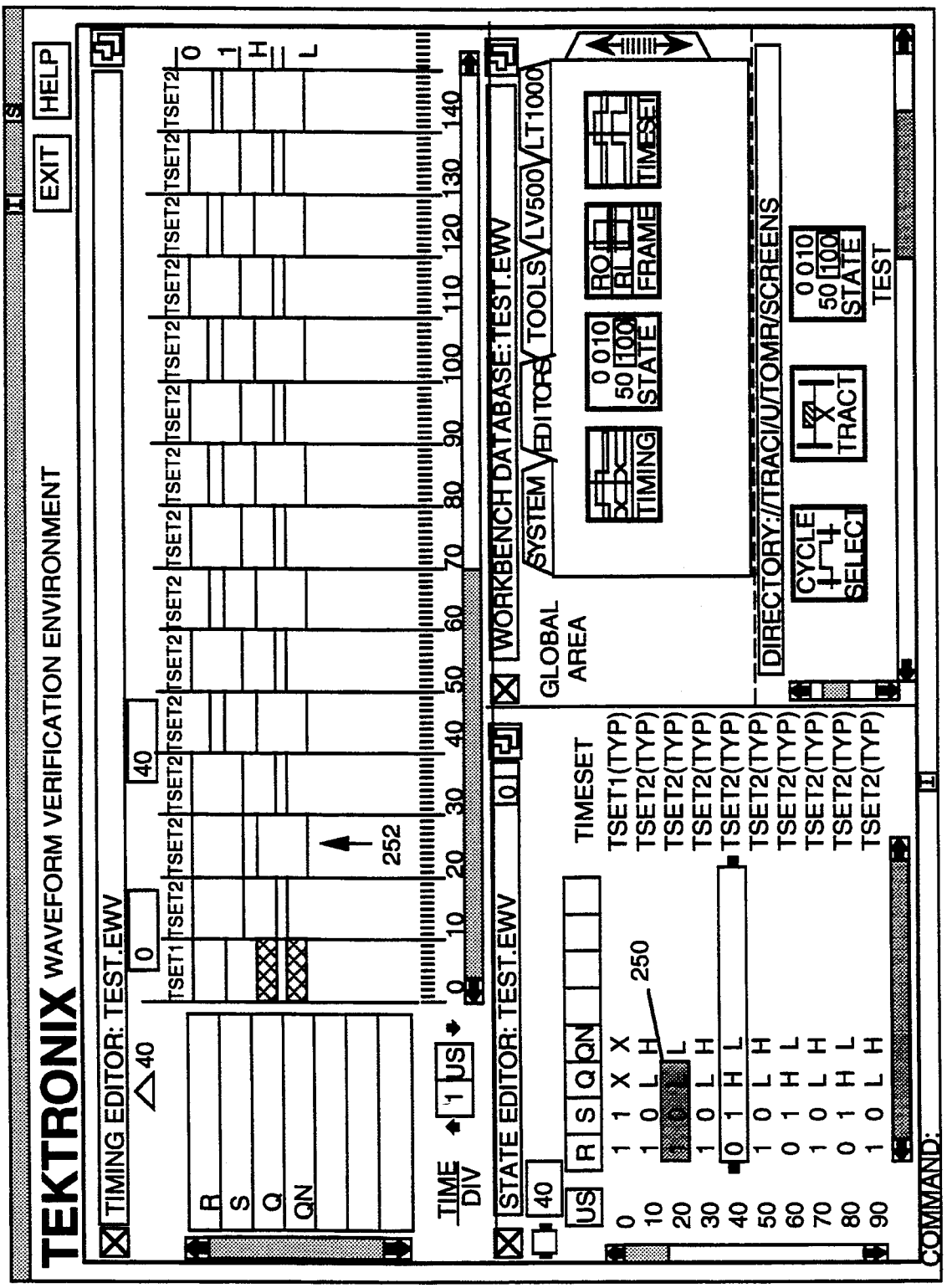
FIG. 39 shows the results of the editing of FIG. 38.

FIGS. 36–39 illustrate further the editing features of system 100. It can be seen in viewing these figures that although the same data is shown in the window of timing editor 120, the timeset allocations are based on cycle boundaries which occur twice as often, i.e. at each waveform transition. This results in the frame definitions for each signal for each timeset being different than they were in the preceding section. In FIG. 37 the mouse-controller cursor has been used to highlight area 246 which includes only a partial vector or sequence associated with the time 20 microseconds. FIG. 38 shows a resulting editor menu 248 used to select an editing option. In this case the data is being cut from the data base. Since part of the vector remains in its original value, it is clear that the entire timeset is not being removed. Thus, in FIG. 39 the removed data elements have been replaced by carrying down the data elements from the sequence above, as shown by highlighted region 250. This is reflected in the continuation of the data through three consecutive timesets shown generally at 252 in the timing editor window, with only signal QN varying.

Figure 40:
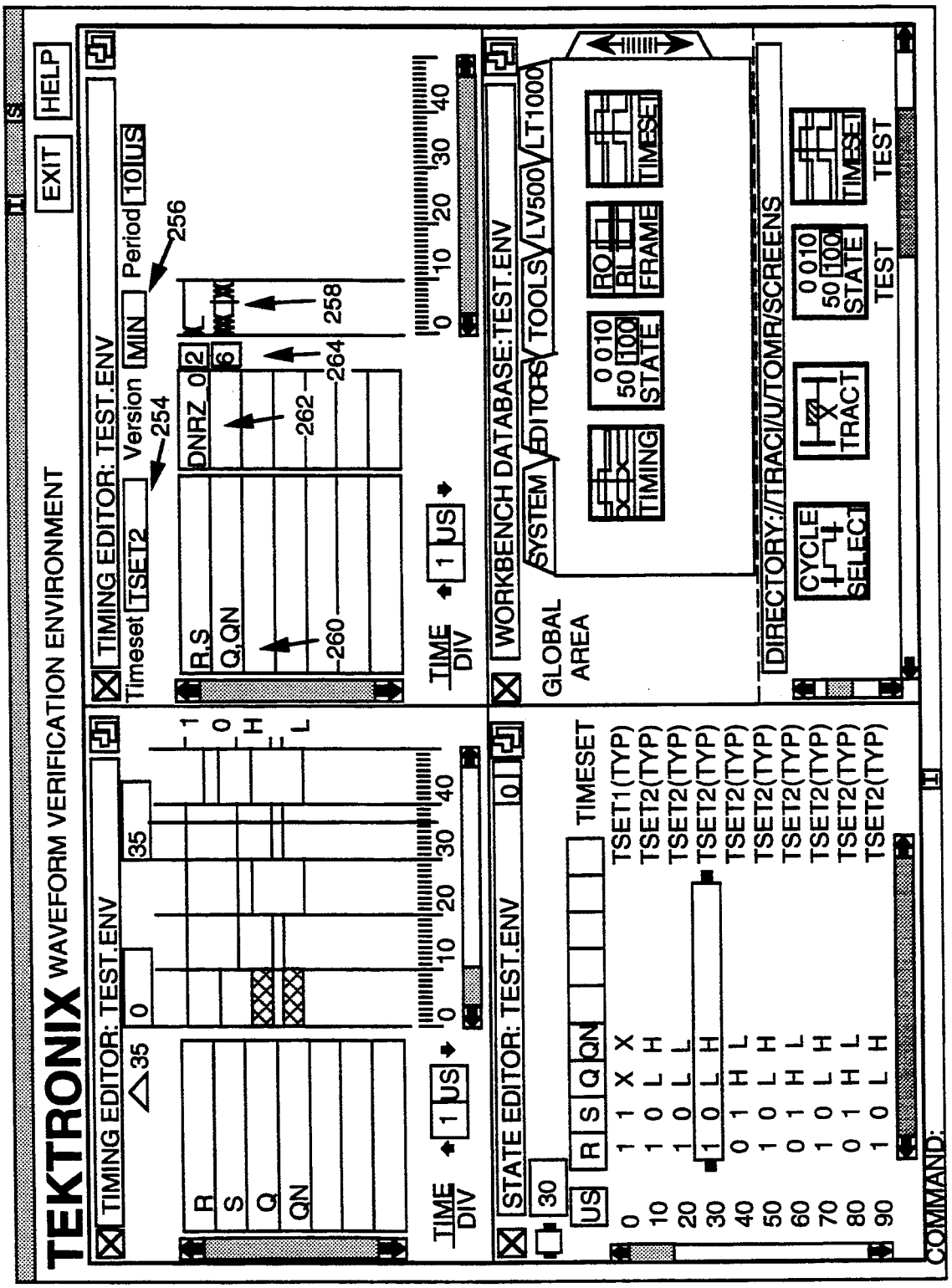
FIG. 40 shows a timeset editor display.

Multiple timing versions of each timeset can optionally be created. In FIG. 40 timeset editor 124 has been executed and is being displayed in the upper right corner. The timeset name selected for editing is shown in the timeset name bar 254. The timeset versions name field appears on the right end of the timeset name bar at 256. The default timing version name is typ for typical. In this example, the min or minimum version is applied.

The use of minimum, maximum and typical timing versions allows for use of the same timesets with different timing of the waveforms to test the timing capabilities of an integrated circuit. It will be noted that the signal waveforms are illustrated for each signal in region 258 with the signals identified in the left column at 260 and the frame variable name included in the intermediate column at 262. Any timing parameters are listed between the waveform and the variable name as shown at 264.

Figure 41:
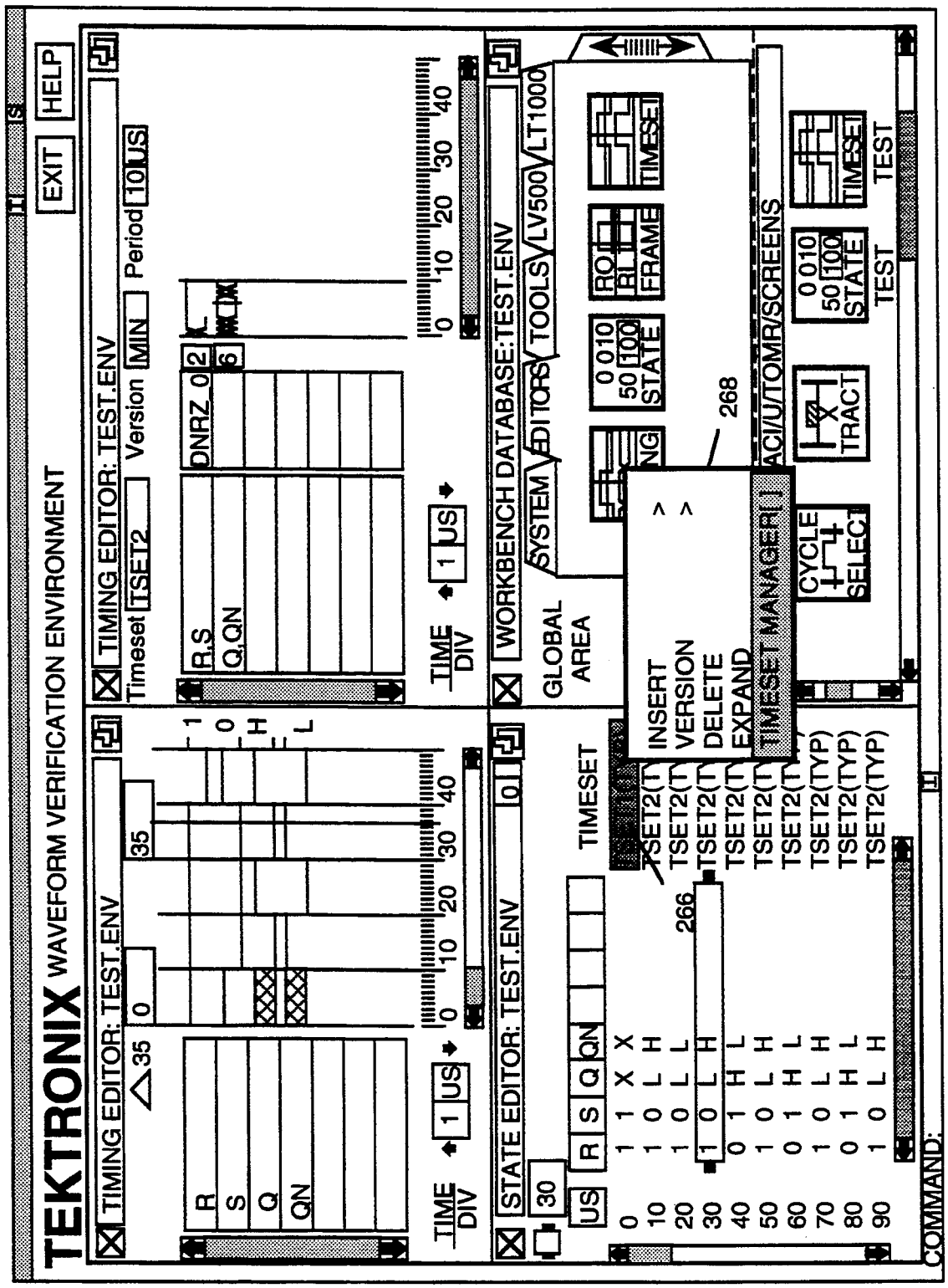
FIG. 41 shows a timeset selection menu.
Figure 42:
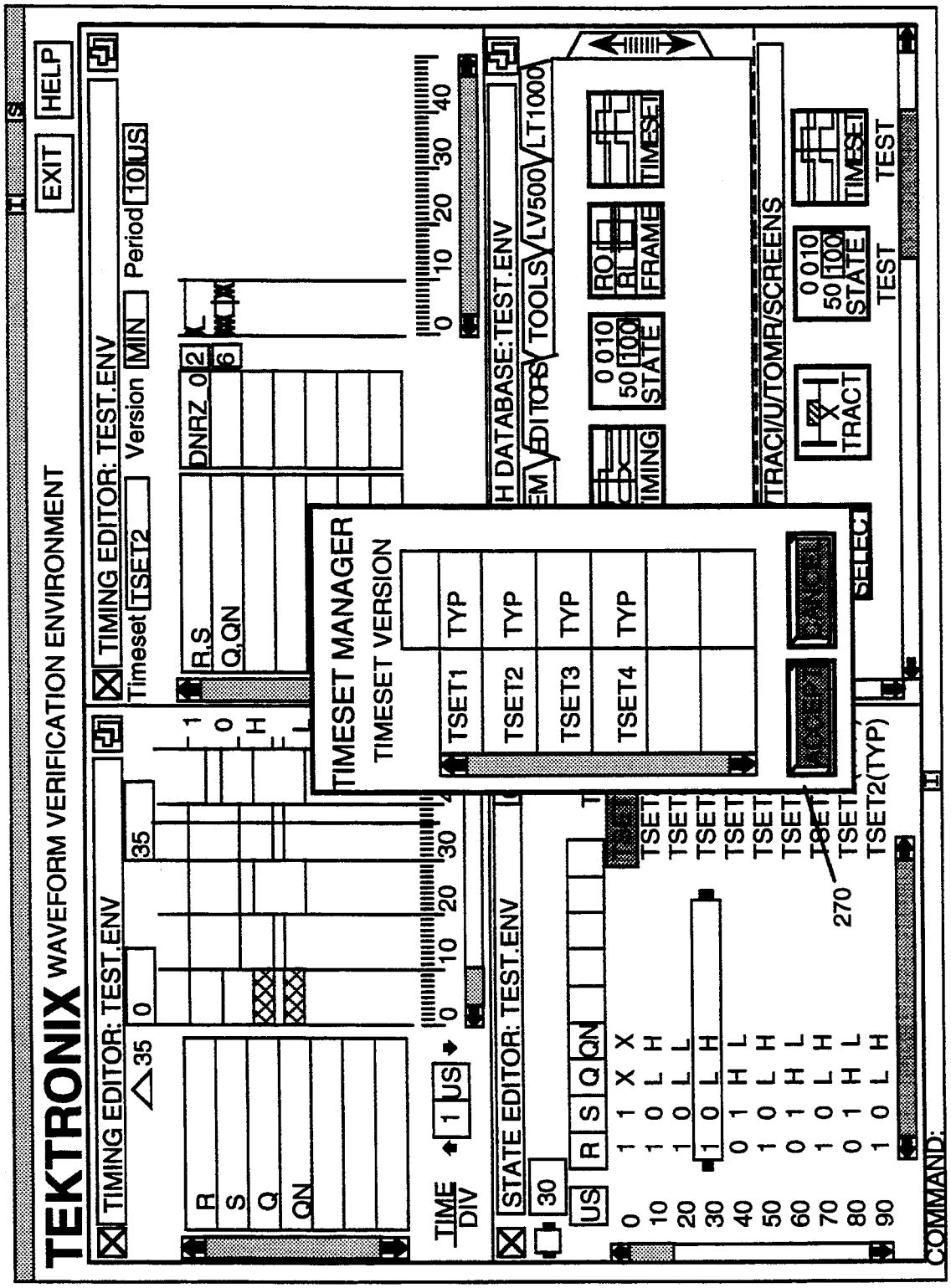
FIG. 42 shows a dialog box for the timeset manager.
Figure 43:
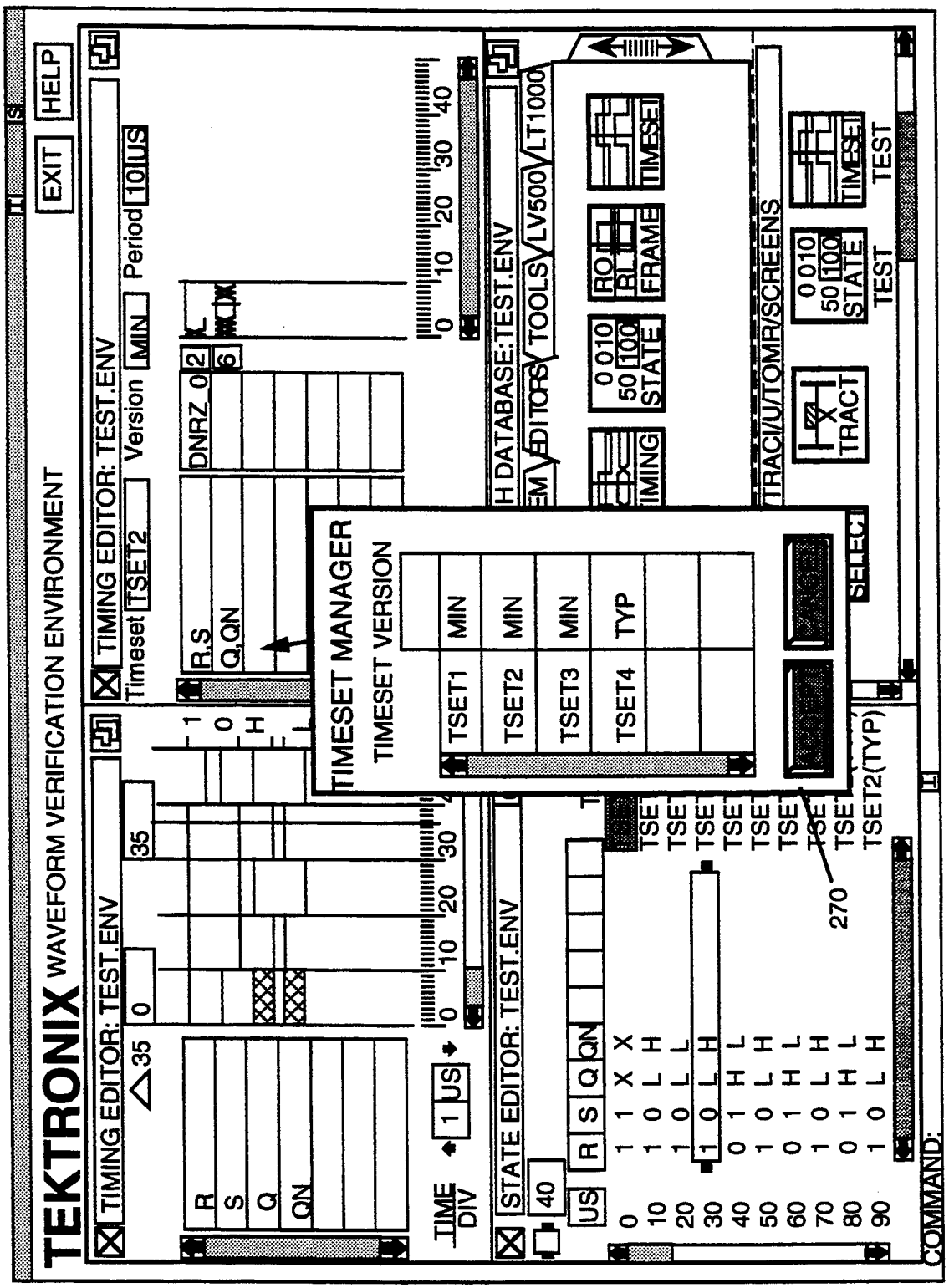
FIG. 43 shows a change in the timeset versions.
Figure 44:
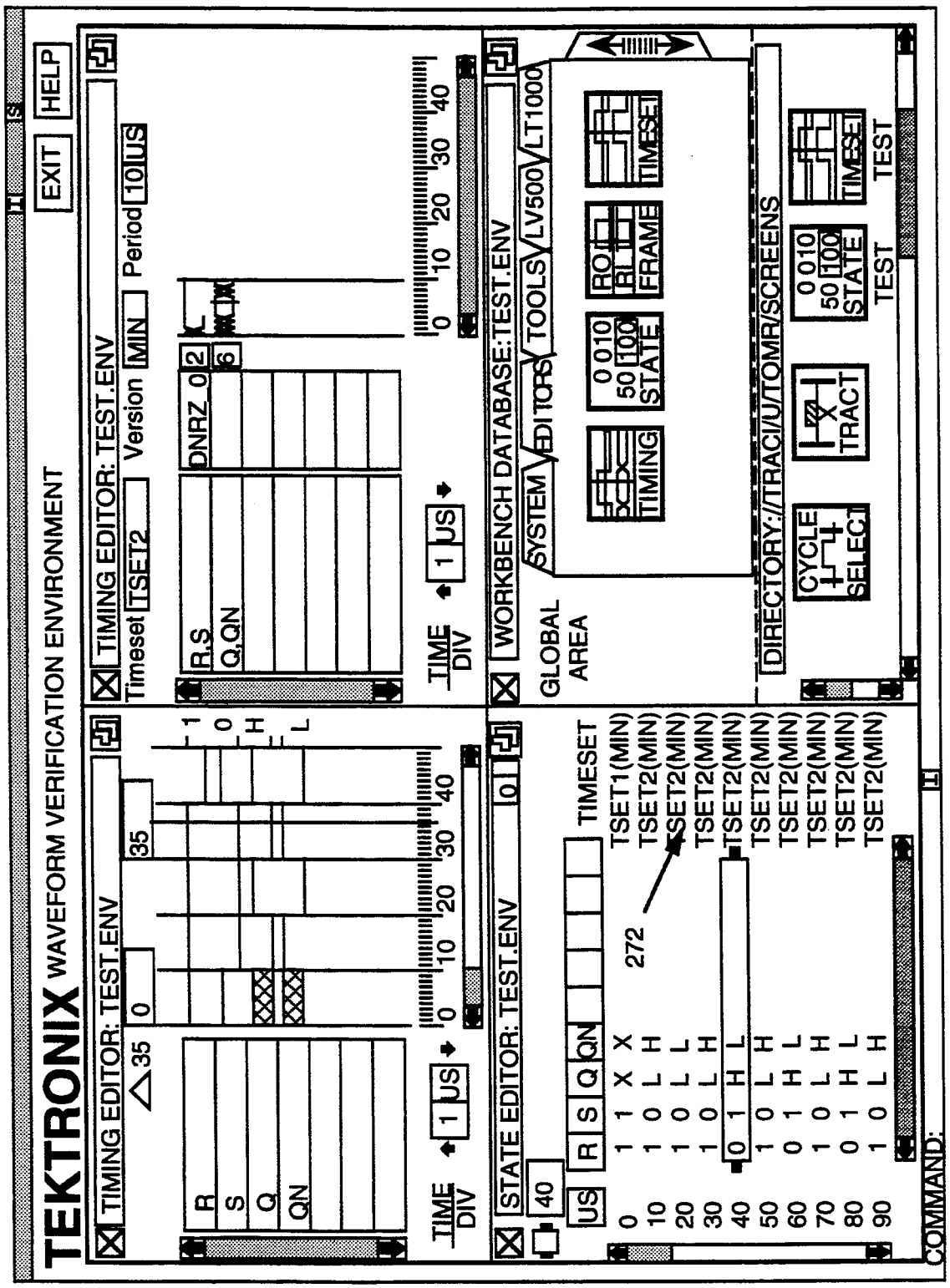
FIG. 44 shows timeset versions changed on the data.

In FIG. 41 a timeset listing is selected and highlighted as shown at 266 and the middle mouse button pressed to obtain a menu 268 containing the selection choices for changing the timeset versions. In this case the timeset manager is selected so that the timeset versions may be chosen. A table shown at 270 in FIG. 42 shows the timeset manager box with the current versions indicated. These versions may be changed, such as to the minimum versions as shown in FIG. 43. By then applying the mouse cursor to the accept button at the bottom of box 270, these timeset versions are inserted into the existing data base and replace the previous versions, as shown in FIG. 44 by timeset designation column 272 in the window of state editor 118.

Figure 45:
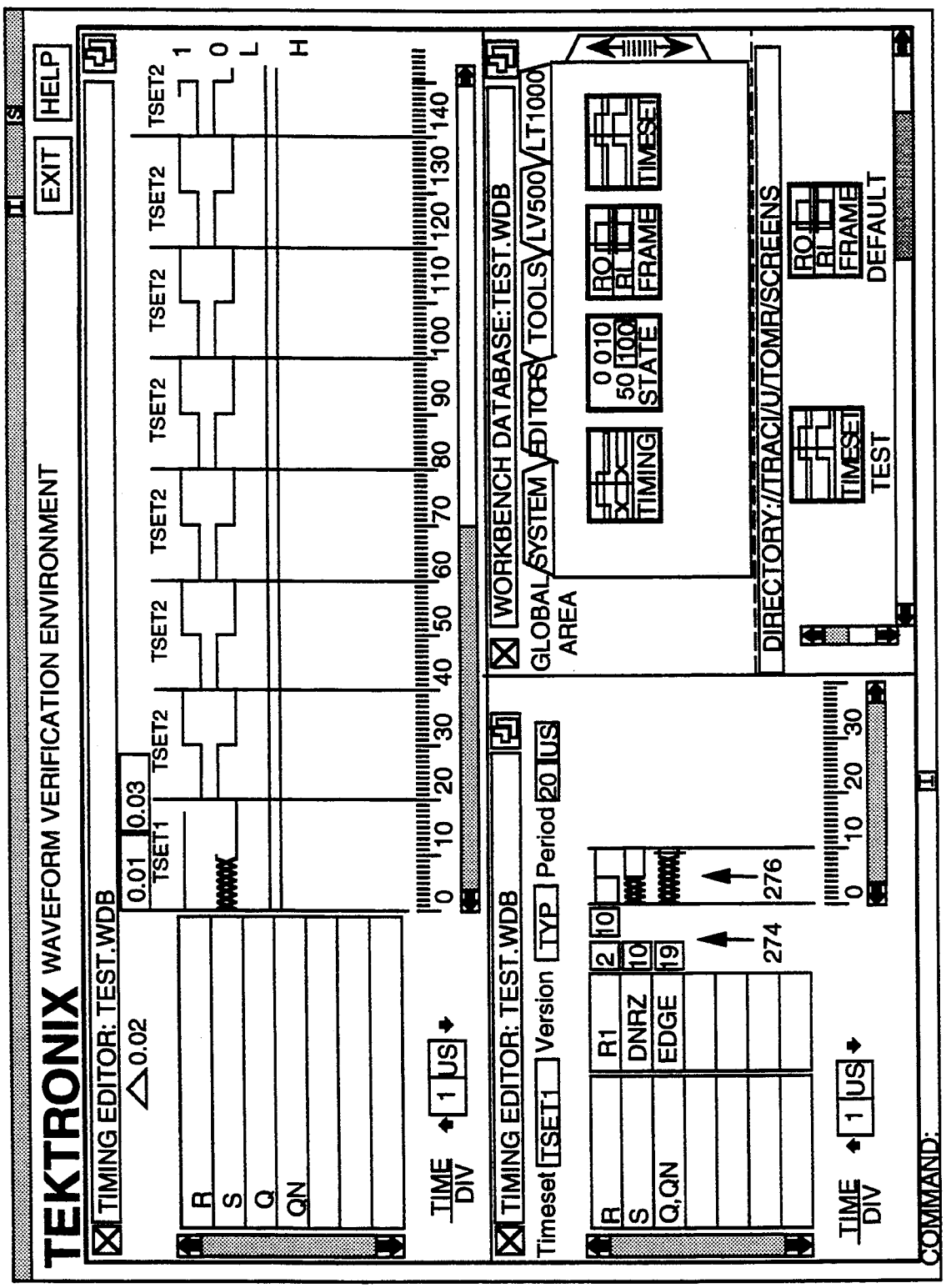
FIG. 45 is similar to FIG. 19 and shows timeset assignments and a timeset editor.

FIG. 45 shows the window of timeset editor 124 positioned in place of the state editor window. Timeset editor 124 here illustrates tester variable names applied to the signals, timing parameters shown in region 274 and associated waveforms shown at 276. It can be seen that different frame definitions were required for the R and S signals, whereas the same frame definitions applied for both output signals. The timing parameters can be adjusted by typing in new values in the parameter boxes, shown at 274, or by dragging the edges of the waveform at 276.

Figure 46:
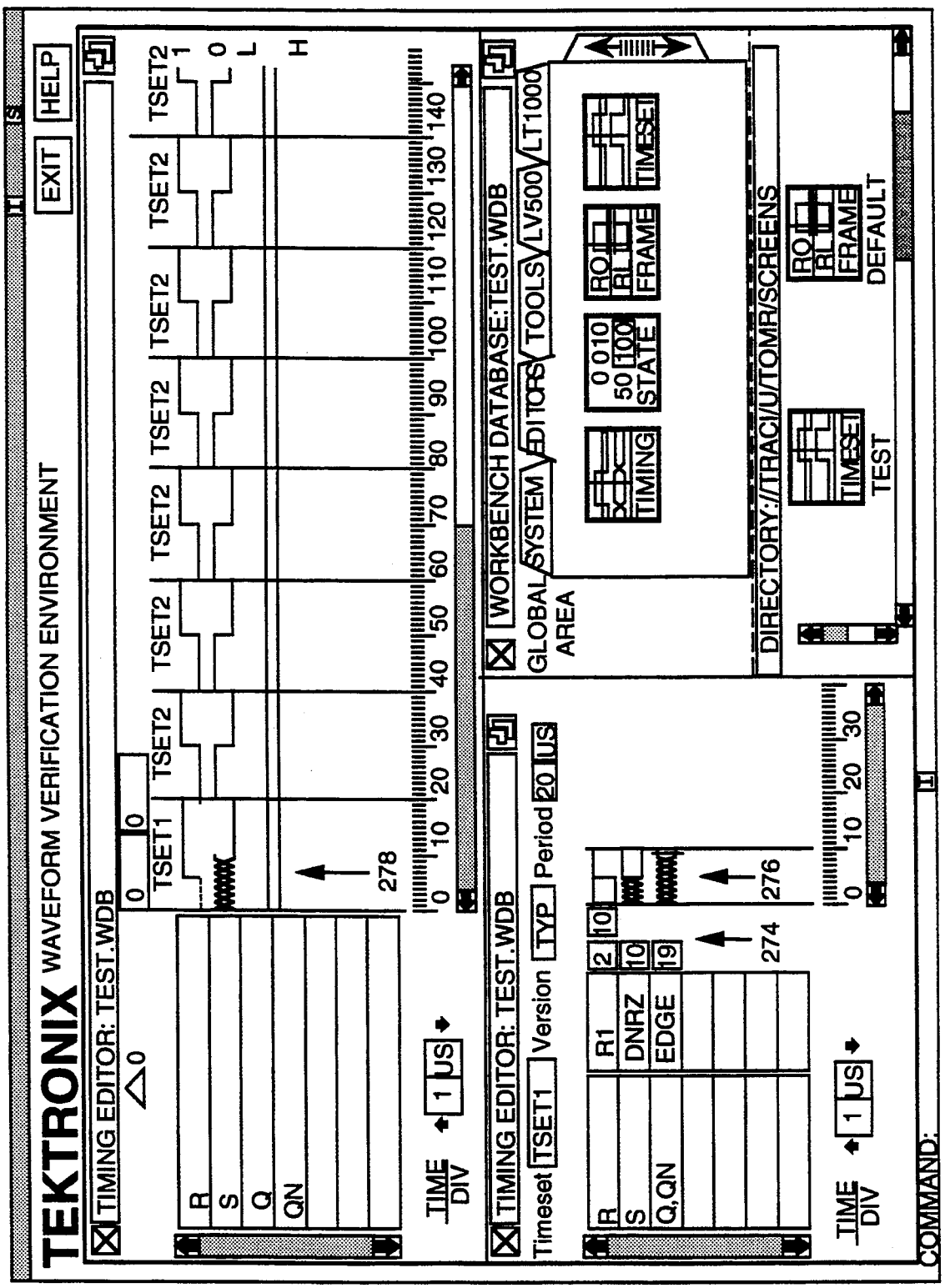
FIG. 46 shows the revision of a timeset definition.

In this case the beginning and ending parameters for the R input signal were both increased by 5 microseconds. The first value is the time at which the state changes and the second value is the duration of the state prior to returning to the original state. Since the cycle has a period of 20 microseconds, the end transition occurs at the end of the cycle, as shown at waveform region 276 in FIG. 46. It can be seen that this change in waveform due to editing with the timeset editor is directly reflected in each occurrence of the corresponding timeset in the data base, as reflected in timing editor waveforms at 278.

Figure 47:
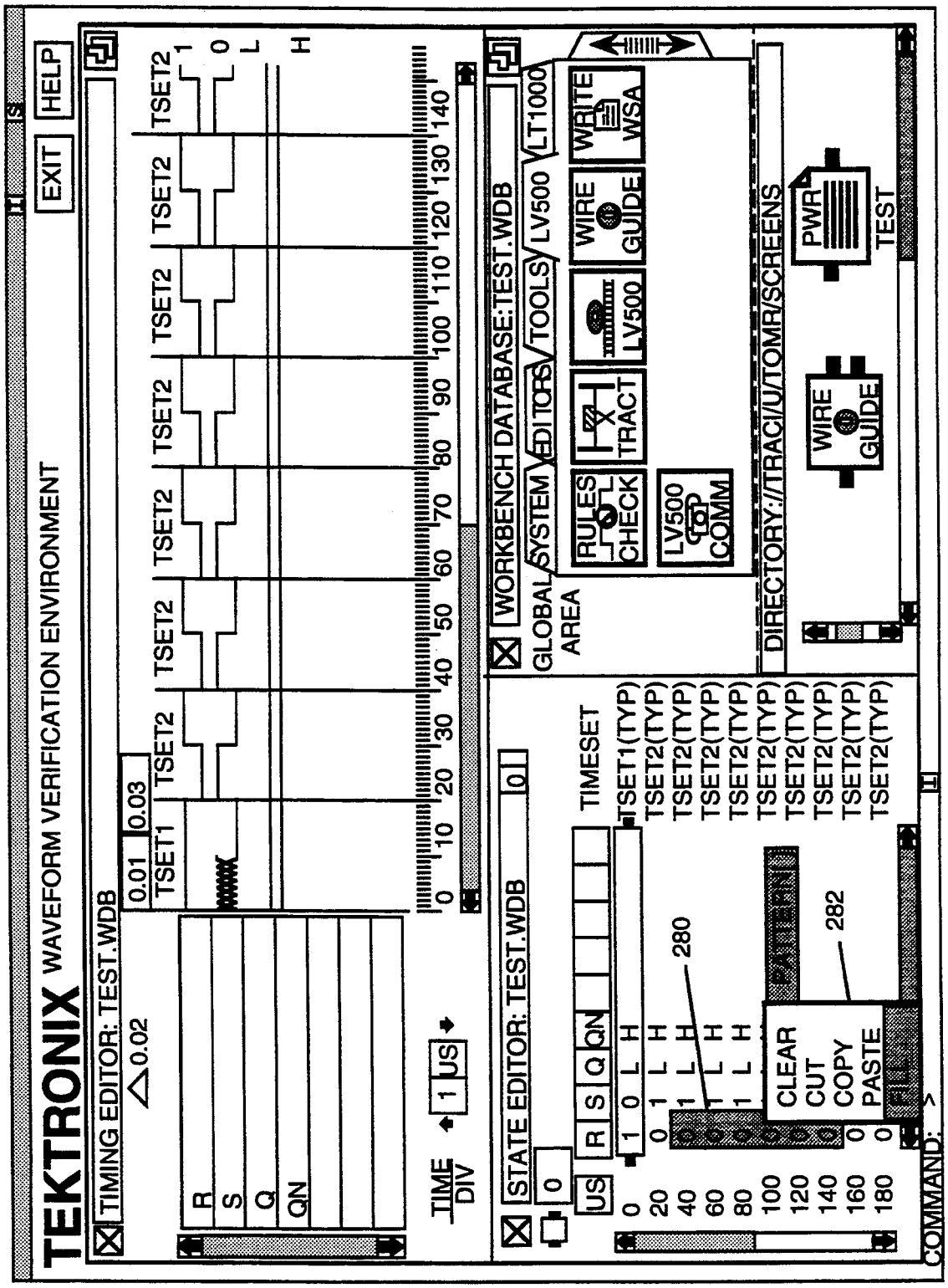
FIG. 47 shows a state editor with an edit menu displayed.
Figure 48:
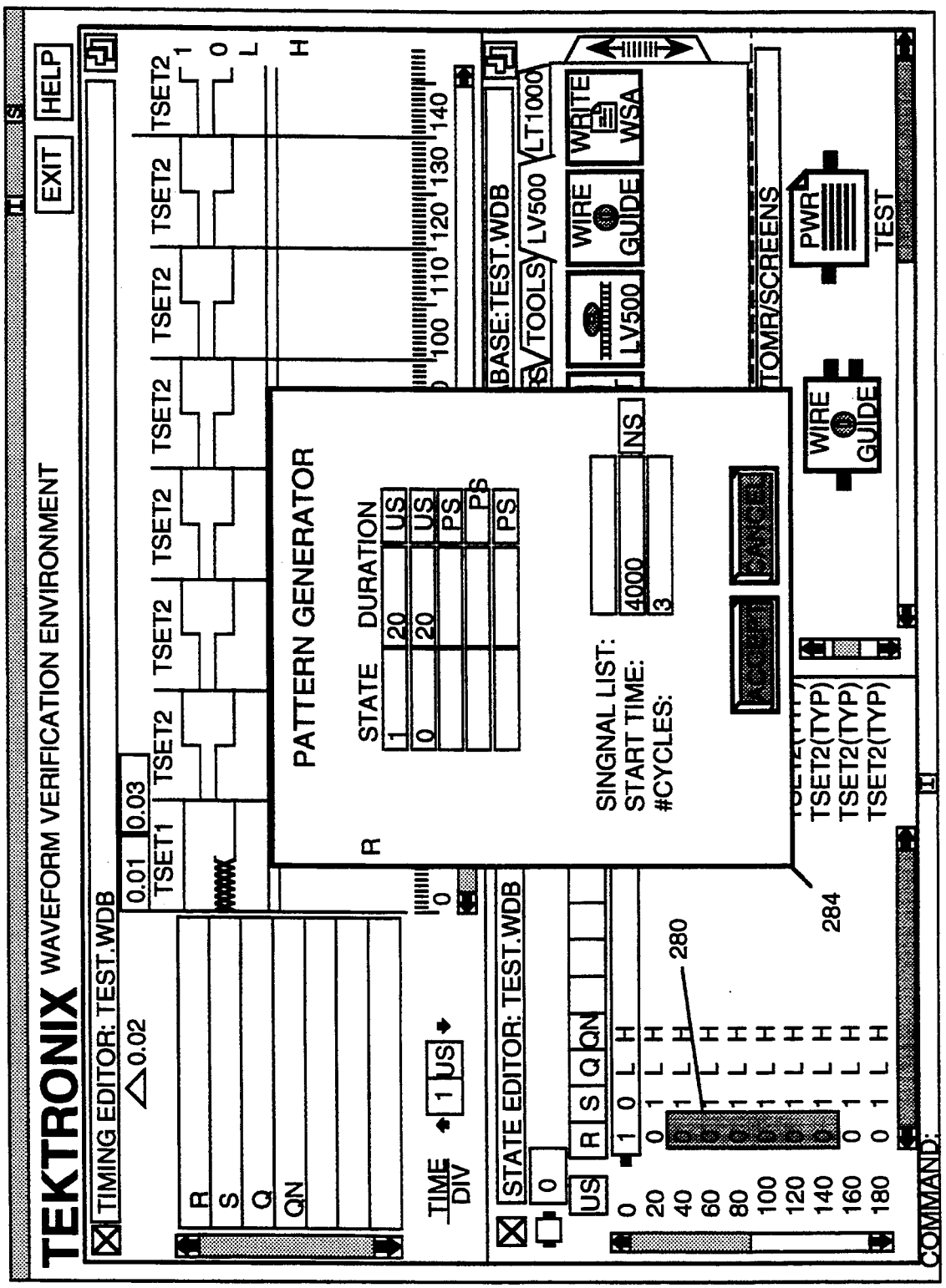
FIG. 48 shows a dialog box for pattern generator selection.
Figure 49:
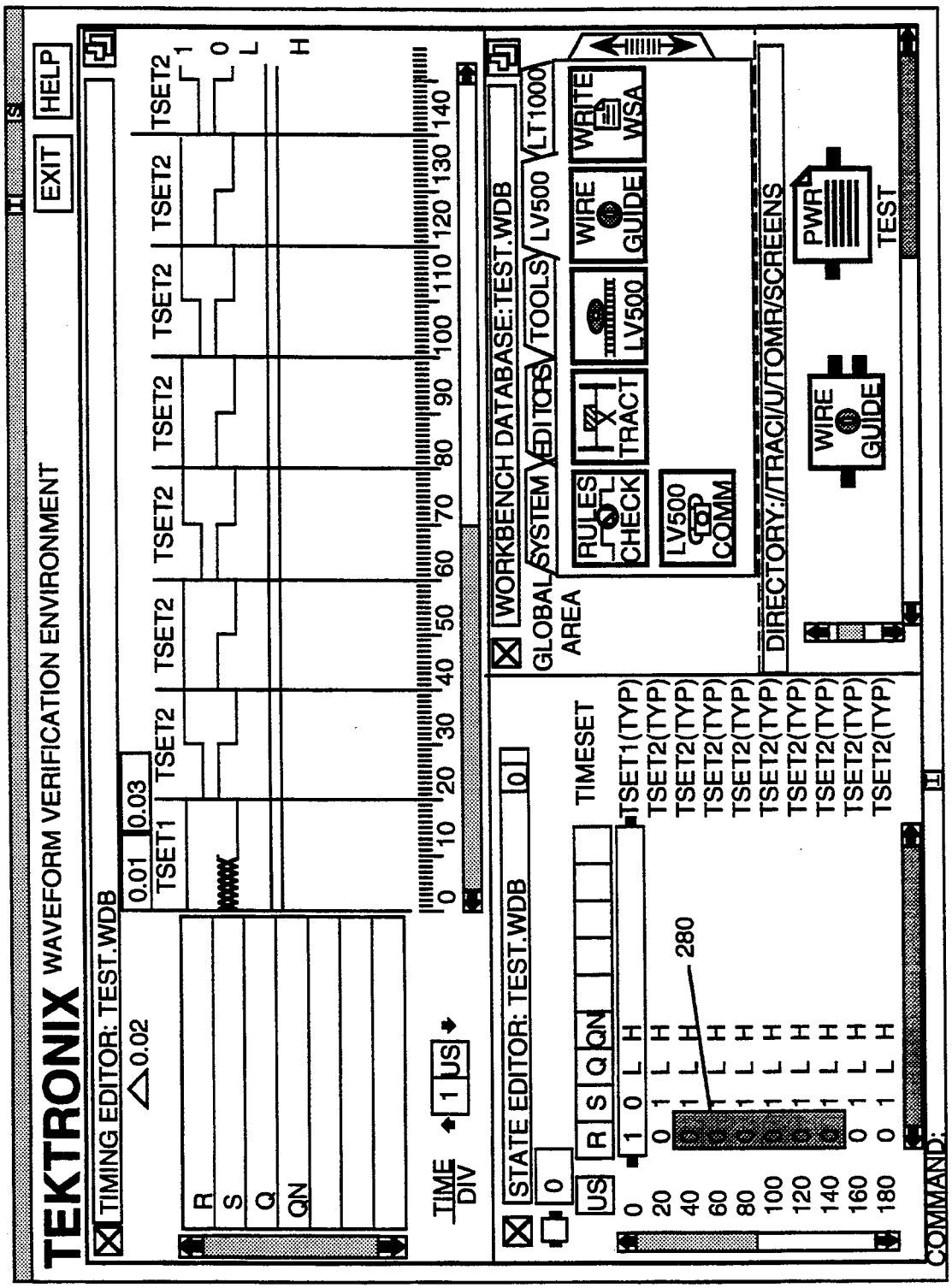
FIG. 49 shows the results of the use of a pattern generator on the selected data.

FIG. 47–49 illustrate yet another way that the data can be edited. In these figures the cycle boundaries are set as originally described. FIG. 47 shows highlighting of a region 280 of data elements associated with signal R which it is desired to convert into a repetitive pattern. This may be accomplished by using a pattern generator selected by a menu 282. By selecting the fill pattern option, a pattern generator dialog box 284, shown in FIG. 48, is displayed. This box provides for inputting information which establishes the pattern. The state values, durations and time units are inserted to define the pattern. The start time and the number of cycles which are generated then define where the pattern is to be inserted. Three cycles of alternating logic state levels are produced with a start time of 40 microseconds. By activating the accept button at the bottom of box 284, the pattern shown by highlighted region 280 in FIG. 49 is produced. The alternating state conditions show up in the timeset values for signal R in state editor 118 and corresponding waveforms are shown in the timing editor 120 display.

Once the data is in a format which is compatible with the desired tester, it is necessary to make assignments of each signal to channels of the tester and corresponding pins of the tested integrated circuit. During this process, the data base resource allocator is executed and a rules check is made to see that the data base conforms with the requirements of the tester.

Figure 50:
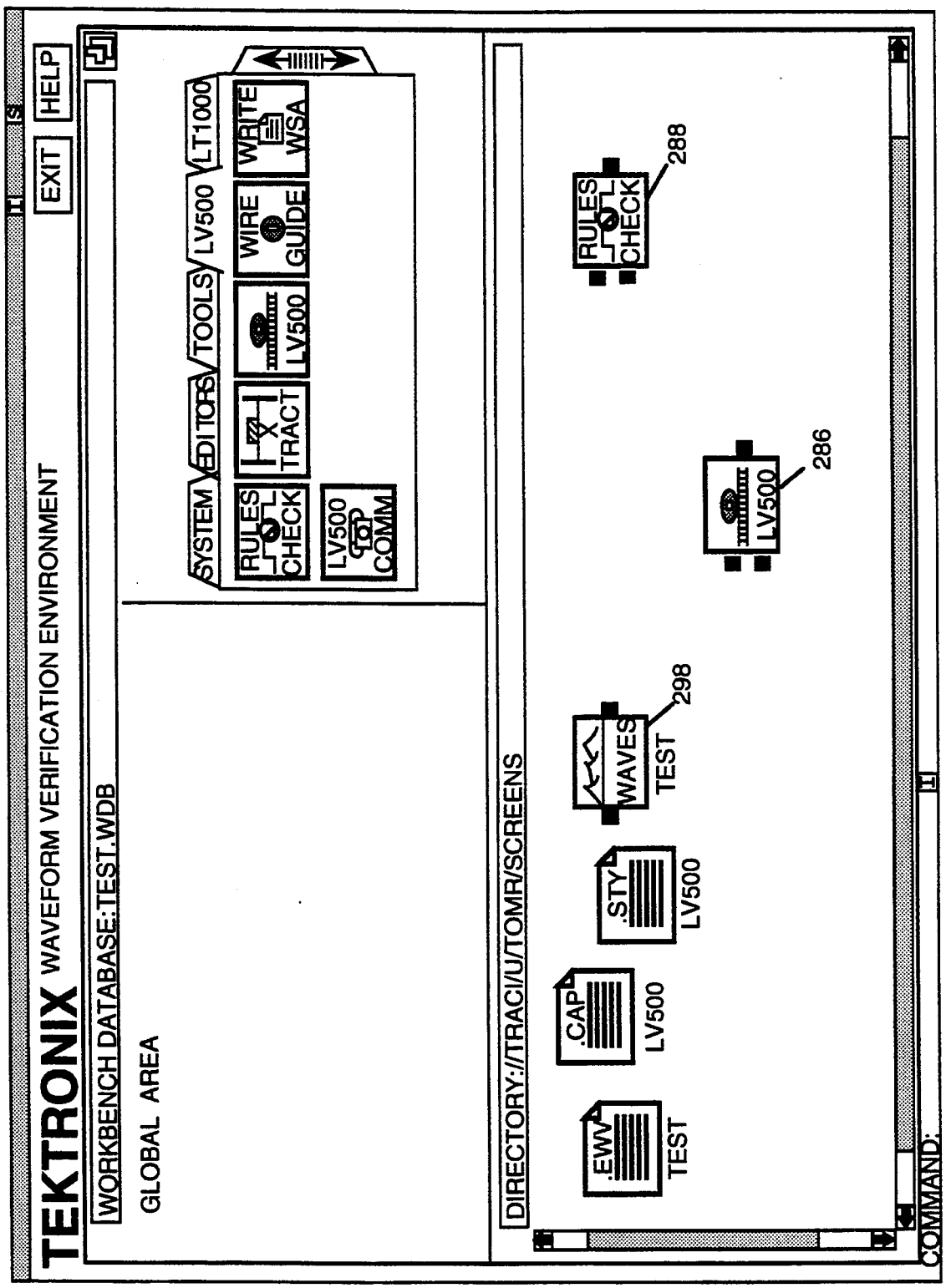
FIG. 50 illustrates a workbench display showing functional icons in a directory region.

FIGS. 50–58 illustrate an exemplary operation to show some of the features of system 100 in providing for these checks and to further illustrate the graphical manner in which functional subroutines are executed using the icon-based controller 102. In FIG. 50 copies of the resource allocator icon 286, labelled "LV500", and the RULES CHECK icon 288 have been taken from the LV500 card and placed in the directory workbench area, as shown.

Both of these icons have two pads or pins on the left side, indicating inputs, and one pad or pin on the right side indicating outputs. These pins appear on process icons which can be connected together to describe data flow from one to the next. In most cases, the data that is passed is a single data base, which is modified through the various processes. The data flow segments or subroutines can be executed as a whole, or they can be executed as individual processes if they are not connected to other processes. Further, multiple programming segments can be wired on a single workbench with each segment being executable by double clicking on any of the icons that are connected or by selecting "execute" from the process icons middle mouse button menu.

Pads or pins can be wired together if the corresponding data types are the same. The data types can be of several types, including pin wire input or output, data base input or output, text input or output, cycle seeds input or output, state map input or output, printing input or output, capabilities input or output, and signal list input or output.

Figure 51:
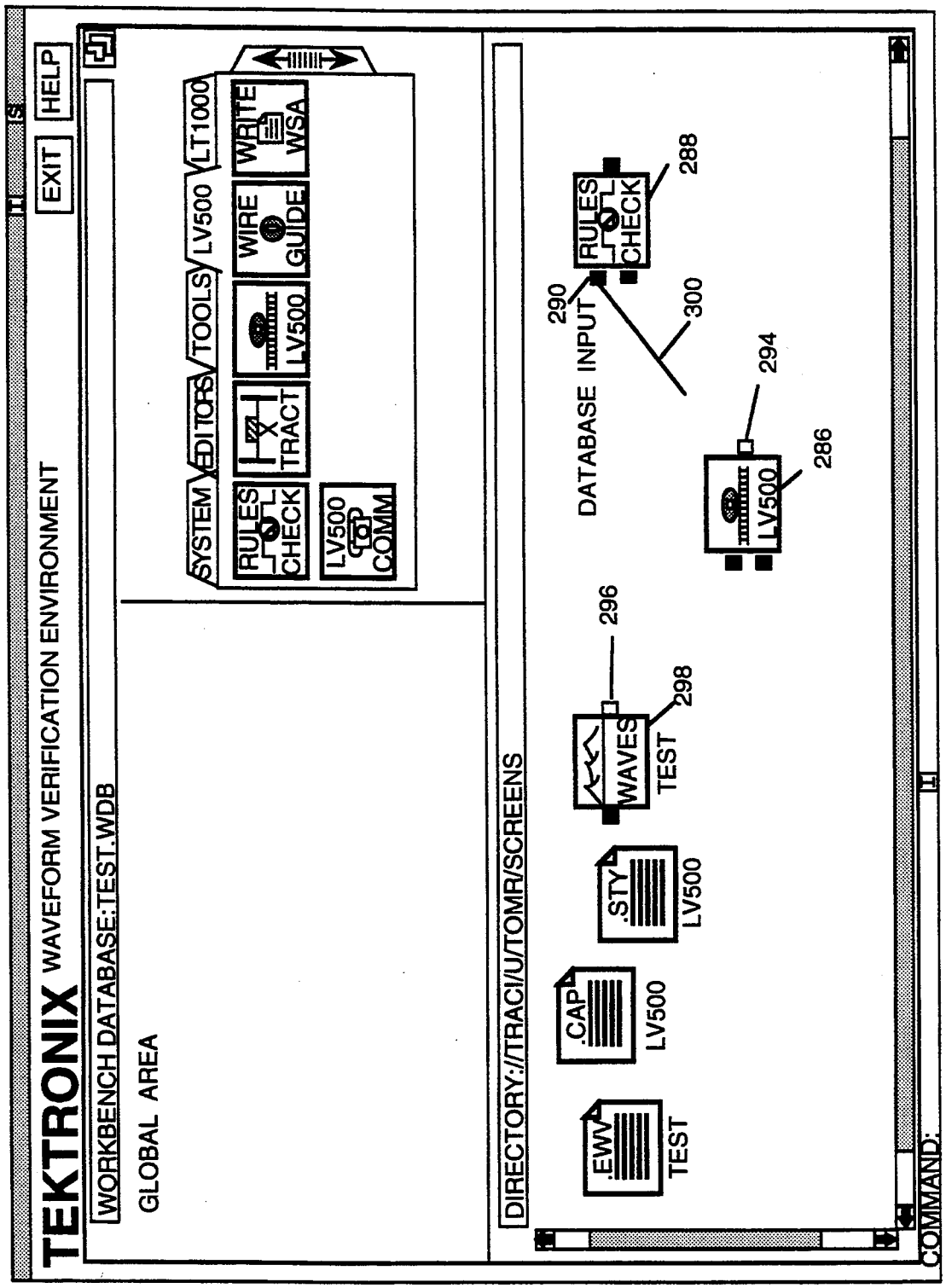
FIG. 51 illustrates selection of an input pin of one icon for connection to another icon.

When the left mouse button is held down on an input or output pad on a process icon, such as pad 290 on icon 288, as shown in FIG. 51, a label 292 shown as "data base input" appears adjacent the pad. At the same time any other pads on any other process icons on the workbench, which can be connected to the selected pad, change from solid squares into square outlines. In FIG. 51, output pad 294 of icon 286 and output pad 296 of icon 298 are shown in outlined form to indicate compatibility with the data type associated with input pad 290.

Figure 52:
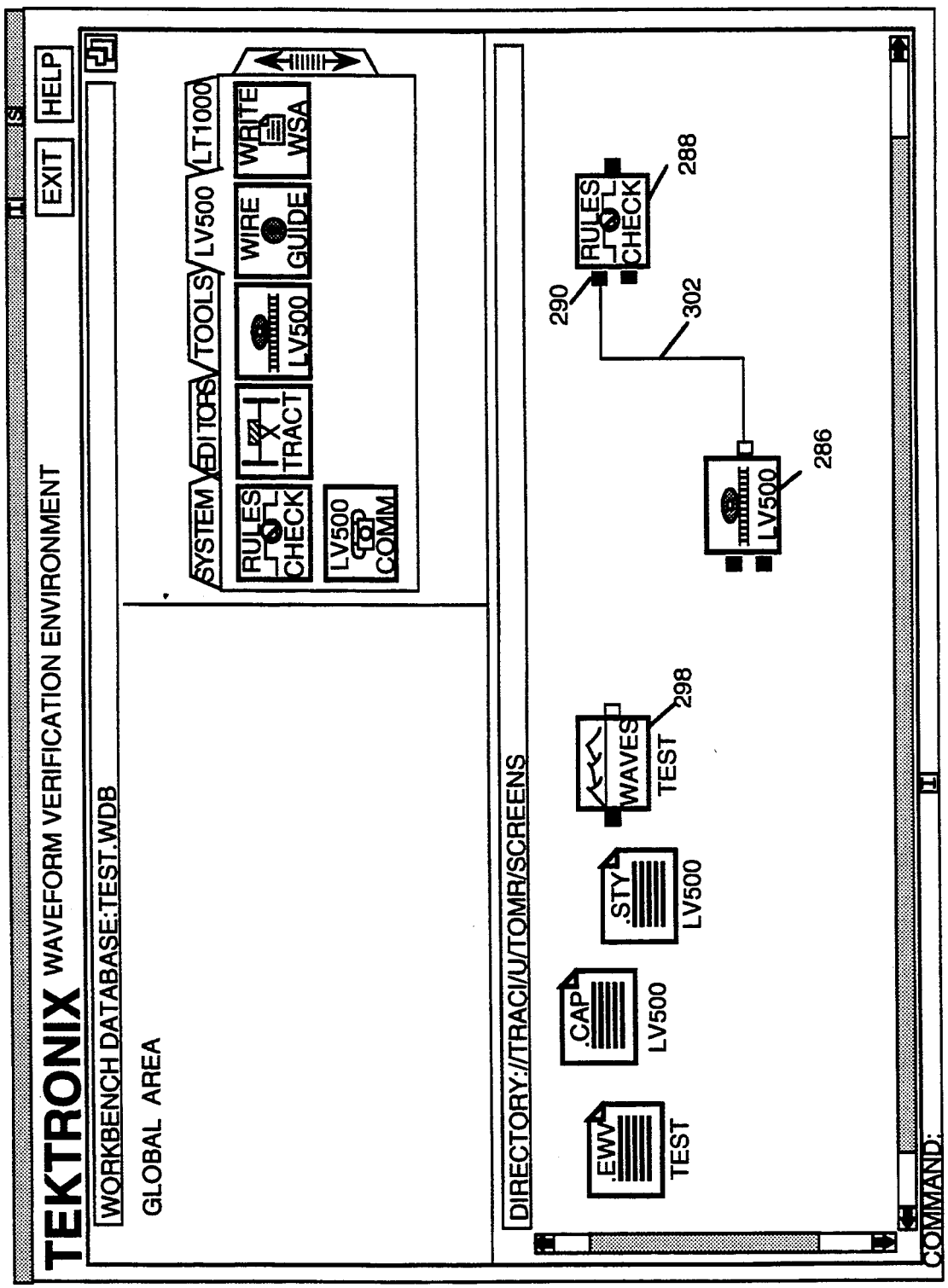
FIG. 52 shows completion of an icon interconnection.

The mouse is dragged to the location of a compatible pad, as shown by partial line 300. The end of the line indicates the position of the mouse-controlled cursor. The mouse cursor is placed over pad 294 and the button released, with a resulting interconnecting line 302 appearing as shown in FIG. 52. The selectable compatible pads return to their original image. In a color display, the potential target pads can also be given a different color to further highlight them.

Figure 53:
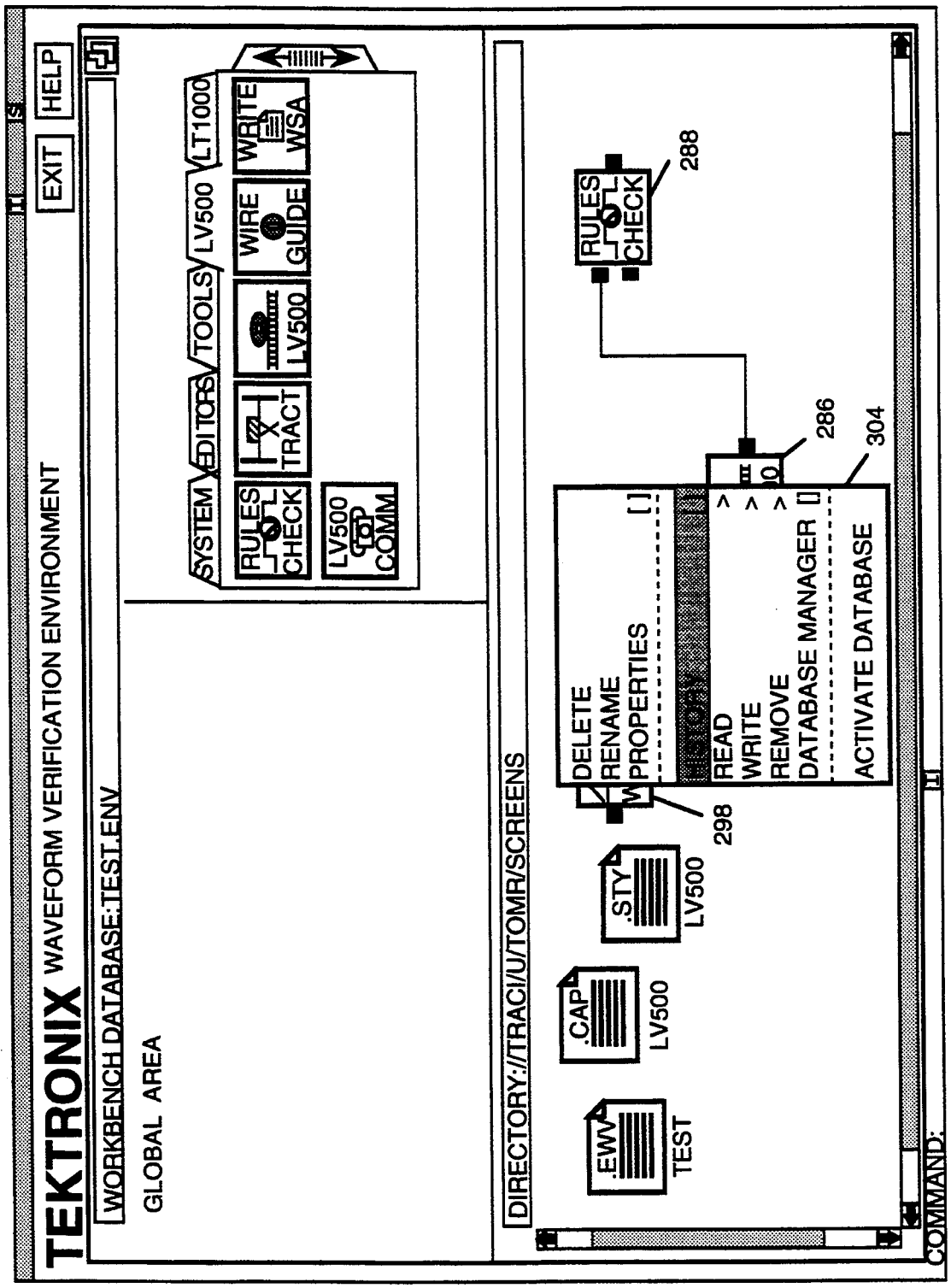
FIG. 53 shows a menu for selecting the history data of a data base.
Figure 54:
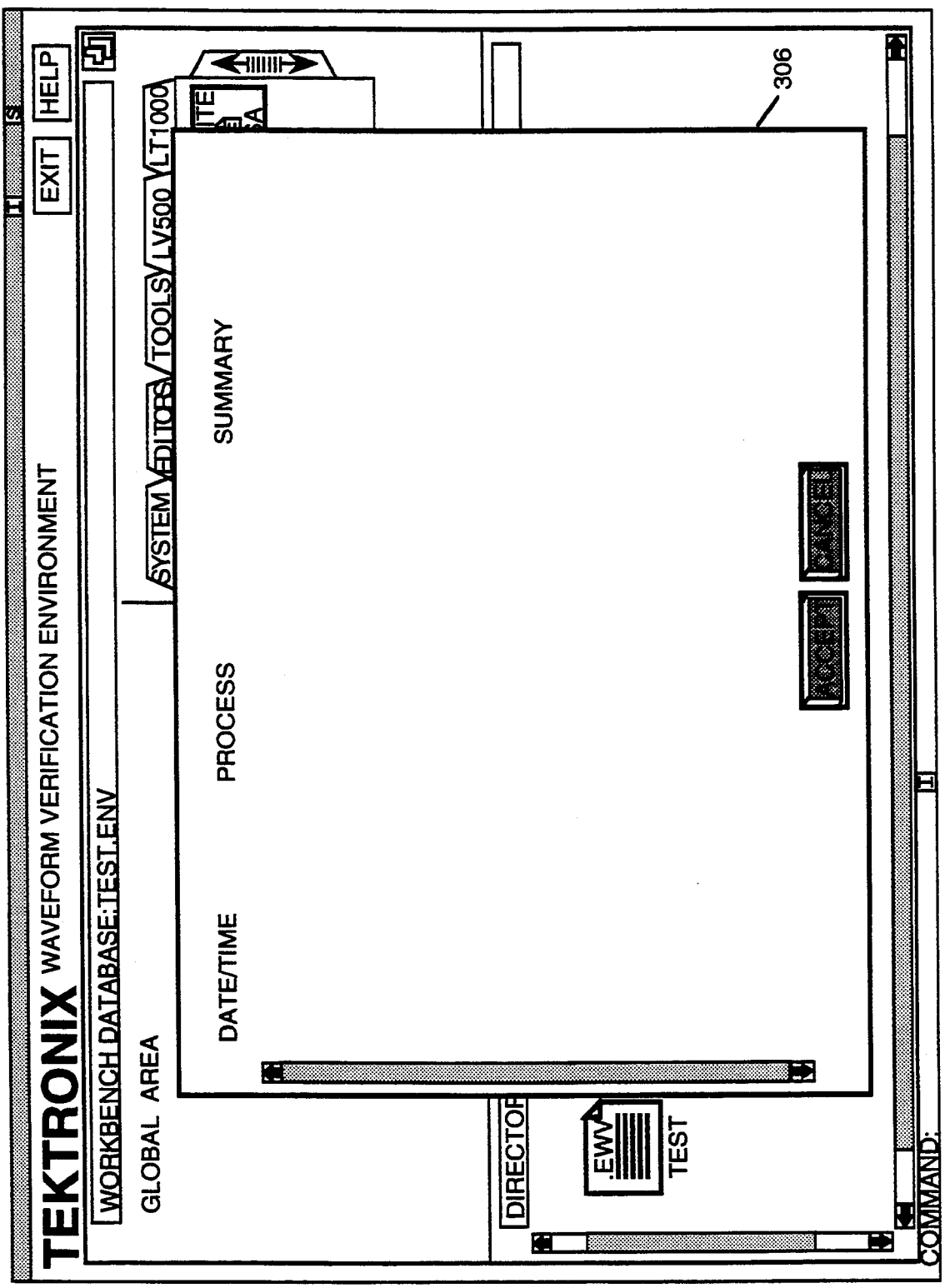
FIG. 54 shows the history data selected in FIG. 53.

A history file associated with the WAVES data base is accessed by menu 304 in FIG. 53. In this menu the history option is selected and highlighted. As a result, the history file is displayed in box 306 in FIG. 54. There are no entries in the data base history at this time.

Figure 55:
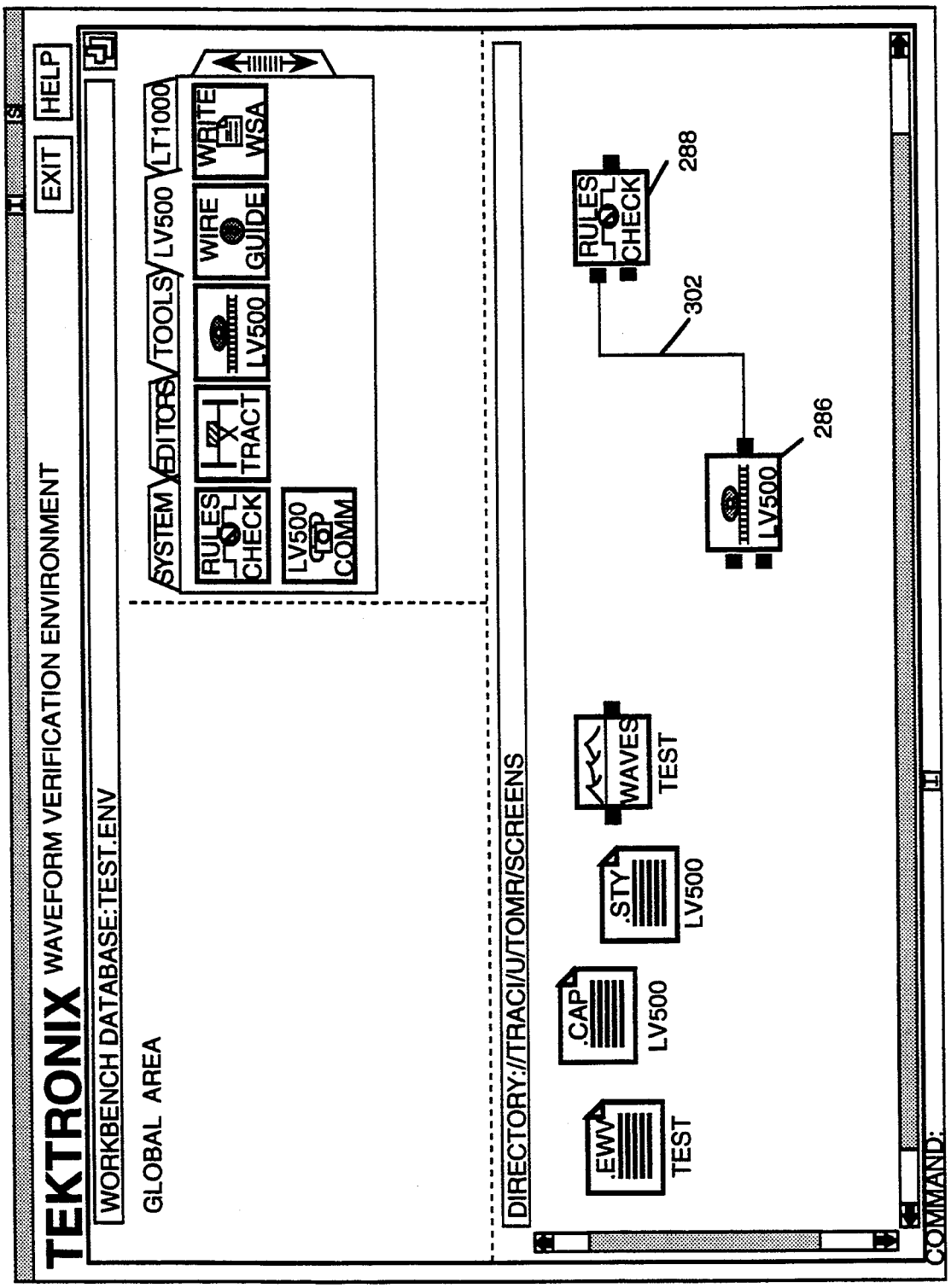
FIG. 55 is similar to FIG. 52 but shows an unsuccessful completion of an execution of an icon-defined program.

By executing the process represented by the connected icons in FIG. 52, it is found that satisfactory completion of these icons was not achieved. As a result as shown in FIG. 55, icons 286 and 288 are given a reverse highlighting image, which in a color monitor would be an alternative color, such as red, to show the operating status of these programs. The operating status, thus, is displayed as a graphical, rather than textual, indication. This immediately alerts the engineer that these programs were not executable in their present form.

Figure 56:
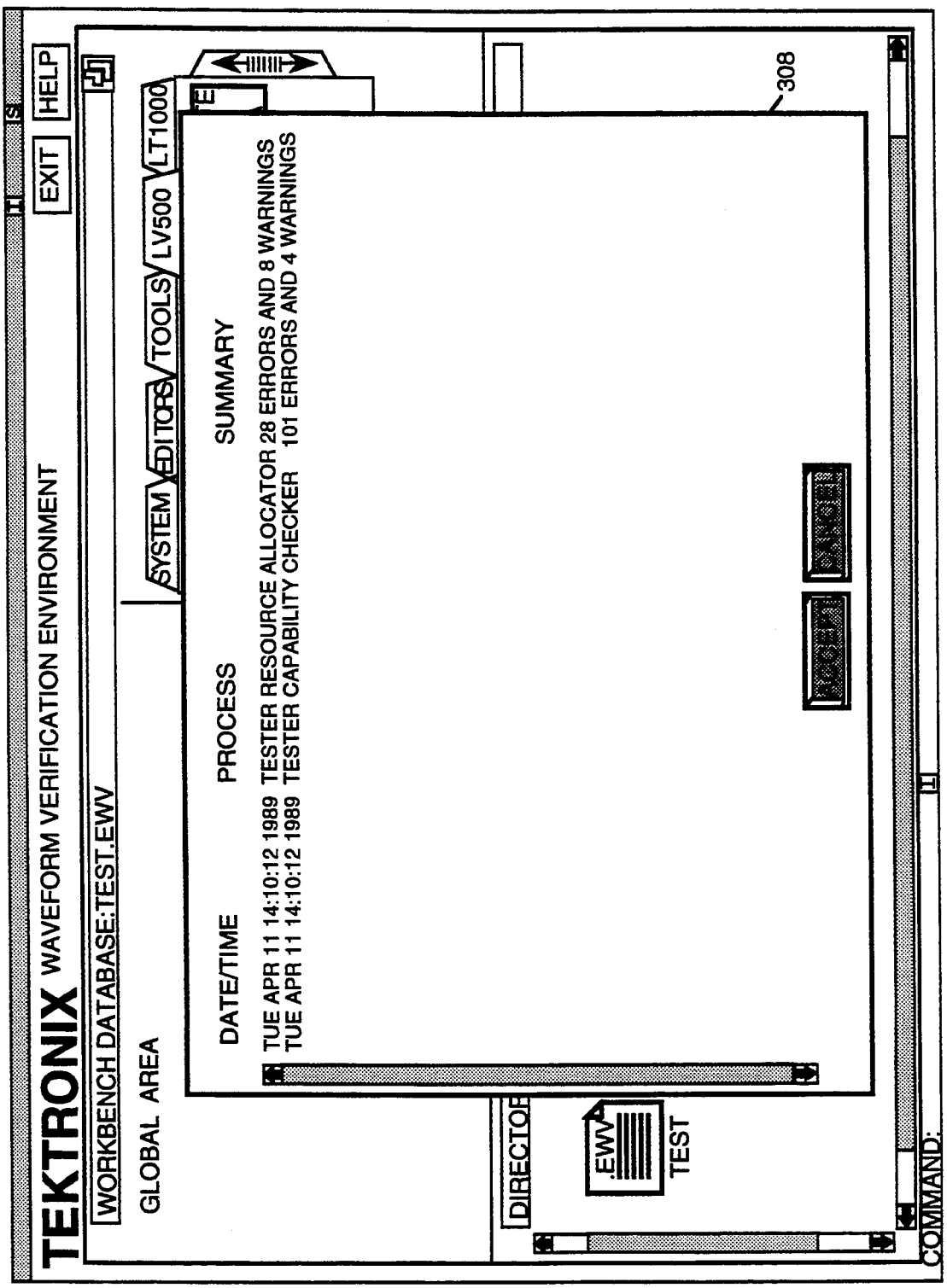
FIG. 56 shows updated history data resulting from the attempted execution of the icon-defined program.

In order to determine the status of the attempted execution, the data base history is requested as described previously, resulting in the display of a box 308 shown in FIG. 56. The tester resource allocator, represented by icon 286, has 20 errors and the tester capability checker, represented by icon 288, has 101 errors.

Figure 57:
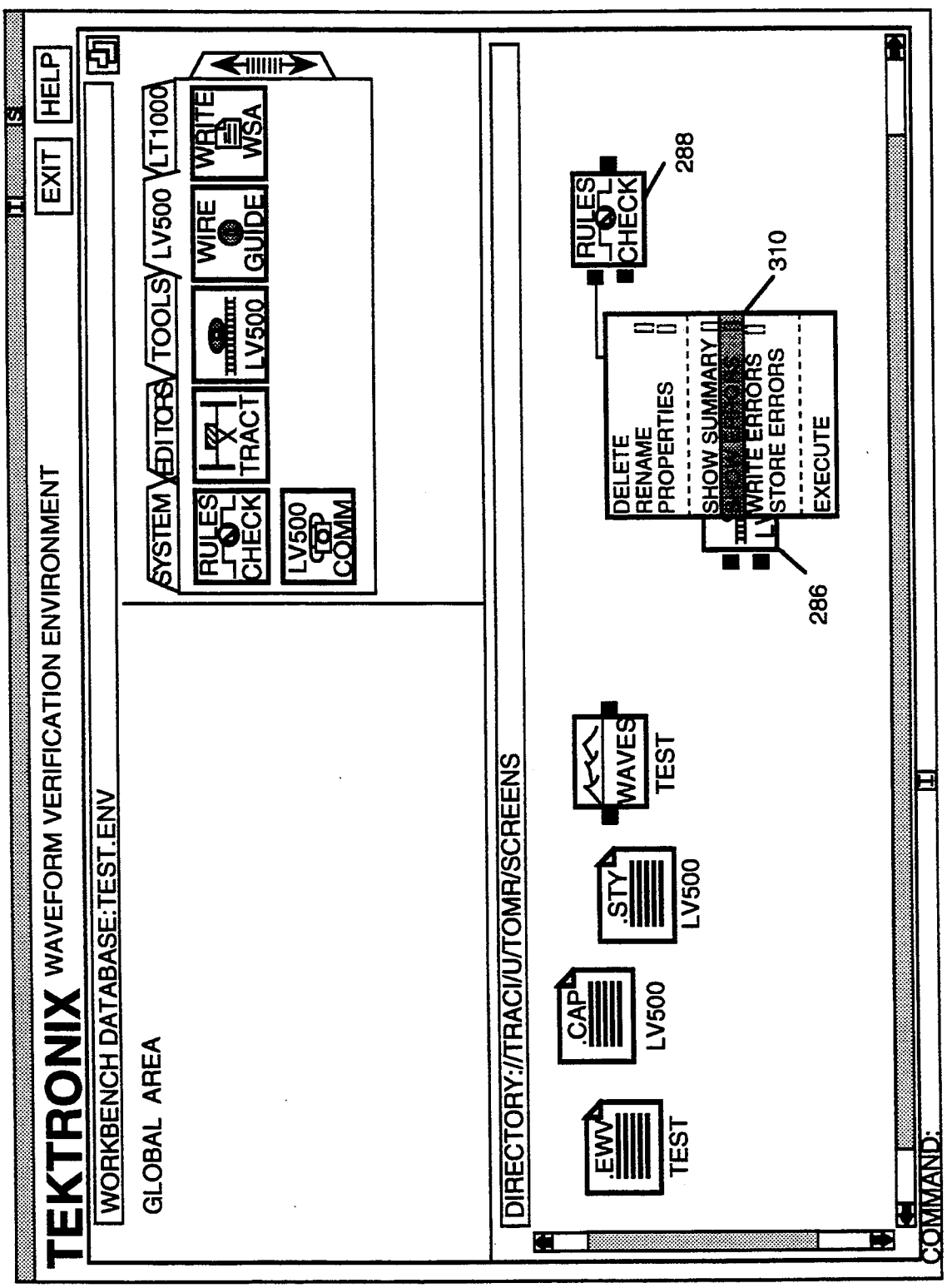
FIG. 57 shows a menu requesting a list of errors.
Figure 58:
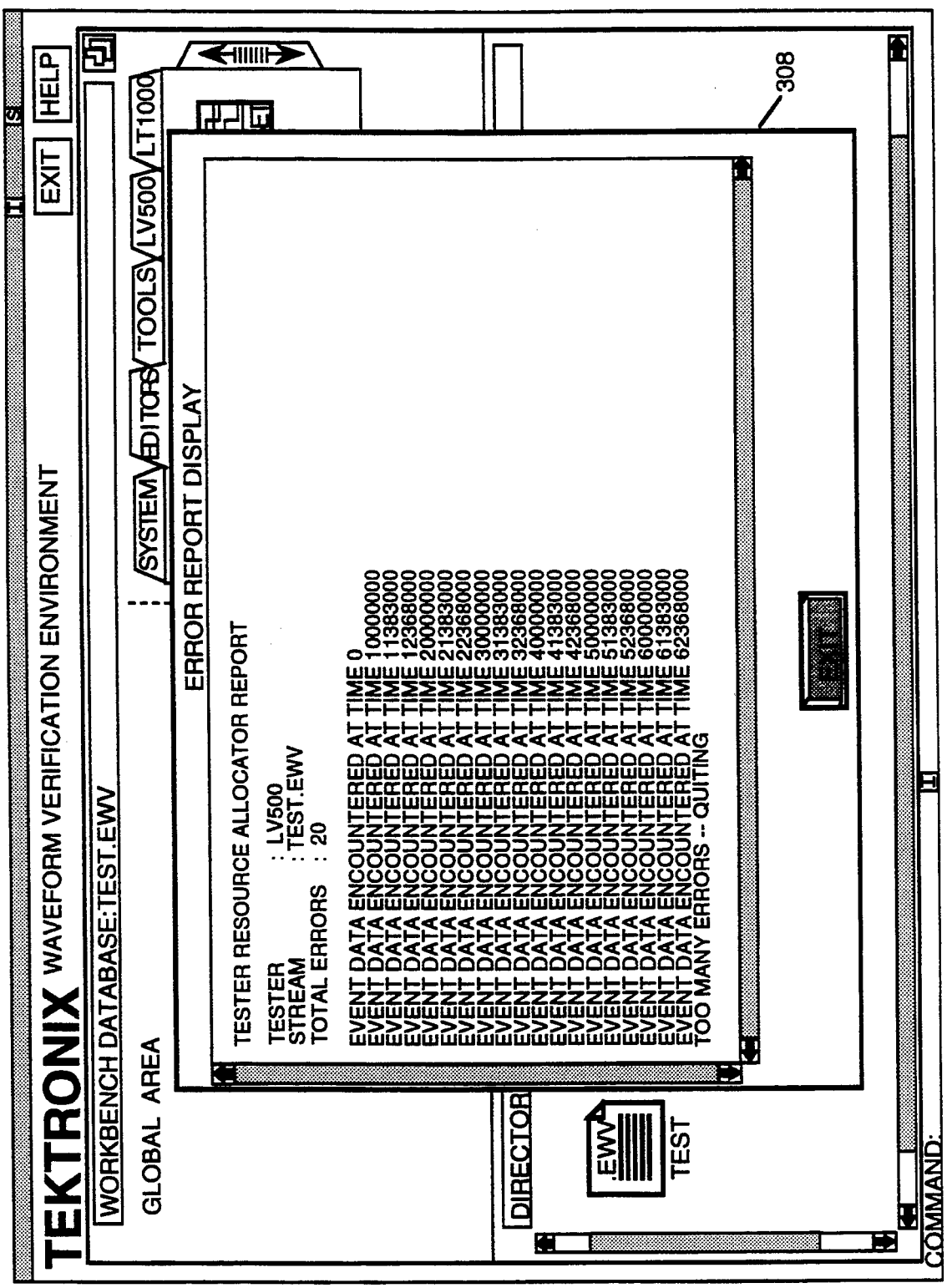
FIG. 58 shows the list of errors selected in FIG. 57.

The specific type of errors encountered can be determined by locating the mouse cursor over a selected icon and retrieving the associated menu, such as menu 310 in FIG. 57. The error report display is selected and shown in box 312 in FIG. 58. In this case, the data base only consisted of event data and did not have timeset assignments made. Thus, at each waveform transition, event data was encountered. If the data base with timeset assignments completed as illustrated in FIG. 49 had been used, these errors would not have been encountered.

Figure 59:
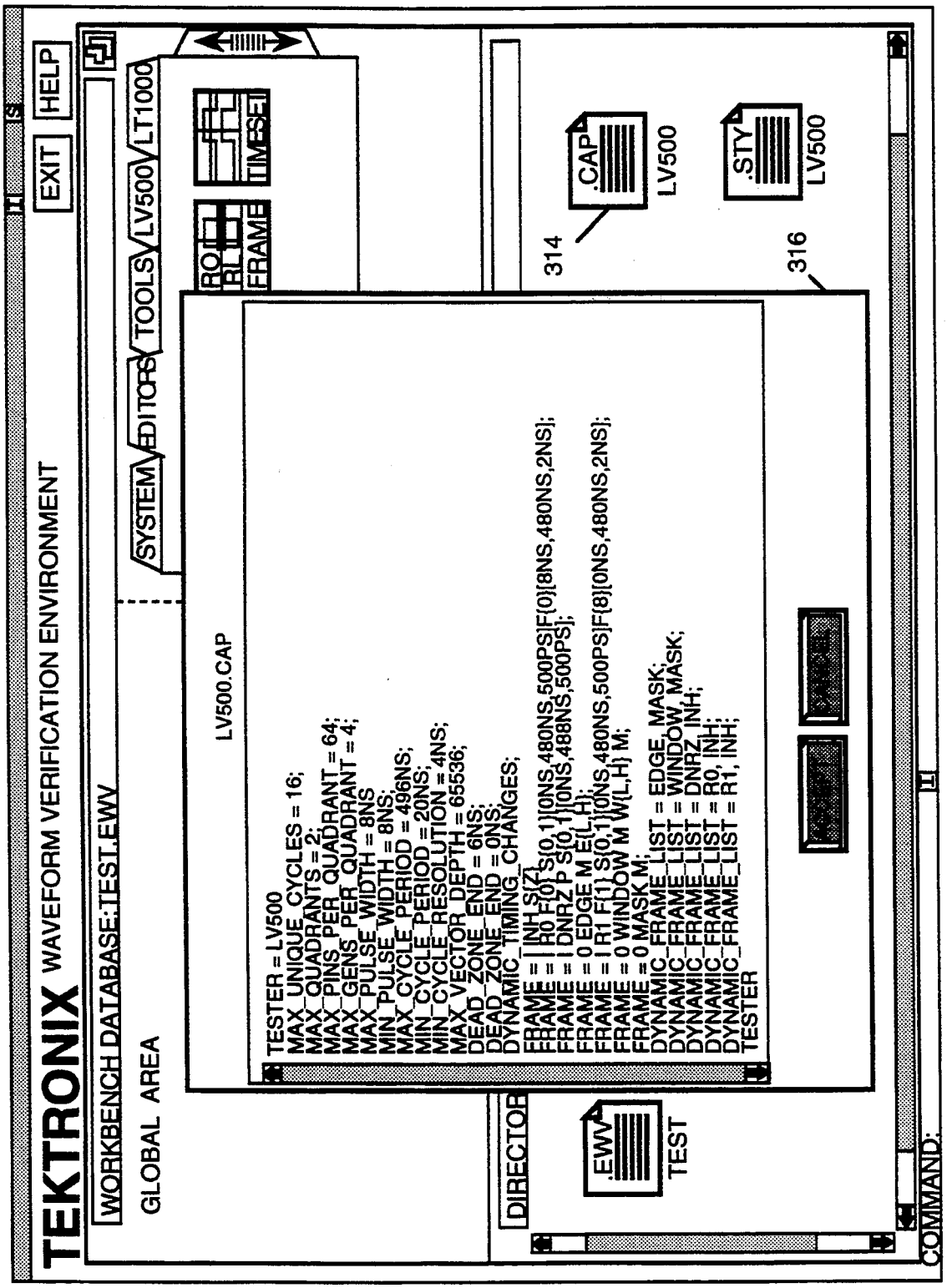
FIG. 59 shows a listing of a tester capabilities file.

Once an acceptable data base is obtained, it is necessary to determine whether the tester is capable of generating the selected waveforms. Data base evaluations are made using the rules checker subroutine which accesses the tester capabilities file represented by icon 314 and listed in box 316 in FIG. 59. This file lists the various operating parameter requirements of the tester, including frame definitions using both the variable name required by the tester and the frame definitions using the frame generation language described previously.

Figure 60:
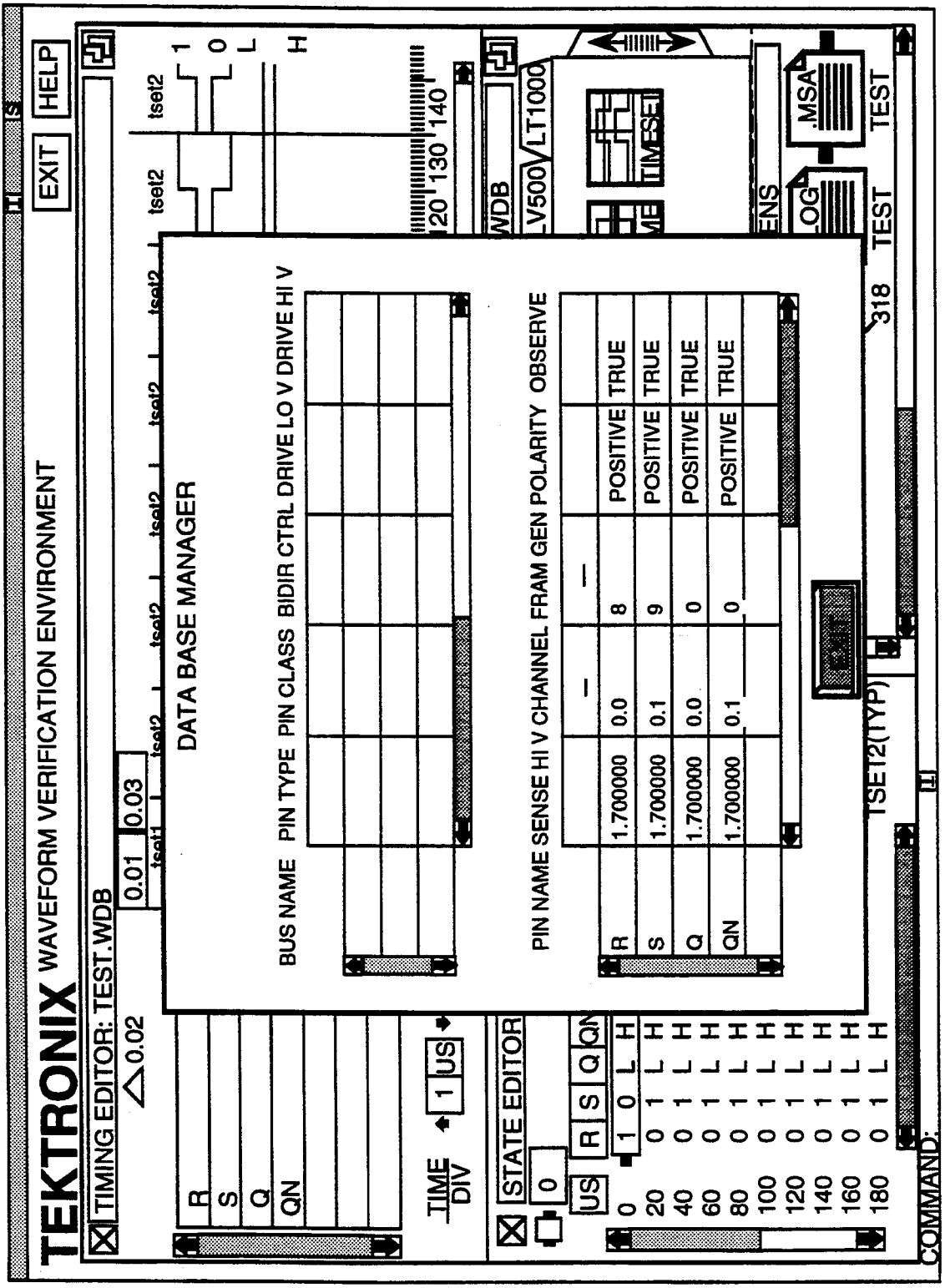
FIG. 60 shows a data base manager table used for defining signals and assigning them to tester channels or viewing automatically generated assignments.

FIG. 60 illustrates a data base manager dialog box 318 used to enter new signal names into the data base or to change signal or bus names and signal characteristics that already have been entered. The data base manager dialog box is available from the editor title bar menu in every editor, the signal display list and the timing, state and timeset editors, and from the data base icon menu on the workbench.

The illustration shown in FIG. 60 does not show all of the information contained within the data base manager dialog box but it does show the types of information that is provided. This information includes the actual signal levels occurring on the signals, the tester channel number to which they have been assigned (identified by channel section and channel number within a section), a frame generator of the tester which is assigned for generating the frame associated with the signal, the polarities and the observed values. Further where several signals have the same information associated with them they may be included under a bus in the upper box.

Figure 61:
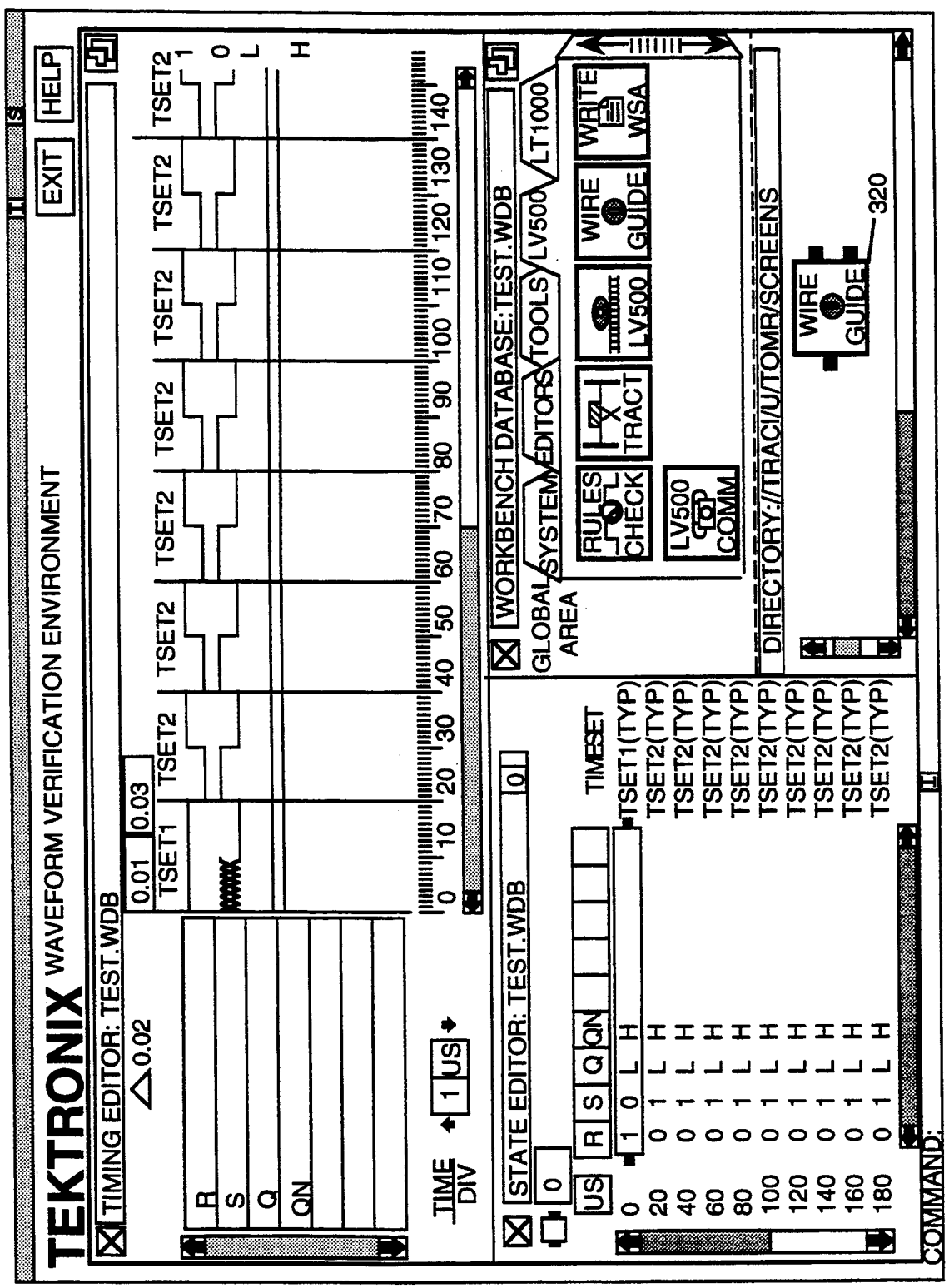
FIG. 61 shows placement of a wire guide icon in a directory area of the workbench editor.
Figure 62:
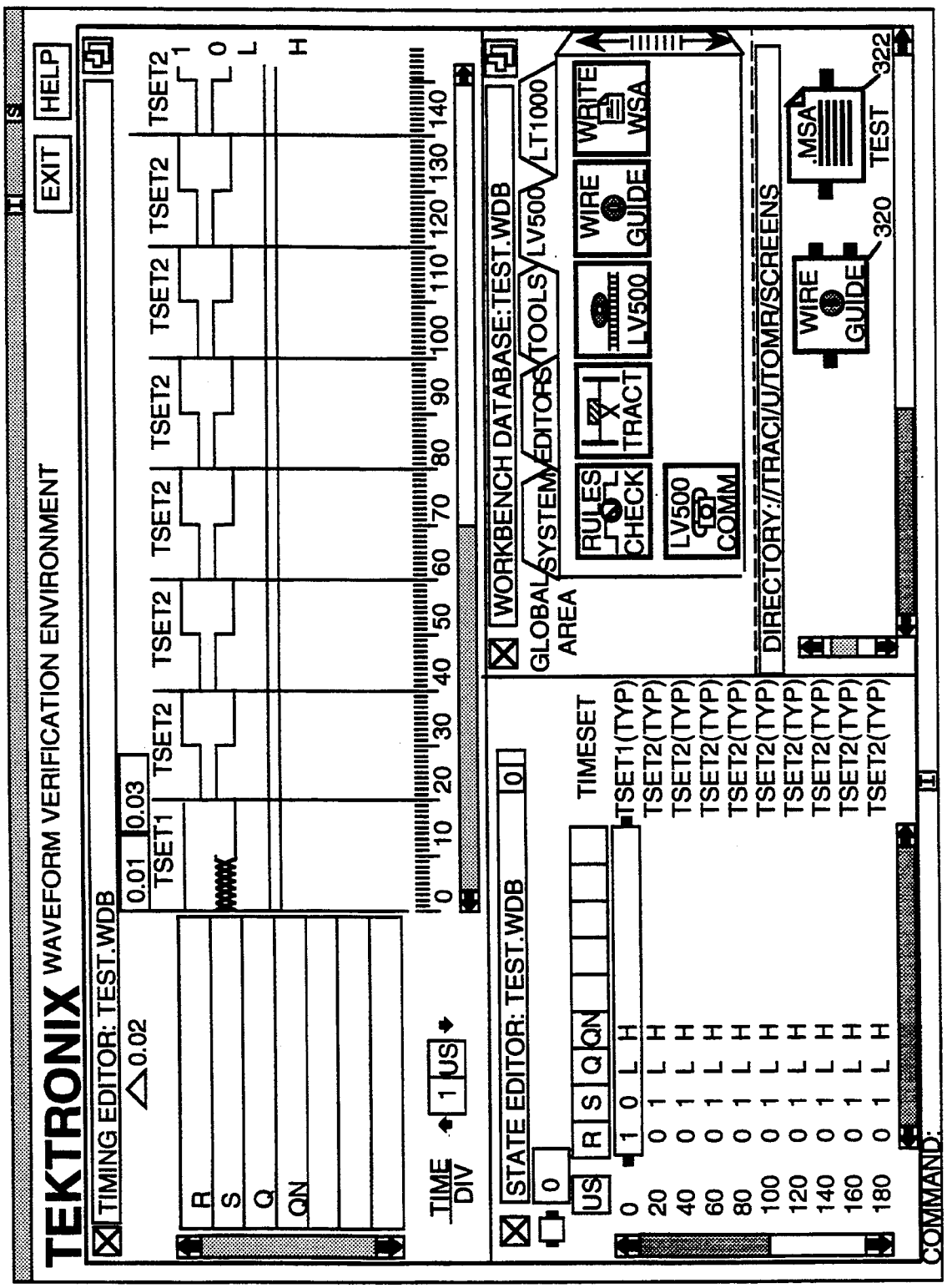
FIG. 62 adds to FIG. 61 the wiring assignment file to the directory area.
Figure 63:
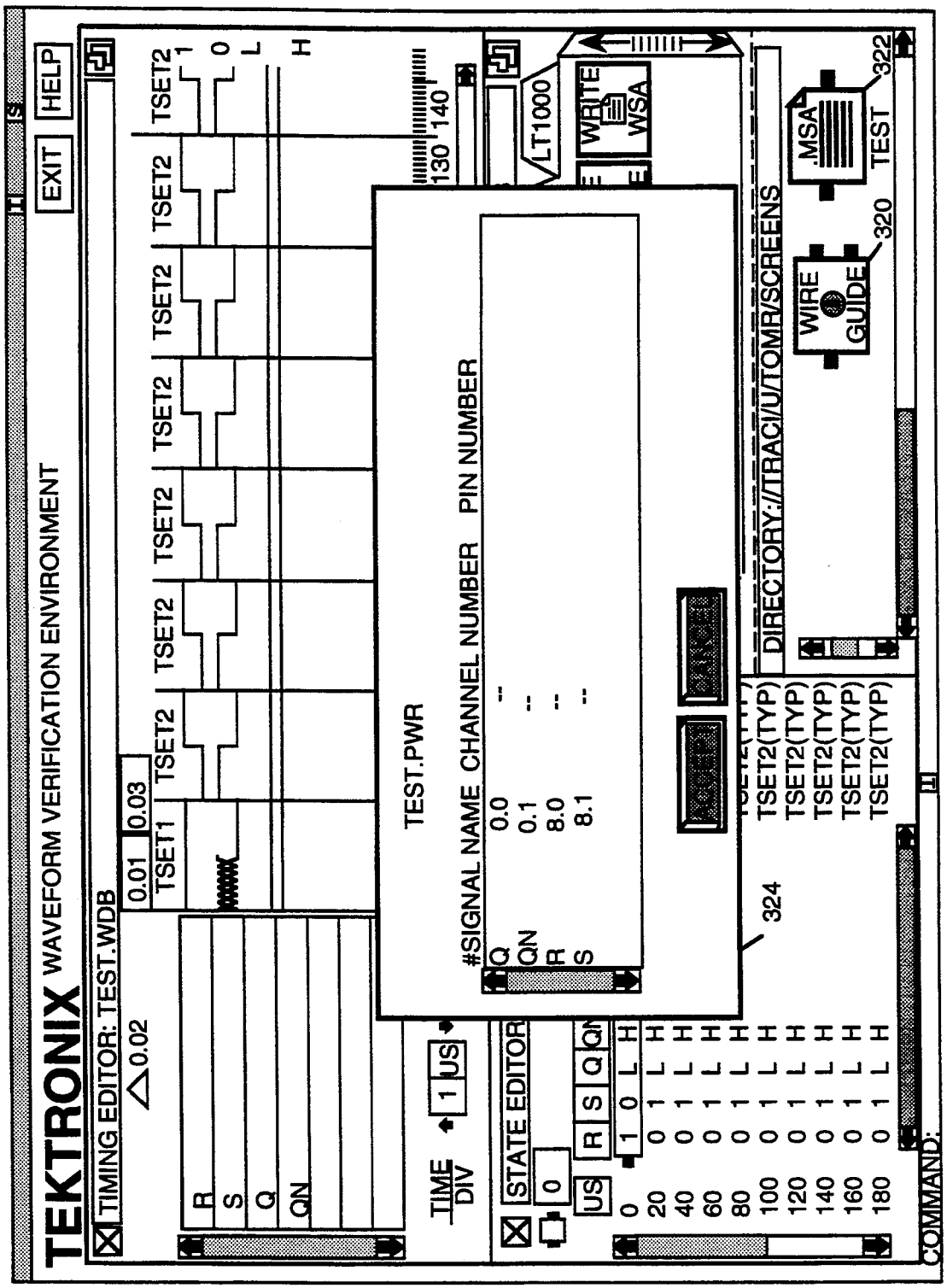
FIG. 63 displays the wiring assignment file contents.

System 100 also provides for generating a fixture report. This report is generated by executing WIRE GUIDE icon 320 which first must be inserted into the directory workbench, shown in FIG. 61. This report generator writes a fixture wiring file that lists the requisite device pin-to-tester channel wiring assignments. A wiring file, identified as PWR icon 322 in FIG. 62, stores the generated report. Execution of wire guide icon 320 results in generation of the fixture report shown in box 324 in FIG. 63. This report lists for each signal the assigned channel number and pin number, if it has been assigned. In this case the pin number assignments have not been made.

Figure 64:
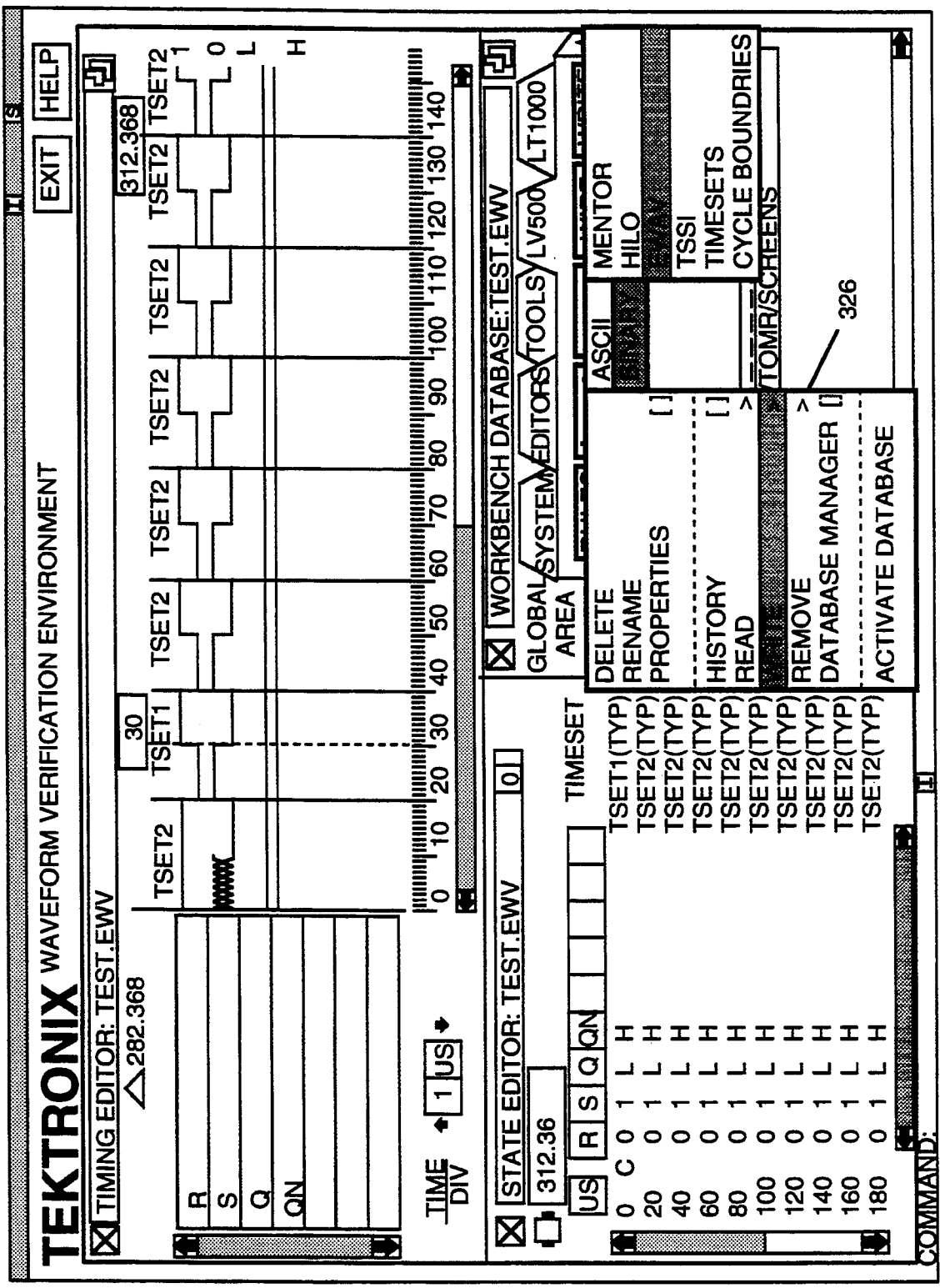
FIG. 64 displays a menu used to write or convert a data base into a simulator-compatible format.

Before actually preparing a test program, it is often desirable to resimulate a test data base to determine that it still complies with the design requirements as determined by a simulator, and to verify the expected responses of any new vectors. In this situation, the data base file can be written to a simulator, such as shown by a menu 326 illustrated in FIG. 64. By selecting the highlighted options in this menu, ASCII data is being written to an EWAV format file for resimulation. The data could be written to other simulation files as well. The material which is transferred is in event format but maintains the same waveform information inherent in the timeset data.

Figure 65:
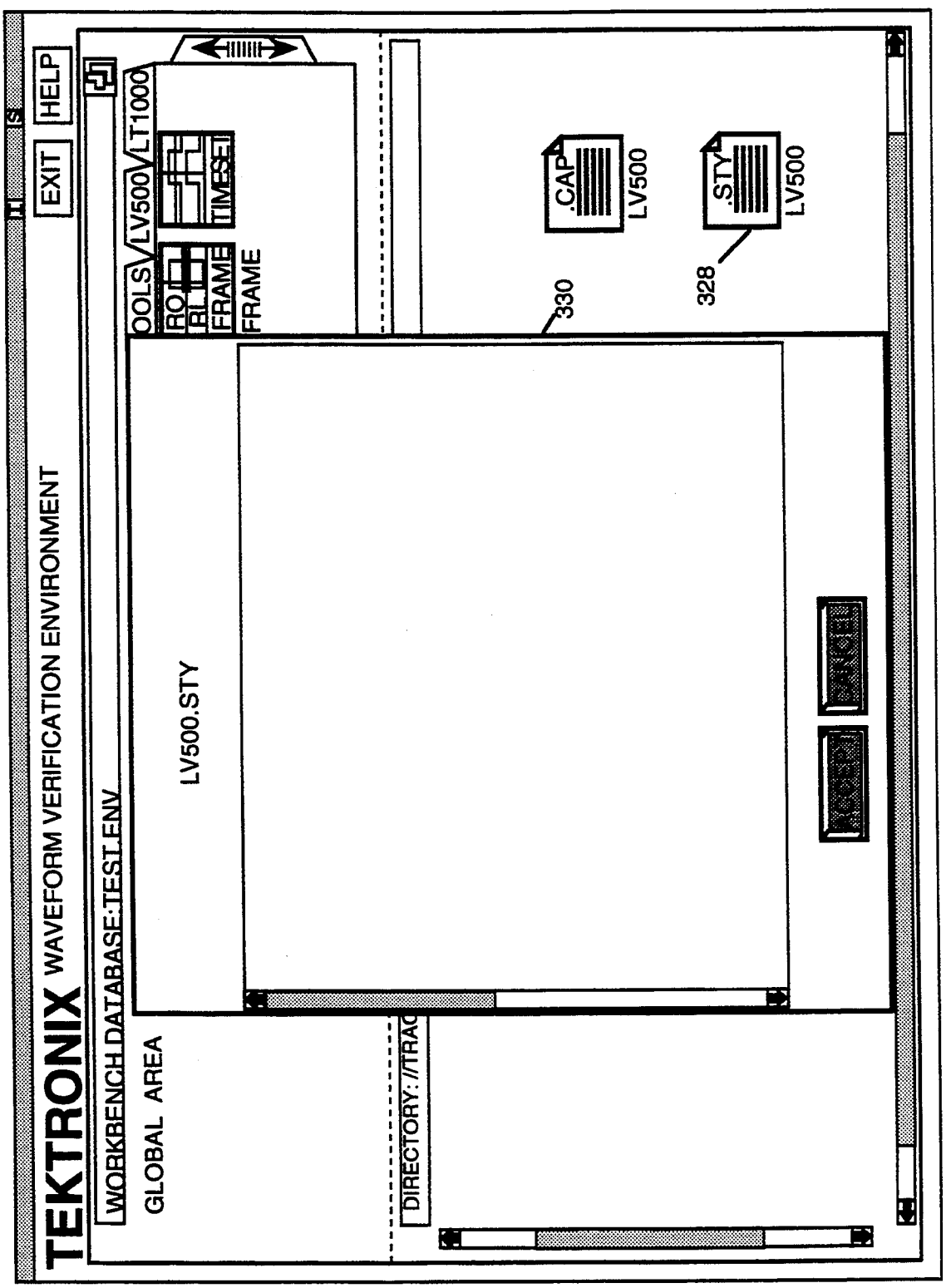
FIG. 65 illustrates the contents of a style sheet used in the formation of a test file.
Figure 66:
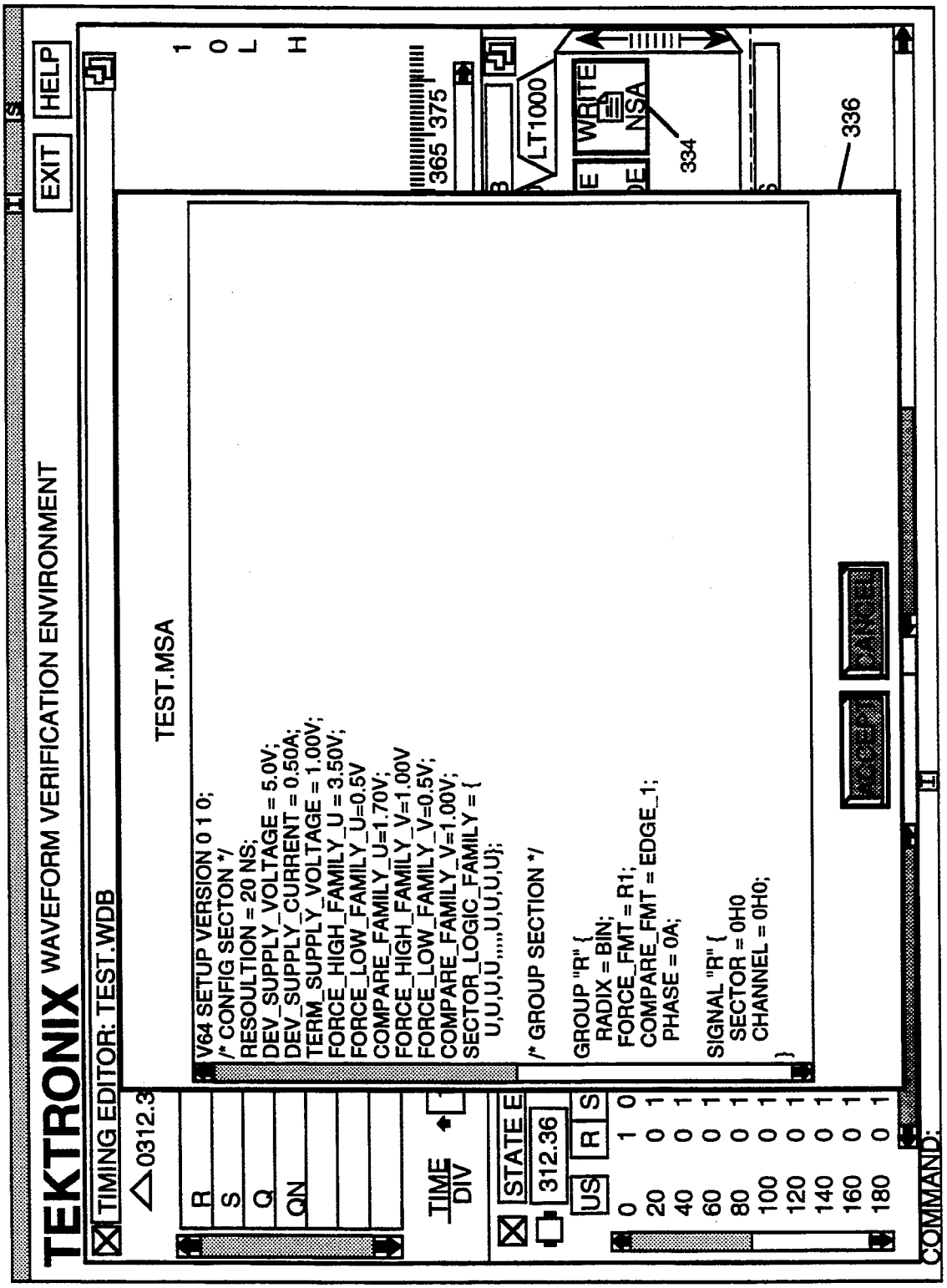
FIG. 66 illustrates a portion of the contents of a test program.

Once the designer is satisfied that the test data is consistent with design objectives, a test program is generated. In order to do this, a style sheet is prepared, as stored in a file represented by STY icon 328 and listed in a box 330 in FIG. 65. It will be noted in this box that the values and functions associated with the style sheet are enclosed in dollar signs. Thus, the values for this style sheet can be varied in a second file while maintaining the format and contents of this style sheet which is customized to fit the particular tester. The values are determined from the tester capabilities file and the data base manager file. These in conjunction with the style sheet are used to generate the test program by executing a copy of the WRITE MSA icon 334 shown in FIG. 66. This results in the writing of an MSA test file shown in box 336 in FIG. 66. The test file is transferred to the tester, in this case to the LV500 tester, using the communications subroutine represented by LV500 COMM icon 338, partially identified in FIG. 67.

DETAILED DESCRIPTION OF OPERATION

The following is a detailed description of operation of the present invention. Hereinafter the operator is referred to in the second person as "you".

Description of TekWAVES 1.0

It is assumed a color monitor is employed. References are made herein to colors of items that appear in Tek-WAVES. This should not cause any confusion for those with monochrome (black and white) screens, as there are always other descriptions of those particular objects.

In situations where you are to supply a name of a file by typing it into the system, italics show what you provide, and regular font the extension you must use. For example, in nameoffile.sgl, you can use any name for the nameoffile, but you must attach the. sgl extension for the Signal List File format. TekWAVES 1.0 is a single software package that runs on an Apollo workstation. With TekWAVES you can create, view, and manipulate digital stimulus vectors, and acquire and download test programs to and from a tester. You can compare the simulations of an electrical schematic with the actual output of an integrated circuit, or chip.

A normal design process could have you feed input vectors into a simulator (outside of TekWAVES), which produces data. These data are expected output because they are what you expect the actual fabricated chip to output. You then take the input vectors and the expected output to a tester with the DeviceUnder- Test, or DUT, which i,s an actual fabricated chip. The tester and the DUT produce actual output. In this scenario, you would then compare the actual output from the DUT with the expected output. You then take the results of the comparison and, if necessary, modify the vector data and run it back through the simulator. This process then can be repeated until you reach a satisfactory simulation or design.

TekWAVES merges the design function with the test function by enabling you to create stimulus vectors for a DUT from simulator data, modify specific waveform events and state characteristics to legal states or events of a tester or simulator, create a test program for a specific tester, simulate the results of a tester through timesets and timing generators, and re-simulate a circuit design with the help of readers and writers to and from simulators.

TekWAVES Databases, Workbench, and Editors

TekWAVES Databases

The basic group of data that you manipulate in Tek-WAVES is in the form of a TekWAVES database, which is, at the minimum, a collection of electrical signals in event and state format. This database can be in any of several specific formats. You move the database from editor to editor,,from process to process, and manipulate it through the Database Manager. These system components are described in detail in their respective sections herein. The most common flow of the database is:

1) from a simulator, into a database format;
2) through the filters on the tools card, often in the order in which they appear on the card, to help in the transfer from event data into state data;
3) into the rules check and timeset extraction processes on the tester card (the LV500 has the most complete support in Release 1.0) to simulate the target tester;
4) downloading the test program into the tester, and then obtaining actual output;
5) uploading the actual output into TekWAVES, and viewing the data in the editors;
6) removing the timesets, and modifying the waveforms and states to improve functionality and performance of the data; and
7) resimulating the schematic.

WorkBench

Workbench control includes: control of the editors, test program generation, database manipulation, tester simulation, data flow program generation and execution, and file manipulation.

Editors

TekWAVES has four editors. You can have several versions of each editor, using each to edit a different database, or one editor to edit different databases, all in a single work session. The editors are the: Timing Editor, which displays and manipulates digital waveforms; State Editor, which displays, creates, and manipulates digital event or state vectors; Frame Editor, which displays, creates, and modifies time frames, which can be tailored to an individual tester; and the Timeset Editor, which displays, creates, and manipulates a group of frames made by frame generators. The editors work in conjunction with one another and communicate via a common database to solve problems that relate to design, verification, and production tests.

Starting TekWAVES

To start the TekWAVES system, type tekwaves to create a new, full-size window, or tekwaves -w in a window that is large enough to contain the editors the application requires (usually approximately one-third of the screen). The start-up options are:

Usage: tekwaves {option}
options
  -h prints this message
  -w opens TekWAVES in the current window
  -v prints product version If the window is too small to display the Workbench area, TekWAVES displays the company logo.

Features of the TekWAVES Environment

Help

On-line help is available throughout TekWAVES. When you press the right mouse button, the system displays a menu that contains information. The help menu varies depending on whether you are in the workbench or one of the editors. Each editor has a specific help menu. To get a complete list of the hierarchy of help, place the cursor on the corporate title bar and press the right mouse button. Selecting the Help Button, located on the screen display at the far right of the TekWAVES title bar, brings up text that describes the help system.

Mouse and Cursors

A mouse click is pressing the left mouse button and quickly releasing it, and causes an object to switch or rotate through a sequence of states. A double click activates an object on the workbench. You select an item by placing the cursor arrow over the item, and pressing and releasing the left mouse button. Selecting an item causes different actions depending on the item. If you put the cursor on a movable item, hold down the left mouse button, and move it around the screen, you are dragging it. A scroll box inside of a scroll bar, and icons on the Workbench, are a few of the objects you can drag.

Slide Icon

The Slide Icon represents a file of a captured screen display. If you press the middle mouse button while the cursor is on the title bar of the workbench or the editors, the system displays a menu. The menu has a Snapshot option, which you can choose. The system then captures the screen display. The system then creates a Slide Icon on the workbench, and gives it a name corresponding to the type of display that you captured. The system appends a number to the name that increases with each snapshot. You can change the name by placing the cursor on the slide icon and entering a new name, or by selecting Rename from the browser menu of the icon and editing the name of the slide. To open a slide, place the cursor of the mouse on the icon when the icon is on the workbench. Then, double-click the left mouse button, and the slide opens. The slide has a title bar, containing, on the left, SnapShot: name ofSlide and a close button on the left. Selecting the close button closes the slide, and restores the previous underlying image. Pressing the middle mouse button while the cursor is on a Slide Icon displays the following menu:

Delete—removes the Slide Icon.
Rename—enables you to change the name of the slide.
Display—same action as a double-click on the icon; displays the slide in the TekWAVES window.

Menus

The middle and right buttons on the mouse enable you to open two different types of menus. Pressing the middle mouse button while the cursor is on the icon produces browser menus. You use browser menus to manipulate your data. When you press the middle mouse button over the title bar of an editor, TekWAVES draws a menu specific to that editor. The middle mouse button menu of the editor enables the control of various activities from choices that you make by releasing the button over a particular item. When you press the middle mouse button while the cursor is on an object, if there is a particular text field, or icon on the workbench, associated with the menu, the system highlights the item while the menu is up. Pressing the right mouse button produces help menus. When you press the right mouse button in an editor, TekWAVES displays a menu that shows a list of the on-line help. The help is specific to that editor. You can see the entire hierarchy of help when you press the right mouse button while the cursor is on the corporate title bar of TekWAVES. You can display different types of menus by pressing the middle or right mouse button. Both types of menus share the following characteristics. The first line of the menu is the name of the menu. An arrowhead (>) to the right of a menu choice indicates there is a submenu. You can see the sub-menu by moving the cursor to the right of the selection, over the arrow. Releasing the button on the item with the arrowhead does not select the item; you must continue to the final menu to make a selection. Square brackets ([]) at the right edge of a menu item indicate that if you select the item, TekWAVES will ask for more information from you through a dialog box before it takes any action. Menu items without arrows or brackets cause immediate action. By moving off the left edge of a submenu, the submenu disappears, and the cursor jumps to the previous menu. By moving completely off the menu and releasing the middle mouse button, you make no selection. If you move the cursor outside the TekWAVES window, you make no selection. If you put the cursor on an icon and press the middle mouse button, and then select the bottom item in the menu of the icon, it always has the same function as double-clicking the icon.

Editor Windows

All TekWAVES editor windows have several features in common. Each editor window has a gray title bar across the top that contains the name of the editor and the name of the database the editor is currently displaying. To the right of the title bar of the editor, and in the upper right corner of every editor window, is an expansion button. Selecting the button expands the editor to fill the entire window. A subsequent selection of the expansion button returns the editor to its original size and location. In the upper left corner of the window of each editor, to the left of the title bar, is a close button. Selecting this button closes the editor, and TekWAVES redraws other editors to expand into the newly available space.

Corporate Title Bar

After TekWAVES boots, it displays the blue corporate title bar at the very top of the TekWAVES window. The workbench button is to the left of the exit button on the corporate title bar, if the workbench is closed. Closing the workbench allows other editors to expand into its space. After the workbench closes, you can open it again by selecting the workbench button in the TekWAVES corporate title bar. The button on the far right of the corporate title bar, to the left of the help button, is the exit button. When you select it, TekWAVES saves the current configuration and closes its windows.

Dialog Boxes

Dialog boxes are one of the ways you can communicate with TekWAVES. The system displays a dialog box after you select an item that has with square brackets ([]) in a menu. Dialog boxes may alert you of errors, give you other useful information about the system, or request information from you. All dialog boxes contain at least one button at the bottom of the dialog box window, which you can select to close the dialog box and possibly take action as you decide. The most common dialog box buttons are ACCEPT and CANCEL. When you select the ACCEPT button, you close the dialog box, and store and use the values in it. Selecting the CANCEL button indicates that you want to close the dialog box, and the system does not take any action (so nothing is saved). Dialog boxes that alert you of errors usually contain a few lines of text and an exit button. If you select the exit button of the Database Manager, it accepts any changes made to the database through it.

Text Fields

A text field is most often bordered by a box on the screen. The state fields, time fields, and timeset fields of the State Editor are also text fields, but they do not have boxes surrounding them. If you put the cursor in a text field and click the left mouse button, the system displays a text cursor, which is a green vertical line. When you type in a text field, characters to appear in the text field before the text cursor. Press return to have the text editor accept the text entry. You can move the text cursor with a selection in the text field. If all of the text in a field is not visible at one time, you can scroll the text field with the left and right arrow keys. If there is no text cursor visible in a text field (no left mouse click in the text field), TekWAVES deletes the current text in the field, and a text cursor appears after you enter the characters. Backspaces in the text field erase any characters before the cursor. You can use left and right arrow keys to move the text cursor in a text field to the previous or next character. You quit text entry with a carriage return or a tab. If you move the cursor outside the text field, the system ignores whatever text you have entered. If you leave a text field with a carriage return, the cursor jumps to the text field below, if there is one. If you enter a tab, the cursor jumps horizontally to the next text field, if there is one. When the cursor is at the edge of the screen, the screen automatically scrolls and pans if there is additional information available off-screen. If there is no additional information, however, the cursor does not move. You can use the page up, page down, page right, and page left keys to duplicate screen-width scrolling or panning, as described in the section on scroll bars. (See the Text Icon section in the System Card chapter for an illustration.)

Scroll Bars

Scroll bars consist of either vertical or horizontal scroll bar shafts with arrows on each end, and scroll boxes between the two arrows. The size of the scroll box varies depending on the type of data the editor displays, and the total amount of data. The ratio of the scroll box size to the scroll bar shaft size is the same as the ratio of the amount of data the editor displays to the total amount of data. If the editor displays 10% of the data, the scroll box fills approximately 100/o of the scroll bar shaft. If the editor displays all of the data, the scroll box fills the scroll bar shaft. However, there always is space available in the editor to add new data.

Panning Windows

Selecting either arrow on a scroll bar causes the window to scroll by 10%. If you hold down the left mouse button, the window continuously scrolls by 10% increments. Selecting either space around a scroll box, within the scroll bar shaft, causes the window to scroll by a screen-width in the direction you specify. Dragging on the scroll box enables you to move the window. In the workbench directory area, you can scroll up to one half page past the current icons in every direction.

Database Manager

The Database Manager enables you to add or delete new signal or bus names in the database, or to change signal or bus names and signal characteristics that already exist. You can also use the dialog box for setting many signal characteristics with essential information for the test program generation process. The Database Manager is available from title bar menu of each editor, the signal name menu in the Timing, State, and Timeset editors, and the menu of the Database Icon (on the System Card).

The Database Manager has two scrolling areas. The top area shows all bus signals. The box also lists each of these individual signals in the lower half of the display. You can edit the available signal names by using a middle mouse button menu over the signal list field and selecting Delete or Rename, or by typing the name of a new bus or individual pin in the next available slot, in the appropriate area. The Database Manager enables you to tailor your signals to specifics of a component, such as which pin numbers correspond to which signal names, and so on. You set the individual signals in each bus with values. If you edit the individual signals so all the signals in the bus do not have the same characteristic, the text field is mixed. You can then examine each signal separately for information. Editing a mixed field causes all the signals in the bus to be the same value. You can add signals by typing in the name of a new signal in the next available slot; you can rename signals by choosing Rename from the popup menu and filling in the dialog box; or, you can delete signals by pressing the middle mouse button while the cursor is on the signal named and then choosing the menu item Delete.

The Database Manager enables you to set the following information for each bus: signal type (input, output, bidirectional, power, ground), signal class (primary, internal, external), bidirectional control (direction specification signal), driving low voltage, driving high voltage, sensing low voltage, sensing high voltage, polarity and observation mask. Voltages in the bus are in floating point numbers. You can edit all the other cells of the parameters by pressing the middle mouse button and choosing from the selections on the menu that appears.

Below the bus area is the information area for the individual signals. You can set the following information for each pin: signal name, pin number (can be alphanumeric), signal type (input, output, bidirectional, power, or ground) signal class (primary, internal, or external), bidirectional control (direction specification signal), driving low voltage, driving high voltage, sensing low voltage, sensing high voltage, channel, frame generator, polarity, and observation mask.

The individual frame generator is an integer. The individual pin can be alphanumeric. The format of the channel depends on the target tester for the database. You or the Tester Resource Allocator set the channel voltages of the LV500. They are set in an x.x format, where x is a hexadecimal value. All the cells of the other individual pins are specific parameters. You select them from the menu that you can display with a middle mouse button press.

Bidirectional SignaLs in the Database Manager

You can create bidirectional signals in two ways. You may insert a new signal by typing the signal name and setting the signal type to bidirectional. If a signal is bidirectional, it may also have an associated control signal within the database. Or you may add two unique signal names to the signal list, one as an input signal and the other as an output signal, each with the same pin number.

If you read a vector file into TekWAVES that is in any format but EWAV, you have to provide control signals for incoming bidirectional data by identifying another signal as the control signal, or by creating a control signal from scratch. The pin number field in the Database manager associates device pin numbers with specific signals. You have to map each device pin to one signal. Under some conditions, such as bidirectional, you can connect a pin to two or more signals, but otherwise this can create a device-damaging short. Control signals cannot have control signals. EWAV supports bidirectional signals, and does not need a control signal. However, if there is a bidirectional signal without control, then directionality comes from the actual signal. Also if there is a bidirectional signal with control, then the control overrides the actual signal. This can happen with a bidirectional signal that is in a file created by translating a file of a simulator.

Handling Bidirectional Signals in Non-EWAV Formats

TekWAVES databases can be in the following file formats: Tektronix EWAV or MSA, Mentor Graphics LOG, Genrad. CAP or .WDL, or TSSI.SEF. Bidirectional pins in Mentor Graphics, TSSI, and Genrad require special considerations. Mentor only has inputs, and not outputs; you need to change some signals to output and bidirectional in the Database Manager. But if you write out a file from the database as a Mentor file, you lose the directional information. You should, therefore, write out the database as a e%w (TekWAVES database) file to preserve the directional information, and continue with the wdb file through the test program generation process. Also bidirectional signals in TSSI files have to have specific control signals, and only bidirectional signals can have control signals. Each signal can have only one control signal. Genrad Hilo files need to have specific bidirectional, input, and output signals.

The TekWAVES Workbench

Workbench Help

You can receive on-line help about the workbench by placing your cursor anywhere on the workbench and pressing the right mouse button. The system then shows a list of topics which have explanations. After you bring up the list, or menu, move the cursor of your mouse through the list, highlighting the different topics. When you find the topic you want to have explained, highlight it with the mouse cursor, release the right mouse button, and the system displays the explanation. You can see the entire organization of online help in TekWAVES by placing the cursor of the mouse on the corporate title bar and pressing the right mouse button.

Workbench Areas

The workbench has several major parts: the title bar, the Global Area, the Card File, and the Directory Area.

Title Bar

The workbench contains a title bar that displays the name of the active database. Pressing the middle mouse button when the cursor is on the title bar of the workbench displays a list of all the databases available in the current workbench. Choosing a database from the list activates it. The system highlights the active Database Icon on the workbench (if the icon of that database is visible), and the name of the database appears in the title bar of the workbench. The Snapshot selection from the title bar menu creates a Slide Icon for archiving or printing the current workbench screen display.

Card File

The Card File resides on the upper right corner of the workbench. The Card File organizes tool clusters onto cards. Bach card contains a set of related tools, each with an iconic representation. The icons represent tools YOU can drag to one of the workbench areas. Selecting the tab of a card brings the card to the front. You rotate through the cards by selecting the knob of the Card File. You can also select and hold down the knob to rapidly scroll through the cards. The cards are the System, Editors, Tools, LV500, LT1000, DAS9200, File, and Translators.

Global Workbench

The Global Workbench area is to the left of the Card File. This is a relatively small workbench area on which you can place icons while you work in a Workbench Directory. You might instantiate editor icons on this space so you do not need instantiated editor icons in each directory you use in a work session. (See Icon Instantiation below.) You can also use this area as an intermediate clipboard when you want to move icons from one directory to another. There is one Global Area for TekWAVES. No matter what startup directory you use, you have access to the global area. You cannot scroll this area. (The system-level directory of the global area is /tekwaves/global.) You cannot wire icons (see Connecting Icons below) from the Global area to a Directory area.

Workbench Directory

The Workbench Directory area is the lower two-thirds of the workbench. It is your main working area on the workbench. The Workbench Directory is a particular directory in the workbench hierarchy of directories. The directory from which TekWAVES starts is the workbench directory is your startup directory. The name of the directory is at the top left of the Workbench Directory Area.

Workbench Directory Icon

When you drag a Workbench Icon onto either of the areas (global or directory) of the workbench, you also create a directory in the file system, which the icon represents. You can drag file and process icons into the Directory Icon and save them as a separately organized directory.

Icons

Icons in TekWAVES are representations of its data files and processes.

Locate Icon

Pressing the middle mouse button on an open workbench area brings up a Locate Icon menu specific to either the Global or Directory Workbench area (see below). This menu has a scrollable list of all the icons in the particular workbench area. When you select an icon, the system moves the directory or global display so the icon you selected is centered in the display, with the cursor resting upon the icon.

Icon Instantiation

You make an instance of an icon by dragging it from a card in the card file onto either the Workbench Global or Directory areas. Also, if you select an icon while it is still on its card, the system puts the icon on the Workbench Directory area. An icon can represent a file, a TekWAVES database, a workbench directory, a process, or an editor.

Icons and Their File Extensions

TekWAVES only represents files and directories as icons if they have TekWAVES extensions. An extension does not appear as part of an icon name, although it may be part of the icon itself. Ascii text file types include .txt (generic text file, with no special format expected), and .nts (notes). Simulation and tester files include: .ewv (ewav; Tektronix neutral event format), .msa (MSA format file), .wdl (HILO), .cap (HILO Capture file), .sef (MSI), .lsr (LASAR), .val (Valid), .dsy (Daisy), and .log (Mentor Graphics Log format file). TekWAVES database and directory files are: .Wkb (workbench directory icon), and .wdb (internal binary database file). Other types include: .fgl (TekWAVES Frame Generation Language; timeset and frame description Me), .smp (state mapping file for state replacement processes), .sed (cycle seeds), .pwr (wiring list), .qsl (qualification signal list) .sgl (signal list), .tcp (tester capabilities), .Sty (style sheet file; WRITE MSA uses files with this extension). You need to add the appropriate extension only if TekWAVES did not generate the file you are reading into Tekwaves. That is, Tek-WAVES automatically appends these extensions to its own files. You can edit all the ascii text files with the text editor, which comes up when you double-click on a icon of a text file.

Process Icons

The Tools Card and the Tester Cards all contain process icons. These icons represent processes that operate on specific TekWAVES databases, and, among other things ', you can use them in the process of converting event data to state data for a particular test program for a tester. The Tester Cards contain icons that perform tester-specific operations, and the processes on the Tools Card are for preparing the initial vectors for the conversion processes. The process icons are arranged on the cards in the order you most likely want to use them (from left to right). These icons have some common functionality. When you press the middle mouse button when the cursor is on a process icon, the system displays the following selections on a menu:

Duplicate—copies the icon and labels it copy_0_of_process.icon.
Delete—removes the icon.
Rename—relabels the icon.
Properties—enables you to enter information specific to each process. The tester-specific processes all rely on information from a Tester Capabilities File (nameoffile.tcp).
Show summary—displays information about the execution of the process.
Show Error—displays errors from the process.
Write Error—displays a dialog box that enables you to name the file to which the errors are written.
Store Errors—loads the errors from the process into the database that produced the errors. The system stores all the rules violations that do not have a time stamp at time 0. You can then view them from the State and Timing editors.
Execute—same action as a double-click on the icon; starts the process.

When you activate a process icon, by double-clicking it or selecting Execute from its middle mouse button menu, the system activates the connected processes (see Iconic Programming and Process Execution below) in the order that the input and output pads on the icons allow.

History

The Database Icon has a History selection in its middle mouse button menu. After execution, the processes update the history information you can read in the History dialog box. If one or more errors occurred during the process, the system highlights the appropriate process icon.

Iconic Programming and Process Execution

You can connect some icons together to describe data flow from one icon to the next. In most cases, the data that you manipulate refers to a single database, which you modify with various processes. You can execute the data flow segments, or programs, as a whole; or, you can execute individual processes, if you do not connect them to other processes. You can execute any one wired segment by placing the cursor on one of the icons, and double-clicking the left mouse button, or you can place the cursor on the icon, press the middle mouse button, and choose Execute from the menu that appears. The execution starts with the first process icon in the segment.

Connecting Icons

Input and output pads are on the left and right sides of process icons. You can wire the pads together if the corresponding data types are the same (the system tells you so with labels on the pads). You can only connect icons with input or output pads. The types are: Snapshot Input or Output, Pin Wire Input or Output, Database Input or Output, Text Input or Output, Cycle Seeds Input or Output, State Map Input or Output, Printing Input or Output, Snapshot Input or Output, Qualifier Input or Output, and Signal.

List Input or Output

When you hold down the left mouse button on an input or output pad on a process icon, several things happen: a label of the type of the data pops-up in a blue field; for example, Signal list Input; a yellow data flow arrow attaches to the pad (it is visible when you move the cursor); or any other pads on any other process icons on the workbench, which can receive the data flow arrow, change from gray squares to square yellow outlines, to which you can attach the yellow data flow arrow.

All the process icons from the testers and Tools cards have at least one pad on the left for database input, and one pad on the right for database output. They may have additional input and output pads as well. You can execute a process without having the icons wired. Although all process icons have input and output database pads, if you leave instantiated icons unwired, they will proceed with the active database. You can not wire icons in the Global area to icons in the Directory area, or wire a loop with the process icons.

Backing Up the Databases

When you use the active database as an input to a process, the system probably will change it. Because of this change, you might want to copy the database for future use. To do so, press the middle mouse button when the cursor is on a process icon from the Tools Card, and a menu appears. The menu has a Properties dialog box, which has a Create Database selection. When you select Create Database, the system makes a copy of the database before the processes execute, and a new Database Icon appears on the workbench. You can use this copy as a reference if you need to return to the database after you execute the process. The safest way to modify data is continuously to save copies (through Create Database) of the database before running a process. However, you can use up memory quickly this way, especially with large vector files. You must be careful to delete unneeded intermediate files, or to write them to disk (through Write>binary).

Deleting Icons and Connectors

You can delete an instantiated icon or wire with the middle mouse button. When you press on it, the system brings up a menu, from which you choose Delete. If you delete an icon, and the icon represents a file in the directory structure, or is a Database Icon, a dialog box asks if you want to delete the file from the directory. The system deletes all connectors starting and ending on an icon you delete. The system, however, does not delete icons that become unconnected when you remove a wire. If you delete the icon of an active editor, TekWAVES removes the icon from the workbench, and closes the editor. If you delete an active database, the system activates another database, and refers to the new database in any open editors.

System Card

The system card contains icons for general-purpose use in the TekWAVES system. The icons include the WAVES (Database) Icon, Text Icon, Notes Icon, Workbench Icon, and Print Icon.

WAVES Database Icon

You can use the TekWAVES Database Icon to create a new TekWAVES database. When you drag the icon off the card and onto the workbench, TekWAVES creates a new empty database, with a default name of data0, data1, and so on. You can rename the Database Icon by placing the cursor over the icon and typing a name, or by pressing the middle mouse button while the cursor is on the icon and selecting Rename from the resultant browser menu. The names of all the databases in the current directory and global workbench areas must be unique. If the name you choose is already in use, TekWAVES prompts you for another name. The browser menu also contains a choice for the Properties dialog box, which enables you to set the format (such as EWAV or Mentor Graphics Log) of the database. The format indicates what set of states are valid. When you read in a file of a particular format, the format setting automatically changes, if necessary. And, once you have finished reading in a file, you can assign it a new format. The Properties box also enables you to set the target tester. The Database Manager then uses the name of the target tester to determine what format in which to display channel information.

A double click on a Database Icon activates it. Only one database can be active at a time (but you can view different databases in different editors). The icon can be in either the Global Area or the Directory Area. The name of the active database is in the title bar of the workbench. You can change the active database by double-clicking on another Database icon, or by choosing Active Database and the name of a database from the browser menu of the workbench title bar. Activating a database, by double-clicking it, changes the views of all the open editors to that database. At least one active database must exist at all times. When you delete the last available database, TekWAVES creates and activates a new, empty Database Icon in the Directory workbench area.

Menu of the WAVES Database Icon

If you press the middle mouse button while the cursor is on the Database icon, the system displays the following options in a menu:

Duplicate—creates a new copy of the database, titled_copy_of_database.

Delete—removes the Database Icon from the workbench. A dialog box appears and asks if you want to remove the database. When you delete a Database Icon, TekWAVES changes all the editor icons assigned to that database to show the newly active database. There is no undo for Delete.

Rename—dialog box enables you to relabel the database.

Properties—enables you to change the type of the database, and to identify the target tester.

Database Type—if you press the middle mouse button while the cursor is in the Database Type field, a menu appears with the formats TekWAVES supports: .cap (Genrad Hilo Capture) .ewv (Tektronix ascii event format), .log (Mentor Graphics Quicksim), .msa (Tektronix LV500 format), .sef (TSSI), and .wdl (Genrad Hilo).

Target Tester—if you press the middle mouse button while the cursor is in the Target Tester field, a menu appears with the name of the testers that TekWAVES supports: LT10001, LV500_128 (pins), LV500_1961, LV500_256, and LV500_64. (These are the Tester Capabilities files standard with TekWAVES 1.0. The default is the LV500-128. You can change the default in the card_defaults file. If you create your own Tester Capabilities File for another tester, place it in the /tekwaves/testers directory, with tcp affixed to the end of the name, and the system will recognize it.

History—a scrolling dialog box shows a history of workbench activity, including the time and names of processes that ran, and status of the processes (successes or failures). Also in the History dialog box are the files you have read into the database.

Read—enables you to select from any files in the system with the following file formats. (To read and convert other formats into a TekWAVES EWAV database, use the Translators Card. Translators supported include Valid ValidSIM, Teradyne LASAR, and Daisy VLAIF.)

ascii—a further submenu lists:
        Genrad.wdi—Hilo simulator input file format.
        Genrad.cap—Hilo simulator output file format.
        Mentor Graphics.Log—Quicksim simulator file format.

Tektronix.ewv—Tektronix neutral file format for simulator event data.

Tektronix.msa—file format that the LV500 requires.

Tektronix.fgl—Frame Generation Language.

TSSI.Sef—TSSI tool file format.

binary—reads the binary version of this database.

Write—The system writes the file as the indicated file type, translates it into one of the formats below if necessary, and gives the file the appropriate extension.

ascii—saves in ascii format as database-name.format extension. The submenu formats are:

Genrad.wd—Hilo simulator input file format.

Mentor Graphics.log—Quicksim simulator file format.

Tektronix.ewv—Tektronix neutral file format for simulator event data.

Tektronix.fgl—Frame Generation Language.

Tektronix.sed—TekWAVES cycle seed file.

TSSI.sef—TSSI tool file format.

binary—saves this TekWAVES database in binary, with the .Wdb extension.

Remove—deletes database items.

timeset assignment—converts the timeset assignments back to event data.

errors—removes all time-correlated errors in the database.

cycle boundaries—removes all cycle boundaries in the database.

comments—removes all comments in the database.

Database Manager—brings up the Database Manager.

Activate Database—same action as a double-click on the icon; activates the database and highlights the Database Icon.

Unsupported Commands and Terms

- .msa TekWAVES ignores the Schmoo, Macro and Define Format sections
- .sef signal names that contain a non-alphanumeric characters generate errors. TekWAVES modifies a bidirectional signal that is controlled by two signals to have only one control signal. A control signal that is controlled by a control signal generates an error.
- .wdl INTEGER, TIME, and TABLE waveform declarations cause errors. The following complex waveform assignments and commands generate errors: CHECK, IGNORE, INSERT, STROBE, TESTINITIALISED, TESTSTABLE, MONITORON, MONITIOROFF, MONITOR,- CHANGE BY . . . TO . . . CHANGE, CHANGE BY . . . TO . . . CHANGED, CHANGE BY . . . TO . . . CHANGE 1, CHANGE BY . . . REPEAT . . . CHANGE, CHANGE BY . . . REPEAT . . . CHANGED, and CHANGE BY . . . REPEAT . . . CHANGE1.
- -.cap Fan-in and fan-out numbers in carrier declarations generate errors. Fault Declarations generate errors. The following commands generate errors: CHECK, IGNORE, DISPLAY, ACTIVE, DETECT, FAIL. C and A command characters generate errors. Commands STROBE and STABLE are ignored.

TEXT Icon

The Text Icon is a tool for creating a variety of types of ascii files to use in TekWAVES. You can create and edit text files. All of the ascii files in a workbench directory appear as text file icons on the workbench. The icon itself has the three- letter extension on it (in upper case letters), and the name labeled beneath it. The different text file types have different default names and extensions. You can rename the icon by placing the cursor on it, typing a new name, and entering return. Text Icon file types include: .nts (notes), .txt (generic text), .smp (state map), .qsl (qualification signals), .msa (module set-up, ascii for the LV500) .fgl (Frame Generation Language), .sed (cycle seeds), .pwr (wiring list), .sgl (signal lists), .err (error), .ewv (LV500's ewav), .wdl (HILO), .sef MSI), .cap (HILO capture), .lsr (LASAR), .log (Mentor Graphics), .val (Valid), and .dsy (Daisy). If you double-click the left mouse button while the cursor is on the icon, a text editor dialog box appears, and displays the text. You can scroll, delete, and add text lines. If you accept your entries, TekWAVES saves them, or deletes the changes if you cancel them. Pressing the middle mouse button while the cursor is on an ascii text icon displays the following options in a menu:

Duplicate—creates a new copy of the file, titled copy_of_name.

Delete—removes the ascii text icon from workbench, and its file from the directory.

Rename—enables you to type in the new name in the field. Press return for the system to accept the name.

Properties—enables you to change the extension on the icon. Press the middle mouse button while the cursor is in the field, and choose from the list of file extensions. The default extension is txt. Changing the extension changes the label of the icon when you accept the dialog box. The extension may indicate a file with a strict format. Changing the extension does not automatically translate the data.

Edit—same action as double-clicking on the icon; the system displays the file for text editing.

Using the Text Editor in TekWAVES

The text editor is active after you open a text file in the global or directory workbench areas. Certain keys in the left keypad of the Apollo augment, and some are similar to, the functions of the scroll bars in a text file. When scrolling right or left, if the text cursor reaches the end of the text on the screen, the text automatically scrolls if there is any more text to display. This also occurs when panning right and left. A line of text can have a maximum of 511 characters. Pressing the carriage return key starts a new line.

NOTES Icon

If you drag the Notes Icon from the System Card onto a workbench, or Select it while it is still on its card and let the system put it on the workbench, you can open it by double clicking it. You then can enter text for future reference. You can rename the icon by placing the cursor on the icon, typing a new name, and entering return. The system saves the file and appends the extension nts to it, and keeps the icon in your workbench directory. The Notes Icon is similar to the Text Icon. However, you should think of the text files as vehicles for the various formats of the waveform files, and the Notes as reminders for yourself. When you press on the middle mouse button while the cursor is on the Notes Icon, the following options appear in a menu:

Duplicate—creates a new copy of the me, labeled copy_of_name.

Delete—deletes the Notes Icon from the workbench, and its file from the directory.

Properties—you can change the file extension, which then actually changes the icon from a Notes Icon to a Text Icon, with the particular extension you choose labelung the icon.

Rename—enables you to change the label of the file.

Edit—opens the file, and you can enter or alter information.

WORK BENCH Icon

When you drag a Workbench Icon onto either of the workbench areas, or select it while it is still on the System Card and have the system place it on the workbench, you create a directory in the file system. The system gives the directory a default name of workbench 1, workbench2, and so on, but you can change the name by placing the cursor on the icon and typing. When you activate the icon, by double-clicking it, it expands, and becomes the current workbench. The icon needs to be on Directory Area to be activated. The name of the workbench directory is on the title bar of the Workbench Directory Area. While the system only shows icons for directories with the wkb extension, the file extension .wkb does not appear on the icon itself or on the name beneath the icon. You can drag other icons into the Workbench Icon to keep them in that particular directory. You can even drag one Workbench Icon into another Workbench Icon. This includes placement of any icons and connections, as well as the settings for any properties boxes. When you change directories, the system saves previous Workbench Directory information. When you close a workbench directory, the system saves changes you have made to any files, and saves the settings you made in the dialog boxes. When you press the middle mouse button while the cursor is on a Workbench Icon, the system displays the following options in a menu:

Delete—removes the directory from the workbench and directory structure; this is possible only if the Workbench Icon is empty. To delete a Database Icon from a Directory Icon, you must place the Database Icon on the Global Area, close and delete the Workbench Icon, and then delete the Database Icon.

Rename—dialog box enables you to change name of the directory.

Change Directory—same action as double-clicking the icon; changes to this workbench directory.

PRINT Icon

You instantiate the Print Icon by dragging it onto a workbench area, or selecting it while it is still on its card, and having the system put it on the workbench. Then, enter any necessary information in the Properties box. A double click starts the printing process and printing proceeds in the background (asynchronously). You can rename the icon by placing the cursor on it, typing a new name, and entering return. If you press the middle mouse button while the cursor is on the Print Icon, the system displays the following options in a menu:

Duplicate—creates a new copy of the Print Icon, labeled copy of name.

Delete—removes the Print Icon.

Rename—dialog box enables you to change the label of the copy of the Print Icon. the print Properties—a dialog box enables you to prepare job.

Printer Type:—postscript or hp; default is postscript.

Paper Size—choose, by placing the cursor of the mouse on the text field and pressing the middle mouse button, from the standard sizes a, b, c, d, e, and normal or rotate (the long axis of the paper) of each of those. Refer to the documentation of your printer or plotter for details.

File Name:—you label the file the process creates to print. This is for you and the system to use.

Print File—if you select the check box, printing occurs when you execute the print process, as opposed simply to creating or saving a file to print later.

Create File—tells the system whether or not to make a new file, as below:

Timing Display—prints the Timing Editor only.

All Time—entire time range, including any not visible.

Select Range—section of the waveforms, including any not visible.

Start:—beginning of the waveforms to print.

Stop—end of the waveforms to print.

Time-per-div:—set the resolution of the time scale; can alter what the editor displays.

State Display—prints the State Editor only.

All Time—or sequences; includes any data not visible.

Select Range—section of the states, including any not visible.

Start:—beginning of the states to print.

Stop:—end of the states to print.

Timeset Display—prints the Timeset Editor only.

All Timesets—including any not visible in the database.

Select Timeset—a particular timeset.

Name:—its name.

Time-per-div:—can alter data displayed in the editor.

Snapshot—this does not create a Slide Icon. It creates, from an existing Slide Icon, a file for the printer to print. The process can only print a slide in postscript format.

Name—the label of a Slide Icon to print.

Text File—Any text file in the system.

Name—the label of the Text File to print.

Execute—same action as a double click on the icon; begins processes as set in the Properties dialog box.

Editors Card

The Editors Card contains the Timing, State, Frame, and Timeset editor icons. When you drag an editor icon onto a workbench, or select it and have the system put it on the workbench, TekWAVES gives it a unique name based on the type of editor. You can then double-click it to open and use the editor. You close editors with the close button in the title bar of the editor. Only one instance, or copy, of each editor can be active. When you activate a new instance of a particular editor, the system closes the previous version of the editor.

Menus of Editor Icons

If you place the cursor on an editor icon that you have dragged onto the workbench, and then press the middle mouse button, the editor displays the following menu:

Duplicate—creates a new copy of the editor, titled copy_of_editor.

Delete—removes the editor icon, and closes the editor if it is active.

Rename—dialog box enables you to change the name of the editor.

Properties—dialog box for the editor (as from the title bar of the editor).

Display—same action as a double-click on the icon; displays the editor with the characteristics set in the Properties dialog box.

Signal List and Menu

The State, Timing, and Timeset editors use a Signal List that specifies the particular signals that they show, from the group of signals available in a particular Tek-WAVES database. Each database has a signal list that the State and Timing editors share. This allows the displays in the two editors to remain synchronized.

Each timeset in the Timeset Editor maintains its own signal list, as the list of signals in a timeset don't need to correspond to the order of the signals in the State and Timing editors. You can modify the actual signals that exist in a TekWAVES database with the Database Manager, which is available from the Signal List Menu, the title bar menu of any editor, or the menu of the Database Icon. The choices in the Signal List Menu are:

Show—adds a signal to an empty signal list slot, or appends the signal to a signal list that already exists in a signal list slot.

signal names—all of the unique signals that exist in the active database. A scroll bar may appear if more signals exist than can fit in a menu, so you can scroll through the signal list.

Hide—removes a signal from the list of signals that exist in an occupied slot in the signal list.

signal names—a dialog box displays a list of all the signals. They are in the same order as they are in the slot. Identical signals may exist in this list, if that was how the signal list was built.

Insert—inserts an empty signal slot above the slot you select. TekWAVES scrolls the display slots down when you insert the empty signal slot. Database Manager the dialog box of the Database Manager appears.

Radix—changes the display radix for a signal or bus, and may change the width of the signal display in the State Editor. (This does not apply to the Signal List Menu in the Timeset Editor).

bin oct dec hex ascii—you can change the radix of the signal list by selecting a different radix. (In the Signal List Menu, you can Hide signals, but not Delete them from a database.)

Viewing Signals

Viewing signals is similar in the State, Timing, and Timeset editors. The Timing and Timeset editors display their signals vertically. The State Editor displays its signals horizontally. Selecting either arrow at the ends of a scroll bar causes the Signal List to scroll by one item in that direction. If you select an end of the scroll bar and hold down the left mouse button, the list continues to scroll. Selecting either space around a scroll box causes the entire list on the screen to page. There is always an empty slot available at the end of the signal list. Dragging the scroll box enables you to specify a new screen of signals or states, which appear when you release the left mouse button. The size of the scroll box, relative to the entire scroll bar shaft, indicates the ratio of the number of signal slots shown in one screen to the total number of signal slots in the entire list. If the entire list is visible, the scroll bar shaft fills the scroll box. A slot is always empty at the end of the signal list (you may have to scroll to it, though).

Scrolling Time

In the Timing and Timeset editors, selecting either arrow causes the time scale to scroll by approximately 100/0 of the screen width in either direction. If you hold down the left mouse button, the time scale scrolls by 10% increments. Selecting either space around a scroll box causes the time scale to scroll by a screen-width. A left mouse button drag on the scroll box enables you to specify a new relative screen time, which the system displays when you release the left mouse button. The size of the scroll box shows the ratio of the displayed data to the total time in the database. If all of the data is visible, you cannot scroll, and the scroll box fills the shaft. In the State Editor, the scrolling of the time scale is similar to scrolling signals. An incremental scroll causes the time scale to scroll up or down by one sequence.

Time-Per-Division Control

The Timeset and Timing editors require control over the time resolution of waveform displays. This consists of controlling a 1-2-5 sequence value and a power of 1000 unit. To select the resolution, you can use an increment and decrement arrow, a popup menu, or left mouse button clicks on the blue squares between the arrows. All three of the above are below the Signal List in both editors. By clicking on the increment or decrement arrows, the sequence rotates through the values 1, 2, 5, 10, 20, 50, 100, 2001 and 500. When you reach a limit, by either decreasing past 1 or increasing past 500, TekWAVES lowers or raises the unit to the appropriate value of 1000. When the you reach the absolute limits, TekWAVES ignores the clicks. By clicking on the right blue square, the unit rotates through the values ps (picoseconds), ns (nanoseconds), us (microseconds), and ms (milliseconds). By clicking on the left blue square, the scale rotates through the values 1, 2, 5, 10, 20, 50, 100, 200, and 500. A middle mouse button press displays a menu with these same options. When you change the time-per-division as above, the system redraws the waveforms and the time scale to reflect the new screen resolution.

Dragging Waveform Edges

You can drag any waveform edges in the Timeset Editor, and affect all the instances of the timeset. In the Timing Editor, you also can drag edges, unless they are within a particular instance of a timeset.

Timing Editor

With the Timing Editor, you can display and modify digital waveforms and digital busforms, as well as see tester cycle boundaries, tester cycle dead zones, errors, comments, and timeset names. To open the icon and display the editor, first put the icon on a workbench area, either by selecting it while it is on its card, or by dragging it off the card onto the workbench. Then, double click the icon, or open the middle mouse button menu of the icon and choose Display once it is on the workbench. The close button to the left of the title bar closes the editor, and the expansion button to the right of the title bar expands or contracts the size of the window. The workbench and other editors resize themselves accordingly.

Layout of the Timing Editor

Across the top of the editor, from left to right, are the close button, the title bar, and the expansion button. Below the title bar, to the left, is the delta symbol, and its delta value. Next to the delta are the cursor bar and mark. Below the Delta symbol are the name of the signals in their cells. Next to the signal name cells are the corresponding waveforms. Below the signal name cells is the time-per-division-control, and next to it is the time scale. Along the far left, and across the bottom, are scroll bars.

Time Delta

The editor displays a time delta to the far left of the time values for the cursor bar and mark. The delta represents the absolute value of the time of your cursor bar, minus the mark time. The editor labels it with a Greek delta letter (Δ) to the left of the delta time value, which is white.

Logic Analyzer Cursors (Cursor Bar and Mark)

Two vertical cursors are available in the Timing Editor, the cursor bar and the mark. The cursor bar, a solid vertical blue line, starts out residing at the tenth tick mark on the time scale. The editor positions the mark, a dashed vertical white line, at the fortieth tick mark (fourth major tick mark) on the time scale. The editor puts the times of the cursor bar and mark, in the same colors, above them in rectangles. If the cursor bar or mark is off the screen, then the editor draws the time values at the side of the display that corresponds to the direction in which the corresponding vertical lines of the values reside. You can drag a cursor bar or mark that is visible. You can also drag the time display, even when you cannot see the cursor bar. If you cannot see the cursor bar, and drag the time meter, the editor draws the cursor bar at the center of the time meter, which allows the cursor bar to pop to a visible region of the display. The editor updates the time of the cursor bar, and you can then drag the cursor bar in the display. After dragging the cursor bar, if you set the snap mode to snap-to-edge in the Properties dialog box, the editor positions the cursor bar on the closest edge in the list of the signals, after you release the mouse button. In the Precision Drag mode, the cursor bar moves more slowly than the other modes, but enables you more easily to locate a specific edge or time. The cursor bar does not snap to an edge when you explicitly enter a time. You control snapping- to-edges of the cursor bar through the Properties box of the Timing Editor. If you want to view edge times, the snap-to-edge option enables you to release the cursor bar close to the edge, and the cursor bar moves to the closest edge, and displays the time. You can type a time value onto the cursor bar or mark time field, and when the system accepts your value, the corresponding vertical line moves to its new location in the time range when you press the return key. If you move the cursor of the mouse out of the time meter, the system does not take what you entered. If you select view cursor states in the Properties dialog box, the editor displays the state of the signal or bus at the time that you specify with the cursor bar. The states appear in blue immediately to the right of each signal. You specify each signal or bus radix with the radix choice in the Signal List Menu.

Signal List

Along the left side of the Timing Editor is a signal list, which is a green grid where the names of the waveforms are. You can type in names of existing signals in the currently displayed TekWAVES database, and the system inserts them into the signal list and displays them.

Busforms

The editor shows multibit data as a busform in the display area. The editor shows the state value of each bit on the bus inside the rails of the busform. If the busform is not wide enough to display the entire state value, the editor does not show it. You can set the display radix of the state value in a busform through the browser menu of the signal list.

Waveforms: State, Strength and Directionality

A waveform display has state, strength, and signal direction. The Timing Editor shows waveforms that are based on these underlying data. The typical states that the editor encodes are logic 1, logic 0, high impedance, and unknown logic state. Signals that you group as busses all have the same display radix. Additionally, the logic state can be driving or resistive. A simulator can also have more information about unknown logic states. The simulator maintains this information to decrease the ambiguity of a logical value, as the simulator propagates the value through the virtual circuit. For example, the editor can encode a state value that is between driving 1 and resistive 1. The Timing Editor (and the State Editor) encode all the variations of state and strength that they can display. When you choose View all states from the Properties dialog box of the editor (in its title bar menu), the editor shows all the states that a given simulator allows with different line styles, multiple rails, and colors. By selecting View 4 states, the editor displays only the four states mentioned above (logic 1, logic 0, high impedance, and unknown logic state, and their output states of H, 0, Z, and X in white). Driving logic high and low states are solid white lines. Sensing logic high and low states are dashed yellow lines. Unknown values are multirail lines, and the areas between the rails are crosshatched.

Waveform Time Resolution

Along the bottom of the waveform display area is a time scale. At the far right of the time scale is the power-of-1000 unit of the time values. To the left of the time scale is the time resolution control area. Any change in time resolution causes immediate changes in the time scale and the waveforms at which you are looking. The value the editor displays in the cursor time meter is in the power-of-1000 unit that labels the time scale. Beneath the time scale is a horizontal scroll bar. Any change in the scroll bar setting results in an immediate change in time scale labels and the displayed waveforms. If the editor cannot draw a transition between states, because of the resolution of the display, then the editor draws the transition as a fuzzy green area. The fuzzy appearance continues forward on the time scale until the transitions again exceed this minimum time setting.

Errors

If you select View Errors from the Properties dialog box, the editor displays a red E just above the time scale at times where there is an error resulting from any processes you have run on a particular TekWAVES database. A left mouse button double click on the E displays a dialog box describing the errors at that time. To leave the dialog box, you can select the Exit button, which closes the dialog box and leaves the error messages in the database. If you want to edit the text of the error messages, use the Write Errors selection from the menu of the process icon that changed to red to indicate an error was created in its process. To remove errors, select Remove>errors from the middle mouse button menu of the current Database Icon. If two or more error regions are immediately adjacent, then a left mouse button double click anywhere on the region displays a dialog box that displays all the adjacent errors.

Comments

When you select View Comments from the Properties dialog box of the Timing Editor and display the comments, the editor draws a green C in the region just above the time scale at the time corresponding to the comment. You can use the menu of the cursor bar to insert comments at the cursor or the mark time. A double click on this C displays a dialog box with the comment. You can edit or delete the comment from this dialog box.

Middle Mouse Button Menu of the Title Bar

The title bar of the Timing Editor displays the name of the currently active database. If you press the middle mouse button while the cursor of the mouse is anywhere in the title bar of the editor, a menu with the following options appears:

Properties—a dialog box appears with the following options:
  View cycle boundaries—toggles the observability of the cycle boundaries that exist in the current database. The editor draws the cycle boundaries as vertical yellow lines that span the entire timing display.
  View dead zones—toggles the observability of a latency period within a cycle. The period is a dead zone. The editor puts a red crosshatch on the zone.
    Tester name—controls dead zones for a specific tester.
  View cursor states—the state values appear to the right of the waveforms.
  View timeset names—toggles the observability of the timeset names you have assigned. The names are over the waveforms.
  View comments or errors—You cannot view comments and errors simultaneously.
    View Comments—A green C appears anywhere a comment has been annotated in the timing waveforms, in the region just above the time scale at the time corresponding to the comment. You can use the menus of the cursor bar and mark to insert comments at the cursor bar or the mark time. A double click on this C displays a dialog box with the comment. You can edit or delete the comment from this dialog box.
    View Errors—A red E appears anywhere an error has been annotated in the timing waveform.
  Cursor Snapping snap to edges or no snapping.
    Snap to edge—when you release the selected cursor bar.
    No snapping—remain where you drag them.
  View 4 states—logic 1, logic 0, high impedance, and unknown logic.
  View all states—all the states a given simulator allows.
Display Database—selects the database the editor displays from the list available in the current system.
Database Manager—brings up a dialog box.
Snapshot—creates a slide of the current timing display.

Whenever you change any of the display attributes, the editor redraws the waveforms you affect.

Signal List Menu

A middle mouse button press on a cell of the Signal List produces the Signal List Menu. When you change a signal list slot, by showing or hiding signals, the editor redraws the waveforms.

Show—any of a list of signal names.
Hide—an extant signal.
  All Signals—in that particular signal cell.
  Signal—a particular signal.
Insert—the system makes an empty signal cell.
Database Manager—brings up a dialog box, as described in the Environment section of this guide.
Radix—number-base format of the signal list data. This is most valuable for busses.
  bin—binary
  oct—octal
  dec—decimal
  hex—hexadecimal
  asc—ascii Along the left of the signal grid is a vertical scroll bar that scrolls the signals. TekWAVES immediately shows any changes to the signal list of the Timing Editor in the display of the State Editor, if the State Editor is visible and displaying the same database.

Cursor Bar Menu

If you press the middle mouse button while the cursor of the mouse is anywhere over the time meter of the cursor bar, the editor displays a menu that has the following choices:

To Normal-To Precision drag—precision drag enables you to drag the cursor bar one pixel at a time.
Find—moves the cursor bar and scrolls the display if necessary.
  next—searching begins at the cursor bar time and proceeds forward in time. When the end time of the pattern is reached, searching stops.
    edge—searches for the next transition edge of a signal.
    cycle—searches for the next cycle boundary.
    timeset—searches for the next instance of a timeset.
    error—searches for the next error.
    comment—searches for the next comment.
    search vector—finds the next match to the search vector.

previous—searching begins at the cursor bar time and proceeds backwards in time. When the system reaches time 0, searching stops.
  edge—searches for the previous transition edge of a signal.
  cycle—searches for the previous cycle boundary.
  timeset—searches for the previous instance of a timeset.
  error—searches for the previous error.
  comment—searches for the previous comment.
  search vector—finds the previous match to the search vector.
Move—the editor places the cursor bar where you tell it, as below:
  Mark—the white dashed vertical line.
    To cursor—the blue cursor bar that is synchronized with the blue cursor bar in the State Editor.
    To start time—moves the Mark to the start of the time scale.
    To end time—moves the Mark to the end of the time scale.
  Cursor bar—the blue cursor bar that is synchronized with the blue cursor bar in the State Editor.
    To mark—the white dashed line.
    To start time—moves the cursor bar to the start of the time scale.
    To end time—moves the cursor bar to the end of the time scale.
  Display—the visible sections of the waveforms of the current database.
    To cursor—Moves your view of the waveforms and time scale to the cursor bar.
    To mark—moves your view of the waveforms and timescale to the mark.
    To start time—moves your view of the waveforms and time scale to the beginning of the time scale.
    To end time—moves your View of the waveforms and time scale to the end of the time scale.
Insert—
  Cycle Boundary at—
    Cursor—places a cycle boundary at the cursor bar.
    Mark—places a cycle boundary at the mark.
  Comment at—
    Cursor—places a comment at the cursor bar.
    Mark—places a comment at the mark.
  Load search vector—the editor loads the current vector for which to search.
    from cursor—loads the vector to search for from the state values across the signals at the time of the cursor bar.
    from mark—loads the vector to search for from the state values across the signals at the time of the mark.
    from dialog—produces the Search Vector Editor. The vector for which to search is the column of states down the right side of the display. You can type in a new set of states for a new vector. A hyphen means you don't care which state the waveform is in at that time. If you enter (type and enter return) a state in the top-most cell in the state column, the entire vector inherits that top state.

Cycle Boundary Menu

You add cycle boundaries to the data by placing the cursor of the mouse on the cursor bar and pressing the middle mouse button. A menu then appears, from which you can choose Insert>Cycle boundary at->—You can put the cycle boundaries at the cursor bar or mark time. You can drag cycle boundaries by putting the cursor of the mouse on the cycle boundary, selecting, and dragging. While you drag the cycle boundary, a time field shows above the cycle boundary. If you attempt to cross a cycle boundary with another cycle boundary, the system gives you a message saying it cannot do so. You cannot drag or change cycle boundaries that bound a timeset. Pressing the middle mouse button while the cursor of the mouse is on a cycle boundary displays the following menu:
  Delete—removes the cycle boundary, unless it is part of a timeset.
  Set Time—displays a dialog box which allows placing of new time for the Cycle boundary. This allows a precise time for the cycle boundary to be set if it could not be reached conveniently by dragging. If you set a cycle boundary at a time that causes it to cross another cycle boundary, the system tells you that there is an error.

State Editor

The State Editor enables you to display, create, and modify digital vectors. You can see event data, as from a simulator, change to state data, as to or from the LV500. To open the editor, first put the icon of the editor on a workbench area, either by selecting it while it is on the Editors Card, or by dragging it off the card onto the workbench. Then, double click the left mouse button while the cursor is on the icon. Or, press the middle mouse button while the cursor is on the icon, and a menu comes up, from which you can choose Display.

Layout of the State Editor

The State Editor displays vectors in a sequential or time scale format. The sequences or times are in rows do%M the editor. There is a different sequence or time for each occasion that at least one state changes. You can display either start time values or sequence numbers for each sequence (through the Properties dialog box of the title bar menu). Along the left side of the editor is a column with sequence or time information for each row of states. To the left of the expansion button on the title bar, on the right side of the editor, is the status character of the editing mode. it is a gray character on a square black background. This character shows whether the time values and timesets of the editor are in Overwrite or Ripple mode. By selecting the mode character, you switch the mode between Overwrite (O) and Ripple (R). Along the bottom of the State Editor is a horizontal scroll bar. Scrolling all the way to the right displays the end of the current signal list. The states (0, 1, X, and so on) the State Editor displays can represent events, or the state values of a timeset. If there is not a timeset name with the sequence, then the states represent events. An event is a change in value from the previous sequence. If a timeset is at the sequence, then the states are the optional initial states you assigned in the frame for each signal. (The editor displays any timesets in a column down the right side of the display after you select View Timesets in the Properties box, which is described below.) The timeset defines the values of the sequence.

The timeset contains information about specific edge times, or events. When you assign a timeset, the sequence represents the states the timeset needs for its entire period. In the State Editor, the time between a sequence of a timeset and the next sequence is the period of the timeset. As you modify data in the State Editor, the Timing Editor shows the changes, if it is displaying the same database.

Editing Modes

You can edit time values in either the Overwrite editing mode or the Ripple editing mode. If you want to replace time values, or overwrite the time of the current sequence without changing any other times, you can use Overwrite mode. If you want to add a time increment to a given sequence, and adjust all subsequent sequences by the same increment, you can use Ripple mode. Deleting states occurs similarly in both modes. In Overwrite mode, you can change the time only to within the range of the previous time and the next time. In Ripple mode, you can change the time to any time greater than the previous time, and all the other times ripple by the difference. You can place timesets in Ripple or Overwrite mode. In Overwrite, for signals that have a timeset with an S (state) FGL operator in the frame assigned to the signals, the system takes the first state following the S, and overrides the data with the period of the timeset. However, if the assigned frame in the timeset contains an E (edge) or W (window) FGL frame operator, the system samples the data at the window or edge strobe time, takes the sampled state, and puts it in the data for the duration of the timeset. The editor tags comments to the data. In Ripple mode, the comments move with the repositioned data.

Editing State Values

You must have at least two vectors to begin editing in the State Editor. One represents the 0 start time, and one sequence at least one picosecond later, which represents the end of the data. (To create vectors from scratch, you must first enter the Database Manager and define a signal; this creates the necessary first two vectors.) All of the states you can edit are in rows beneath their signals. You can change the value of states by changing the states at the intersection of the signal and sequence. The editor updates the database, and the Timing Editor synchronizes with the new state values. If you type in illegal states for the database type, the editor brightens the error twice, and then displays the old values. The State Editor shows drive and sense information. Drive, or force, states are yellow, and sense, or compare, states are in bold white type.

Comments

When you select View Comments in the Properties dialog box, the editor draws a green C to the right of the sequence column, if that sequence contains a notation. Double-clicking on the C displays a dialog box for viewing, editing, or deleting the comment. When the editor writes a binary database version to disk, the editor maintains the time-correlated comment in the disk representation. Similarly, when the editor initially reads a binary database version from disk, the database maintains any comments the editor encounters, and displays the C. When you select Tag Comments from the Time-Sequence Column Menu, the editor inserts a green C (if you selected Display Comment in the Properties box), and presents a dialog box. You can then enter your own comment in the text field of the dialog box.

Errors

When you select the View Error mode in the Properties box of the editor, the editor draws a red E to the left of the time column if that time has an associated error. If you double click on the E, the editor displays a dialog box with information about the error. The State, Timeset, and Timing editors report any violations Rules Check encounters.

Menus

Middle Mouse Button Menu of the Title Bar

The title bar of the State Editor shows the name of the current database. You can change the database by choosing Display Database from the State Editor browser menu Of the title bar. The menu is below:
Properties—the Properties dialog box of the editor has the following options:
View Timesets—controls the display of the timeset area, which is a column down the far right of the editor. When you select View Timesets, you can assign timesets, and can display names of assigned timesets. See the Timeset Binding section below.
View Comments or Errors—controls the display of the comments and errors area in the State Editor. You then choose to see either comments or errors. You cannot view comments and errors simultaneously.
View Comments—a green C appears anywhere a comment has been annotated to the data, to the right of the sequence-time column.
view Errors—a red E appears anywhere an error has been annotated to the data, to the right of the sequence-time column.
View Options—of the data in the State Editor.
View Events—the system places a period where a rise or fall does not occur in a vector.
View All States—all the states.
View 4 States—the only logic states the editor uses are 0, 1, Z, and U, which correspond to input and output o, 1, Z, and U in EWAV.
View All States—shows all the states.
View Sequence—controls the display of sequence numbers as labels to each row in the editor.
View Time—controls the display of time values as labels to each row in the editor.
Display Database—choose from the TekWAVES databases available in the current workbench.
Database Manager—can add, delete, and specify signals and parameters of the signals, as described in the Environment section of this guide.
Snapshot—creates a Slide Icon of the current State Editor screen display.

Signal List Menu

Across the top of the State Editor are green rectangles that have the names of the signals. You can bring up the Signal List Menu by pressing the middle mouse button while the cursor is on the rectangles.
Show—places one or more signals in the signal list slot.

Hide—removes from display one or more signals in the signal list slot.
  All Signals—of the current TekWAVES database.
  Signal—a particular signal.
Insert—a slot in the signal list, in which to put another signal or bus.
Database Manager—can add, delete, and specify signals and parameters of the signals, as described in the Environment section of this guide.
Radix—number-base format of the signal column.
  bin—binary
  oct—octal
  dec—decimal
  hex—hexadecimal
  asc—ascii The editor displays the state values with the radix that you specify in the Signal List Menu. The width of an individual signal list varies with the display radix, length of signal name, and the number of bits in the state value.

Sequence-Time Column Menu

When you select View Sequence in the Properties dialog box, the editor shows the sequence numbers, and puts SEQ at the top of the column. You cannot edit sequence values. (You can edit states in a sequence, but not the sequence numbers themselves.) When you select View Time in the Properties dialog box, the resultant time values represent the times at the start of the sequences. The editor shows the time unit above the time column. A menu with the available unit selections (ps, ns, us, Ms) is available by pressing the middle mouse button when the cursor is on the unit display rectangle above the sequence-time column. The middle mouse button menu of the sequence-time column has the following choices:

Insert—in Overwrite mode, the editor places a new sequence before the current sequence with a time value set to the midpoint between the current time and the previous time. If such a setting is not possible, then the editor displays an error message saying so. In Ripple mode, the editor inserts a new sequence at the current time. The period of the new sequence is the same as the previous one. The editor then adjusts the time values of all the following sequences by the period of the new sequence.
  Delete—removes the state values across all the signals and removes the sequence point. In Overwrite, sequences scroll up on the display, but times do not change. A special case is when you are in Overwrite mode, and you attempt to delete a sequence that follows a sequence that has a timeset. In this case, you cannot remove the sequence you selected. If the editor is in Ripple mode, the editor removes the period of time represented by that sequence, and the editor decrements all the subsequent sequence times by the period of the deleted sequence.
  Tag Comment—enables you to make notations to the sequence.
  Time increment—1ps-500 ms time gradations for when you add a sequence to the end of the data; the increments are from 1 ps, through ns, us, and 500 ms. N"en you aeate data from scratch, the default is 1 ps.

Range Selection Menu

You can select and drag a yellow rectangular area over the rows of sequences. You can also select a range, or a single cell, page down through the vectors, select another cell, and that entire distance becomes the selected range. This is a range of states. If you reach the limits of the display screen while forming the yellow area, and there is room to scroll, the sequence display scrolls along the same axis you are dragging. If you hit a corner during range selection, both axes simultaneously scroll. Pressing the middle mouse button while the cursor is over a range you select produces a menu with the following selections:

Clear—removes the yellow rectangular range from the sequences.
  Cut—copies all selected state values to the paste buffer and removes them from the display. State values from the sequence above the cut are copied into the selected range. The editor deletes the previous contents of the paste buffer.
  Copy—copies all selected state values to the paste buffer. The previous contents of the paste buffer are lost.
  Paste—replaces selected ranges you choose with state values from the paste buffer. The system uses the upper left cell of the selection to define the destination range of the copy. All data is copied from the paste buffer to a range the exact dimension of the source. If the destination is larger than the source and the destination is an even multiple of the source, for example, twice as wide and three times as high, the source is used multiple times to fill the destination. If the destination is not an even multiple of the source, no pasting occurs. A dialog box reports that error.
  Fill—
    Pattern—a dialog box appears that enables you to generate a pattern, which is a list of state-duration pairs, as well as the number of cycles, and a start time. You can use this for strobe, control, clock, or any single-bit signal that has a repetitive pattern. After the system accepts the pattern, the Timing Editor immediately reflects the changes.

Timeset Column Menu (Binding Timesets)

Down the far right side of the State Editor is a timeset column that is so labeled, if Display Timesets is set in the Properties dialog box. You can type in names of existing timesets that are in the current database. This binds specific vectors to particular timesets of your tester. If you insert an incorrect name, the system gives the error message "Unknown timeset xxx." and then reverts it to the previous name. If you press the middle mouse button while the cursor is in the timeset column, the following menu appears:

Insert—enables you to select from a list of available timesets that appears. If you are in Overwrite mode, the system inserts the timeset at the current sequence time, and overwrites all sequences that occur during the timeset period. If you are in Ripple mode, the system inserts the timeset at the current sequence time, and modifies all the subsequent sequence times by the period of the timeset. Once you assign a timeset, the name of the timeset is put in the timeset column of the appropriate sequence. When you add a timeset to the last sequence, the system adds a new sequence at the new end of the time-sequence column, which is extended by the timeset. The editor uses the state values from the previous sequence as state values for the new sequence. If you assign a timeset that does not define all the signals in the database, the system assumes the frame is single state, preserving the previous state if possible.
    timeset names—from currently defined timesets in the database.

Version—list of valid timing versions for a timeset. The editor uses the current timing version as a parameter of the timeset. You can set the current version with the Timeset Manager.

Delete—removes a timeset and the sequence from a sequence row.

Expand—converts state and timeset data to event data. The system might create multiple sequences to replace the state and timeset representations.

Timeset Manager—brings up a dialog box that lists the names of the timesets and their current versions. You can set all timesets to the same version (min, max, or tip) or each timeset to a unique timing version.

Cursor Bar Menu

The State Editor has a blue horizontal cursor bar that lies over one of the data rows. If you view the same database with both the State and Timing editors, the blue cursor bar functions in the State Editor at the same time as the blue cursor bar in the Timing Editor. When you move the cursor bar in the State Editor, by dragging the handles on either end of it, the cursor in the Timing Editor also moves. When you move the cursor bar in the Timing Editor, the system moves the cursor bar in the State Editor to the start time of the sequence, during which the time of the cursor bar of the Timing Editor falls. When the cursor bar reaches the edge of the displayed sequences, the data cells to show the next sequence. A text field above the time-sequence column shows the time or sequence number of the cursor. Entering a time, or sequence, causes the cursor to move to that time or sequence. Selecting the icon of the cursor bar, to the left of the sequence-time meter of the cursor bar, scrolls the data so the cursor is visible as the top sequence. If you press the middle mouse button while the cursor of the mouse is on the handles of the cursor bar, the sequence-time meter of the cursor bar, or the icon of the cursor bar, the following menu appears:

Find—a search function through the signals of the current database.
    next—
      timeset—that you or the system has created.
      error—any annotated by any process. The red E is only visible if you choose View Errors in the Properties box.
      comment—any that you or the system annotated. The green C is only visible if you choose View Comments in the Properties box.
      search vector—a series of time or sequence bits from one or more signals, as defined in the Search Vector dialog box.
    previous—
      timeset—that you or the system has created.
      error—any annotated by any processes. The red E is only visible if you choose View Errors in the Properties box.
      comment—any that you or the system annotated. The green C is only visible if you choose View Comments in the Properties box.
      search vector—a series of time or sequence bits from one or more signals, per the Load Search Vector selection.

Move—
  Cursor—the system moves the cursor bar.
    To start time—time or sequence 0.
    To end time—of the time-sequence column.
  Display—moves the view of the State Editor, without moving the cursor bar.
    To cursor—finds the cursor bar.
    To start time—of the time-sequence column.
    To end time—of the time-sequence column.
  Load Search Vector—for searching the database for a particular time-sequence row.
    from cursor—the time-sequence row within the cursor bar is what the editor will search for. Choose Find next or previous search vector (above) to have the editor move the cursor bar.
    from dialog—brings up the Search Vector Editor, which enables you to tell the system of a particular set of states, or a particular signal. You can edit the search vector by setting a state or don't care (-) for each signal. You can set a state in the top-most cell of the search state column that all the states inherit.

Figure 67:
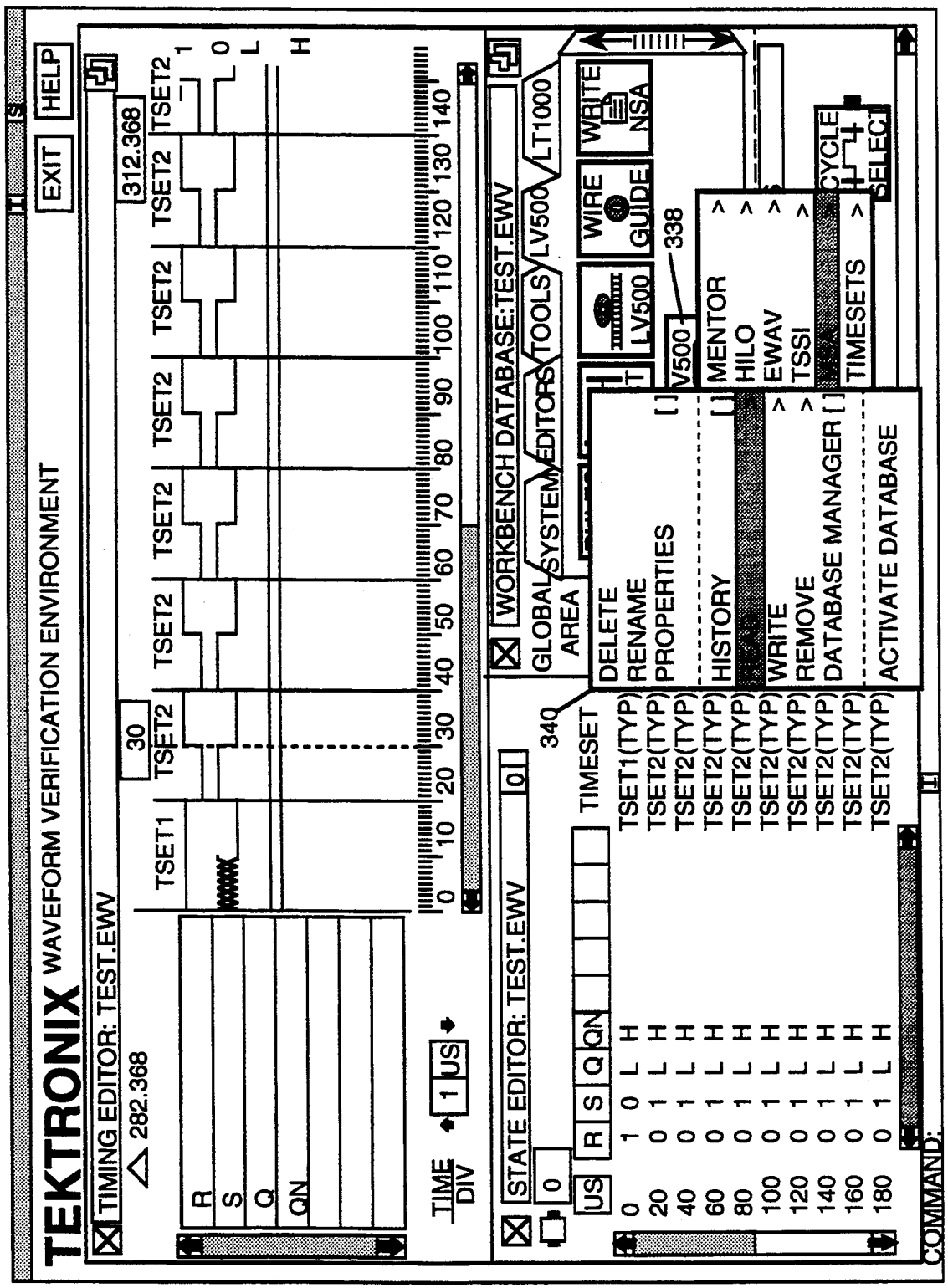
FIG. 67 shows a menu commanding a tester file to be read and input into the system.

Once the tester has performed a test, it is often desirable to compare the results and determine whether This can be done by reading the file, such as is illustrated by menu 340 in FIG. 67. Once the data base is retrieved, any comments that are produced which describe the results of the test are identified by the letter C between the time and state signal columns of the state editor display as shown at 342 in FIG. 68. The comment can then be retrieved, as shown in the comment display and editor box 344.

Frame Editor

The Frame Editor enables you to create, view, and edit tester frames in a TekWAVES database. You then use the frames to build timesets in the Timeset Editor. This enables you precisely to tailor the waveforms in your TekWAVES database to match the abilities of the timing generators and counters of your target tester. Frames are descriptions of waveform segments, and each has a name. You describe frames with Frame Generation Language formulae. TekWAVES puts any files with the extension fgl on the workbench as icons upon power-up. To open the icon of the editor, first put it on a workbench area, either by selecting it while it is on the Editors Card, or by dragging it off the card onto the workbench. Then, double click the icon, or open the middle mouse button menu of the icon, and choose Display once it is on the workbench After you open the editor, it displays any frames in the current database. You can specify a Tester Capabilities File. To do so, place the cursor on the title bar of the editor. Then press the middle mouse button, and choose Read>*.tcp->nameoffile.tcp. The system then loads frames of that Tester Capabilities File into the editor.

Layout of the Frame Editor

The Frame Editor has, across the top, a close button to the left of the title bar, the title bar, and the expansion button. Below the title bar, from left to right, is a vertical scroll bar, the frame name column, the input-output direction column, the formulae of the frames, and then the waveforms of the frames.

Frame Name Column

TekWAVES identifies frames by name. In the editor, the names of the frames are in a column of cells down the left side of the display, and a vertical scroll bar controls scrolling through the list of frame names. You can type in a name for a new frame in an empty slot.

Frame Name Menu

To rename a frame, choose Rename from the middle mouse button menu of the frame name. The middle mouse button menu of the frame name also has a Delete choice, which enables you to remove that particular frame. The system does not delete a frame if there are timesets in the current database that refer to it.

Input—Output Column

The second column from the left is for specifying whether the signals are input or output. Selecting the field toggles it as 0 for output, I for input, or B for bidirectional. Alternately, you can bring up a menu containing the same three signal directions with the middle mouse button, and choose one there.

FGL Column

The third column from the left contains a field that enables you to view and edit the Frame Generatmon Language formula, which is described below.

Waveforms of Frames

The waveform of a frame is to the right of the formula. If the editor finds an error while it parses a formula and tries to create a waveform, the editor tells you so in a dialog box, and it does not draw the waveform. You can then modify the formula. The waveform edges are placed evenly across the display, simply to show the number of their edges as their formulae define the edges. You cannot drag the waveform edges.

Syntax of Frames

Formula-description:=
 'frame'`='Frame_description`;'
Frame-description:=Frame-type Frame-name Frame_semantics (Frame-semantics
Frame-type:='T'|'O'|'NB'
Frame-name:=Alpha-numeric-string
Frame-semantics:=['~'] Expression {Timing_constraint}
Expression:=(Forcing_state|State_set | Previous_state|Mask|Edge
Forcing-state:='F'{State}
State_set:={States}
Previous-state:='P'
Mask:='M'
Edge:='E' {States}
Window:='W' {States}
States:=State {','State}
State:=Valid_states
Timing-constraint:='['Min_time, Max_time, Step_time']'
Min-time,Max-time,Step_time:=Time Valid-states
:= <EWAV>      H l M U m u X L O I t i Z -continued

| | |
|---|---|
| :=<HILO> | U D T F R B P N L X O H W L Z |
| :=<TE.STER> | H l X U L 0 T Z |
| :=<MENTOR LOG> | @> < l U X 0 I 0 H L |
| :=<TSSI-SEF> | HU X N L D T Z |

Middle Mouse Button Menu of the Title Bar

The title bar of the Frame Editor displays the name of the database you are currently working with. If you press the middle mouse button while the cursor is anywhere on the title bar, the following menu appears:

Properties—sets the Frame Editor to display formulae, waveforms, or both.

Database—enables you to choose a database from a list of databases in the current workbench.

Read—brings Tester Capabilities files or Frame Generation Language files into the current database.

Write—puts the frame data from the current database into a text file. A dialog box appears that enables you to enter the name of the file. Only frame descriptions are written to this file, even if timeset descriptions are in the database. To write the frame and timeset descriptions to one file, write from the Timeset Editor, or from the database in the workbench. The system adds the fgl extension to the file, and puts its text file icon on the workbench.

Delete all Frames—removes all unused frame descriptions from the database.

Snapshot—takes a snapshot of the Frame Editor, and creates a Slide Icon on the workbench.

Timeset Editor

The Timeset Editor enables you to create, view, and edit timesets in a TekWAVES database. To open the editor, first put the icon on a workbench area, either by selecting it while it is on the Editors Card, or by dragging it off the card onto the workbench. Then, double-click the left mouse button while the cursor is on the icon, or put the cursor on the icon, press the middle button of the mouse, and choose Display from the resultant browser menu. The editor works with timesets, which are formed with the Frame Generation Language. Any files in the current TekWAVES database that have the .fgl extensions are on the workbench as text icons, labeled with .FGL.

Layout of the Timeset Editor

Signals are listed along the left in the green rectangular cells, and must correspond to signal names in the database. You control the display of this vertical list of signals with the scroll bar to the left. To the right of the name cell of each signal is a white cell for the name of a frame. The cell with the name of the timeset is below the title bar of the editor. To the right of the name cell of the timeset is a series of cells in which you specify the timeset parameters of version and timing period.

Creating Timesets

To create timesets:

1) Open the Timeset Editor. Be sure the default frames and timesets are based upon the tester and configuration you need, by looking in the Properties dialog box for the name of the tester.

2) Show, in the signal list, the signals you want in the timeset. Show the signals through the menu that appears when you put the cursor on the signal list and press the middle mouse button.

3) Choose, through the browser menu in the cells for the frame names, the frames you want to apply to the signal or signals. You can then see the timing parameters change per frame.
4) If you need to alter the timing, either drag the waveforms or enter new timing parameters through the keyboard.
5) Go to the State Editor, and apply, or bind, the timesets to the database. Do this by first selecting View Timesets in the Properties dialog box of the State Editor. Then place the cursor of the mouse on the TIMESET column next to the appropriate sequence, press the middle mouse button, and choose a timeset to bind to that signal through the Timeset Binding menu that appears.

Editing Timesets

A TekWAVES database can contain frames and timesets. Frames are descriptions of waveform segments. The system describes frames in formulae written in the Frame Generation Language (FGL). You edit and create frames in the Frame Editor. Timesets are combinations of frames that you or the system apply simultaneously to several signals. A timeset definition contains a list of signals, a list of frames you or the system apply to those signals, and the timing parameter values that you or the system give to those frames to determine the placement of the edges. The Timeset Editor enables you to build timesets from the frames available in the database. You can view the frames in the Frame Editor. The system assigns a default name to a timeset when you create it. You can change the name by choosing Rename from the middle mouse button menu of the timeset name field. Typing over the name brings up the timeset that you name. If another timeset already has the new name you enter, the system flashes the name twice, and reverts to the previous name.

Choosing Frames

The menu of the frame name cell enables you to apply frames from the Frame Editor to timesets in the Timeset Editor. You choose a frame for a signal, or signals, by choosing the name of the frame from a menu, which is available from the white cells in the column to the right of the signal list column. Only the frames that match the 1-0 type of the signal or signals are available. The menu appears when you put the cursor of the mouse on the name of the frame and press the middle mouse button. You can also select a frame for a list of signals by selecting the frame name and sequencing through the available names of frames.

Timing Parameters

After you choose a name for a frame, timing parameter fields appear to the right of the name of the frame. There is one less timing parameter than the number of possible edges the frame describes. Default times enable you to view and begin working with the waveform. You can adjust the times by typing in the timing parameter fields, or by dragging edges in the waveform. There is one timing parameter field for each required timing parameter. The timing parameter fields are the distances from edge to edge. The number of timing parameters can change, depending on the frame. To the right of the cells of the timing parameters is an area to display the waveform.

Timeset Period

The period defaults to 100 ns for new timesets. You should modify the default period, if you need to, before you define the timeset. You can, however, modify the period after defining the timeset if you do not shorten the period so much that the timing parameters extend the edge past the end of the timeset. If you change to a shorter period, you must first move the edge to within the new period. You type in a time value to change it, and select the unit to toggle it through the choices, or choose a time unit from the middle mouse button menu of the time unit cell.

Dragging Edges

To the right of each timing parameter is the timing waveform area. Waveforms are displayed here, and you can modify them by moving individual edges. You can drag individual edges in the waveform by placing the cursor on the edge, pressing the left mouse button, and dragging the edge to adjust the position of the edge. The system updates the corresponding timing parameters.

Time-Per-Division Control

You can manipulate the time resolution of the waveforms in the Timeset Editor by using the time-per-division control under the signal list. When you select a new resolution, the waveforms redraw themselves at the new time setting, and the time scale changes. The timing parameters also change, since they are in the same time units as the time scale.

Panning Waveforms in Time

The horizontal scroll bar at the bottom of the timeset Editor pans the time scale.

Timing Versions of Timesets

You can, optionally, create multiple timing versions of each timeset. The Timeset Editor displays the name of the currently displayed timing version in a white rectangle to the right of the timeset name cell, just below the title bar of the editor. The default timing version name is typ, for typical. You can bring up another timeset by typing over the name with the name of the timeset,you want. If the name you enter does not exist, the name flashes twice and returns the old values.

Menus

Middle Mouse Button Menu of the Title Bar

The title bar of the Timeset Editor displays the name of the current database. You can bring up another database by choosing Database from the middle mouse button menu of the title bar. The menu has the following choices:
- properties—sets display characteristics for the Timeset Editor.
- View dead zones—the display shows any red crosshatched dead zones.
- Tester Name—the name of the target device Tester Capabilities File of the tester. The LVS00-128 is default. To change the target tester whose timesets you edit, place the cursor of the mouse in the name field, type in the name, of the new tester, and enter return. Or, you can place the cursor in the time field, press the middle mouse button, and choose from the menu that appears, which lists all the Tester Capabilities Files in the system. The system then uses the timesets from the Tester Capabilities File of the new tester.

Database—you can choose a database from a list of available databases in the current workbench directory.

Read—reads timeset description files into the database.

.fgl—gives a list of files with the fgl appendage. These files have timeset and frame descriptions in Frame Generation Language.

.tcp—Tester Capabilities Files. TekWAVES 1.0 has capabilities files for the LT1000 and all pin configurations of the LV500.

Write—writes the frame and timeset data from the current database into a text file. A dialog box appears that enables you to specify the name of the file. The system adds the fgl extension, and the icon of the file appears on the workbench.

Delete All Timesets—from the current database, if they are not instantiated in the database.

Rules Checker—enables you to test the timesets against the capabilities, or rules, of the target tester. These are defined in the Tester Capabilities File.

Run—the system will start the process with either all timesets or the current timeset.

All Timesets—in the current database.

Current Timeset—as named in the timeset name field.

Properties—of the rules checker.

Tester—the name of the target tester. The default is the LVS00.

Automatically load error—places the errors into the database so you can view them from the Timing and State editors.

Timeset Rule Check Selection—check the boxes for the rules to check against.

Run All Checks—all of the below.

Run Selected Check—one or more of those below.

Timing—verifies the number of timing generators the target tester should use.

States—format of legal states of the target tester.

Min/Max Pulse Width—capability of the target tester.

Min/Max Cycle Length—capability of the target tester.

Edge Resolution—of the target tester.

Dead Zone—looks for any signal edges in dead zones.

Show Summary—after running the rules checker, a dialog box appears describing activity of the rules checker process.

Show Errors—The system logs all errors to the timeset from the previous execution of the Rules Checker, and displays a red E above the time scale at the time an error occurs. You can double-click on the E and read the error messages in a dialog box.

Write Error—creates an error file on the workbench.

Database Manager—brings up the Database Manager.

Snapshot—takes a snapshot of the display of the Timeset Editor. A Slide Icon appears on the workbench, and you can display the snapshot by placing the cursor on the icon and double-clicking the left mouse button.

Signal List Menu

The signal list of the Timeset Editor is not the same as the signal list in the Timing and State editors. The system keeps a separate signal list for each timeset in the Timeset Editor, but the operation is the same. The signal list and the processes of the signal list do not change any signals that are not in the timeset. You can manipulate the signals in each timeset with the Signal List Menu. If you press the middle mouse button while the cursor is on a name cell of a signal, the menu of the signal list appears. It has the following choices:

Show—displays a list of available signals. The signals are available depending on their input or output type. You cannot display a signal in more than one cell.

Hide—from the signal list.

all signals—in the current signal name cell.

signal—displays a list of available signals.

Insert—creates a slot into which you can place signals.

Database Manager—displays the Database Manager. You can add signals to the database, and set information about each signal in the database.

Menu of the Timeset Name

The timeset name field is the left-most white rectangle beneath the editor. Pressing the middle mouse button while the cursor is in the name field of the timeset brings up the following menu:

Current—lists the currently available timesets that you can select.

Rename—you can relabel the current timeset in a dialog box (type in the name, and enter return).

Delete—removes the current timeset if no signals refer to it.

New—adds a new timeset with a default name (tset1, tset2, and so on) and default timing version typ.

Copy Current—uses the current timeset as a timeset to define a new timeset.

Empty Timeset—starts from a completely empty timeset definition.

Menu of the Frame Name

The white rectangles in the column to the right of the signal list column are the frame name cells. You can select a frame from the middle mouse button menu of the frame name cells. If you do so, only the frames that match the 1-0 type of the signals are available. The menu of the frame name cell enables you to apply frames from the Frame Editor to timesets in the Timeset Editor.

Waveform Menu (State Editing)

You also can edit a timeset by deleting, and thereby forcing the specification of, states. If you put the cursor of the mouse over an editable state in the timing waveform area and press the middle button, a menu appears with choices such as: 0, X, 1. This menu only appears over states that you can edit. You cannot edit fixed states, or single-state segments. The valid state values for the waveform come from the Frame Generation Language formulae. When you delete a state from a description of a frame, you create a new frame. This new frame appears in the Frame Editor, and the new name is displayed as the name of the frame in the signal list.

Menu of the Timing Version Name

A middle mouse button press on the name cell of the version displays a menu with the following selections:
Current—lists currently defined timing version names for the current timeset, from which you can select a version name, and the editor displays all the timing parameter values from that version.
Rename—a dialog box enables you to type in a name, enter return, and the editor relabels the version.
Delete—removes the timing version.
New—creates a new timeset timing version with a default name of typ1, typ2, and so on. The starting point for a new timing version is the current set of timing versions the editor lists in the Current selection. You can then modify the timing parameters. The editor shows any modifications to the signal lists and frames in the timing versions.

Tools Card

There are seven process icons on the Tools Card: Map States, Glitch Filter, Bidir Split, Align Edges, Align Cycles, Scale Timing, and Cycle Select. As with the Tester cards, you generally will run the processes on the Tools Card in the order they appear on the card.

Map States Filter

The Map States Filter performs state substitution on a database to map the data from legal states for one file format (for example, a simulator), to the legal states for another file format (for example, that used by a logic verifier such as the LVS00). You can specify, in the Properties dialog box (see below), a State Map File, or you can specify common mapping operations such as elimination of unknown states.

Operation

After you drag the Map States Filter icon onto the workbench, or select it and have the system put the icon on the workbench for you, you can place the cursor on the icon, and press the middle mouse button, and a menu appears. Then, choose Properties from the menu, and use the dialog box that appears to specify how to do the substitution. Double-clicking the icon of the Map States Filter, or choosing Execute from the browser menu of the icon, starts the filter, and a box with a clock shows that the process is running. The box includes an Exit button, winch stops the process, leaving the partial results in the database.

Middle Mouse Button Menu

Pressing the middle button of the mouse while the cursor is on the icon produces a menu with the following options:
Delete—removes the icon.
Rename—enables you to enter a new label for the icon.
Properties—produces dialog box for configuring the process.
Time Range—specifies the time length.
Use all times—the entire time scale in the particular TekWAVES database.
Select time—
Start Time—if you do not specify a start time, the filter uses the beginning of the time scale.
Stop Time—if you do not specify an end time, the filter uses the end of the time scale in the database.
Create Database—copies the database before the process starts, as a backup in case the process partially executes and then fails. If you do not choose Create Database, the system updates the database with the new states, and removes the old states.
Name—you enter the name of the new database in the text field to the right of the check box.
Use Signal List—if you do not specify a Signal List File, the filter uses the observe list from the database.
File Name—specifies the name of a Signal List File (nameoffile.sgl) that the filter uses.
State Replacement—
Remove Unknown States—if the original database contains unknown input states (U), this allows the filter to translate those to known states in the target state set. You can map unknown states to: 0 1 Z.
previous—does not create an edge.
complement—of previous state. Note: If you choose previous, the filter actually removes an edge from the data. Complement creates a transition, while removing the unknown state. If the previous state is also unknown, the filter sets the new state to Z.
Replace output Hi-Z States—you can select this option to map Z to either pull down (0) or pull up (1).
Replace States—specifies any state to map from, and any state to map to.
replace—a state.
with—another state.
State Mapping File—specifies the name of a State Map File (nameoffile.smp) which determines the mapping for several states simultaneously. This substitution is order independent; that is, map 1 to 0 and 0 to 1 would complement the data. All of the previous functions are simplified versions of this function.
Show Summary—displays information about the last execution of the process.
Show Error—displays the error information in a scrollable text window.
Write Error—displays a dialog box that enables you to name the file to which the system writes the errors.
Store Error—saves any errors into the database, so you can view them from the Timing and State editors.
Execute—same action as a double click on the icon; starts the process.

GlitchFilter

The Glitch Filter resides with the other filters on the Tools Card. The Glitch Filter removes or lengthens pulses from the data that are less than a width you specify. You can use this to remove spikes and glitches that appear in the data as a result of simulation. If you have told the filter to delete pulses, when it finds a pair of edges, it removes the pulse by deleting both edges, and assigning the state before the pulse to the time interval between the edges. If you have specified that pulses are to be lengthened, the time is increased by either moving the last edge out, moving the first edge in, or moving both edges half the required distance. If the inter moves edges, it is possible that new pulses of less than the specified width are created as the system removes old ones. The filter does not remove or expand pulses from within timesets. If the data is a mixture of timeset and event data, the filter removes pulses only from the event data.

Operation

After you instantiate the Glitch Filter, you can choose Properties from the browser menu, and use the dialog box to set up the operation. Double-clicking the left mouse button while the cursor is on the Glitch Filter Icon starts the filter, and a busy box appears informing you of the status of the process. A clock shows the process is active. The busy box includes an Exit button that stops the process.

Middle Mouse Button Menu

The Properties dialog box, available from the menu of the icon, specifies the minimum pulse width, what time range to affect, which signals to affect, and whether to create a new pulse. You specify the time range with a start time and an end time. If you do not specify a start time, the filter uses the beginning of the time scale in the database (time 0). If you do not specify an end time, it uses the end of the time range in the database. If you press the middle button of the mouse, a menu appears on the screen. The menu has the following choices:

Delete—removes the icon.
Rename—enables you to enter a new label for the icon.
Properties—of the process.
 Time Range—where to start and stop filtering.
 Use all times—of the TekWAVES database.
 Select time—a particular period of time.
  Start Time—specify.
  Stop Time—specify.
 Create Database—copies the database before the process starts, as a backup in case the process partially executes and then fails. If you do not choose Create Database, the system updates the database with the new edges, and removes the old edges.
 Name—enter the name of the new database.
 Signal List File—specifies the name of a Signal List File nameoffile.sgl) for the Glitch Filter process. If you don't specify a list, the filter uses the observe list from the Database Manager.
 Define Pulse Width—the following choices are available for indicating the minimum pulse width:
  Tester Define Minimum Pulse—enter the name of the tester to use, and the filter uses the minimum resolution of the tester. This is in the Tester Capabilities File as the minimum pulse width.
  User Specified Period—enter the integer value in the first field, then select the time unit cell to toggle it through ns, us, etc.
 Options—You can also specify whether to remove or lengthen pulses.
  remove pulse—
  lengthen pulse—the default is to move the last edge out in time. If you lengthen pulses, you have three options to choose from:
   last edge—out in time,
   first edge—out in time, or
   both edges—both edges move half the required distance.
Show Summary—displays information about the last execution of the process.
Show Error—displays the error information in a scrollable text window.
Write Error—displays a dialog box that enables you to name the file to which the system writes the errors.
Store Errors—saves any errors into the database, so you can view them from the Timing and State editors.
Execute—same action as a double click on the icon; starts the process.

Bidir Split Filter

The Bidir Split Filter converts each bidirectional pin in the current database into a unique input and a unique output pin. You can monitor the conversion of the pins in the Database Manager. The new output pin has the name of the original bidirectional pin, with an —0 appended to it. If it is not sensing, it has a T state. The new input pin has the name of the original bidirectional pin, with an _1 appended to it if it is not driving, it has a Z state. If the new input name conflicts with an existing pin name, the filter notes an error message. If you use a bidirectional pin in an instantiated timeset in the database, the filter does not split the pin, and the filter notes an error message. Bidirectionals do not appear in the Timeset Editor until you split them with this filter.

Operation

When you instantiate the Bidir Split Filter, by dragging it off the Tools Card and onto the workbench, or selecting it so the system moves it onto the workbench, you can select Properties from the browser menu, and use a dialog box to specify whether to create a new database. Double clicking the mouse while the cursor is on the Bidir Split Filter icon starts the filter, and a busy box appears that informs you of the status of the process. A clock shows that the process is running. The busy box includes an Exit button that can stop the process.

Middle Mouse Button Menu

Delete—removes the icon.
Rename—enables you to enter a new label for the instance of the icon.
Properties—dialog box.
 Create Database—copies the database before the process starts, as a backup in case the process partially executes and then fails. If you do not choose Create Database, the system updates the database with the new pins, and removes the old pins.
 Name—names the new database.
 Use Signal List—If you do not enter one, the filter uses the observe list from the pin information in the database. This operation affects only bidirectional signals within the list.
  File Name—specifies the name of a Signal List File (nameoffile.sgl) in the dialog box.
Show Summary—displays information about the last execution of the process.
Show Errors—displays the error information in a scrollable text window.

Write Errors—displays a dialog box that enables you to name the file to which the system writes the errors.

Store Error—saves any errors into the database, so you can view them from the Timing and State editors.

Execute—same action as a double click on the icon; starts the process.

Align Edges Filter

The Align Edges Filter adjusts edges across the signals in your TekWAVES database, or a Signal List File you aeate, for events that occur at almost the same time. You might do this for several reasons; to align transitions on bidirectional pins, to align input transitions in order to minimize timing generator requirements, or to align output transitions in order to minimize sampling requirements. This tool enables you to specify a reference event, a snapping window, and a snap position relative to the time of the reference event. A reference event is a point in time that you use to define the time window within which the filter searches for edges to snap. The reference event serves as a reference for determining the snap point. You can describe a reference event in terms of a specified transition on a separate reference signal in the TekWAVES database, or a set of state values on other signals with the Qualification Signal List File. hen the filter detects the reference event, that is, a signal you marked that has a state transition such as 1 to 0, the filter scans all of the signals for edges that fall within a time interval. You define the interval with the snapping window, relative to the reference event. The filter moves all the marked edges to the time you specify.

Qualification Signal List File (.qsl)

The Qualification Signal List File is a list of pairs of signal names and states, such as 0, 1, H, or L. The Align Edges process can use the qsl file as it aligns the edges of the signals in the Signal List File. The process always aligns the edges of the Signal List File to a transition event of a reference signal, which you specify in the Properties box of the process. The reference signal is in the TekWAVES database (not in the Signal List File). The process then can use the states of the signals in the Qualification Signal List File to qualify further the Signal List File edges with the transition in the reference signal. When the process matches the states of the signals in the qsl file to an event of the reference signal, the process then aligns the edges of the Signal List File signals to the transition, or edge, of the reference signal. If the reference signal is in the Signal List File as well as the TekWAVES database, then the process ignores it, and does not move any of the edges of the reference signal in the Signal List File. Also, the process does not affect the signals in the qsl file. When creating the file, you must individually specify each signal of a bus. The states must be valid states for the format of the specific TekWAVES database with which you are working. A file could look like this:

| (signal) | (state) |
|---|---|
| OUTPUT[9] | 0 |
| OUTPUT[8] | 1 |

Dead Zones

Other options in the Align Edges Filter enable you to remove edges from dead zones, and to align edges to the resolution of the tester. If you tell the filter to remove edges from dead zones, the filter locates any edge that falls within a dead zone, such as a specified distance from a cycle boundary, and moves it to the nearest point outside the dead zone within the current cycle. Aligning to the resolution of the tester moves all the edges to the nearest time that is a multiple integer of the resolution of the tester. Notice that all of these operations can compromise the integrity of the data to some degree, so you should save previous versions of the data.

Operation

If you choose Properties from the middle mouse button menu of the Align Edges Icon, you can use the dialog box to specify how to do the operation. The filter does not move edges within timesets. Double clicking on the icon starts the filter, and a busy box appears telling you of the status of the job. A clock shows that the job is running. The busy box includes an Exit button that stops the process.

Middle Mouse Button Menu

Delete—removes the icon.
Rename—enables you to enter a new label for the icon.
Properties—dialog box.
 Time Range—in which to align edges.
 Use All Times—of the current TekWAVES database.
 Select Times—
  Start Time—if you do not specify a start time, the filter uses the beginning of the time scale. You can toggle through the ns, us, ms, and ps choices with the left mouse button.
  Stop Time—If you do not specify a stop time, the filter uses the end of the time scale in the database. You can toggle through the ns, us, ms, and ps choices with the left mouse button.
 Create Database—copies the database before the process starts, as a backup in case the process partially executes and then fails. If you do not choose Create Database, the system updates the database with the new edges.
 Name—enter the label the new database in the text field.
 Use Signal List—specifies the name of a Signal List File (nameoffile.sgl). If you do not specify one, the filter uses the observe list from the pin information in the database. This list determines which signals the filter affects with this operation.
  File Name—the name of the Signal List File. The filter aligns the edges only of the signals in the file, and not an entire TekWAVES database.
 Options—
  Align Edges—
  Reference Signal—
   From state—the beginning state of the reference edge.
   To state—the final state of the reference edge.
  Use Qualification Signal List-select the check box to affirm.

File Name:—of any extant qsl files. Either manually type in the name, or choose the name from a browser menu that is available when you place the mouse cursor in the text field and press the middle mouse button.

Snap Point Offset—specifies the time distance from the reference event to which the edges in the Signal List File snap. You can toggle through the ns, us, ms, and ps choices with the left mouse button.

Snap Range (Time from Reference)—where the transition event occurs, and the qsl signals are at the state you specified, the process snaps the edges of the signals in the Signal List File, using the transition event as a reference time. Specify here for how much time edges snap. The process removes any edges that are within the snap range yet are not the edges that the process snaps.

Begin Snap—specifies the time distance from the reference time that marks the beginning of the snap range. You can toggle through the ns, us, ms, and ps choices with the left mouse button.

End Snap—specifies the time distance from the reference time that marks the end of the snap range. You can toggle through the ns, us, ms, and ps choices with the left mouse button.

Remove from Dead Zones—moves any edges that fall within dead zones outside the dead zones, as defined in the Tester Capabilities File.

Tester—the LV500 is default. To change the tester configuration, either manually type in the name, or choose the name from a browser menu that appears when you place the mouse cursor in the text field and press the middle mouse button.

Align on Tester Resolution—snaps all the edges in the pin group to the nearest integer multiple of the tester resolution, as set in the Tester Capabilities File.

Tester—the LVS00 is default. To change the tester configuration, either manually type in the name, or choose the name from a browser menu that appears when you place the mouse cursor in the text field and press the middle mouse button.

Show Summary—displays information about the last execution of the process.

Show Error—displays the error information in a scrollable text window.

Write Error—displays a dialog box that enables you to name the file to which the system writes the errors.

Store Error—saves any errors into the TekWAVES database, so you can view them from the Timing and State editors.

Execute—same action as a double click on the icon; starts the filter.

Align Cycles Filter

When you create cycle boundaries, they may not lie at time points that a tester can reproduce, because of the cycle length t- M resolution limits of the tester. You use the Align Cycles Filter to move cycle boundaries to the nearest time point your tester can reproduce. For example, the cycle length resolution for the LVS00 is 4 ns. If a cycle boundary is placed at 51 ns, this filter moves the cycle boundary to 52 ns. If a cycle boundary lies equidistant between two choices for legal placement, the filter always moves it out in time. You cannot move cycle boundaries that are timeset boundaries. Also, notice that moving cycle boundaries can modify the waveform data. You should, accordingly, save previous versions of the data.

Operation

After you place the Align icon of the Cycles Filter on the workbench, you can select Properties from the browser menu of the icon, and the dialog box enables you to specify how to do the operation. Double clicking on the Align Cycles Filter icon causes a busy box to appear that shows you the status of the job. A clock shows that the job is running. The busy box includes an Exit button, which stops the process.

Middle Mouse Button Menu

Delete—removes the icon.

Rename—enables you to enter a new label for the icon.

Properties—dialog box.

Tester—the name of the tester you are to use. A Tester Capabilities File uses the tester name as a reference to determine the resolution of the tester.

Choose Start & Stop Times—

Use all times—the entire time scale of the particular TekWAVES database.

Select Times—a range of time to change.

Start Time—enter the integer value in the first field, then select the tune unit cell to toggle it through ns, us, etc.

Stop Time—enter the integer value in the first field, then select the time unit cell to toggle it through ns, us, etc.

Ignore Signal Changes—if there are any signal edges (state changes) between the original boundary time and the revised boundary time, the filter moves those edges to the new boundary time; in effect, the cycle boundary movement drags them along.

Automatically load errors—into the TekWAVES database. This saves them, and enables you to access the errors through the editors.

Create Database—copies the database before the process starts, as a backup in case the process partially executes and then fails. If you do not choose Create Database, the system updates the database with the new cycles, and removes the old cycles.

Name—of the database you create.

Show Summary—displays information about the last execution of the process.

Show Errors—displays the error information in a scrollable text window.

Write Errors—displays a dialog box that enables you to name the file to which the system writes the errors.

Store Errors—saves any errors into the database, so you can view them from the Timing and State editors.

Execute—same action as a double click on the icon; starts the filter.

Scale Timing Filter

The Scale Timing Filter stretches, or compresses, the input data by a factor you specify. It moves output edges by maintaining the nine difference between each output edge and the previous input edge. Notice that, since the previous input edge is not necessarily the cause of the output edge, this may not accurately reflect the propagation that you would expect between an input transition and the resulting output transition. You should, therefore, resimulate your data. The Scale Timing Filter has several applications, including changing simulation data for a tester that cannot operate a circuit at the speed at which the circuit was simulated.

Operation

When you put the Scale Timing Icon onto the workbench, you can select Properties from the browser menu of the icon, and a dialog box enables you to specify how to do the operation. If you double click the left mouse button while the cursor is on the icon of the Scale Timing Filter, the filter starts, and a busy box tells you the status of the process. A clock shows that the process is running. The busy box includes an Exit button that stops the process, leaving the database partially changed.

Middle Mouse Button Menu

Delete—removes the icon.
Rename—enables you to enter a new label for the icon.
Properties—enables you to specify the scale factor, and whether to make a new version of the database, or to create a new database.
   Create New Database—copies the database before the process starts, as a backup in case the process partially executes and then fails. If you do not choose Create Database, the system updates the database with the new edges, and removes the old edges.
   Name—enter the name of the new database in the text field to the right of the check box.
   Scale Factor—specifies the scale factor with a floating point multiplier. 1.0 means no scaling, 2.0 means the time is doubled, 0.5 means the time is halved, and so on.
Show Summary—displays information about the last execution of the process.
Show Error—displays the error information in a scrollable text window.
Write Error—displays a dialog box that enables you to name the file to which the system writes the errors.
Store Errors—saves any errors into the database, so you can view them from the Timing and State editors.
Execute—same action as a double click on the icon; starts the process.

Cycle Select

Cycle Select assigns cycle boundaries for a tester based on your input. You choose from a variety of parameters in the Properties dialog box described below. To display the Cycle Select Properties dialog box, put the cursor on the icon, and press the middle mouse button, and choose Properties. A cycle boundary is a time stamp where a tester starts one or more timing generators. A timing generator is a hardware device that controls when in time a tester applies stimuli to the Device Under Test (DUT). You can generate cycle boundaries by a variety of algorithms, depending on your particular application. You can specify whether you want to leave existing cycle boundaries in place, or to remove them when you generate new ones. Tek-WAVES only supports synchronous data—that is, tester cycles apply across all pins.

Operation

When you drag the Cycle Select Icon off the Tools Card (or select it while it is on the Tools Card) and put it onto the workbench, you can select Properties from the browser menu of the icon, and it displays a dialog box that enables you to specify how to do the operation. Double clicking the Cycle Select icon starts the process, and a busy box appears informing you of the status of the process. A clock shows that the system is processing the data. The busy box includes an Exit button that stops the process. Cycle Select does not always place a cycle boundary at the end of the data, but you can place one there if you need to, in the Timing Editor, where you can display and add cycle boundaries.

Middle Mouse Button Menu

Pressing the middle mouse button while the cursor is on the icon displays the following menu:
Delete—removes the icon.
Rename—enables you to enter a new label for the icon.
Properties—dialog box.
   Time Range—for the filter to process.
     Use All Times—in the current database.
     Select times—in which to assign cycle boundaries.
       Start Time—you enter the integer value in the first field, then select the time unit cell to toggle it through ns, us, etc.
       Stop Time—you enter the integer value in the first field, then select the time unit cell to toggle it through ns, us, etc.
   Create Database—copies the database before the process starts, as a backup in case the process partially executes and then fails. If you do not choose Create Database, the system updates the database with the new cycle boundaries, and removes the old cycle boundaries.
     Name—you must enter the name of the new database in the text field.
   Use Signal List—the process finds
   File Name—
   Existing Cycle Boundaries—could have been placed manually, or by an earlier run of the Cycle Select process.
     Use as Seeds—the existing cycle boundaries.
     Remove—the existing cycle boundaries.
   Use Seed File—use existing cycles as seeds.
     File Name—name the file to use (type the name and enter return).
   Method—
     Use Seed File Only—the process reads the above named seed file, and does not generate any other cycles.
     Automatic—assigns cycle boundaries by looking for cyclic tendencies in the data, and placing cycle boundaries at locations that minimize the demand on the resources of your tester. Cycle Select may use cycle boundaries existing in the data as seeds for the algorithm. This algorithm also has a metric for scoring cycle boundaries based on the number of signals that confirm each location.

Constant Period—specifies a period. If you use Reference Signal (see below), you need to fill in the signal name and the transition type. This places a cycle boundary at the start time that you supply, and continues placing cycle boundaries at time intervals that you specify. The Constant Period generator stops placing cycle boundaries when it reaches the end time that you specify. When you pick values for the start time and time intervals, you should select values that fall on your tester's resolution requirements.

Fixed Cycle Length—2 state cycles—no more than two states describe the 2-state cycle format. All state transitions must fall between the boundaries of a cycle. This process finds the smallest time between two edges between the start time and the end time. Cycle Select then uses the smallest time as the time interval in the Constant Period option. Cycle Select calculates a new start time, so the edges that the time interval is based on fall between the boundaries of the cycle. With the selected cycle boundaries, each signal has a 2-state format.

Variable Cycle Length 1-state cycles—a single state describes the 1-state cycle format. All state transitions fall on cycle boundaries. This process finds each edge and places a cycle boundary at that time.

Fixed Cycle Length 1-state cycles—a single state describes the 1-state cycle format. This means that all state transitions fall on cycle boundaries. This process finds the greatest common factor of the time distances between adjacent edges. Cycle Select then uses the greatest common factor as the period for placing cycle boundaries. This guarantees that all edges fan on cycle boundaries, and that each signal has a single-state cycle format.

Add at Change of Direction—adds a cycle boundary where a bidirectional signal changes direction.

Use a Reference Signal—you might want to use the clock, or other signal, as a reference signal.

Signal Name—labels a reference signal to determine the location of the cycle boundary. Cycle Select places a boundary whenever a state transition occurs in the reference signal. You select the actual transition as a:
rising edge—
falling edge—
any transition—

Show Summary—displays information about the last execution of the process.

Show Errors—displays the error information in a scrollable text window.

Write Errors—displays a dialog box that enables you to name the file to which the system writes the errors.

Store Errors—saves any errors into the database, so you can view them from the Timing and State editors.

Execute—same action as a double click on the icon; starts the process.

LV500 Card

The LV500 card has icons that perform tester-specific operations, as well as general vector filtering operations. The icons on the LV500 tester card are in the order they should, in most cases, be used. They are the:

RULES CHECK (Tester Capabilities Checker)
X TRACT (Timeset Extractor)
LV500 (Resource Allocator)
WIRE GUIDE (Fixture Report Generator)
WRITE MSA (Test Program Generator)
LVS00 COMM (Communications)

These icons are process icons and have some common functionality. The Properties dialog box of each icon contains input information specific to each process.

The tester-specific processes all rely on information from a Tester Capabilities File (nameoffile.tcp). The following is a list of tester specifics that the Tester Capabilities File requires:

Tester name
Number of input channels
Number of output channels
Frame types and descriptions
Cycle length requirements
Cycle resolution
Edge resolution
Minimum and maximum pulse width
Number of timing sets
Number of timing generators
Dead zones
Dynamic format change limitations
Vector depth
Legal states
Voltage Limitations You can connect the icons on the LV500 Card together as a flowchart of operations. (See the Icons section of the Workbench chapter of this guide.) You can also connect files as input to a process. When you activate a process icon, by double-clicking on the icon, or choosing Execute from the browser menu of the icon, the system activates the processes in the sequence they have on the card. When you activate a process, the system uses the information from the Properties dialog box of the process to perform the operations on the active database. The system can not run on an empty database, and will tell you if you attempt to do so. After the process runs, it updates the history information available in the Database History dialog box. This is available from the menu you get by placing the cursor on the Database Icon and pressing the middle mouse button.

Displaying Errors

If one or more errors occurred during the execution of the process, the system highlights the LVS00 icon. The middle mouse menu of the process icons has four items relevant to process error information:

Show summary—displays information about the last execution of the process.

Show error—brings up a window with a description of the errors.

Write error—displays a dialog box that enables you to name the file to which the errors are written.

Store error—loads all errors for the process into the database that produced the errors. You then can view the errors from the Timing and State editors.

You can see any errors by choosing the Show Errors, Write error file, and Store errors options in the browser menu of a process icon. You can get this menu by placing the cursor on the icon and pressing the middle mouse button. If you store the errors into the database you can see the errors from the Timing and State editors. The Timing Editor contains a horizontal error bar, while the State Editor contains a vertical bar. In each case, when a process logs an error, the event in violation is highlighted by a red E in the error bar. When you decide to read the error message of a violation, by double-clicking on the red E in the bar region, a dialog box appears with the error message. All errors that do not have a time stamp associated with them are stored at time 0.

About Testers

Testers are machines that apply data to a Device-Under-Test (DLM at some multiple of a basic clock frequency. They function on the basis of timing cycles, with a specific timing, such as frame, delay, width, and so on per pin. The electrical waveform you apply to an input pin of a DUT has the state value for that pin at a given time, or cycle. The frame and timing information for that input pin then modulate the state value. You and the tester can compare the waveform on a DUT output pin against an expected state value during an interval that the strobe timing of the comparator defines.

RULES CHECK (Tester Capabilities Checker)

Rules Check, or the Tester Capabilities Checker, checks simulation force and compare data for tester compatibility. Each tester has a number of rules and limitations that you need to verify before you can generate a tester-specific program. Rules Check assumes that the simulation input for the process has the correct information to simulate the device under test (DUT). Rules Check makes no attempt to verify the quality of the simulation data. You have the option of checking the data based on a series of tester capabilities that differ from tester to tester. Although Rules Check has the ability to check for a number of capability violations simultaneously, you have the option to check only one at a time, several at a time, or all at once. In addition, you can select a start and stop time to enable checking of only certain windows of simulation data. This simplifies debugging the simulation data by allowing you to break down your checking procedures into modules. You can specify certain signals or all signals, which enables you to check your data by data groups, or types. Rules Check uses the observe column in the Database Manager, or a Signal List File you specify in the Properties dialog box of Rules Check, to indicate which signals in the database participate in the tester capability checks.

Operation

Dragging a Rules Check Icon from the LVS00 Card (or selecting it while it is on the card) creates a new Rules Check Icon on the Workbench. Its default settings are not necessarily those you set in the last instance of Rules Check you used. Rules Check creates an error list. Among other things, you can use it to create a file that lists all the violations Rules Check encountered. Rules Check only checks against the Tester Capabilities File (nameoffile.tcp). While the process is running, a busy box appears with a clock showing the complete process. A complete sweep of the clock corresponds to a complete job. The busy box contains a Exit button that enables you to terminate the process.

Middle Mouse Button Menu

If you place the cursor on the icon and press the middle mouse button, a menu with the following choices appears:

Delete—removes the icon.
Rename—enables you to relabel the icon.
Properties—enables you to set a test for each instance of the Rules Check icon. The dialog box contains:
  Tester—the name of the target tester. If you instantiated the icon from a tester card, the name of that tester appears by default.
  Choose Start & Stop Times—of the database to check for tester capabilities.
  Use all times—in the current database.
  Select times—
    Start Time—the start time of the time window that Rules Check uses for capability checking. The default is 0.
    Stop Time—the stop time of the time window that Rules Check uses for capability checking. The default is the end time of the data.
  Use Signal List—if you do not specify a Signal List File, the process uses the observe list from the Database Manager. This list determines which signals this process affects.
  File Name—specifies the name of the Signal List File (nameoffile.sgl).
Automatically load errors—saves any errors into the database, so you can view them from the Timing and State editors.
Rule Check Selection:—selects the data to test using any or several rule checks.
  Run All Checks—runs all the algorithms below. After Rules Check finishes all checks, it displays any resultant errors or comments.
  Run Selected Checks—
    Frame Allocation—each timing generator has a limited set of frames that it can produce. This test verifies that assigned frames are available on the specified tester. The available frames are described in the Tester Capabilities File in Frame Generation Language (FGL). Some testers, including the LV500, do not allow dynamic assignment of frames on a vector-by- vector basis. In such cases, the frame must remain the same throughout all the test vectors. This test makes sure that dynamic assignments are not performed when the specified tester does not have dynamic frame assignment capability. The DNRZ and edge frames are different. They are divided into leading and trailing edges. The system does not determine those until test program generation (WRITE MSA). If there is an error, the WRITE MSA process creates an error file explaining the error. Each tester recognizes a limited set of states. This test verifies that all states in the data correspond to legal states for the particular tester.
    Edge Resolution—each vector data transition must fall on a multiple of the minimum resolution of the tester in order to be reproducible by the tester. This test verifies that each edge pertaining to the timing information in the timeset falls within this criteria.

Cycle Resolution—each cycle boundary must fall on the minimum resolution of the tester to ensure tester reproducible vectors. Each cycle specifies the beginning of a timeset, and the period of the timeset must fall within the tester's timing constraints.

Dead Zone—some testers require that edges not fall within a certain area of a cycle boundary, or dead zone. This checks that no edge occurs within these leading or trailing dead zones of a cycle.

Voltage Assignments—voltage drive and compare levels of pins are verified.

Min-Max Cycle Length—verifies that cycle lengths, which are bordered by cycle boundaries, are within the capabilities of the tester.

Timeset Generator Allocation—verifies the number of timing generators used, as each tester has a limit on the number of timing generators that you can assign to a pin during a test vector sequence; number of timing sets assigned to a pin group during a test vector sequence; variable length cycles, as some testers do not allow variable length cycles.

Pin Resources and Allocation—Testers have a limit as to how many of their pins may be configured as drive (input), compare (output) and I-0 pins due to tester architecture and configuration. This test verifies that sufficient tester resources are available, and reports what is required to meet vector data resource requirements. In addition, it verifies that all signals are uniquely assigned to tester channels. A warning is generated if more than one signal is wired to the same pin.

Vector Dept—checks the number of vectors, or number of cycles, you define, and compares it to the tester's limit.

Min-Max Pulse Width—verifies that minimum and maximum pulse width requirements are as the tester capabilities file specifies.

Vector Initialization—Some testers enable you to initialize the drivers before starting the test vectors. When this is not the case, this check verifies that no frames in the first timeset begin with the previous state (P) FGL operator. If a frame in the first timeset does begin with the (P) FGL operator, then an error message appears. You then need to generate a preceding timeset with all DNRZ formats assigned to 0 delay.

Show Summary—displays information about the last execution the process.

Show Errors—displays the error information in a text window.

Write Errors—displays a dialog box that enables you to name the file to which the errors are written.

Store Error—into the database, so the Timing and State editors can display them.

Execute—same action as a double click on the icon; starts the process.

XTRACT (Timeset Extractor)

The Timeset Extractor converts event-encoded waveform data into equivalent state and timing representations, which are compatible with given sets of frame definitions. The Timeset Extractor reads frame definitions from the Tester Capabilities File for the LV500 tester.

Converting an Event in a Simulator to a State in a Tester

A tester requires state data, which consists of a series of states for each pin. In contrast, logic simulators produce event data, which consists of a time-ordered series of value changes, or events, for each signal. Each event has three attributes: the signal that changes, the time of the change, and the new logic value of the signal. You must convert event data to its equivalent state and timing representation for a tester to reproduce a comparable waveform. Traditionally, a sampling algorithm has done the event-to-state format conversion process. This method samples the event data at a repeating and fixed time interval. The sampled value for each signal becomes the signal state for that interval, or cycle. In effect, the algorithm constructs a waveform for each signal, the value of which remains unchanged until the next sample point. The accuracy of sampling is subject to the length of the sample interval. If the sample interval is large, there may be many events between samples that are lost. If the interval is small, the sampled waveform more nearly matches the original waveform. However, with a small sample interval the pattern depth, or number of samples, is very large and may exceed the resources of the tester. So, sampling is ineffective for many waveform data sets. The Timeset Extractor does not use a sampling algorithm. Instead it employs pattern recognition within predefined cycle periods to determine an appropriate tester state-frame-timing representation for each pin during each cycle. The extractor reads legal frame and timing limits for a given tester from the tester capabilities file, and constrains the algorithm to produce only valid solutions for that tester. (TekWAVES contains capabilities files for all configurations of the LV500.)

Using the Timeset Extractor

You may not need to use the Timeset Extractor while producing a tester-compatible test program. If you have already manually created data using the State and Timeset editors, or read data from a state-data formatted file (such as an MSA file), then the timing, frame, and state information is already present. In that case, you can go to the Resource Allocator and Test Program Generator. If not, you need to run the Timeset Extractor to convert the event data to state data. If you have created data from timesets that used frames, which something other than a tester defined, you might run the Timeset Extractor to convert the data to timesets, using only the tester-specific frames. Before running the Timeset Extractor, cycle boundaries must have been created, either manually by entering them with the Timing Editor, or automatically by running the Cycle Selector.

Timeset Extraction Algorithm in TekWAVES

The timeset building process traverses the event data sequentially through time, examining the event transitions for each signal between two successive cycle boundaries. Within each cycle it extracts the equivalent frame-timing-state representation for each signal, regardless of whether the signal is input or output. If multiple frames match, the extractor attempts to minimize the number of frame types by examining all cycles across a given signal and assigning the most commonly usable frame type. However, this does not ensure that the frame type does not change, as the LV500 requires. The timeset building process loads the state value of each signal back into the TekWAVES data structures and compares existing timesets against the frame and timeset for the current cycle. If they match, it uses the existing timeset. Otherwise, it defines a new timeset. The extractor associates the current vector of state values with a timeset via the name of the timeset. If preassigned timesets exist, the timeset extractor attempts to use them. If the preassigned timesets do not work, it automatically replaces them. The extractor sequentially names the timesets as it creates them. The name is tset1, tset2, and so on. For output, or sensing, signals, you need to specify the type and time placement of strobes. You can place edge strobes at the beginning of a cycle plus some time delta, at the end of a cycle minus some time delta, or at some time delta after the last edge in the cycle. If you specify window strobing, the window extends from the time delta after the last edge, until the end of the cycle.

Rules Checking

The extractor reads the Tester Capabilities File to determine the set of available tester frames. If the extractor can not map the behavior of a given signal onto a legal tester frame, the extractor issues a warning message. You can then assign that signal an NRZ frame with a state of high impedance (Z) or abandon timeset extraction for that cycle, leaving all the data within that cycle in event format.

Operation

The Timeset Extractor accesses the active database to obtain the cycle boundaries, event data to be converted, and the type, function, and class of pin. You can set pin attributes in the Database Manager. The Timeset Extractor also reads the Tester Capabilities File to obtain the legal tester frames and legal tester states. The X Tract process transforms an event view of the waveform data into a state-timeset view, while ensuring that the result is compatible with the set of frames defined in the Tester Capabilities File. On output signals, the resultant state-timeset view may be different from the original event data; the state value is that of the output signal at the strobe time, and the timing of timeset comes from the strobe, not the original event data. While the X Tract process is running, a box appears with a clock showing the complete process. The busy box contains an Exit button that enables you to terminate the process.

Middle Mouse Button Menu

If you place the cursor on the icon and press the middle mouse button, a menu with the following choices appears:
Delete—removes the icon.
Rename—enables you to relabel the icon; type the name and enter return.
Properties—enables you to set the following information in a separate dialog box:
Tester:—the name of the target tester; the default is the LV500-128. If you want to establish a different default tester or tester configuration, which will then apply throughout the TekWAVES system.
Create Database—copies the database before the extractor executes, as a backup in case the process partially executes and then fails. If you do not choose Create Database, the system updates the database with the new timesets and frames, and removes the old timesets and frames.
File—labels the name of the netv database in the text field to the right of the Create Database check-box.
Convert Unassignable Frames—indicates that if the extractor cannot assign a frame (from the legal set of frames for the LV500), the extractor assigns a frame of Inhibit (INH) with a state of Z. If you do not convert timesets, the extractor does not assign a timeset if it cannot assign one or more frames in the period.
Strobe Type—selects strobe type and placement, to indicate the time delta to use in strobe placement. If you select Edge strobe, you can select the method used to place the strobe:
Edge: cycle end −delta−
Edge: last edge +delta−
Edge: cycle start +delta−
Window: last edge +delta extends to the end of the cycle.
Strobe Delta—enables you to enter the integer value in the first field, then select the time unit cell to toggle it through ns, us, etc.
Show Summary—displays information about the last execution of the process.
Show Errors—displays the error information in a scrollable text window.
Write Errors—displays a dialog box that enables you to name the file to which the errors are written.
Store Errors—into the database, so the Timing and State editors can display them.
Execute—same action as a double click on the icon; starts the process.

Tester Resource Allocator

The Tester Resource Allocator assigns logical signals, through the pins of a device, to specific tester channels, and assigns tester channels to shared timing resources. The Resource Allocator only works with the Tektronix LV500 ASIC prototype verification system. If you have manually created a Pin Wire File (nameoffile.pwr), wire the icon to the Tester Resource Allocator on the workbench, or fin in the pin name of the Wiring Input File in the Properties dialog box of the Resource Allocator.

Driver Timing

The timing electrical impulses to an input pin of the DUT have the parameters of time and state.

Strobe (Comparator) Timing

Variations in rise and fall times, and propagation delay times, of devices result in output timing that rarely matches the expected output timing exactly. Typically, you place the strobe tester times conservatively to ensure that the outputs of the device have settled to stable values before you make comparisons. Strobing may be one of two types: edge strobing or window strobing. Edge strobing compares the actual output with the expected output at a single point in time. Window strobing does the comparison over a transfer is. 1200 is safest. It is unlikely that you can transfer a large file at 9600 baud.

Ethernet—Tektronix/Ethernet network Ethernet, with the FrP protocol, requires your setup of a user identification password for file transfers. This is different under the AEGIS shell than the Bourne shell.

Instrument Net Name—Ethernet requires a name of any machine in its communications network.

Host Name—the name of the computer from which you are transferring the test program. The system usually can find this itself.

Show Summary—displays information about the last execution of the process.

Show Errors—displays the error information in a scrollable text window.

Write Error—displays a dialog box that enables you to name a file to which the errors are written.

Store Errors—loads the errors from the process into the database for easy access from the editors.

Execute—same action as a double click on the icon; starts the process.

LT1000 Card

TekWAVES 1.0 cannot generate a test program for the LT1000. You can use it, however, to check a TekWAVES database against the timing resolutions of the LT1000, and extract timesets per the timing generators of the LT1000, thereby simulating the LT1000. Then, in order to generate an actual test program, after simulating the LT1000, download a.ewv vector file into the actual LT1000, capture the output data, and return to TekWAVES, follow the following procedure:

1) While in TekWAVES, filter the database through all of the filters on the Tools Card, and Rules Check on the LT1000 card.
2) While in TekWAVES, write out a TekWAVES database in the TSSI SEF format.
3) You can then copy the SEF-formatted TekWAVES database into a directory which the 'MSI PBRIDGE(C) can access.
4) You can then prepare a test program from the database with PBRIDGE.
5) Download the test program to the LT1000.
6) Acquire the actual output data.
7) Write it back out into SEF.
8) Copy that SEF file into the TekWAVES directory.
9) Read the SEF file into TekWAVES for further modifications, and possibly moving back to a simulator.

RULES CHECK (Tester Capabilities Checker)

Rules Check, or the Tester Capabilities Checker, checks simulation force and compare data for tester compatibility. Each tester has a number of rules and limitations that you need to verify before you can generate a tester-specific program. Rules Check assumes that the simulation input for the process has the correct information to simulate the device under test (DUT). Rules Check makes no attempt to verify the quality of the simulation data. You have the option of checking the data based on a series of tester capabilities that differ from tester to tester. Although Rules Check has the ability to check for a number of capability violations simultaneously, you have the option to check only one at a time, several at a time, or all at once. In addition, you can select a start and stop time to enable checking of only certain windows of simulation data. This simplifies debugging the simulation data by allowing you to break down your checking procedures into modules. You can specify certain signals or all signals, which enables you to check your data by data groups, or types (such as bus, input, output, control, bidirectional, and so on). Rules Check uses the observe column in the Database Manager, or a signal list you specify in the Properties dialog box of Rules Check, to indicate which signals in the database participate in the tester capability checks.

Operation

Dragging a Rules Check Icon from the LT1000 card (or selecting it while it is on its card) creates a new Rules Check Icon, with defaults not necessarily those you set in the last instance of Rules Check you used. Rules Check creates an error list that you can use to create a file listing all the Rules Check violations encountered. Rules Check only checks against the Tester Capabilities File (nameoffile.tcp). While the process is running, a busy box appears with a clock showing the complete job. A complete sweep of the clock corresponds to a complete job. The busy box contains an Exit button that enables you to terminate the process.

Middle Mouse Button Menu

If you place the cursor on the icon and press the middle mouse button, a menu with the following choices appears:

Delete—removes the icon.

Rename—enables you to telabel the icon.

Properties—enables you to set a test for each instance of the Rules Check icon. The dialog box contains:

Tester—the name of the target tester. If you instantiate the icon from a Tester Card, the name of that tester appears by default.

Choose Start & Stop Times—of the database to check for tester capabilities.

Use all times—in the current database.

Select times—

Start Time—the start time of the time window that Rules Check uses for capability checking. The default is 0.

Stop Time—the stop time of the time window that Rules Check uses for capability checking. The default is the end time of the data.

Use Signal List—if you do not specify one, the process uses the observe list from the Database Manager. This list determines which signals this process affects.

File Name—specifies the name of the Signal List File (nomeoffiie.sgl).

Automatically load errors—saves any errors into the database, so you can view them from the Timing and State editors.

Rule Check Selection—selects the data to test using any or several rule checks.

Run All Checks—Rules Check finishes all checks before displaying any error information or comments.

Run Selected Checks—

Frame Allocation—each timing generator has a limited set of frames that it can produce. This test verifies that assigned frames are available on the specified tester. The available frames are described in the Tester Capabilities File in Frame Generation Language (FGL). Each tester recognizes a limited set of states. This test verifies that all states in the data correspond to legal states for the particular tester.

Edge Resolution—each vector data transition must fall on a multiple of the minimum resolution of the tester in order to be reproducible by the tester. This test verifies that each edge pertaining to the timing information in the timeset falls within this criteria.

Cycle Resolution—each cycle boundary must fall on the minimum resolution of the tester to ensure tester-reproducible vectors. Each cycle specifies the beginning of a timeset, and the period of the timeset must fall within the timing constraints of the tester.

Dead Zone—some testers require that edges not fall within a certain area of a cycle boundary, or dead zone. This checks that no event occurs within these leading or trailing dead zones of a cycle boundary.

Voltage Assignments—voltage drive and compare levels of pins are verified.

Min-Max Cycle Length—verifies that cycle lengths, which are bordered by cycle boundaries, are within the capabilities of the tester.

Timeset Generator Allocation—verifies the number of timing generators used, as each tester has a limit on the number of timing generators that you can assign to a pin during a test vector sequence; number of timing sets assigned to a pin group during a test vector sequence; and variable length cycles, as some testers do not allow variable length cycles.

Pin Resources and Allocation—Testers have a limit as to how many of their pins may be configured as drive (input), compare (output) and I-0 pins due to tester architecture and configuration. This test verifies that sufficient tester resources are available, and reports what is required to meet vector data resource requirements. In addition, it verifies that all signals are uniquely assigned to tester channels. The system gives a warning if more than one signal is wired to the same pin.

Vector Depth—checks the number of vectors, or number of cycles, you define, and compares it to the limit of the tester.

Min-Max Pulse Width—verifies that minimum and maximum pulse width requirements are as the Tester Capabilities File specifies.

Vector initialization—Some testers enable you to initialize the drivers before starting the test vectors. When this is not the case, this check verifies that no frames in the first timeset begin with the previous state (P) FGL operator. If a frame in the first timeset does begin with the (P) FGL operator, then an error message appears. You then need to generate a preceding timeset with all DNRZ formats assigned to 0 delay.

Show Summary—displays information about the last execution of the process.

Show Errors—displays the error information in a scrollable text window.

Write Errors—displays a dialog box that enables you to name the file to which the errors are written.

Store Errors—into the database, so the Timing and State editors can display them.

Execute—same action as a double click on the icon; starts the process.

X TRACT (Timeset Extractor)

The Timeset Extractor converts event-encoded waveform data into equivalent state and timing representations, which are compatible with given sets of frame definitions. The Timeset Extractor reads frame definitions from the Tester Capabilities File for the LT1000 tester. Converting an Event of a Simulator to a State in a Tester. A tester requires state data, which consists of a series of states for each pin. In contrast, logic simulators produce event data, which consists of a time-ordered series of value changes, or events, for each signal. Each event has three attributes: the signal that changes, the time of the change, and the new logic value of the signal. You must convert event data to its equivalent state and timing representation for a tester to reproduce a comparable waveform. Traditionally, a sampling algorithm has done the event-to-state format conversion process. This method samples the event data at a repeating and fixed time interval. The sampled value for each signal becomes the signal state for that interval, or cycle. In effect, the algorithm constructs a waveform for each signal, the value of which remains unchanged until the next sample point.

The accuracy of sampling is subject to the length of the sample interval. If the sample interval is large, there may be many events between samples that are lost. If the interval is small, the sampled waveform more nearly matches the original waveform. However, with a small sample interval the pattern depth, or number of samples, is very large and may exceed the resources of the tester. So, sampling is ineffective for many waveform data sets. The Timeset Extractor does not use a sampling algorithm. Instead it employs pattern recognition within predefined cycle periods to determine an appropriate tester state-frame-timing representation for each pin during each cycle. The extractor reads legal frame and timing limits for a given tester from the tester capabilities file, and constrains the algorithm to produce only valid solutions for that tester. (TekWAVES contains a capabilities file for the LT1000.)

Using the Timeset Extractor

You may not need to use the Timeset Extractor while producing a tester-compatible test program. If you've already manually created data using the State and Timeset editors, or read data from a state-data formatted file, then the timing, frame, and state information is already present. You can then write out the TekWAVES database into TSSI SEF format, and then take that database into ISSI PBRIDGE software for creating a test program. If not, you need to run the Timeset Extractor to convert the event data to state data. If you have created data from timesets that used frames, which something other than a tester defined, you might run the Timeset Extractor to convert the data to timesets, using only the tester-specific frames. Before running the Timeset Extractor, cycle boundaries must have been created, either manually by entering them with the Timing Editor, or automatically by running the Cycle Selector.

range of time; any difference between actual and expected values during the window time frame is an error condition. The Resource Allocator assumes that the Timeset Extractor has assigned the strobe times. You can disable drivers and comparators on a per-cycle basis. This feature is sometimes called drive inhibiting and comparator masking. It is an important capability for testing bidirectional DUT pins, which can switch between inputs and outputs on any given cycle.

Shared Resources

The LV500 supports up to 256 channels that can either force or compare, but has only 16 timing generators. Channels are organized into four groups of 64 with four timing generators per group. You can only connect channels to timing generators within their respective groups. Thus, each group of 64 channels shares four timing generators. Usually drive frames, such as NRZ, DNRZ, RO, RI, and so on are independent, even though they must share timing sets. Timing sets are the edge placement times associated with each driver and comparator. So, a signal with a DNRZ drive frame and a delay time of 10 ns can share a timing generator with a signal with an RO drive frame, a delay time of 10ns, and a width of 20 ns. An edge strobed comparator with a strobe time of 10ns can also share the same generator. The Resource Allocator assigns device pins, or signals, to specific tester channels and timing generators so signals with similar timing and inhibit requirements can share timing resources. On the LV500, each timing generator has two independent edge generators. For comparator window strobing, or driver RO-RL formatting, you need both edge generators: one for the delay time and one for the width time. For comparator edge strobing and DNRZ drive formatting, you only need one edge generator. The LV500 allows either the delay edge or the width edge as the control mechanism for the delay time for DNRZ frame and the delay time for edge strobing. If possible, the Tester Resource Allocator takes advantage of this flexibility of the LV500.

Operation

The Tester Resource Allocator is an optional step in the process of transforming waveform data into a tester-compatible test program. You can partially or completely enter channel and timing generator assignment via the Database Manager. If you enter this data manually, you can proceed directly to WRITE MSA (the test program generator). Before running the Tester Resource Allocator, timeset and state data must have been created, either manually using the State and Timeset editors, or automatically, using the Timeset Extractor. The Tester Resource Allocator reads the following per-signal information from the TekWAVES database: device pin number, device pin type-function-class, tester frame, timing parameters, tester channel (if you entered it), and generator (if you entered it). If channel assignments exist, the Tester Resource Allocator uses them, as entered, and fills assignments for all other signals. You must specify a direction control signal for each bidirectional signal. The control signal defines the dynamic behavior of a bidir pin. If the control signal is 0, the bidir pin is an input; if the control signal is a 1, the bidir pin is an output.

The allocator reads the Tester Capability File corresponding to the tester name in the Properties dialog box to determine the number of available timing generators and tester channels. If the number of resources the file requires exceeds the tester limits, the system gives an error message, and does not make any more resource assignments. In that case, subsequent channel or generator entries in the data structures are left empty and unassigned. While the process is running, a busy box appears with a clock showing the status of the process. The busy box contains a Exit button that enables you to stop the process.

Middle Mouse Button Menu

If you place the cursor on the icon and press the middle mouse button, a menu with the following choices appears:

Delete—removes the icon.
Rename—enables you to relabel the process icon.
Properties—dialog box.
   Tester—the name of the target tester. If you dragged the icon from a Tester Card, the name of that tester appears by default.
   Create Database—copies the database before the process starts, as a backup in case the process partially executes and then fails. If you do not choose Create Database, the system updates the database with the new timesets and frames, and removes the old timesets and frames.
     File—enter the name of the new database in the text field to the right of the check box.
   Wiring Input File—specifies the name of a Pin Wire File (nameoffile.pwr) if you have manually created one. This file contains a list of corresponding signal names, pin numbers, and tester channel numbers.
Show Summary—displays information about the last execution of the process.
Show Errors—displays the error information in a scrollable text window.
Write Error—displays a dialog box that enables you to name a file that the errors are written to.
Store Errors—loads the errors from the process into the database for easy access from the Timing and State editors.
Execute—same action as a double-click on the icon; starts the process.

Output

The Tester Resource Allocator writes the following per-signal data back to the TekWAVES database: tester channel assigned, and timing generator assigned.

Errors

The following errors are possible:
illegal user-assigned channel-to-generator mapping: the channel cannot be connected to the generator specified due to hardware resource partitioning,
too many timing generators required: the number of unique timing sets within a given channel partition (quadrant) exceeds the number of timing generators available.
too many channels required—the number of device pins exceeds the number of installed tester channels.

Wire Guide (Fixture Report Generator)

WIRE GUIDE writes a fixture wiring file that lists the requisite device pin-to-tester channel wiring. This file tells you which pin of a device to connect to which channel of a DUT (socket) card on the LV500. You can use the pwr file as input to the resource allocation process. While the process is running, a busy box appears with a clock showing the status of the process. The busy box contains an Exit button that enables you to stop the process.

Middle Mouse Button Menu

If you place the cursor of mouse on the icon and press the middle mouse button, a menu with the following choices appears:

Delete—removes the icon.
Rename—enables you to relabel the icon.
Properties—enables you to set the following information:
  Pin Wiring Report File—labels the Pin Wire File (nameoffile.pwr). This file contains the list of corresponding signal names, pin numbers, and tester channel numbers WIRE GUIDE assigns.
Show Summary—displays information about the last execution of the process.
Show Errors—displays the error information in a scrollable text window.
Write Errors—displays a dialog box that enables you to name the file to which the errors are written.
Store Errors—stores error information into the database for access from the State and Timing editors.
Execute—same action as a double click on the icon; starts the process.

WRITE MSA (Test Program Generator)

The WRITE MSA process produces a functional test program for the LV500, using information from a TekWAVES database. You invoke WRITE MSA by dragging it from the LV500 card onto the workbench (or selecting it while it is on the card). Before running WRITE MSA, you need to provide state and timeset values, and resource and wiring data. You can enter these manually via the various editors, or create them automatically with CYCLE SELECT, X TRACT, or LV500 (Tester Resource Allocator). It is important that you run your event data through RULES CHECK before you convert it into the MSA format. The MSA format has the correct syntax for the tester, but does not check for tester rules, and can have pulses and other extraneous information that the LV500 should not have.

Operation

WRITE MSA reads the following information from the TekWAVES database: timeset name, cycle length, signal frame and timing definitions; extracted state values, including direction control for each bidirectional pin; signal name; channel number for each pin; and, timing generator for each pin-channel. WRITE MSA reads the above data and reads a test program form. The test program form defines the format of the test program for the LV500. WRITE MSA fills the values it reads from the TekWAVES database into the appropriate fields to create a complete ascii test program file. While WRITE MSA is running, a busy box appears that contains a clock showing the status of the process. The busy box contains an Exit button that enables you to stop the process. TekWAVES ignores the Schmoo, Macro and Define Format sections.

Middle Mouse Button Menu

If you place the cursor of the mouse on the icon and press the middle mouse button, a menu with the following choices appears:

Delete—deletes the icon.
Rename—enables you to enter a new label for the icon.
Properties—dialog box.
  Tester—the LV500 - 128 appears as a default. The tester name field contains a middle mouse button menu that contains the names of any other Tester Capabilities files.
  Supply Voltage—default is 5.0 volts.
  Term Supply Voltage—default is 3.0 volts. This is the voltage the tester delivers to the termination resistors of the DUT card.
  Supply Current—default is 0.5 amps.
  Test Program File—enter the name of the file the process creates.
Show Summary—displays information about the last execution of the process.
Show Errors—displays rules violations.
Write Errors—displays a dialog box that enables you to name a file to which the system saves the rules violations.
Store Errors—saves any errors into the database for access from the State and Timing editors.
Execute—same action as a double click on the icon; starts the process.

Communications Icon

The Communications icon enables you to transfer the MSA test programs that you created with the WRITE MSA process from TekWAVES to the LV500. If you place the cursor of the mouse on the icon, press the middle mouse button, and choose Properties, you get a dialog box. You can then enter the name of the test program, the type of tester (the LV500 is default), and which direction the data is going (to or from the ,MSA tester). TekWAVES 1.0 and the LV500 both support RS-232, GPIB, and Ethernet) systems. The GPIB and Ethernet boards and software are available as options to the LV500. They are also optional on the Apollo. (Apollo uses the AT GPI Board from National Instruments.)

Middle Mouse Button Menu

If you place the cursor of the mouse on the icon and press the middle mouse button, a menu with the following choices appears:

Duplicate—copies the process icon.
Delete—removes the icon.
Rename—enables you to relabel this particular process icon.
Properties—a dialog box with the following:
  Tester—enter the name of the tester. The default is the LV500.
  Test Program File—names the MSA file to send or receive.
  Transfer Direction—
    To Tester—LV500.
    From Tester—LV500.
  Protocol Type
    GPIB—general Purpose Interface Board available from National Instruments.
      Address—default is 5. There are 32 possible addresses available, some of which may already be occupied.
    RS-232—
      Port Number—in the back of the Apollo.
      Baud Rate—default is 9600. However, the slower the baud rate, the more reliable the

Timeset Extraction Algorithm in TekWAVES

The timeset building process traverses the event data sequentially through time, examining the event transitions for each signal between two successive cycle boundaries. Within each cycle it extracts the equivalent frame-timing-state representation for each signal, regardless of whether the signal is input or output. If multiple frames match, the extractor attempts to minimize the number of frame types by examining all cycles across a given signal and assigning the most commonly usable frame type. Within each cycle it also loads the state value of each signal back into the TekWAVES data structures, and compares existing timesets against the frame and timeset for the current cycle. If they match, it uses the existing timeset. Otherwise, it defines a new timeset. The extractor associates the current vector of state values with a timeset via the name of the timeset. If preassigned timesets exist, the timeset extractor attempts to use them. If the preassigned timesets do not work, it automatically replaces them. The extractor sequentially names the timesets as it creates them. The name is tset1, tset2, and so on.

For output, or sensing, signal, you need to specify the type and time placement of strobes. You can place edge strobes at the beginning of a cycle plus some time delta, the end of a cycle minus some time delta, or at some time delta after the last edge in the cycle. If you specify window strobing, the window extends from the time delta after the last edge, until the end of the cycle.

Rules Checking

The extractor reads the Tester Capabilities File to determine the set of available tester frames. If the extractor can't map the behavior of a given signal onto a legal tester frame, the extractor issues a warning message. You can then assign that signal an NRZ frame with a state of high impedance (Z), or abandon timeset extraction for that cycle leaving all the data within that cycle in event format.

Operation

The Timeset Extractor accesses the active database to obtain the cycle boundaries, event data to be converted, and the type, function, and class of pin. You can set pin attributes in the Database Manager. The Timeset Extractor also reads the Tester Capabilities File to obtain the legal tester frames and legal tester states. The Timeset Extractor transforms an event view of the waveform data into a state-timeset view, while ensuring that the result is compatible with the set of frames defined in the Tester Capabilities File. On output signals, the resultant state-timeset view may be different from the original event data; the state value is that of the output signal at the strobe time, and the timeset's timing comes from the strobe, not the original event data. While the timeset extractor is running, a busy box appears with a clock showing the complete job. A complete sweep of the clock corresponds to a complete job. The busy box contains an Exit button that stops the process.

Middle Mouse Button Menu

If you place the cursor on the icon and press the middle mouse button, a menu with the following choices appears:

Delete—removes the icon.
Rename—enables you to relabel the icon; type the name and enter return.
Properties—enables you to set the following information in a separate dialog box:
  Tester:—the name of the target tester; the default is the LT1000.
  Create Database—copies the database before the extractor executes, as a backup in case the process partially executes and then fails. If you don't choose Create Database, the system updates the database with the new timesets and frames, and removes the old timesets and frames.
    File—labels the name of the new database in the text field to the right of the Create Database check-box.
  Convert Unassignable Frames—indicates that if the extractor cannot assign a frame (from the legal set of frames for the LT1000), the extractor assigns a frame of inhibit (INH) with a state of Z. If you do not convert timesets, the extractor does not assign a timeset if it cannot assign one or more frames in the period.
  Strobe Type—selects strobe type and placement. To indicate the time delta to use in strobe placement. If you select Edge strobe, you can select the method used to place the strobe:
    Edge: cycle end −delta−
    Edge: last edge +delta−
    Edge: cycle start +delta−
    Window: last edge +delta—extends to the end of the cycle.
  Strobe Delta—enter the integer value in the first field, then select the time unit cell to toggle it through ns, us, etc.
Show Summary—displays information about the last execution of the process.
Show Errors—displays the error information in a scrollable text window.
Write Errors—displays a dialog box that enables you to name the file to which the errors are written.
Store Errors—into the database, so the Timing and State editors display them.
Execute—same action as a double click on the icon.

WRITE EWAV

The Write EWAV process creates an EWAV file that you can transfer from the Apollo to the LT1000. Use the FTP protocol over Ethernet for the transfer. EWAV is a Tektronix file format for neutral simulator event data. There are no tester restrictions in an EWAV file. The LV500, DAS9200, and LT1000 can all read it. If you place the cursor over the icon, and depress the middle mouse button of the mouse, the following menu appears:

Duplicate—copy this particular process icon.
Delete—removes the icon.
Rename—relabel this particular process icon.
Properties—see below.
  .EWV File-enter the name of the file the process creates.
Show Summary—displays information about the last execution of the process.
Show Errors—displays the error information in a scrollable text window.
Write Error—displays a dialog box that enables you to name a file to which the errors are written.
Store Errors—loads the errors from the process into the database for easy access from the editors.

Execute—same action as a double click on the icon; starts the process.

LT1XXXCOMM

The LT1000 COMM Icon enables you to transfer an EWAV file from TekWAVES to the LT1000. In the Properties dialog box, which you get from the middle mouse button menu of the icon, you enter the name of the test program, the type of tester (the LT1000 is default), and which direction the data is going (to or from the tester). TekWAVES 1.0 and the LT1000 both support FTP over the Ethernet system. The Ethernet board and software are available with the LT1000. They are also optional on the Apollo. The middle mouse button menu has the following selections:

Duplicate—copies this particular process icon.
Delete—removes the icon.
Rename—relabel this particular process icon.
Properties—see below:
    Tester—enter the name of the tester. The default is the LT1000.
    Test Program File—names the test me to send or receive.
    Transfer Direction—
        To Tester—LT1000—
        From Tester—Lt1000—
    Protocol Type—
        GPIB—does not apply to the LT1000—
        Address—does not apply to the Lt1000—
        RS-232—does not apply to the LT1000
            Port Number—does not apply to the LT1000
            Baud Rate—does not apply to the LT1000
        Ethernet—Tektronix/Ethernet network. Ethernet, with the FTP protocol, requires your set-up of a user identification password for file transfers. This is different under the AEGIS shell than the Bourne shell.
            Instrument Net Name—Ethernet requires a name of any machine in its communications network.
            Host Name—the name of the computer from which you are transferring the test program.
Show Summary—displays information about the last execution of the process.
Show Errors—displays the error information in a scrollable text window.
Write Errors—displays a dialog box that enables you to name a file to which the errors are written.
Store Errors—loads the errors from the process into the database for easy access from the editors.
Execute—same action as a double click on the icon; starts the process.

DAS9200 Card

The DAS9200 card has process icons that enable you to download your EWAV-formatted test vectors into the Tektronix DAS9200 Logic Analyzer. This card enables you to use TekWAVES to augment communications with the DAS9200.

WRITE EWAV

The WRITE EWAV recess creates an EWAV file that you can transfer from the Apollo to the DAS9200. You can use Ethernet, GPIB, or RS-232 for the transfer. EWAV is a Tektronix file format for neutral simulator event data. There are no tester restrictions in an EWAV file. The LV500, DAS9200, and LT1000 can all read it. If you place the cursor over the icon, and depress the middle mouse button of the mouse, the following menu appears:

Duplicate—copies this particular process icon.
Delete—removes the icon.
Rename—relabels this particular process icon.
Properties—see below.
    .EWV File—enter the name of the file the process creates.
Show Summary—displays information about the last execution of the process.
Show Errors—displays the error information in a text window.
Write Errors—displays a dialog box that enables you to name a file to which the errors are written.
Store Errors—loads the errors from the process into the database for easy access from the editors.
Execute—same action as a double click on the icon; starts the process.

DAS COMM

The communications icon enables you to transfer an EWAV file to and from TekWAVES and the DAS9200. In the Properties dialog box, which you get from the middle mouse button menu of the icon, you enter, among other things, the name of the test program, the type of tester (the DAS9206-is default), and which direction the data is going (to or from the tester). TekWAVES 1.0 and the DAS9200 both support RS-232, GPIB, and Ethernet) systems. The GPIB and Ethernet boards and software are available as options to the DAS9200. They are also optional on the Apollo. (Apollo uses the AT GPIB board from National Instruments.) If you place the cursor in the icon, and press the middle mouse button, a menu with the following choices appears:

Duplicate—copies this particular process icon.
Delete—removes the icon.
Rename—enables you to relabel this particular process icon.
Properties—a dialog box with the following:
    Tester—enter the name of the tester. The default is the DAS9200.
    Test Program File—names the test file to send or receive.
    Transfer Direction—
        To Tester—DAS9200.
        From Tester—DAS9200.
    Protocol Type—
        GPIB—General Purpose Interface Board available from National Instruments.
            Address—default is 5. There are 32 possible addresses available, some of which may already be occupied.
        RS-232—
            Port Number—in the back of the Apollo.
            Baud Rate—default is 9600. However, the slower the baud rate, the more reliable the transfer is. 1200 is safest. It is unlikely that you can transfer a large file at 9600 baud.
        Ethernet—Tektronix-Ethernet network. Ethernet, with the FTP protocol, requires your set-up of a user identification password for file transfers. This is different under the AEGIS shell than the Bourne shell.
            Instrument Net Name—Ethernet requires a name of any machine in its communications network.

Host Name—the name of the computer from which you are transferring the test program. The system usually can find this itself.

Show Summary—displays information about the last execution of the process.

Show Errors—displays the error information in a scrollable text window.

Write Errors—displays a dialog box that enables you to name a file to which the errors are written.

Store Error—loads the errors from the process into the database for easy access from the editors.

Execute—same action as a double-click on the icon; starts the process.

FILE CARD

The File Card contains icons that manage the data that TekWAVES or you aeate and use. The icons only represent empty files, but they enable you to avoid the step of renaming a .TXT file icon. You can wire icons from the File Card to various process icons from the Tools and LV500 cards. These process icons assume that the data in the files that they attempt to read is in the appropriate format. Extensions for the File Icons on the File Card are:

.sgl-Signal File; lists signals that any TekWAVES process can use. You create this manually.

.smp-State Mapping File for the Map States process. You create this manually.

.sed-Cycle Seeds File for the Cycle Select icon. The Database Icon can write this out, or you can create it manually.

.pwr-wiring list file for the resource allocation process. The WIRE GUIDE process can write this out, or you can create it manually.

.msa-Module Set-up, Ascii. This is the format of the test program for the LV500. The WRITE MSA process can write this out, or you can create it manually.

.ewv-Event-Wave format. It is a neutral format for simulator event data. The Database Icon can write this out, or you can create it manually.

.qsl-Qualification Signal List. You can use this as an input to the Align Edges process. You create this manually.

Menu of the File Card Icons

If you put the cursor of the mouse on a File Card icon that is on the workbench, and press the middle mouse button, the system displays a menu with the following choices:

Duplicate—creates a new copy of the file, titled copy_of- file.

Delete—removes the file icon.

Rename—a dialog box appears that enables you to change the name of the file.

Properties—this choice opens a submenu with a dialog box that enables you to change the file format of the icon. a Edit—same action as a double click on the icon; opens the file for you to view or alter.

Translators Card

While you can read in and write out the file formats for simulators from Genrad, TSSI, and Mentor Graphics, you can use the icons on the Translators Card to convert stimulus and response data output from other simulators into the EWAV file format. TekWAVES can then read the EWAV Me. The simulator file formats TekWAVES translates are: Valid ValidSIM, Teradyne LASAR, and Daisy VLAIF. TekWAVES only translates the file formats of the above simulators into the TekWAVES EWAV file format, and not back to the format of the simulator.

USER TO EWAV

If you have a program that can translate the file format of another simulator into EWAV, you can use it through the USER TO EWAV icon. To do so, attach .trn to the name of the program and place it as the file /tekwaves/bin/nameoffile.trn The program does not necessarily have to be written in C; the language only has to run on the host computer. TekWAVES must be able to invoke the program with the parameter "nameoffile.trn -F import_file -o output_file.ewv".

Middle Mouse Button Menu

After you drag a translator icon onto either of the workbench areas, a middle mouse button press while the cursor is on it displays the following menu:

Duplicate—copies the icon

Delete—removes the translator icon.

Rename—the particular instance of the icon.

Properties—dialog box.

Translator:—the name of the simulator format you are converting into EWAV. If you depress the middle mouse button in the Translator name field, a list appears that enables you to translate another of the simulators, instead of the particular icon you have opened. (This is redundant with dragging another icon off the ' Translators Card.)

Input File Name—enter the name of the simulator Me to translate.

Output File Name—the name of the EWAV file to generate.

Execute—same action as a double-click on the icon.

Show Summary—displays information about the last execution of the process.

Show Errors—displays rules violations.

Write Errors—displays a dialog box that enables you to name a file to which the system saves the rules violations.

Store Errors—saves any errors into the database, so you can view them from the Timing and State editors.

The LASAR translator icon requires three separate files: Pin In, Pin Out, and the translator file. These files should be in the form nameoffile.pi, nameoffile.po, and nameoffile.lsr, respectively.

Installation

Loading the TekWAVES Software

The TekWAVES installation program installs the TekWAVES software product on a node with a cartridge tape drive, or to any other node in a network that has the same version of Aegis SR9.x or SR10.x. You need about 5 megabytes of disk space for the installation. (Do not use the CRP command, as you will get errors.)

To load the TekWAVES software:

1) You must log in as the system administrator with locksmith, or root privileges. This is necessary because the installation script needs the authority to set ownerships and permissions.

2) Insert the tape into the drive.

3) Type wd / (Aegis) or cd / (UNIX). Then, type /com/rbak - dev ct -f 1 tekwaves -as/tekwaves −1 -ms -sacl. This installs the installation script. The machine responds with: Restore Complete.

4) Type/tekwaves/install/install

The program begins prompting you for the target node and operating system type (Aegis or UNIX). The system prompts you to select an operating system because while in communication modes, TekWAVES uses shell scripts written in Aegis or Unix. If you use the wrong shell script, a failure occurs. Once the script has installed TekWAVES, the installation script checks the TekWAVES files to ensure a successful installation. When it has finished installation, it displays the message: Installation is now complete.

After you finish all of the installations, you can delete the directory/tekwaves_install, as you do not need it again. If you install TekWAVES again, the installation process will create that directory again. Because of the differences between 9.x and 10.x, you can only install from an SR.x to another SR.x node, or an SR10.x to another SR10.x node. If you experience installation errors, you can reset the permissions and ownerships with the wave.perm script. Type "wd /tekwaves/verify" (Aegis) or "cd/tekwaves/verify" (UNIX). Then, type: "wave.perm".

Changing the Default Tester

The various editors and processes throughout TekWAVES assume that the tester you are using is the Tektronix LV500, configured for a 128 pin DUT card. A tester with that configuration has a Tester Capabilities File titled lv500-128. If you want TekWAVES to assume, in the appropriate defaults in the system, that you have another tester, you can use one of the other extant Tester Capabilities files. The others are for the LV500_64, LV500-192, LV500-256, and LT1000. Or, you can create one of your own, and place it in the correct directory. Then, open the card defaults file under the/tekwaves/testers directory (see TekWAVES Directory Structure below), and change the default lv500-128 entries to the new tester.

TekWAVES Directory Structure

These are standard Unix directories:
- (777) /tekwaves
  - (444) copyright
- (777) /tekwaves/global
- (777) /tekwaves/icons
  - (444) system icons
- (755) /tekwaves/help
  - (444) Lt1000.mkt
  - (444) das9200
  - (444) lv500.mkt
  - (755) workbench
  - (755) timing
  - (755) state
  - (755) frame
  - (755) timeset
  - (444) help—general help description (press help button to display this)
- (755) /tekwaves/bin
  - (555) tekwaves executable
  - (555) lvts - serial communication executable
  - (555) lvtg - GPIB communication executable
  - (555) lvte.- link to Ethernet communication script (from Aegis or Unix directory)
  - (555) wavetp - link to script
  - (777) daisy.trn - Daisy translator
  - (555) lasar.tm - lasar translator
  - (555) valid.tm - valid translator
  - (555) unix - directory of Unix scripts (all scripts should be 555)
  - (777) aegis - directory of aegis scripts (all scripts should be 555)
  - (555) icon-generator - executable to translate WPS files to icon files
- (777) /tekwaves/bin/aegis
  - (777) lvte_sr9.7
  - (555) wavetp
  - (555) print_script
- (777) /tekwaves/bin/unix
  - (555) lvte
  - (555) wavetp
  - (555) print-script
- (555) /tekwaves/fonts
  - (444) Digi default fonts
- (777) /tekwaves/testers
  - (444) lv500.sty
  - (444) lv500_64.tcp
  - (444) lv500-128.tcp
  - (444) lv500_192.tcp
  - (444) lv500 256.tcp
  - (444) card defaults
  - (444) lt1000.tcp
- (777) /tekwaves/demo
  - (444) demo.ewv

Networking TekWAVES

You can copy TekWAVES and its files, obviously, from one Apollo node to another. You can move files via the global workbench area only between authorized nodes running TekWAVES, if you have established symbolic links. You can also execute TekWAVES processes from an authorized remote node.

Establishing Communications from the Apollo to the LV500

RS-232 Communication Problems Between Apollo and the LV500

If you are transmitting or receiving files via RS-232 communications between your Apollo and an LV500, baud rates above 1200 are not reliable. We recommend that you use another communication protocol, such as GPIB or Ethernet, for large file transfers. If you decide, however, to use RS-232 at baud rates above 1200, files might not completely transfer, or might be garbled. The LV500 might not return to the normal menu screen after a file has incompletely transferred, even though TekWAVES indicates that the transfer is complete. (If you are transferring from the LV500, it indicates a complete transfer when the busy box disappears, and the MSA File Icon appears on your workbench.) If the LV500 keyboard is still locked by the foreign host after file transfer is complete, transmit a small file to the LV500 one to three times. This usually unlocks the keyboard on the LV500. If this does not work, the only other option is to power down the LV500. Another problem with using RS-232 for communications is that you cannot use the background feature of the TekWAVES printing process on the DN3000.

RS-232 Cable Information

To use RS-232 communications, obtain or build an RS-232 cable with male DB25 connectors on both ends, wired pin-to-pin as indicated below. Connect one end of your RS-232-C cable to the HOST DB25 connector on the LV500, and the other end to the S101 DB25 connector on your Apollo. This is the RS-232 DB25 male cable wiring diagram (minimum necessary connections are marked with an asterisk:

*1→1 (Chassis Gnd)
*2→2 (Send)
*3→3 (Receive) DB25 Male
5→5 (CTS (Clear To Send))
6→6(DSR (Data Set Ready))
*7→7 (Gnd)
8→8 (CD (Carrier Detect))
20→20 (DTR (Data Terminal Ready))

Installing the RS-232 Option

Refer to the LV500 Operator's Manual (Tektronix part number 070-7379-00) and your Apollo documentation for specifics. Be aware though, that RS-232 restrains the size and speed of your file transfers to and from the tester. The first time you run TekWAVES on a 10.x Unix node, and try to download to an LV500 connected to another node on the network you might receive the following warning from the Apollo operating system: "?(crp) warning: pad support unavailable". If you get this message, you must enter the following command from the 10.x node: "/usr/apollo/bin/inty spmio / -n //remote-node", where remote- node is the name of the node to which the LV500 is connected.

RS-232 Apollo Terminal Control Port Information

You set the properties of the serial port device driver with the tctl command. You set the properties of the driver to match the low level protocol of the printer or plotter. To display the low level protocol characteristics of serial port 1 (siol), enter "/com/tctl -line 1". The characteristics should match the following. You can change them using various options of the tctl command. On your Apollo, verify and, if necessary, modify your TCTL (Terminal ControL) port as below.

$ tctl
Status of Line 1:
Erase (character delete) character: 08 (hex)
Kill (line delete) character: 18 (hex)
End of file character: 1A (hex)
Quit character: 1D (hex)
interrupt character: 03 (hex)
Suspend character: 10 (hex)
New line delay: 0 Speed:1200
Raw: FALSE,Echo: FALSE,
CvtRaw_L:FALSE, Host_Sync: TRUE, Input_Sync: TRUE
RTS: TRUE DTR: TRUE, DCD: FALSE
CTS: FALSE,Quit _Enable: FALSE, Int_Enable: FALSE
Susp_enable: FALSE, DCD_Enable: FALSE, CTS_enable: FALSE
BP_Enable: FALSE, RTS_Enable: FALSE
Eight bits per character, Parity: None, One stop bit
Errors enabled: FRAMING If you need to, you can use the following command line to set up the TCTL: "TCTL -LINE 1 -NOECHO -SYNC -INSYNC -SPEED 1200".

RS-232 Setup Information for the LV500

On the LV500, move to the Communications Menu. There, verify or, if necessary, set the following:
RS-232 Host Port
Protocol: DAS 9200 PCL
Baud Rate: 1200
Mode: 7-bit ASCII
Flow Control:XON/XOFF
Input EOL:NL (LF)
Output EOL:CR
Interrupt:DEL (Hex 7F)

SPM Monitor Process Information

If you are transmitting or receiving files via RS-232 communications between your Apollo and LV500, you must have the SPM server (Server Process Manager) running on the Apollo to enable RS-232 communications. To see if the server is running, at an Aegis prompt type: $ pst <CR> or, if you are running Unix, type: % /com/pst <CR>. If the spm-server is not running, start it by typing the following command on the command line at the bottom of the display (enter the shell-cmd key on the left-hand keypad): cps/sys/spm/spm <CR>. However, the spm server startup command should be placed in the startup. 191 file (or the startup file for your system type), to be executed during boot up of your Apollo. Consult your Apollo documentation for details.

Ethernet (LAN)

This is the standard Apollo file transfer mechanism.

GPIB

Refer to the LV500 Operator's Manual (part number 070-7379-00) and your Apollo documentation for specifics. You must obtain National Instruments' AT GPIB Board for installation in the Apollo. The GPIB Board for the LV500 is available from Tektronix as an option to the LV500.

GPIB Information

To install the AT-GPIB option in your Apollo, you need the installation kit National Instruments provides with their General Purpose Interface Bus, which includes a cartridge tape and documentation.

AT-GPIB Installation

Observe proper procedures for handling static sensitive devices. To install the AT-GPIB board in your Apollo, refer to the instructions on pages 6-9 in the "Apollo AEGIS GPIB Handler" document supplied with your board.

AT-GPIB jumper Settings

You should use the following jumper settings: Base 1/0 Address (U23) 2C0 Hex, DMA Channel (DREQ, DACK) 5 (DREQ5,DACKS) Interrupt Line (IRQ) 7.

LV500 GPIB Setup

Move to the communications area of the LV500 setup menu, and verify or set the address to an unused GPIB address. The LV500 supports GPIB addresses 2–30.

Installing Printers and Plotters

If you install both a laser printer and an HP plotter in a ring of Apollos, you will most likely connect them to two separate Apollo nodes. Each of the nodes has a print server process for feeding files to the printer or plotter. Usually you connect the peripheral to serial port 1 (siol) of a node. The print queue directory (/sys/print), where the printing process temporarily holds files until it prints them, can be on any node in the network, including one of the print server nodes. The /sys/print directories of all the other nodes in the network must have symbolic links to the/sys/print directory on the print queue node that you specify.

Setting Up an Apple Laserwriter

The following command, to start the laser printer server, must be in the startup file of the node to which you connect the printer: cps/comm/prsvr 'sys/-node_data/lw_config -n lw_server. The startup file is typically/sys/node-data/startup.191 or /sys/node - data/startup.1280bw. The startup filename varies with the size of the display, and color or monochrome attributes. The print server reads /sys/node - data/lw-config to configure the server for the particular device it will be handling. For the laser printer, this file must contain:

| PRINTER_NAME | LW |
|---|---|
| DEVICE | APPLE |
| INTERFACE | SERIAL |
| SPEED | 9600 |
| SIO_LINE | 1 |
| FORM_FEEDS | 0 |
| FILE-BANNERS | OFF |
| PAGE_HEADERS | OFF |
| RESOLUTION | 300 |

Setting Up an HP Plotter

The following command, to start the HP plotter server, must be in the startup me of the node to which you connect the plotter: cps/com/prsvr /sys/-node_data/hplt-config -n hplt- server. The startup file is typically/sys/node-data/startup. 191 or /sys/node-data/startup.1280bw. The startup file name varies with the size of the display, and color or monochrome attributes. The print server reads /sys/node-data/hplt -config to configure the server for the particular device it will be handling. For the HP plotter, this file must contain:

| PRINTER NAME | HPLT |
|---|---|
| DEVICE | GE |
| INTERFACE | SERIAL |
| SPEED | 9600 |
| SIO-LINE | 1 |
| FORM_FEEDS | 0 |
| FILE - BANNERS | OFF |
| PAGE-HEADERS | OFF |

Setting Up a Serial Port Driver

You set the properties of the serial port device driver with the tctl command. You set the driver properties to match the low level protocol of the printer or plotter. To display the characteristics of serial port 1 (siol), enter: /com/tctl -line 1. The characteristics should match the following. You can change them using various options of the tctl command.

Status of Line 1:
Erase (character delete) character: 08 (hex)
Kill(line delete) character: 18 (hex)
End of file character: 1A (hex)
Quit character: 1D (hex)
Interrupt character: 03 (hex)
Suspend character: 10 (hex)
New line delay: 0
Speed:9600
Raw: TRUE, Echo: FALSE, Cvt_NL: FALSE
CvtRaw_NL: FALSE, Host_Sync: TRUE, Input Sync: TRUE
RTS: TRUE, DTR: TRUE, DCD: FALSE
CTS: FALSE, Quit_Enable: TRUE, Int_Enable: FALSE
Susp_Enable: FALSE, DCD_Enable: FALSE, CTS_enable: FALSE
BP_Enable: FALSE, RTS_Enable: FALSE
Eight bits per character, Parity: None, Two stop bits
Errors enabled: FRAMING

Null Modem Cabling for Printers and Plotters

This is the RS-232 cable DB25 male-male wiring diagram. (Minimum necessary connections are marked with an asterisk)

1→1 (Chassis Gnd)
2→3 (Receive)
3→2 (Send)
7→7 (Gnd)
6→20 (DTR (Data Terminal Ready))
20→6 (DSR (Data Set Ready))

Unix

This script assumes the existence of a .netrc file (for auto- login purposes) in the user's home directory. The .netrc file should contain the following: machine machine_name login log_name password pass-string. The machine name supplied in this netrc file must be the same name that is passed to this script and assigned to the variable "LV500-name". If the LV500 was configured for ftp without any password, then supply a dummy password in this file (any will suffice). As the user's password is contained in the file, the file mode should be 700. Use the Unix command "chmod 700 .netrc" to change the mode.

Aegis

FTP operations on the Aegis SR9.7 do not have the option of using a netrc Me as on Unix systems. This means that the user is name and password must be either passed to the script as a command line argument, or they must be hard-coded into this script. Currently the script gets the user's name from the environment variable LOGNAME. The user's password must be hard-coded. Place the appropriate password with the "pass" variable (see below) by editing this script. The LV500 may be configured so that it does not require a password. If this is the case then don't edit this file; just leave the password as "dummy".

Script print_script:
set printer name
MUST BE PERSONALIZED TO TekWaves OPERATIONAL ENVIRONMENT
printer:=lw
set plotter name
MUST BE PERSONALIZED To Tekwaves OPERATIONAL ENVIRONMENT
plotter:=hplt
enable -pre10 if running SR10 with print server on pre- SR10 machine
MUST BE PERSONALIZED TO TekWaves OPERATIONAL ENVIRONMENT
mixed:='-pre10'
mixed:='

Tester Capabilities File (.tcp)

The Tester Capabilities File (nameoffile.tcp) contains a description for a single tester. The process icons on the Tools Card, LV5000 Card, LT1000 Card, and DAS9200 Card contain process icons, all of which refer to a Tester Capabilities File. All of the Tester Capabilities Files must be in the/tekwaves/testers directory. The following process icons and editors use the Tester Capabilities File: GLITCH FILTER (Pulse Filter), Align Edges Filter, Align Cycles Filter, RULES CHECK (Tester Capabilities Checker), Frame Editor, and X TRACT (Timeset Extractor). A description of the Frame Generation Language is in Appendix 3. FGL requires that each frame description takes one line in the Tester Capabilities File.

Conventions

Information in the syntax below that you are to provide is in italic type; for example, number. Keywords that you are to enter verbatim are in bold font; for example, max_unique_cycles. A number is stipulated here to be a floating point number, enabling you to specify a decimal if you need to do so. An integer is an even number, without a decimal. A scale is in volts (v) or millivolts (mv). Time is in pico seconds (ps), nanoseconds (ns), microseconds (us), or milliseconds (ms). ":=" means "is defined as."

Tester Capabilities File tester_capabilities_file: = tester_description
The following must be at the beginning of the file:

---
tester_description := tester = tester_name
tester_info
---

All of the following are optional and can be in any order:

---
```
tester_info= (
max_unique_cycles | max_pulse_width |    min
cycle_period | max_cycle_period |    min
edge_resolution | max vector_depth |    dead_
zone_end | state_map | frame |
num_pins_per_sector | max_dvolt_fams |
max_dvolt_fams_psect | max_cvolt_fams |
max_cvolt_fams_psect | drive_rail | comp_rail |
   section | max_quadrants | max_per_quadrant|
max_gens_per_quadrant | dynamic_frame_list |
dynamic_frame_changes | dynamic_timing changes
 | min cycle_resolution | vector_initialization |
   voltage_families | dead_zone_beg |
)    min_pulse_width | ind_drive_comp_rails |
max unique cycles:= max unique_cycles number;
max_pulse_width := max_pulse_width = time (ns)
min_pulse_width := min_pulse_width = time (ns);
max_cycle_period := max_cycle_period = time (ns)
min_cycle_period := min_cycle_period = time (ns)
min_cycle_resolution := min_cycle_resolution time;
max. vector_depth := max_vector_depth = integer;
dead_zone_beg := dead_zone_beg = time (ns) ;
dead_zone_end := dead_zone_end = number (ns)
state_map := state_map = stot state_pair{','
stot_State_pair};
```
---

Example state values are 1,0, H, L, Z, X.

stot state_pair:=stot number=state_value;

These are in FGL:

frame: = frame = formula description;

These must follow frame=:

dynamic_frame_list: = dynamic_frame_list =-frame_name, frame_name, {frame_name};

drive_rail: = drive_rail = low voltage number scale, high voltage number scale, resolution number scale (mv);

comp_rail: = comp_rail = number scale, number scale, number scale (mv) ;

section: = section = low pin number, high pin number, low timing generator number, high timing generator number;

num_pins_per_sector: = num_pins_loer_sector-=integer;

max_dvolt_fams: = max_dvolt_fams = integer;
max_cvolt_fams: = max_cvolt_fams = integer;
max_dvolt_fams_psect = integer
max_cvolt_fams_psect = integer;
max_dvolt_fams_Psect: = max_cvolt_fams_psect-=integer;

max_quadrants: = max_quadrants = integer;
max_pins_per_quadrant: = max_quadrant = integer;

max_gens_per_quadrant: = max_gens_per_quadrant integer;

The file must end with this:

tester: = tester

LV500-128 Capabilities File
lv500-128.tcp
tester=lv500
max_unique_cycles=16; max_quadrants=2;
max_pins_per_quadrant=64;    max_gens_per_quadrant=4;
max_pulse_width=480ns; min_pulse_width=8 ns;
max_cycle_period=496 ns;
min_cycle_period=20 ns;
min_cycle_resolution=4 ns;
max_vector_depth=65536;
dead_zone_end=6 ns;
dead_zone_beg=0 ns;
num_pins_per_sector=16;
max_dvolt_fams=2;
max_dvolt_fams_psect=1;
max_cvolt_fams=2;
max_cvolt_fams_psect=1;
drive_rail=1 v, 5.5 v, 50 mv;
drive_rail=0.5 v, 5 v, 50 mv;
comp_rail=0.5 v, 5.5 v, 50 mv;
section=0, 63, 1, 4;
section=128, 191, 9, 12;
dynamic timing_changes;
frame= |N H S{Z};
frame= |DNRZ P S{0,1}[0 ns, 480 ns, 500 ps];
frame= |RO F{O}S{0,1}[0 ns , 480 ns, 500 ps] F{0}[8 ns,488 ns,2 ns];
frame= |R|F{1}S{0,1}[0 ns 480 ns,500 ps] F{1}[8 ns, 488 ns, 2 ns];
frame= |R|F{Z}S{0,1}[0 ns,4 ions, 500 ps]F{Z}[8 ns, 488 ns, 2 ns];
frame=0 EDGE M E {L,H}; frame=0 WINDOW M W{L,H}M;
frame=0 MASK M;

dynamic_frame_list=EDGE, MASK; dynamic_frame_list=WINDOW, MASK; dynamic_frame_list=DNRZ, INH;
dynamic_frame_list=RO, INH; dynamic_frame_list=R1, INH; dynamic_frame_list=RI, INH; tester

Frame Generation Language (.fgl)

The system puts any text files that have fgl appended to the name on the workbench. FGL describes frames and timesets. You can create an FGL File manually, with the Text Icon, or you can write on out through the Database Icon. The following components of the system use FGL:

The WAVES database icon: selecting Read>ascii> Tektronix .fgl> from the middle mouse button menu of the icon shows a list of fgl files available in that particular TekWAVES database. If the system reads a timeset description with signal names that are not in the database, the system adds the names to the database automatically with the external signal class. You then have to define these signals through the Database Manager.

RULES CHECK: each tester has a limited set of frames that it can produce. This test verifies that assigned frames are available on the specified tester.

Frame Editor: the Frame Editor edits and creates frames in FGL.

Timeset Editor: the Timeset Editor uses FGL in creating and editing timesets that are built from frames.

Timing Editor: modifications to the graphical waveform representations in the Timing Editor are built from FGL—

Syntax of FGL frame-def: = frame-name frame-semantics
frame-name: = string ("string" means nrz, dnrz, TO, rl, ri)
frame-semantics: = {[force|state|previous|compare|[constraint]]} (~means complement value)
force: = 'F' {State-value'}' (Example state-values are 1, 0, H, L, Z, X.)
state: = 'S'{'state-value {','state value}'}'
previous: = 'P' (Use the previous F, S or C value.)
compare: = 'C'{'state-value {','state_value}'}'
constraint: = '['min_time time-base','max-time time-Ease',' step_time time-base']' (Timing constraints are relative to the last edge.)
min_time, max_time, step_time: = Pos-integer timebase: = (ps|ns|us|ms)

You can supply frames in the Tester Capabilities File for specific testers by adding new format strings and semantics.

Cycle Seed File (.sed)

A cycle seed file contains a list of cycle times in picoseconds. You use it to seed the CYCLE SELECT process. You can use the Database Icon to write a sed file, or create one from the File Card. Example: 0, 100, 200, 300, 400, 500

Wiring File

WIRE GUIDE (Fixture Report Generator) writes out a file that lists which of the pins of the device-under test to wire to which tester channel. WIRE GUIDE must have input from other cycle- producing processes, such as CYCLE SELECT and X TRACT, to produce a PWR file. As the system does not know what type of device you are testing, you must manually assign the pin numbers in the Database Manager. A wiring file has three columns: signal name, channel number, and pin number. As with other text files, you can view and edit the file by selecting Edit from its middle mouse button menu.

Below is an example wiring file:

| Signal Name | Channel Number | Pin Number |
|---|---|---|
| addr[O] | 14 | 4 |
| addr[1] | 15 | 5 |
| addr[2] | 16 | 6 |
| addr[3] | 17 | 7 |
| data[O] | 20 | 10 |
| data[1] | 21 | 11 |
| data[2] | 22 | 12 |
| data[3] | 23 | 13 |
| cs | 1 | 20 |
| r/w | 2 | 21 |
| clk | 3 | 2 |

Signal File (.sgl)

An SGL Icon, representing an empty Signal List File, resides on the File Card. A Signal List File is an-ascii me that contains a list of signal names. It lists signals that any TekWAVES processes that are represented by process icons can use. In the Align Edges process, if the reference signal is in the Signal List File as well as the TekWAVES database, then the process ignores it, and does not move any of the edges of the reference signal in the Signal List File. If you do not create a Signal List File, the various processes and editors use the observe list from the pin information in the database, which you can see and change in the Database Manager. After you create a Signal List File, you can specify it in the dialog boxes of the MAP STATES Filter, Align Edges Filter, Glitch Filter, and Bidir Split Filter. An example is: sig1 sig2 sig3

State Mapping File (.smp)

The State Mapping File is an ascii state file that contains a list of state pairs. It is for the Map States Filter, which determines the mapping for several states. None of the processes create this file; you create it with an empty file from the File Card. In the Map States Filter, you can name a State Mapping File. This substitution is order independent; for example, map 1 to 0 and 0 to 1 would complement the data.

| Example: |
|---|
| x 1 |
| z 0 |
| H 1 |

Timeset Format in Frame Generation Language (.fgl)

The Timeset Editor and Database Icon use the timeset file, and can read it into the database. It is an ascii text file that contains timeset and frame descriptions. If the system reads a timeset description with signal names that are not in the database, the names are added to the database automatically with the external signal class. You then have to define these signals further through the Database Manager.

Conventions

-continued

| Label | := | Label is defined as |
|---|---|---|
| | {} | Repeat contents zero or more times |
| | () | Optional Contents |
| | \| | Or item |
| | " | Text or character as is |

Syntax of a .fgl Timeset File

Frame_generation_Language:=Tekwaves_Tool_type
Frame_generator_list Timeset_list
Tekwaves:='TekWAVES_subroutine_definitions'
Tool_type:='tool"='Tool_type_name';'
Tool_type_name:='EWAV' |'HILO'|'TEST'-'MENTOR_LOG'|'TSSI_SEF'
Frame_generator_list:=Formula_description {Formula_generator_list}
Timeset_list:=Timeset {Timeset_list}
Timeset:='timeset"='Timeset_name Time_period'{'(Timeset_body)'}'
Timeset_name:=Alpha_numeric_string
Time_period:=Time
Timeset_body:=Timeset_Signal {Timeset_body}
Timeset_Signal:='signal'='Signal_list Frame_name'{Version_body'}'
Signal_list:=Signal {','Signal)
Signal:=Alpha_numeric_string {'[Number(':'Number)']')
Version_body:=Version{Version_body}
Version:=version"='Version_name','Time{ Time{';'}';'
Time:=Number ('ps'|'ns'|'us'|'ms')

Syntax of formula_description:

Formula_description:='frame"='Frame_description';'Frame_description:=Frame_type Frame_name Frame_semantics{Frame_semantics}Frame_type:=-'I'|'O'|'B'Frame_name:=Alpha_numeric_string
Frame_semantics:=['~']Expression{Timing_constraint}Expression:=(Forcing_state|State set|Previous_state|Mask|Edge
Forcing_state:='F'{State}State_set:='S'{States}Previous_state:='P'Mask:='M'Edge:='E'{States}Window:='W'{States}States:=State {','State}State:=-Valid_states Timing_constraint:=['Min_time, Max_time, Step_time']' Min_time,Max_time,-Step_time:=Time

| Valid_states:= | <EWAV> H 1 M U m u X L O T I t Z |
|---|---|
| := | <HILO> U D T F R B P N L X O H W L Z |
| := | <TESTER> H 1 X U L 0 T Z |
| := | <MENTOR_LOG> @ > < 1 U X O I 0 H L * |
| := | <TSSI_SEF> H U X N L D T Z |

Signal Name Syntax

You enter signal names in the Database Manager. The specification of the signal names follows. TekWAVES does not check the compatibility of signal names for the various tools you use. That is, take care not to name a signal with a name that is reserved in your target tool. For example, if you intend to write out a .wdl file for the HILO simulator, do not name a signal z or time, as z and time are reserved names in HILO.

Allowed special characters: .!#&=—_~"/+-;><$:@\.
Maximum signal name length: 64.
Largest numeral for a bus label: 32767.
Illegal characters: %(),?[] {}|

Busses may be specified with each individual bit listed, or may be given as ranges. Bit indexes for busses have an optional leading alpha name, but must always have an ending numeric. For bit indexing in a bus, the leading alpha is case insensitive. Bundles are defined as a name, with signal names or bit indexes inter-mixed, enclosed in brackets. Busses or bundles may not include other busses or bundles. The following do not produce errors:
1. clk
2. abc456781012345678201234567830123456 78
3. clk!#&<>
4. 0123456785012345678601234

Bus
4. busb[0:3]
5. busb [0]
6. busb[a0]
7. busb [clk]
8. bus [abcqweryuiopasdfghjklzxcvnmqweryuiopa0]

Bus with maximum bit index
9. busb[A0:A1024]

Bus with case insensitive leading alpha for bits
10. busb[A0:A3]

Bus with ranges and individual bit
11. busb[A0:A3,A5:A7,A4]

Bundle with one signal
12. busa[clk!#&<>]

Bundle with two signals
13. busb[clk, clr]

Bundle with bit indexes and single signal
14. busb[a00:a3,clk,bl:b7]

The following produce errors:
1. clk]
2. [A0:A3]
Signal a repeated
3. bus[a,b,a,cl
4. bus[A0:a3,al]
No ending number
5. bus[a:a]
No closing bracket
6. busb [AO: A3
No beginning bracket
7. busbAO:A3 ]
Brackets reversed
8. busb]AO:A3
Double colon
9. busb[AO:A3: :A4 :A6]
10. busb []
11. bush [, a]
12. bus[:a3]
13. bus [AO: , b]
14. bus [ABC :ABC3 ]
15. bus [ABCO :DEF3 ]
16. bus [@#% ]
17. busb[a,b]c

Tool Characters

In each of the four columns below, arranged under the tool headings EWAV, HILO, Tester (generic), Mentor Log, and TSSI SEF, the character to the left of the comma is the legal tool character, and the character to the right is the character TekWAVES writes out into a respective file. For example, the character 0 in the Mentor Log format has no directly corresponding EWAV state, so it would be translated to EWAV as a 0. A hyphen ( - ) indicates an invalid state for that tool. A "0" is numeric and a "O" is alphabetic.

| | EWAV | HILO | Tester | Mentor Log | TSSI SEF |
|---|---|---|---|---|---|
| 1a. Force high impedance to unknown | Z,Z | Z,Z | Z,Z | *,* | Z,Z, |
| 1b. Sense high impedance to unknown | T,T | Z,Z | T,T | *,* | T,T, |
| 2a. Force high impedance to 0 | i,i | Z,Z | -,Z | L,L | Z,Z |
| 2b. Sense high impedance to 0 | t,t | Z,Z | -T | L,L | T,T |
| 3a. Force high impedance to 1 | I,I | Z,Z | -,Z | H,H | Z,Z |
| 3b. Sense high impedance to 1 | T,T | Z,Z | -,T | H,H | T,T |
| 4a. Force resistive 0 | -,0 | L,L | -,0 | O,O | -,D |
| 4b. Sense resistive 0 | -,L | L,L | -,L | O,O | -,D |
| 5a. Force resistive 0 to resistive 1 | -,Z | W,W | -,U | -,U | -,N |
| 5b. Sense resistive 0 to resistive 1 | -,T | W,W | -,X | -,u | -,N |
| 6a. Force resistive 1 | -,1 | H,H | -,1 | I,I | -,U |
| 6b. Sense resistive 1 | -,H | H,H | -,H | I,1 | -,U |
| 7a. Force driving 0 | 0,0 | 0,0 | 0,0 | 0,0 | D,D |
| 7b. Sense driving 0 | L,L | 0,0 | L,L | 0,0 | L,L |
| 8a. Force driving unknown | X,X | X,X | U,U | X,X | N,N |
| 8b. Sense driving unknown | X,X | X,X | X,X | X,X | X,X |
| 9a. Force driving unknown to 0 | U,U | X,X | -,U | X,X | N,N |
| 9b. Sense driving unknown to 0 | M,M | X,X | -,X | X,X | X,X |
| 10a. Force driving unknown to 1 | U,U | X,X | -,U | X,X | N,N |
| 10b. Sense driving unknown to 1 | M,M | X,X | -,X | X,X | X,X |
| 11a. Force resistive unknown | -,X | -,X | -,U | U,U | -,N |
| 11b. Sense resistive unknown | -,X | -,X | -,X | U,U | -,N |
| 12a. Force driving 1 | 1,1 | 1,1 | 1,1 | 1,1 | U,U |
| 12b. Sense driving 1 | H,H | 1,1 | H,H | 1,1 | H,H |
| 13a. Force driving 0 to resistive 0 | -,o | N,N | -,o | -,U | -,N |
| 13b. Sense driving 0 to resistive 0 | -,L | N,N | -,L | -,U | -,N |
| 14a. Force driving 1 to resistive 1 | -,H | P,P | -,1 | -,U | -,N |
| 14b. Sense driving 1 to resistive 1 | -,H | P,P | -,H | -,U | -,N |
| 15a. Force 0 unknown to high impedance | -,i | B,B | -,Z | -,U | -,N |
| 15b. Sense 0 unknown to high impedance | -,T | B,B | -,T | -,U | -,N |
| 16a. Force high impedance to resistive 1 | -,I | R,R | -,Z | -,U | -,N |
| 16b. Sense high impedance to resistive 1 | -,T | R,R | -,T | -,U | -,N |
| 17a. Force resistive 0 to high impedance | -,i | F,F | -,Z | -,U | -,N |
| 17b. Sense resistive 0 to high impedance | -,T | F,F | -,T | -,U | -,N |
| 18a. Force high impedance to unknown 1 | -,I | T,T | -,Z | -,U | -,N |
| 18b. Sense high impedance to unknown 1 | -,T | T,T | -,T | -,U | -,N |
| 19a. Force unknown 0 to high impedance | -,i | D,D | -,Z | -,U | -,N |
| 19b. Sense unknown 0 to high impedance | -,T | D,D | -,T | -,U | -,N |
| 20a. Force resistive 0 to unknown 1 | -,I | U,U | -,Z | -,U | -,N |
| 20b. Sense resistive 0 to unknown 1 | -,T | U,U | -,T | -,U | -,N |
| 21a. Force indeterminate 0 | -,O | -,o | -,Z | <,< | -,D |
| 21a. Sense indeterminate 0 | -,L | -,o | -,T | <,< | -,D |
| 22a. Force indeterminate 1 | -,1 | -,1 | -,Z | >,> | -,U |
| 22b. Sense indeterminate 1 | -,H | -,1 | -,T | >,> | -,U |
| 23a. Force indeterminate X | -,X | -,X | -,U | @,@ | -,N |
| 23b. Sense indeterminate X | -,X | -,X | -,X | @,@ | -,N |

EWAV File

The EWAV file format is an ascii format for event files for logic simulators and testers. The EWAV file format has three sections. The first section is an Environment Section, the second section is the Signal Declaration Section, and the final is the Event Data Section. The Environment Section contains information such as the EWAV file version, the data created, the time seated, the creator, the intended destination, and finally the time scale. The Signal Declaration Section contains the definitions of the signals. The data of the signals is in the Event Data Section. The information found in a signal definition is the name of the signal, bit specification, directions, path and possibly a bidirectional reference signal. The Event Data Section contains the value for each bit in each of the signals, at the time specified for each event.

The Environment Section

This section contains the version of the EWAV file. Any other information in this section is optional. However, if you omit the timescale command, the is a timescale of 1 ps is assumed. The following is an example of the environment section:

required version event 0 12;
optional data 12 23 1987;
optional time 10 56 00;
optional source "hilo";
optional destination "92LV";
optional design "opus";
optional, timescale=1 ns;
but 1 ps is the default version

This command specifies the version of the EWAV file. The command looks like this: "version event 0 1 2;".

date month day year;

This statement notates the creation date of the EWAV file. A date statement might look like this: "data 12 23 1987;" This is strictly an optional statement and has no semantic effect on subsequent translations operations.

time hour minute second;

This statement notates the creation time of the EWAV file. A time statement might look like this: "time 10 56 00;" This is strictly an optional statement and has no semantic effect on subsequent translation operations.

source "ascii string";

This statement notates the creator of the EWAV file. A source statement might look like this: source "hilo";. This is strictly an optional statement and has no semantic effect on subsequent translation operations.

destination "ascii string"

This statement notates the final destination of the EWAV file. A destination statement might look like this:destination "92LV" This is strictly an optional statement and has no semantic effect on subsequent translation operations.

design "ascii string"—

This statement notates the design that the EWAV file is from. A design statement might look like this: design "opus word recognizer"; This is strictly an optional statement and has no semantic effect on subsequent translation operations.

timescale=time value

This statement defines the units of the ones digit for the event time found in each vector in the event data section. The time value portion of the timescale command has the following format: [0-9]+[munp]s. If the timescale command is absent, a value of 1 ps is assumed.

comments

You can add comments nearly anywhere in the EWAV file. The comments are the same as the C language uses, and look like this: /* comment text*/. You can place these anywhere in white space in an EWAV file.

The Signal Declaration Section

The signal declaration section is a list of signal definitions. The order of the signal declarations is significant. The event data is grouped in the same order as the signal definitions. A signal declaration has a signal name, an optional bit specification a direction, an optional path, and finally an optional bidirectional reference.

```
signal ad[1:0] input;
signal clock input;
signal d[0:71 bidir {
reference read {
path = "/cpu/cell12;
polarity = positive;
signal read input {
path = "/cpu/cell12;
}
signal reset input;
signal write input;
``` signal

The signal statement contains the name of the signal, the bit specification (bitspec) of the signal, the direction of the signal, an optional path, and an optional bidirectional reference signal.

polarity

The format of a signal statement is: signal foo[0:7] input; or, if the signal is a bidirectional with a bidirectional reference signal, then: signal foo[0:7] bidir (reference read {polarity positive; "".

signal names

If a signal name starts With an alphabetic character (A-Za- z) and is followed by zero or more alphabetic characters, numeric character (0-9) or underscores ('- '), then the name does not need to have double quotations. If the name contains any other characters, then double quotes ("") must precede and follow it. The following are examples of legal signal names: foobar, FooBar, foo ' bar, foobar89, "foo bar 89", and "foobar%$$89".

bit specification

A signal name may also contain a bitspec. The format for a bitspec is [MSB:LSB], where MSB is the index of the most significant bit, and LSB is the index of the least significant bit. MSB and LSB give the position of the event data. For example, the statement "signal foo[0:7];" defines a signal with the name foo with 8 bits, where the leftmost bit, in the event data section, is bit 0, and the right-most bit is bit 7. A signal with no bitspec is assumed to have a width of 1.

direction

The legal directions possible are: input, output, and bidir. Data for a signal of the input direction is forced into the DUTData for a signal of the output direction is compared with the results from the DUT. Data for a signal of the bidir direction is both force and compare.

path (optional)

The path statement is inside the curly braces of a signal statement. It enables you to include the hierarchical path name as part of name of the signal. An example path statement is: path="/cpu/ce 11 12";

reference

The reference statement is inside the curly braces of a bidirectional signal statement. It enables you to specify the bidirectional reference signal for the signal. This determines the direction for the signal you specify by using the data in the reference signal. If the polarity for the reference is positive, then a value of 0 is FORCE, and I is COMPARE in the reference. If the polarity for the reference is negative, then I is FORCE, and 0 is COMPARE. If the data in the reference signal is 'x' or 'z', then the data for the signal is 'x'. An example of the reference statement is: reference foo 2 (polarity=positive). In the example, foo is the name of the reference signal, and 2 is the bitspec. You can omit the bitspec in references to a signal with no bitspec. The polarity can be positive or negative. The reference statement can also contain an optional path statement.

The Event Data Section

The event data section has three types of statements. They are timestamped data vector, timestamped signal change list, and markers.

timestamped data vectors

Each timestamped vector contains the time (in timescale units) when the change occurred. The time is followed by a colon. Following the colon is a list of binary values for the signals, which you list in the order of the signals in the signal section. The vector is ended with a semicolon. An example timestamped data vector might be: 10102: 1011 LHLLHLHH. The timestamp 10102 is the time that the vector occurred. The timestamp is in the units defined in the timescale command in the environment section. The organization of the data vectors implies that there are two groups, one 4 bits and another 8 bits. However, the spacing of groups is only done for readability. The group order and width in the signal declaration section is the definition of what each bit in the vector maps to. The binary data for the signals in each vector, starting at the left, is the most significant bit of the first signal and goes to the least significant bit of the first signal. It is followed by the most significant bit of the second signal and goes to the least significant bit. This pattern for the data continues until all the data for the vector is displayed. For readability, usually the binary data is separated with a space at signal boundaries, but are not required.

timestamped signal change list

The timestamped signal change list is more compact than the timestamped data vectors, for notating small changes. It allows only signals with changes to be listed. It has a timestamp (in timescale units) followed by an at-sign ('@'). Each signal data change in the signal change list is notated with a signal key followed by a comma (',') and then the data for the signal. A signal key is the order number that a signal appears in the signal declaration section. The key of the first signal would be 0, the key of the next signal would be 1, and so on. There may be any number of key-data pairs on the line of the signal change list. A semi-colon (';') follows the last key-data pair. An example of a signal change list is: 10210@1,1 01 1 4,HLHHHLHL. This example says the second and the fifth signals have changed at time 10210.

marker

The event data may also contain a marker, which is a special comment. A marker is a way to notate some interesting thing about the data in a way that may be kept after the EWAV file has been translated into another file format. Normal C-style comments are removed by most translators, while markers are generally passed through the translation process. The format of a marker statement is as follows: marker "some interesting observation".

Pin Directionality in EWAV

The data for signals with the direction input is either a 1 for high, a 0 for low, a 'z' for hi impedance, or an 'x' for unknown. The data for signals with the direction output is either a 'H' for high, a 'L' for low, or an 'x' for unknown. The data for signals with the direction bidir has the following meaning:

| Value | FORCE | COMPARE |
|---|---|---|
| high | 1 | H |
| low | 0 | L |
| tristate | z | T |
| tristate high | I | — |
| tristate low | i | — |
| unknown | x/X | x/X |
| unknown high | U | D |
| unknown low | u | d |

The meaning of the data for a bidir signal may be overridden if the signal has a bidirectional reference. N"en a signal is bidirectional and has a bidirectional reference signal then the data for the reference determines the direction for the signal. If the polarity for the reference is positive, then a value in the reference of 0 is FORCE, and 1 is COMPARE. If the polarity for the reference is negative, then 1 is FORCE and 0 is COMPARE. If the data in the reference signal is 'x' or 'z', then the data for the signal is 'x'. .

Description of BNF

The Backus Naur Form (BNF) is a formal method for describing languages. Many variations of BNF exist today. The following describes the BNF used to describe the MSA grammar.

// is the notation for a comment. The comment starts with and ends at the end of the line.

:= A colon with an equal sign is the equivalence statement. This separates left- and right-hand sides of BNF rifles.

I A single vertical line is the OR symbol. You use it on the right-hand side of a BNF rule to allow the rule to derive several actions.

{} Curly braces around symbols mean that they repeat one or more times.

[] Square braces around a symbol means that it is optional. Parentheses around symbols mean that they are in a group together.

' Single quotes around characters or character strings notate keywords or characters that a rule requires.

.. Two periods can connect a range of quoted characters.

```
EWAV BNF
//
// This is the BNF for the EWAV file format. // This
version of the BNF will read versions // '0 1 0','0 1
1' and 1 1 2' of the EWAV
// file format.
//
Event_File := Event_Type [{Test-id)] (Signal-Defsl
(Test-Vectors)
Event_Type := 'version' sp'event'sp'O'sp'l' sp ('O'|
'1'| '2')
Semi
//
// The Test-ld statement are optional, however if the
// 'timescale' statement is omitted then a timescale of
1ps
// is used by default.
//
Test-Id:=      'date' sp Day sp Month sp Year Semi
       |       'time' sp Hour sp Minute sp Second
Semi
       |       'source' sp String Semi
       |       'destination' sp String Semi
       |       'designer sp String Semi
       |       'design' sp String Semi
       |       'timescale' Opt_Equal Integer
               ('ps' I 'ns' I 'us' I 'ms') Semi
```

```
                                  ;
Day       := Integer;
Month     := Integer;
Year      := Integer;
Hour      := Integer;
Minute    := Integer;
Second    := Integer;
Opt_Equal:= ([[sp] '=' [sp]]| sp)
;
// A Signal definition can be followed by a semi or by
// one signal identifier statement or by a signal ident
list.
//
Signal_Defs Signal
    (
        Semi |
        (sp Sig_Id) |
        ([sp]'{'[sp] {Sig_Id}'}'[sp])
Signal := 'signal' sp Name ([sp] Bit Spec sp | sp)
IOType;
Bit_Spec := '['[sp] Integer [sp]':' [sp] Integer [sp]
']';
IO_Type := 'output' | 'input' | 'bidir
//
// References are only used on bidir signals
//
Sig_Id:= 'pin'Opt_Equal String [{','String | sp
String}]Semi
        |   'testchannel'Opt_Equal String
        |       {','String | sp String }] Semi
        |   polarity'Opt_Equal'positive'Semi
        |   polarity'Opt_Equal'negative'Semi
        |   path'Opt_Equal String Semi
        |   reference'sp Name [sp BitNumber]
        |       (Semi I|([sp] '{' [sp] {Ref-Id}'}' [sp]))
Ref Id:=    polarity'Opt Equal'positive'Semi
        |   'polarity' Opt_Equal 'negative' Semi
        |   path'Opt Equal String Semi
        ;
Test Vectors:=    Time [sp]':'([sp] Vector_Data| Semi
        |   Time [spl'@'[sp] Key','Vector_Data [fsp
            Key','Vector_Data)] Semi
        |   'marker sp Quoted_String Semi
//
// The "Key" is the index to the signal on which the //
current event is occurring. The "Key" for the // first
signal in the signal list is 0, the second is 1,
// etc.
//
Key:=          Integer;
BitNumber:=    Integer;
;
// Time is an unsigned 32 bit integer. It must be no
larger
// than 2A32 (which is —4ms when the timescale is 1
ps).
//
Time:=         Integer;
//
// Vector Data characters and their meaning:
//
// Value     force    Compare
//
// high       1        HI
// low        0        L
// hi-imp     z        T
//                     i/I    —
// unknown    x/X      x/X
//            u/U      d/D
// Note:
//    z/T = hi-z
//    i = hi-z 0
//    I = hi-z I
//    X/X = unknown/mask
//    u/d = unknown/mask 0
//    U/D = unknown/mask 1
//
Vector-Data:=
{'O'|'X'|'X'|'Z'|'H'|'L'|'T'|'i'|'I'|'u'|'U'|'d'|'D|;
Integer:=      {'0'..'9'};
Name:=         String;
String:=       Quoted_String | Ident
                                  ;
Ident          ('a'..'z' I 'A'..'Z'
Quoted-String:= '\"'{"|'\\t'|'l'|'#'//'~'}'\"'
sp:=                    {"|\\t'|'\\n'|'\\|Comment}
//
// This is a "C" style comment.
//
Comment := '/'*'{''..''~'|'\\t'|'\\r'}'*'/
Semi:=         [sp]';'[sp]
EWAV Example
    version event 0 1 2;
    timescale = 1ns;
    signal ad[1:0] input;
    signal clock input;
    signal d[0:7] bidir {reference read {
    polarity = positive;
    }
    }
    signal read input;
    signal reset input;
    signal write input;
    /*  aa    c    dddddddd    r r w */
    /*  dd    I    ::::::::    e e r */
    /*  ::    o    01234567    a s i */
    /*  10    c                d e t */
    /*        k                t e  */
    marker       "initialize";
    40:     00 0 zzzzzzzz 1 0 1;
    90:     1,1;            /* clock changed to 1;
    140:    @1,0 4,1;       /* clock changed to 0 and
reset
    changed to 1 */
    190:    00 1 zzzzzzzz 1 1 1;
    marker "read cycle";
    240:    00 0 LLLLLLLL 0 1 1;
    290:    00 1 LLLLLLLL 0 1 1;
    340:    1 0 0 LLLLLLLL 0 1 1;
    390:    1 0 1 LLLLLLLL 0 1 1;
    marker "write cycle";
    440:    00 0 zzzzzzzz 1 1 1;
    490:    00 1 zzzzzzzz 1 1 1;
    540:    00 0 zzzzzzzz 1 0 1;
    590:    00 1 zzzzzzzz 1 0 1;
    640:    00 0 zzzzzzzz 1 1 1;
    690:    00 1 zzzzzzzz 1 1 1;
    740:    00 0 000000000 1 1 0;
    790:    00 1 000000000 1 1 0;
    840:    00 0 zzzzzzzz 1 1 1;
    890:    00 1 zzzzzzzz 1 1 1;
    marker "read cycle";
    940:    00 0 LLLLLLLL 0 1 1;
    990:    00 1 LLLLLLLL 0 1 1;
```

Qualification Signal List File (.qsl)

The Qualification Signal List File is a list of signal names and states, such as 0, 1, L, or H. The Align Edges process can use the .qsl file as it aligns the edges of the signals in the Signal File.

The process always aligns the edges of the Signal File to a transition event of a reference signal, which you specify in the Properties box of the process. The reference signal is in the TekWAVES database (not in the Signal File). The process then can use the states of the signals in the Qualification Signal List File to qualify further the Signal File edges with the transition in the reference signal. When the process matches the states of the signals in the qsl file to an event of the reference signal, the process then aligns the edges of the Signal File signals to the transition, or edge, of the reference signal. The process does not affect the signals in the oqsl file. When creating the file, you must individually specify each signal of a bus. The states must be valid states for the format of the specific TekWAVES database with which you are working. A file could look like this:

| signal | state |
| --- | --- |
| OUTPUT[9] | 0 |
| OUTPUT[8] | 1 |

Glossary

Accept—saves any entries or changes to information in dialog boxes. The system renames an icon after you enter and then accept the new name.

Align Cycles Filter—moves cycle boundaries to the nearest time point that a specific tester can reproduce.

Align Edges Filter—aligns edges across a group of signals for events that occur at almost the same time.

Ascii Text Icon—enables you to edit any ascii text. Double- clicking the icon with the left mouse button produces a text editor dialog box, and the text of the file. You can scroll, delete, and add lines. If you accept your entries, TekWAVES saves them, or deletes the changes if you cancel them.

bidirectional pin—is both an input and output signal. You can create bidirectional signals in two ways: 1) Insert a new signal in the Database Manager by typing the signal name and setting the signal type to "bidir." If a signal is "bidir," it may also have an associated control signal within the database. 2) Add two unique signal names to the signal list, one as an input signal and the other as an output signal, each with the same pin number.

Bidir Split Filter—converts each bidirectional signal into a unique input signal and a unique output pin. The new output pin has the name of the original bidirectional signal, with an -Q appended to it. If it is not sensing, it has a T state. The new input signal has the name of the original bidirectional signal with an _1 appended to it. If it is not driving, it has a Z state.

browser menus—come up when you choose something in TekWAVES with the middle mouse button. You use a browser menu to manipulate your data. A middle button browser menu enables you to control various activities from choices in the menu, which you make when you release the middle button.

busses—multibit signals.

Card File—resides in the upper right corner of the workbench. The cards have icons representing tools that you drag to the workbench. Selecting the title of a card brings the card to the front. By dragging vertically on the card file knob, you rotate the cards. The possible cards are the System, Editors, Tools, LV500, LT1000, DAS9200, Files, and Translators cards.

channel—per signal is within the Database Manager, in the scrolling area for single-bit signals. It is the channel number of the tester to set for single-bit signals.

check boxes—enable you to toggle an item on or off.

click—a mouse button press followed by an immediate release.

close button—in the upper left corner of the window of each editor, to the left of the title bar of each editor. Selecting this button closes the editor, and TekWAVES redraws other editors to expand into the newly available space.

Communications Icon—resides on the individual tester cards. It enables you to move files to and from the testers.

corporate title bar—appears after TekWAVES boots, and displays the TekWAVES name.

cursor bar—a guide in both the Timing and State editors. In the Timing Editor, it is a single blue vertical line that marks a time position. In the State Editor, it is a blue horizontal rectangular outline with tabs on the ends. The cursor bar is linked to both editors.

cycle boundary—a time stamp where the tester starts one or more timing generators. A cycle boundary is the beginning or end of a complete sequence of values of a waveform. You can select and drag cycle boundaries. You can add them to your data in the Tuning Editor and with the middle mouse button browser menu in the Cycle Boundary Generator. The Align Cycles and Align Edges filters also move cycle boundaries. Cycle boundaries may not cross other cycle boundaries.

Cycle Select—resides on the Tools Card. It assigns cycle boundaries to a database based on your input. You can generate cycle boundaries by a variety of algorithms, depending on your particular application.

Database Icon—resides on the System Card. You use it to create a TekWAVES database. When you drag the icon off the card and onto the workbench, TekWAVES creates a new empty database, with a default name of data1, data2, and so on. You can rename the database by placing the cursor over the icon and typing a name, or by selecting Rename from the middle mouse button menu of the Database Icon.

Database Manager—the tool you use to enter new signal names into the database, or to change signal or bus names and signal characteristics that you already have. The Database Manager is available from the menu of the title bar in every editor, the signal list in the Timing, State, and Timeset editors, and from the menu of the Database Icon on the workbench.

dead zone—an interval of inaction in a cycle, as between an input stimulus and the resultant response, or a latency period at the end of a cycle. The Align Edges filter enables you to move edges from dead zones. Rules Check and the Timing Editor also affect dead zones.

delete—a command that totally removes data from the database. In TekWAVES, you delete something, such as an icon, with a middle mouse button press on any icon or wire, which brings up a menu, from which you choose Delete. If you delete an icon, and the icon represents a file in the directory structure or is a database icon, a dialog box asks if you want to "delete the file nameoffile?" TekWAVES deletes all connectors starting and ending on an icon you delete; however, TekWAVES does not delete unconnected icons resulting from the removal of a connector. If you delete the icon of an active editor, TekWAVES removes the icon from the workbench, and closes the editor. In the Signal List, you can remove and hide signals, but not delete them.

dialog boxes—appear after you select an item with square brackets in a menu, or they may appear as a warning after various operations. Dialog boxes may alert you of errors, give you other useful information about the system, or request information from you.

Directory Workbench Icon (small)—enables you to move to the startup TekWAVES directory from other directories within the directory structure of TekWAVES. It is in the far left of the workbench window, above the scroll bar of the Directory Area. It is only extant when you have gone from the startup directory to another directory. TekWAVES saves all information in the workbench directory when you leave it.

double click—a rapid press, release, press, release of the left mouse button. A double click on an icon in the workbench activates it.

dragging—pressing down and holding the left mouse button on an object, and moving the mouse to cause the object to move. A scroll box inside of a scroll bar, and icons in the Workbench, are examples of the objects you can drag.

edge dragging—waveform edges is available in the Timing Editor and in the Timeset Editor. In the Timeset Editor, you can drag edges to change the delay and width timing parameters. In the Timing Editor, you can drag edges to move an edge in time.

EDIF—an acronym for the Electronic Data Interchange Format.

editing frames—in the Frame Editor enables you to create, edit, and display frames. TekWAVES identifies frames by name. You specify frames in terms of formulae using the Frame Generation Language syntax.

editors—reside on the Editors Card. They are the Frame, State, Timing, and Timeset editors. When you instantiate the icon of an editor, TekWAVES gives it a default name based on the type of editor.

Editors Card—the second card on the Card File when you start TekWAVES. It contains the icons of the editors.

editor title bar—a gray bar across the top of the windows of the editors and the workbench. It contains the name of the editor and the name of the active database.

EWAV—a Tektronix file format for neutral simulator event data. There are no tester restrictions in an EWAV file. The LV500, DAS9200, and LT1000 can all read it. The format is defined in the Appendixes.

exit button—on the right of the corporate title bar. When you select it, TekWAVES saves the current configuration of your files. To the left of the exit button is the workbench button when the workbench is closed.

expansion buttons—to the right of the title bars of the editors, in the upper right corner of the windows of the editors. If you select the button, the editor expands to fill the entire host window. A subsequent selection of the expansion button returns the editor to its previous size and location.

File Card—in the card file contains icons of files that you can wire to various process icons from the Tools and Tester cards.

Fixture Report Generator—resides on the Tester cards. You use it to list the pin-to-tester channel wiring of a device, and mapping the DUT card to match the test program.

force—the stimulus a tester applies to an input pin of a device- under-test.

FrameEditor—enables you to display, create, and modify tester frames. You then create timesets (in the Timeset Editor) for a particular tester from the frames.

Frame Generation Language—uses a format for the semantics of a frame. TekWAVES uses the language to draw graphical representations of waveforms in the Timeset Editor, as well as in the Timing Editor when you apply a specific format to a state. In addition, you use the Frame Generation Language to describe timing generator resources that are specific to a tester.

frames—named descriptions of waveform segments. You describe frames in Frame Generation Language formulae. You then use frames to build timesets in the Timeset Editor.

frame generator—per pin per tester can be set in the Database Manager. The frame generators of each tester have limited sets of frames they can produce, and have timing restrictions such as edge resolutions. You can set these in Rules Check.

frame selection—occurs in the Timeset Editor, and is choosing the name of a frame from a middle mouse button menu, or selecting the frame field and sequencing through the available frame names. You can add new frame descriptions through the Frame Editor.

Glitch Filter—resides with the other filters on the Tools Card. The Glitch Filter removes or lengthens pulses from the data that are less than a width you mark. You can use this to remove spikes and glitches that appear in the data as a result of simulation.

Global Workbench—area is to the left of the Card File. You can drag editor icons to this space so you don't have to have instantiated editor icons in each directory you use in a work session. You can also use this area as a clipboard, or intermediate space, when you want to move icons from one directory to another. There is one global directory (/tekwaves/global ) for TekWAVES. No matter what startup directory you use, you have access to the same global directory.

graphical editing—of waveforms is available in the Timing Editor. You can select and drag any visible edge. The Timing Editor modifies all data between the time of the old edge and the time of the new edge.

help—available throughout TekWAVES. Pressing the right mouse button displays a help menu, which varies depending on whether your cursor is in the workbench or one of the editors. The workbench and each editor have unique help menus. You can see the entire hierarchy of help with a right mouse button press on the corporate title bar.

hide—a command unique to the Signal List Menu, which is available in the State, Timing, and Timeset editors. The command enables you to remove a signal from the list without deleting it from the database.

icon—can represent a file, a TekWAVES database, a hierarchical object, a process, or an editor. All files and directories in the workbench directory with extensions recognized by TekWAVES are instantiated on the workbench as icons corresponding to their file name extensions. The extension is not shown as part of the name.

iconic programming and process execution—occurs on the workbench. You can connect some icons together to describe data flow from one icon to the next. In most cases, the data that you pass is a single database, which you modify with various processes. You can execute the data flow segments, or programs, as a whole, or you can execute individual processes, if you do not connect them to other processes. You can wire multiple programming segments on a single workbench. You can execute any one segment by selecting and double-clicking on the top-most icon, or by selecting execute from the middle mouse button menu of the process icon.

increment and decrement arrows—enable you to select a time resolution of a waveform in the Timing and Timeset editors.

input and output pads—are square tabs on the right and left of process icons that you can wire together, if the corresponding data types are the same. For example, all process icons from the tester cards have at least one pad on the left for database input, and one pad on the right for database output. They may have additional input and output pads as well. By clicking the middle mouse button on the input or output pad, you can view a description of the data available, or expected, at that pad.

instantiation—You make a copy of, or instance of, an icon by dragging it from a card in the Card File onto either the Workbench Global or Workbench Directory areas. An instantiated icon can represent a file, a TekWAVES database, a hierarchical object, a process, or an editor.

LV500—the Tester Resource Allocator. LV500 assigns logical signals, through the pins of a device, to specific channels of tester, and assigns the tester channels to shared timing resources.

LV500 Comm—the communications function for transferring files from your host computer to and from the LV500. TekWAVES supports Ethernet, GPIB, and RS-232 hardware and protocols.

Map States—performs state substitution on a database. It maps the data from legal states for one tool, such as a logic simulator, to the legal states for another tool, such as a logic analyzer. You can specify a mapping table, or common mapping operations such as elimination of unknown states.

MSA—the file format that the LV500 requires. It is an ascii file that contains screen display information for the tester.

middle mouse button press—displays menus that you use to manipulate data in TekwAVES.

observe list—in the Database Manager indicates whether a signal in a device under test is capable of somehow being probed, either at the pad on the chip itself or a pin of the package of the chip. The default setting for all signals is true, for observable.

panning screens—occurs in the workbench directory area. Selecting either arrow causes the window to scroll by 100/0. If you hold down the left mouse button, the window continuously scrolls by 10% increments. Selecting either space around a scroll box, within the scroll bar shaft, causes the graphics page to scroll by a screen-width in the direction you specify. Dragging on the scroll box enables you to specify a new screen for the directory. In the workbench directory area, you can scroll up to one page past the current icons in every direction.

panning waveforms in time—possible in the Timeset Editor. You use the horizontal scroll bar at the bottom of the editor. The editor adjusts the time scale, and redraws the waveforms after a change in the scroll bar's setting.

pin number—a value you can enter in the single-signal area of the Database Manager.

Print—resides on the System Card. You tell the system what file to print, from which printer to print, and then double click the icon to start the printing process. Printing proceeds without interfering with the workbench or editor activities.

process icons—reside on the Tools Card, LV500 Tester Card, LT1000 Tester Card, and DAS9200 Tester Card. While the process icons have some common functionality, each icon on the Tester Card modifies, checks, or transports data for a particular tester, while the icons on the Tools Card are processes that are not tester dependent.

Qualification Signal List File—a list of signal names and states, such as reset 0. The Align Edges process can use the qsl file as it aligns the edges of the signals in the Signal List File.

range selection—enables you to select a rectangular range in the State Editor. One corner anchors at your first selection. The range is yellow. If you need to select more than the limits of the screen, and there is room to scroll, the display automatically scrolls along the same axis you drag.

radix—a number base used in the Timing and State editors, to show state values. If you change the radix for a particular signal in one editor, the radix of the*signal in the other editor also changes (if you are viewing the same database in both editors).

right mouse button press—displays a help menu that varies with the editor or workbench your cursor is on when you press the button.

RulesCheck—reads a Tester Capabilities File to determine the limitations of the tester. It resides on the LV500 and LT1000 cards. It checks the force and compare data of a simulator for compatibility with a tester. Each tester has a number of rules and specifications to which you tailor your data before generating a tester-specific program.

ScaleTiming Filter—scales simulation data for use on a tester that cannot operate the circuit at the speed at which it was simulated. The Scale Timing Filter stretches or compresses the input data by a factor that you specify, and moves output edges by maintaining the time difference between each output edge and the previous input edge.

scroll bar—consists of either a vertical or horizontal scroll bar shaft, a scroll box, and two arrows. It enables you to reposition a screen display, such as a menu or the workbench directory.

scroll bar shaft—has an arrow on each end and a scroll box. It is inside a scroll bar.

scroll box—the gray rectangle within the scroll bars. Its length varies depending on the proportion of the data you are looking at in that particular editor, versus the total amount of data in that editor. You can scroll it to reposition the display.

scrolling signals—occurs similarly in the State, Timing, and Timeset editors. The Timing and Timeset editors display their signals vertically. The State Editor displays signals horizontally. Selecting either arrow at the ends of a scroll bar causes the signal list to scroll by one item in that direction. If you select and hold down the left mouse button, the list continues to scroll. Selecting either space around a scroll box causes the entire list on the screen to page.

scrolling time—occurs in the Timing and Timeset editors. When you select either arrow in the arrow bar shaft, the time range scrolls by 100/o of the screen width in that direction. If you select an arrow and hold down the left mouse button, the time range continuously scrolls. If you select either space around a scroll box, within the scroll bar shaft, the time range pages in that direction. In the State Editor, scrolling the time range is similar to scrolling signals.

selecting—pressing and releasing the left mouse button over an object, thereby activating it for your use .

Sequence Time Column—along the left side of the State Editor. It has sequence or time values for each row of states. When you select view sequence in the Properties dialog box, the editor shows sequence values, and "SEQ!' at the top of the column. You cannot edit sequence values. When you select view time, the values represent the time across all the state values in the row in which a change has occurred.

sense—the measured result of the output pin of a device- under test.

signal class—primary, internal, or external. You set this in the bus area of the Database Manager.

Signal List Menu—in the State, Timing, Timeset editors. It is a list that specifies the signals that that editor shows, from the group of signals available in a version of a database.

signal name selection—a capability of the Signal List menu in the Timing, State, and Timeset editors. Choosing the name cell of a signal in the Timing, State, or Timeset editor gives a Signal List menu. The signal list of Timeset Editor is not the same as the one the Timing and State editors use, but their operations are similar.

signal type—a parameter you set in the Database Manager. A single pin, or a bus, can be input, output, bidirectional, power, or ground.

Slide Icon—results from taking a snapshot of display of an editor, via the editor or title bar menu of the workbench. The Slide Icon represents a file of a captured screen display. The Slide Icon has the name of the editor, affixed with a number that increases with each snapshot. You can change the name by placing the cursor on the Slide Icon and typing, or by selecting Rename from the browser menu of the icon.

snapshot—capability is in the title bar of every editor and the workbench. It stores a bit map of a specific display for archiving and printing. (See Slide Icon.)

spike—the same phenomenon as a glitch.

State Editor—displays, creates, and modifies digital vectors. It displays vector data in a sequence format. A sequence is defined for every time at least one state changes for each sequence. The states (0, 1, X . . . etc.) in the State Editor represent events or timeset state values.

state editing—possible in the State Editor. All of the state values of a particular database are in rows beneath the signal list. By typing legal states at the intersections of signals and sequences, you change the states. After you do so, TekWAVES updates the database, and if the Timing Editor is displaying the same database, it synchronizes with the new state value. If you type an illegal state value for the database type, the error flashes twice, and the old value appears.

System Card—contains icons of tools for general use in the TekWAVES system. They are the Database, Workbench Directory, Printer, and ascii Text icons.

target tester—the tester holding the DUT into which you will load the pertinent vector files. TekWAVES comes with Tester Capabilities Files to support all configurations of the LV500 and one for the LT1000.

Tester Cards: LV500, LT1000, and DAS9200—contain the Rules Check, X TRACT, LV500, WIRE GUIDE, WRITE MSA, LV500 COMM, DATA SHEET, WRITE EWAV, LT1XXX COMM, and DAS COMM icons.

Test Program Generator (WRITE MSA)—resides on the LV500 tester card. It produces a functional test program for the LV500, using information from a given TekWAVES database. Before running the Test Program Generator, you need to provide state and timeset values, and resource and wiring data. You can enter these manually via the various editors, or automatically with CYCLE SELECT, X TRACT, and the Resource Allocator. WRITE MSA requires you to first run RULES CHECK.

Tester Resource Allocator—resides on the LV500 tester card. It assigns the pins of a device to specific tester channels, and assigns the channels of a tester to shared timing resources, if any are required.

time-per-division Control—available in the Timeset and Timing editors, as they require control of the time resolution of waveforms. This consists of a 1-2-5 sequence value and a power of 1000 unit. To select the resolution, you can use an increment and decrement arrow, and a browser menu.

timeset—a group of frame generators that can apply waveforms simultaneously to several signals. Each frame generator in the timeset produces a specific frame, and this collection of frames is a timeset.

timeset binding—binding of timesets to vectors occurs in the State Editor. You can type in names of existing timesets, which are defined in the current database, in the timeset column. If you enter an incorrect name, the name flashes twice and then reverts to the previous name. To avoid errors, you should use the browser menu of the Timeset Editor.

timeset display—in the Timing, Timeset, and State editors.

timeset editing—in the Timeset Editor enables you to build timesets from the frames available in the database, which you can see in the Frame Editor, and access from the menu of the name of the frame. You can change timing parameters or drag edges.

Timeset Editor—enables creation, viewing, and editing of timesets in a TekWAVES database. A TekWAVES database can contain frames and timesets.

timeset extraction algorithm—traverses the event data sequentially through time, examining the event transitions for each signal between two successive cycle boundaries. Within each cycle it determines the appropriate tester frame generator for the LV500 to assign to the DUT.

Timeset Extractor—converts event-encoded waveform data into an equivalent state and timing representation that is compatible with a given set of frame definitions. The process reads frame definitions from the Tester Capabilities File associated with the specified tester.

Timing Editor—enables you to display and modify single-bit digital waveforms and multibit digital busforms- You can change the time resolution of the waveforms, as well as see tester cycle boundaries, tester cycle dead zones, errors, and comments.

timing generator—a hardware device that controls when and where a tester applies stimuli to a device under test.

timing parameters—in the Timeset Editor. After you select a name of a frame, timing parameter fields appear to the right of the name of the frame. There is one less timing parameter than the number of possible edges described by the frame. Default times enable you to view the waveform. You can adjust the times by typing in the timing parameter fields, or by dragging edges in the waveform.

timing versions of timesets—in the Timeset Editor enable you optionally to create multiple timing versions of each timeset. The timeset version name field appears on the right end of the name bar of the timeset. The default timing version name is TYP, for typical.

title bar—a bar across the top of a window on your screen that has the name of the editor or workbench you are in, and the name of the active database.

TooLs Card—contains the Align Cycles Filter, Align Edge Filter, Bidirectional Split Filter, Cycle Boundary Generator, Pulse Filter, Map States Filter, and Scale Timing Filter.

Translators Card—has icons of specific translators to convert stimulus response data output from the Valid ValidSIM, Teradyne LASAR, and Daisy VLAIF simulators into EWAV for TekWAVES to read. The User Icon enables you to have access to your own translator. The translations are one-directional into EWAV.

tristate—an output condition where the state of the signal floats between 0 and 1.

waveform time resolution—adjustable in the Timing Editor. Along the bottom of the waveform display area is a time scale with time values. At the far right of the timescale is the power-of-1000 unit of the time value labels. To the left of the timescale is the time resolution control area. Any change in time resolution causes immediate changes in the timescale labels and the waveforms.

wire—a graphical representation of a connection between two icons on the workbench. The line, or wire, represents the path of the flow of a database or other file.

Wire Guide—the Fixture Report Generator. You use it to list pin-to- tester channel wiring of a device, and mapping the DUT card to match the test program.

Workbench—the first area that appears after TekWAVES starts. It is a graphical interface, augmented with an iconic programming language, that enables electrical engineers to link design and test applications.

Workbench Button—on the corporate title bar, and is visible only if the workbench is closed. Selecting the button opens the workbench.

Workbench Directory—a rectangular area on the workbench that has dashed white lines around it. It is your main working area in the workbench. The name of the directory is at the top of the directory area. You can scroll the workbench area.

Workbench Directory Icon—represents a directory of TekWAVES files. To create a new directory, drag a Workbench Directory Icon onto the workbench (or select it while it is on the System Card, and the system puts it on the workbench). You can then place instances of icons in the Directory Icon for organizational purposes. When you double-click on an instantiated Workbench Directory Icon, you open a new workbench directory area, which only has the icons that you earlier placed in the Workbench Directory Icon. To return to the startup directory, select the small Workbench Directory Icon above the left workbench directory scroll bar. The name of the current directory is at the top of the Workbench Directory Area.

workbench space—a composition of three distinct, but interacting components: the Card File, the Global Workbench area, and the Workbench Directory.

Write MSA—the Test Program Generator for the LV500. It resides on the tester card. It produces a functional test for the LV500, using information from a given TekWAVES database. Before running the Test Program Generator, you need to provide state and template values, and resource and wiring data. You can enter these manually via the various editors, or automatically with the Cycle Generator, Template Extractor, and Resource Allocator. The Test Program Generator automatically runs the Tester Rules Checker first, unless you override it in the dialog box.

X Tract—the Timeset Extractor. It converts event-encoded waveform data into an equivalent state and timing representation that is compatible with a given set of frame definitions. Frame definitions are read from the Tester Capabilities File associated with the specified tester.

Thus, it can be seen that system 100 provides a very dynamic tool for generating stimulus vectors for use in simulation, for converting simulation stimulus/response vector data into a format which is compatible with a selected tester and for communicating that data to the tester. Further, any modified or augmented data can be resimulated prior to testing, and results of a test run may be retrieved and compared with desired results. This is all accomplished through a very visual, graphical display which provides for essentially complete control over the display using input devices. Textual information is entered through the keyboard, but otherwise, almost all of the control and manipulation is provided using the mouse controls. It will therefore be appreciated that although the invention and its various features have been described through a particular preferred embodiment, variations in the design and structure of such an embodiment can be made which are within the spirit and scope of the invention as defined in the claims.

We claim:

1. A system for generating and displaying a block diagram program comprising:
   user-operable input means for inputting data, including data for selecting a plurality of blocks;
   programmable computer means including memory means for storing computer program instructions and data, and processing means coupled to the input means and to the memory means for executing the stored program instructions, the processing means including means responsive to input data for producing graphic data representing the selected blocks, the blocks having terminals of at least two types such that only terminals of the same type can be connected; and
   graphic display means responsive to the graphic data for displaying images of the selected blocks and associated terminals, the input means including means for selecting a terminal of one block for coupling to a terminal of another block, the processing means including means responsive to the input data for producing graphic data identifying terminals of other blocks of the same type as the selected terminal, and the display means including means responsive to the graphic data for displaying terminals of other blocks, which terminals are of the same type as the selected terminal, with a feature visually distinguishing them from terminals which are not of the same type.

2. A system according to claim 1 wherein the visually distinguishing feature comprises a color.

3. A system according to claim 1 wherein the visually distinguishing feature comprises a geometric form.

4. A system according to claim 1 wherein the blocks represent an associated predetermined function and the terminal types correspond with different forms of data being input or output from the corresponding block functions.

5. A system according to claim 4 wherein the processing means further comprises means for producing graphic data representing a term identifying the form of data associated with a selected terminal, and the display means comprises means responsive to the graphic data for displaying the term.

6. A system according to claim 5 wherein the term is displayed adjacent the selected terminal.

7. A system for generating, displaying and executing a block diagram program, at least one block of the program representing a predetermined function, each performance of the function resulting in one of a plurality of outputs, the system comprising:

user-operable input means for inputting data, including data for selecting a block and associated function;

programmable computer means including memory means for storing computer program instructions and data, and processing means coupled to the input means and to the memory means for executing the stored program instructions, the processing means including means responsive to input data for performing the function associated with the selected block and for producing graphic data representing the selected block with a graphic feature indicative of the output of the function performance, which graphic feature is visually distinguishable from a graphic feature indicative of another output of function performance; and graphic display means responsive to the graphic data for displaying an image of the selected block with the corresponding graphic feature.

8. A system according to claim 7 wherein one output comprises the completion of the performance of the associated function, and another output comprises the noncompletion of the performance of the associated function.

9. A system according to claim 7 wherein the graphic features comprise colors of the image of the associated block.

* * * * *